US011617290B2

(12) United States Patent
Kim et al.

(10) Patent No.: US 11,617,290 B2
(45) Date of Patent: Mar. 28, 2023

(54) ORGANIC LIGHT-EMITTING DEVICE

(71) Applicant: SAMSUNG DISPLAY CO., LTD., Yongin-si (KR)

(72) Inventors: Younsun Kim, Yongin-si (KR); Seulong Kim, Yongin-si (KR); Dongwoo Shin, Yongin-si (KR); Jungsub Lee, Yongin-si (KR); Naoyuki Ito, Yongin-si (KR); Jino Lim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 15/220,636

(22) Filed: Jul. 27, 2016

(65) Prior Publication Data

US 2017/0179403 A1 Jun. 22, 2017

(30) Foreign Application Priority Data

Dec. 22, 2015 (KR) ........................ 10-2015-0184083

(51) Int. Cl.
*H01L 51/00* (2006.01)
*H01L 51/50* (2006.01)
(Continued)

(52) U.S. Cl.
CPC ........... *H10K 85/654* (2023.02); *H10K 50/11* (2023.02); *H10K 50/13* (2023.02); *H10K 85/615* (2023.02);
(Continued)

(58) Field of Classification Search
CPC ......... H01L 2251/301; H01L 2251/552; H01L 51/0052; H01L 51/0054; H01L 51/0058;
(Continued)

(56) References Cited

U.S. PATENT DOCUMENTS

| | | |
|---|---|---|
| 5,393,614 A | 2/1995 | Nakada |
| 6,387,544 B1 | 5/2002 | Thompson et al. |

(Continued)

FOREIGN PATENT DOCUMENTS

| | | |
|---|---|---|
| CN | 1708475 A | 12/2005 |
| CN | 101079472 A | 11/2007 |

(Continued)

OTHER PUBLICATIONS

Machine translation for CN 104835921 A (publication date: Aug. 2015). (Year: 2015).*

(Continued)

*Primary Examiner* — Dawn L Garrett
(74) *Attorney, Agent, or Firm* — Lewis Roca Rothgerber Christie LLP

(57) ABSTRACT

An organic light-emitting device includes: a first electrode; a second electrode facing the first electrode; an emission layer between the first electrode and the second electrode; a hole transport region between the first electrode and the emission layer; and an electron transport region between the emission layer and the second electrode, wherein the electron transport region includes a first compound, at least one selected from the hole transport region and the electron transport region includes a second compound, the first compound is represented by one selected from Formulae 1A to 1D, and the second compound is represented by Formula 2A or Formula 2B:

<Formula 1A>

(Continued)

-continued

<Formula 1B>

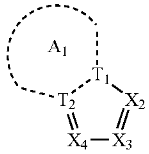

<Formula 1C>

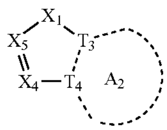

<Formula 1D>

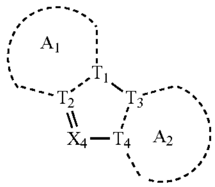

<Formula 2A>

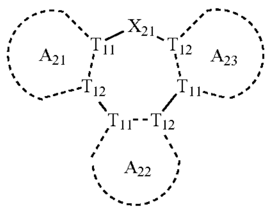

<Formula 2B>

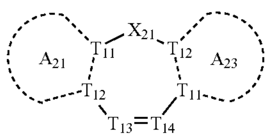

18 Claims, 2 Drawing Sheets

(51) Int. Cl.

| | |
|---|---|
| ***H10K 85/60*** | (2023.01) |
| ***H10K 50/11*** | (2023.01) |
| ***H10K 50/13*** | (2023.01) |
| ***H10K 101/40*** | (2023.01) |
| ***H10K 50/16*** | (2023.01) |
| ***H10K 50/155*** | (2023.01) |
| ***H10K 50/17*** | (2023.01) |
| ***H10K 101/30*** | (2023.01) |
| ***H10K 102/00*** | (2023.01) |

(52) U.S. Cl.

CPC ......... *H10K 85/622* (2023.02); *H10K 85/626* (2023.02); *H10K 85/657* (2023.02); *H10K 85/6572* (2023.02); *H10K 50/155* (2023.02); *H10K 50/16* (2023.02); *H10K 50/171* (2023.02); *H10K 2101/30* (2023.02); *H10K 2101/40* (2023.02); *H10K 2102/00* (2023.02)

(58) Field of Classification Search

CPC ............. H01L 51/0067; H01L 51/0071; H01L 51/0072; H01L 51/5004; H01L 51/504; H01L 51/506; H01L 51/5072; H01L 51/5092

See application file for complete search history.

(56) References Cited

U.S. PATENT DOCUMENTS 7,833,632 B2 11/2010 Kawamura et al.
8,154,195 B2 4/2012 Nishimura et al.
8,512,875 B2 8/2013 Kawamura et al.
8,859,111 B2 10/2014 Parham et al.
9,076,978 B2 7/2015 Lee et al.
9,093,652 B2 7/2015 Jung et al.
9,224,969 B2 12/2015 Song et al.
9,331,287 B2 5/2016 Hong et al.
9,520,567 B2 12/2016 Lee et al.
9,691,991 B2 6/2017 Hong et al.
10,164,195 B2 12/2018 Kim et al.
10,297,756 B2 5/2019 Lee et al.
2002/0096995 A1* 7/2002 Mishima ............. H01L 51/5016 313/506
2003/0039858 A1* 2/2003 Igarashi ................ H01L 51/005 428/690
2003/0072965 A1* 4/2003 Kimura ................ C07D 473/00 428/690
2003/0157364 A1 8/2003 Senoo et al.
2005/0089717 A1 4/2005 Cosimbescu et al.
2006/0061265 A1 3/2006 Kawamura et al.
2006/0105202 A1* 5/2006 Kitamura ............... C09K 11/06 428/690
2006/0269781 A1 11/2006 Lai et al.
2007/0054151 A1 3/2007 Iwakuma et al.
2007/0200490 A1* 8/2007 Kawamura .......... C07D 235/08 313/504
2007/0215867 A1 9/2007 Kawakami et al.
2007/0267958 A1 11/2007 Kitazawa et al.
2007/0273273 A1 11/2007 Kim et al.
2008/0138654 A1* 6/2008 Kathirgamanathan ....................... H01L 51/0058 428/690
2009/0009065 A1 1/2009 Nishimura et al.
2009/0045730 A1 2/2009 Nishimura et al.
2009/0096357 A1 4/2009 Lee et al.
2009/0309492 A1 12/2009 Hofmann et al.
2010/0289008 A1 11/2010 Jang et al.
2011/0156013 A1 6/2011 Kim et al.
2012/0091438 A1 4/2012 Yabunouchi et al.
2012/0104940 A1 5/2012 Shin et al.
2012/0153268 A1 6/2012 Kawamura et al.
2012/0217492 A1 8/2012 Kim et al.
2012/0235123 A1 9/2012 Lee et al.
2012/0256174 A1 10/2012 Jung et al.
2013/0207082 A1 8/2013 Cho et al.
2014/0027744 A1 1/2014 Yoshida et al.
2014/0054564 A1 2/2014 Kim et al.
2014/0159005 A1 6/2014 Kawamura et al.
2014/0183466 A1 7/2014 Lee et al.
2014/0197384 A1* 7/2014 Kim .................... H01L 51/0054 257/40
2014/0217393 A1 8/2014 Kato et al.
2014/0225072 A1 8/2014 Kim et al.
2014/0291631 A1 10/2014 Lee et al.
2014/0336392 A1 11/2014 Kim et al.
2015/0053933 A1 2/2015 Lee et al.
2015/0060808 A1 3/2015 Kim et al.
2015/0102301 A1 4/2015 Cho et al.
2015/0155491 A1 6/2015 Mujica-Fernaud et al.
2015/0171348 A1* 6/2015 Stoessel .............. C07F 15/0033 252/301.16
2015/0194610 A1 7/2015 Hwang et al.
2015/0207093 A1 7/2015 Kim et al.
2015/0325794 A1* 11/2015 Nishimura ........... C07D 403/04 257/40
2015/0340618 A1 11/2015 Lee et al.
2015/0340621 A1 11/2015 Parham et al.
2016/0226000 A1 8/2016 Kim et al.
2016/0308146 A1* 10/2016 Parham ................ C07D 313/06
2016/0322583 A1* 11/2016 Kim .................... H01L 51/0067
2016/0351825 A1 12/2016 Kim et al.

(56) References Cited

U.S. PATENT DOCUMENTS

2017/0179395 A1 6/2017 Kim et al.
2017/0179396 A1 6/2017 Kim et al.

FOREIGN PATENT DOCUMENTS

CN 101159316 A 4/2008
CN 101384560 A 3/2009
CN 101400757 A 4/2009
CN 102803437 A 11/2012
CN 103140564 A 6/2013
CN 103904252 A 7/2014
CN 104103765 A 10/2014
CN 104520308 A 4/2015
CN 104835921 A * 8/2015
CN 106981576 B 1/2020
EP 2163550 A1 3/2010
EP 2484665 A1 8/2012
EP 2599851 A2 6/2013
JP 10-88119 A 4/1998
JP 2002234888 A 8/2002
JP 2006-256979 A 9/2006
JP 2008-177455 A 7/2008
JP 2008-243932 A 10/2008
JP 2011-100942 A 5/2011
JP 2015-13804 A 1/2015
KR 10-2007-0023676 A 2/2007
KR 10-2008-0080513 A 9/2008
KR 10-2010-0017136 A 2/2010
KR 10-2010-0039369 A 4/2010
KR 10-2010-0040901 4/2010
KR 10-2011-0008619 1/2011
KR 10-2011-0106193 9/2011
KR 10-2011-0117549 10/2011
KR 10-2012-0022861 3/2012
KR 10-2012-0052316 A 5/2012
KR 10-2012-0092550 8/2012
KR 10-2012-0092555 8/2012
KR 10-2012-0100709 9/2012
KR 10-2013-0028813 A 3/2013
KR 10-2013-0093327 8/2013
KR 10-2013-0098225 A 9/2013
KR 10-2013-0098229 A 9/2013
KR 10-2014-0034709 3/2014
KR 10-2014-0074286 6/2014
KR 10-2014-0085110 7/2014
KR 10-2014-0087882 7/2014
KR 10-2014-0102089 8/2014
KR 10-2014-0119642 10/2014
KR 10-2014-0128653 11/2014
KR 10-2014-0135525 A 11/2014
KR 10-2015-0001101 A 1/2015
KR 10-2015-0008678 1/2015
KR 10-2015-0021861 3/2015
KR 10-2015-0021861 A 3/2015
KR 10-2015-0024491 3/2015
KR 10-2015-0026114 3/2015
KR 10-2015-0034612 4/2015
KR 10-2015-0037119 4/2015
KR 10-2015-0039136 4/2015
KR 10-2015-0041931 4/2015
KR 10-2015-0070897 6/2015
KR 10-2015-0077284 7/2015
KR 10-2015-0080966 A 7/2015
KR 10-2015-0081736 7/2015
KR 10-2015-0086095 7/2015
KR 10-2015-0088066 7/2015
KR 10-2015-0103945 A 9/2015
KR 10-2015-0121394 A 10/2015
KR 10-2015-0124609 A 11/2015
KR 10-2016-0094834 A 8/2016
WO 00/033617 A1 6/2000
WO 2004/041774 A1 5/2004
WO WO 2007/029403 A1 3/2007
WO WO 2007/063986 A1 6/2007
WO WO 2011/010839 A1 1/2011
WO WO 2011/055932 A2 5/2011
WO 2012/005364 A1 1/2012
WO WO 2012/015274 A2 2/2012
WO WO 2012/070233 A1 5/2012
WO WO 2013/035329 A1 3/2013
WO WO 2013/039184 A1 3/2013
WO WO 2013/182263 A1 12/2013
WO WO 2014/094964 A1 6/2014
WO 2014/129869 A1 8/2014
WO WO 2015/082046 A2 6/2015
WO WO 2015/093812 A1 6/2015
WO WO 2015/099481 A1 7/2015
WO WO 2015/133804 A1 * 9/2015
WO WO 2015/160224 A1 10/2015
WO 2015/167259 A1 11/2015
WO WO 2015/190718 A1 12/2015
WO 2016/058504 A1 4/2016
WO WO 2016/122178 A2 * 8/2016

OTHER PUBLICATIONS

Google Patents translation for WO 2016/122178 A2 (publication date: Aug. 2016). (Year: 2016).*
Dyes and Pigments, vol. 114, (2015), pp. 184-195. (Year: 2015).*
Wang et al., Chinese Journal of Chemistry, vol. 33, Issue 8, Aug. 2015, pp. 948-954. (Year: 2015).*
Rodrigo, R. et al.; "Cancentrine. IV. Acetolysis Products of Cancentrine Methiodide"; Canadian Journal of Chemistry; vol. 50; 1972; pp. 3900-3910.
Machine Translation of KR 10-2015-0001101 listed above, 55 pages, (publication date: Jan. 2015).
U.S. Office Action dated Feb. 21, 2019, issued in U.S. Appl. No. 15/292,040 (13 pages).
Extended European Search Report for European Application No. 16191328.0, dated May 3, 2017, 7 pages.
Wei, Yi, et al.; Emission Mechanism of Doubly ortho-Linked Quinoxaline/Diphenylfluorene or cis-Stilbene/Fluorene Hybrid Compounds Based on the Transient Absorption and Emission Measurements during Pulse Radiolysis, Article, Journal of the American Chemical Society, The Society, vol. 131, No. 19, May 20, 2009, pp. 6698-6707.
Definition of buffer. http://www.dictionary.com/browse/buffer?s=t. As viewed on Apr. 12, 2018. (Year: 2018).
Machine Translation of JP 2006-256979 A. Sep. 28, 2006. (Year: 2006).
Machine Translation of WO 2015133804 A1. Sep. 11, 2015.
EPO Extended Search Report dated Nov. 4, 2016, corresponding to European Patent Application No. 16191351.2 (6 pages).
EPO Extended Search Report dated May 2, 2017, corresponding to European Patent Application No. 16195444.1 (8 pages).
EPO Extended Search Report dated May 2, 2017, corresponding to European Patent Application No. 16195460.7 (8 pages).
EPO Extended Search Report dated May 3, 2017, for corresponding European Patent Application No. 16191373.6 (6 pages).
U.S. Office Action dated Oct. 5, 2017, issued in U.S. Appl. No. 15/187,665 (17 pages).
U.S. Office Action dated Oct. 19, 2017, issued in U.S. Appl. No. 15/192,848 (23 pages).
U.S. Office Action dated Nov. 22, 2017, issued in U.S. Appl. No. 15/197,621 (17 pages).
U.S. Office Action dated Feb. 22, 2018, issued in U.S. Appl. No. 15/284,371 (15 pages).
U.S. Final Office Action dated Mar. 27, 2018, issued in U.S. Appl. No. 15/187,665 (13 pages).
U.S. Office Action dated Apr. 12, 2018, issued in U.S. Appl. No. 15/177,360 (12 pages).
U.S. Final Office Action dated Apr. 20, 2018, issued in U.S. Appl. No. 15/197,621 (14 pages).
U.S. Notice of Allowance dated Jul. 18, 2018, issued in U.S. Appl. No. 15/284,371 (10 pages).
U.S. Final Office Action dated Oct. 1, 2018, issued in U.S. Appl. No. 15/177,360 (12 pages).
U.S. Office Action dated Dec. 17, 2018, issued in U.S. Appl. No. 15/197,621 (16 pages).

(56) References Cited

OTHER PUBLICATIONS

U.S. Office Action dated Jan. 18, 2019, issued in U.S. Appl. No. 15/177,360 (6 pages).
European Patent Office Extended Search Report, dated May 3, 2017, for Patent Application No. EP 16191361.1, 7 pages.
Ran, Xue-Qin et al., "Structural, electronic, and optical properties of doubly ortho-linked quinoxaline/diphenylfluorene hybrids", Journal of Physical Organic Chemistry, Nov. 9, 2010, pp. 646-656, John Wiley & Sons, Ltd.
U.S. Office Action dated May 14, 2019, for U.S. Appl. No. 15/192,848, 20 pages.
Koene, Bryan E., et al.; Asymmetric Triaryldiamines as Thermally Stable Hole Transporting Layers for Organic Light-Emitting Devices, American Chemical Society, 1998, Chemical Materials, vol. 10, pp. 2235-2250.
Office Action issued in U.S. Appl. No. 15/192,848 by the USPTO, dated Nov. 20, 2019, 23 pages.
Office Action issued in U.S. Appl. No. 15/292,040 by the USPTO, dated Dec. 16, 2019, 16 pages.
Office Action issued in U.S. Appl. No. 15/294,638 by the USPTO, dated Dec. 17, 2019, 14 pages.
Machine English Translation of Enomoto et al. (JP 10088119 A). Jun. 18, 2020.
U.S. Final Office Action dated Jun. 23, 2020, issued in U.S. Appl. No. 15/292,040 (17 pages).
U.S. Final Office action dated Apr. 10, 2020, issued in U.S. Appl. No. 15/192,848 (21 pages).
Hu, J-Y and Yamato, T. Synthesis and photophysical properties of pyrene-based multiply conjugated shaped light-emitting architectures: toward efficient organic-light-emitting diodes. Organic Light Emitting Diode—Material, Process and Devices. InTech. Chapter 2, pp. 21-60. Jul. 27, 2011. (Year: 2011).
Machine Translation of JP 2008-243932 A. Oct. 9, 2008. (Year: 2008).
Machine Translation of WO 2014/129869 A1. Aug. 28, 2014. (Year: 2014).
Definition of alkylenes. IUPAC Compendium of Chemical Terminology. 2014. (Year: 2014).
U.S. Office Action dated Jul. 31, 2020, issued in U.S. Appl. No. 15/187,665 (16 pages).
U.S. Advisory Action dated Aug. 24, 2020, issued in U.S. Appl. No. 15/197,621, 8 pages.
U.S. Office Action dated Sep. 30, 2020, issued in U.S. Appl. No. 15/192,848, (37 pages).
U.S. Office Action dated Oct. 2, 2020, issued in U.S. Appl. No. 15/197,621, (26 pages).
Machine English translation of Huang et al. (WO-2016/058504 A1 ). Nov. 16, 2020.
U.S. Office Action dated Nov. 19, 2020, issued in U.S. Appl. No. 15/292,040 (17 pages).
U.S. Advisory Action dated Mar. 29, 2021, issued in U.S. Appl. No. 15/187,665 (6 pages).
U.S. Final Office Action dated Mar. 29, 2021, issued in U.S. Appl. No. 15/197,621 (29 pages).
European Patent Office Summons to attend oral proceedings pursuant to Rule 115(1) EPC, for European Patent Application No. 16191351.2, issued Sep. 8, 2020, 5 pages.
U.S. Final Office action dated Mar. 8, 2021, issued in U.S. Appl. No. 15/192,848 (29 pages).
Machine English translation of Mizuki et al. (JP 2015013804 A). May 20, 2021.
Machine Translation of KR 10-2015-0121394 A. Oct. 29, 2015. (Year: 2015).
Machine Translation of WO2016/122178A. Aug. 4, 2016 (Year: 2016).
Application KR10-2015-0012223. Filed Jan. 6, 2015. (Year: 2015).
Machine Translation of KR20160091735A, corresponding to application KR10-2015-0012223. Filed Jan. 6, 2015. (Year: 2015).
U.S. Final Office Action dated May 4, 2021, issued in U.S. Appl. No. 15/294,638 (18 pages).
U.S. Final Office Action dated May 25, 2021, issued in U.S. Appl. No. 15/292,040 (16 pages).
U.S. Advisory Action dated Jun. 2, 2021, issued in U.S. Appl. No. 15/197,621 (6 pages).
U.S. Office Action dated Jun. 28, 2021, issued in U.S. Appl. No. 15/192,848 (23 pages).
Machine Translation of KR2015-0124609A. Nov. 6, 2015. (Year: 2015).
U.S. Final Office Action dated Jan. 25, 2022, issued in U.S. Appl. No. 15/197,621 (16 pages).
Chinese Office Action dated Jan. 6, 2022, issued in Chinese Patent Application No. 201911253625.8 (6 pages).
Advisory Action for U.S. Appl. No. 15/177,360 dated Aug. 19, 2019, 2 pages.
Advisory Action for U.S. Appl. No. 15/177,360 dated Dec. 6, 2018, 2 pages.
Advisory Action for U.S. Appl. No. 15/187,665 dated Apr. 13, 2020, 6 pages.
Advisory Action for U.S. Appl. No. 15/187,665 dated Jun. 28, 2019, 4 pages.
Advisory Action for U.S. Appl. No. 15/187,665 dated Jun. 6, 2018, 5 pages.
Advisory Action for U.S. Appl. No. 15/192,848 dated Jul. 5, 2019, 5 pages.
Advisory Action for U.S. Appl. No. 15/192,848 dated Jul. 9, 2018, 5 pages.
Advisory Action for U.S. Appl. No. 15/192,848 dated Jun. 17, 2020, 4 pages.
Advisory Action for U.S. Appl. No. 15/192,848 dated May 14, 2021, 4 pages.
Advisory Action for U.S. Appl. No. 15/197,621 dated Aug. 14, 2019, 5 pages.
Advisory Action for U.S. Appl. No. 15/197,621 dated Jul. 6, 2018, 4 pages.
Advisory Action for U.S. Appl. No. 15/292,040 dated Jul. 26, 2021, 3 pages.
Advisory Action for U.S. Appl. No. 15/292,040 dated Sep. 26, 2019, 3 pages.
Advisory Action for U.S. Appl. No. 15/292,040 dated Sep. 4, 2020, 3 pages.
Advisory Action for U.S. Appl. No. 15/294,638 dated Jul. 12, 2021, 3 pages.
Advisory Action for U.S. Appl. No. 15/294,638 dated Nov. 12, 2019, 3 pages.
Advisory Action for U.S. Appl. No. 15/294,638 dated Sep. 8, 2020, 3 pages.
Final Office Action for U.S. Appl. No. 15/177,360 dated Jun. 14, 2019, 11 pages.
Final Office Action for U.S. Appl. No. 15/177,360 dated Oct. 1, 2018, 12 pages.
Final Office Action for U.S. Appl. No. 15/187,665 dated Apr. 19, 2019, 12 pages.
Final Office Action for U.S. Appl. No. 15/187,665 dated Feb. 7, 2020, 14 pages.
Final Office Action for U.S. Appl. No. 15/187,665 dated Jan. 19, 2021, 10 pages.
Final Office Action for U.S. Appl. No. 15/192,848 dated Apr. 23, 2018, 9 pages.
Final Office Action for U.S. Appl. No. 15/197,621 dated Jun. 4, 2020, 19 pages.
Final Office Action for U.S. Appl. No. 15/197,621 dated May 29, 2019, 17 pages.
Final Office Action for U.S. Appl. No. 15/292,040 dated Jul. 3, 2019, 11 pages.
Final Office Action for U.S. Appl. No. 15/294,638 dated Aug. 28, 2019, 18 pages.
Final Office Action for U.S. Appl. No. 15/294,638 dated Jun. 26, 2020, 11 pages.
Notice of Allowance for U.S. Appl. No. 15/177,360 dated Apr. 23, 2020, 8 pages.
Notice of Allowance for U.S. Appl. No. 15/177,360 dated Aug. 12, 2020, 5 pages.

(56) References Cited

OTHER PUBLICATIONS

Notice of Allowance for U.S. Appl. No. 15/177,360 dated Dec. 2, 2020, 5 pages.
Notice of Allowance for U.S. Appl. No. 15/177,360 dated Dec. 22, 2021, 5 pages.
Notice of Allowance for U.S. Appl. No. 15/177,360 dated Jul. 21, 2021, 5 pages.
Notice of Allowance for U.S. Appl. No. 15/177,360 dated Mar. 24, 2021, 5 pages.
Notice of Allowance for U.S. Appl. No. 15/177,360 dated May 10, 2022, 5 pages.
Office Action for U.S. Appl. No. 15/177,360 dated Sep. 26, 2019, 10 pages.
Office Action for U.S. Appl. No. 15/187,665 dated Oct. 25, 2018, 15 pages.
Office Action for U.S. Appl. No. 15/187,665 dated Sep. 23, 2019, 12 pages.
Office Action for U.S. Appl. No. 15/192,848 dated Dec. 4, 2018, 16 pages.
Office Action for U.S. Appl. No. 15/197,621 dated Aug. 17, 2021, 17 pages.
Office Action for U.S. Appl. No. 15/197,621 dated Dec. 13, 2019, 18 pages.
Office Action for U.S. Appl. No. 15/294,638 dated Apr. 4, 2019, 14 pages.
Office Action for U.S. Appl. No. 15/294,638 dated May 10, 2022, 25 pages.
Office Action for U.S. Appl. No. 15/294,638 dated Nov. 20, 2020, 11 pages.
Restriction Requirement for U.S. Appl. No. 15/177,360 dated Dec. 19, 2017, 7 pages.
Restriction Requirement for U.S. Appl. No. 15/284,371 dated Nov. 27, 2017, 7 pages.
Restriction Requirement for U.S. Appl. No. 15/292,040 dated Oct. 4, 2018, 5 pages.
Notice of Allowance for U.S. Appl. No. 15/177,360 dated Aug. 29, 2022, 5 pages.
Office Action for U.S. Appl. No. 15/197,621 dated Jul. 11, 2022, 27 pages.
Office Action for U.S. Appl. No. 15/292,040 dated Jun. 7, 2022, 15 pages.
Final Office Action for U.S. Appl. No. 15/294,638 dated Oct. 5, 2022, 25 pages.
Final Office Action for U.S. Appl. No. 15/197,621 dated Nov. 14, 2022, 18 pages.
Final Rejection for U.S. Appl. No. 15/292,040 dated Dec. 2, 2022, 15 pages.
Advisory Action for U.S. Appl. No. 15/197,621 dated Jan. 23, 2023, 4 pages.
Advisory Action for U.S. Appl. No. 15/292,040 dated Jan. 26, 2023, 3 pages.
Advisory Action for U.S. Appl. No. 15/294,638 dated Dec. 19, 2022, 3 pages.
Notice of Allowance for U.S. Appl. No. 15/177,360 dated Dec. 21, 2022, 5 pages.

* cited by examiner

ORGANIC LIGHT-EMITTING DEVICE

CROSS-REFERENCE TO RELATED APPLICATION

This application claims priority to and the benefit of Korean Patent Application No. 10-2015-0184083, filed on Dec. 22, 2015, in the Korean Intellectual Property Office, the entire content of which is incorporated herein by reference.

BACKGROUND

1. Field

One or more aspects of embodiments of the present disclosure relate to an organic light-emitting device.

2. Description of the Related Art

Organic light-emitting devices are self-emission devices that have wide viewing angles, high contrast ratios, short response times, and excellent brightness, driving voltage, and response speed characteristics, and can produce full-color images.

The organic light-emitting device may include a first electrode disposed (e.g., positioned) on a substrate, and a hole transport region, an emission layer, an electron transport region, and a second electrode, which are sequentially disposed on the first electrode. Holes provided from, for example, the first electrode may move toward the emission layer through the hole transport region, and electrons provided from, for example, the second electrode may move toward the emission layer through the electron transport region. Carriers, such as holes and electrons, may then recombine in the emission layer to produce excitons. These excitons transition from an excited state to a ground state, thereby generating light.

SUMMARY

One or more aspects of embodiments of the present disclosure are directed towards an organic light-emitting device having a low driving voltage and high efficiency.

Additional aspects will be set forth in part in the description which follows and, in part, will be apparent from the description, or may be learned by practice of the presented embodiments.

According to one or more embodiments, an organic light-emitting includes:

a first electrode;

a second electrode facing the first electrode;

an emission layer between the first electrode and the second electrode;

a hole transport region between the first electrode and the emission layer; and an electron transport region between the emission layer and the second electrode, wherein the electron transport region includes a first compound, at least one selected from the hole transport region and the electron transport region includes a second compound, the first compound is represented by one selected from Formulae 1A to 1 D, and the second compound is represented by Formula 2A or 2B:

Formula 1A

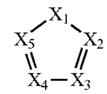

Formula 1B

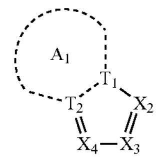

Formula 1C

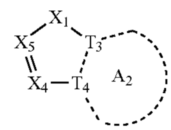

Formula 1D

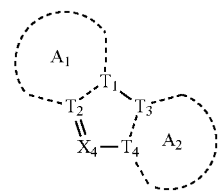

Formula 2A

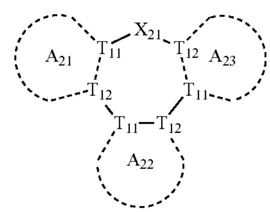

Formula 2B

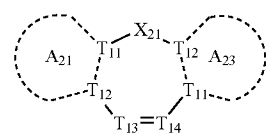

In Formulae 1A to 1D, 2A, and 2B, ring $A_1$ may be a $C_5$-$C_{60}$ carbocyclic group or a $C_1$-$C_{30}$ heterocyclic group, each substituted with at least one *-[$(L_{11})_{a11}$-$(R_{11})_{b11}$], and ring $A_2$ may be a $C_5$-$C_{60}$ carbocyclic group or a $C_1$-$C_{30}$ heterocyclic group, each substituted with at least one *-[$(L_{12})_{a12}$-$(R_{12})_{b12}$].

rings $A_{21}$, $A_{22}$, and $A_{23}$ may each independently be a $C_5$-$C_{60}$ carbocyclic group or a $C_1$-$C_{30}$ heterocyclic group, each substituted with at least one *-[$(L_{22})_{a22}$-$(R_{22})_{b22}$], $T_1$ to $T_4$ may each independently be carbon or nitrogen, a bond between $T_1$ and $T_2$ may be a single bond, and a bond between $T_3$ and $T_4$ may be a double bond, $T_{11}$ and $T_{12}$ may each independently be carbon or nitrogen, two or more selected from three $T_{11}$(s) in Formula 2A may be identical to or different from each other, $T_{13}$ may be N or C($R_{27}$), $T_{14}$ may be N or C($R_{28}$), two or more selected from three $T_{12}$(s) in Formula 2A may be identical to or different from each other, two $T_{11}$(s) in Formula 2B may be identical to or different from each other, two $T_{12}$(s) in Formula 2B may be identical to or different from each other, a bond between $T_{11}$ and $T_{12}$ may be a single bond or a double bond, a case where three $T_{11}$(s) and three $T_{12}$(s) in Formula 2A are all nitrogen may be excluded, and a case where two $T_{11}$(s), two $T_{12}$(s), $T_{13}$, and $T_{14}$ in Formula 2B are all nitrogen may be excluded, ring $A_1$ may be condensed with a 5-membered ring in Formulae 1B and 1D, while sharing $T_1$ and $T_2$ therewith, and ring $A_2$ may be condensed with a 5-membered ring in Formulae 1C and 1D, while sharing $T_3$ and $T_4$ therewith, rings $A_{21}$, $A_{22}$, and $A_{23}$ may each be condensed with a 7-membered ring in Formulae 2A and 2B, while sharing $T_{11}$ and $T_{12}$ therewith, $X_1$ may be selected from O, S, and N-$[(L_1)_{a1}$-$(R_1)_{b1}]$, $X_2$ may be N or C-$(L_2)_{a2}$-$(R_2)_{b2}$, $X_3$ may be N or C-$(L_3)_{a3}$-$(R_3)_{b3}$, $X_4$ may be N or C-$(L_4)_{a4}$-$(R_4)_{b4}$, and $X_5$ may be N or C-$(L_5)_{a5}$-$(R_5)_{c5}$, $X_{21}$ may be selected from O, S, Se, C$(R_{23})(R_{24})$, Si$(R_{23})(R_{24})$, and N-$[(L_{21})_{a21}$-$(R_{21})_{b21}]$, $L_1$ to $L_5$, $L_{11}$, $L_{12}$, $L_{21}$, and $L_{22}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a5, a11, a12, a21, and a22 may each independently be an integer selected from 0 to 5, $R_1$ to $R_5$, $R_{11}$, $R_{12}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —N$(Q_1)(Q_2)$, —B$(Q_1)(Q_2)$, —C(═O)$(Q_1)$, —S(═O)$_2(Q_1)$, and —P(═O)$(Q_1)(Q_2)$, b1 to b5, b11, b12, b21, and b22 may each independently be an integer selected from 0 to 4, $R_4$ and $R_5$ may be optionally connected to each other to form a saturated or unsaturated ring, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{11})(Q_{12})(Q_{13})$, —N$(Q_{11})(Q_{12})$, —B$(Q_{11})(Q_{12})$, —C(═O)$(Q_{11})$, —S(═O)$_2(Q_{11})$, and —P(═O)$(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and —Si$(Q_{31})(Q_{32})(Q_{33})$, —N$(Q_{31})(Q_{32})$, —B$(Q_{31})(Q_{32})$, —C(═O)$(Q_{31})$, —S(═O)$_2(Q_{31})$, and —P(═O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
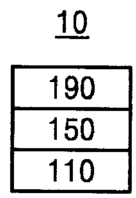
FIG. 1 is a schematic view of organic light-emitting device according to an embodiment.

In the following detailed description, only certain embodiments of the present disclosure are shown and described, by way of illustration. As those skilled in the art would recognize, the present disclosure may be embodied in many different forms and should not be construed as being limited to the embodiments set forth herein.

An organic light-emitting device according to an embodiment may include a first electrode, a second electrode facing the first electrode, an emission layer between the first electrode and the second electrode, a hole transport region between the first electrode and the emission layer, and an electron transport region between the emission layer and the second electrode, wherein the electron transport region may include a first compound and at least one selected from the hole transport region and the electron transport region may include a second compound.

The first compound may be represented by one selected from Formulae 1A to 1D, and the second compound may be represented by Formula 2A or 2B:

Formula 1A

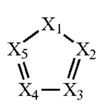

Formula 1B

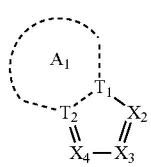

Formula 1C

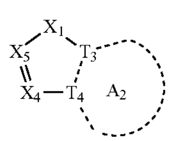

Formula 1D

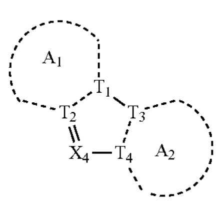

-continued

Formula 2A

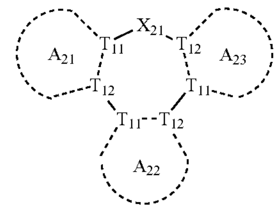

Formula 2B

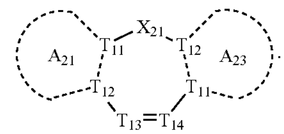

In Formulae 1B to 1D, ring $A_1$ may be a $C_5$-$C_{60}$ carbocyclic group or a $C_1$-$C_{30}$ heterocyclic group, each substituted with at least one *-[$(L_{11})_{a11}$-$(R_{11})_{b11}$], and ring $A_2$ may be a $C_5$-$C_{60}$ carbocyclic group or a $C_1$-$C_{30}$ heterocyclic group, each substituted with at least one *-[$(L_{12})_{a12}$-$(R_{12})_{b12}$]. Descriptions of $L_{11}$, $L_{12}$, a11, a12, $R_{11}$, $R_{12}$, b11, and b12 are the same as described below.

$T_1$ to $T_4$ may each independently be carbon or nitrogen; a bond between $T_1$ and $T_2$ may be a single bond; a bond between $T_3$ and $T_4$ may be a double bond; ring $A_1$ may be condensed (e.g., fused) with a 5-membered ring in Formulae 1B and 1D, while sharing $T_1$ and $T_2$ therewith; and ring $A_2$ may be condensed (e.g., fused) with a 5-membered ring in Formulae 1C and 1D, while sharing $T_3$ and $T_4$ therewith.

For example, ring $A_1$ in Formulae 1B to 1D may be selected from a cyclopentadiene group, a dihydropyridine group, a dihydropyrazine group, a dihydroquinoline group, a dihydroisoquinoline group, a benzotetrahydropyran group, a benzotetrahydrothiopyran group, a tetrahydronaphthalene group, an imidazolodihydroquinoline group, an imidazolodihydronaphthalene group, a pyrrolodihydronaphthalene group, and a dihydrophenanthrene group, each substituted with at least one *-[$(L_{11})_{a11}$-$(R_{11})_{m1}$], ring $A_2$ may be selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a cyclopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a pyrrolonaphthalene group, a cyclopentanaphthalene group, a silolonaphthalene group, a selenophenonaphthalene group, a furonaphthalene group, a thienonaphthalene group, a pyrroloquinoline group, a cyclopentaquinoline group, a siloloquinoline group, a selenophenoquinoline group, a furoquinoline group, a thienoquinoline group, a pyrroloisoquinoline group, a cyclopentaisoquinoline group, a siloloisoquinoline group, a selenophenoisoquinoline group, a furoisoquinoline group, a thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and an indolonaphthalene group, each substituted with at least one *-[$(L_{12})_{a12}$-$(R_{12})_{b12}$].

In various embodiments, ring $A_1$ in Formulae 1B to 1D may be selected from groups represented by Formulae 1-1 to 1-8, each substituted with at least one *-[$(L_{11})_{a11}$-$(R_{11})_{b11}$], and ring $A_2$ may be selected from groups represented by Formulae 1-9 to 1-21, each substituted with at least one *-[$(L_{12})_{a12}$-$(R_{12})_{b12}$]:

Formula 1-1

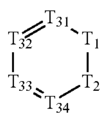

Formula 1-2

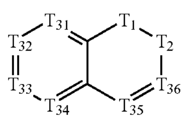

Formula 1-3

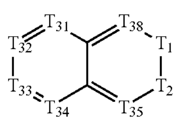

Formula 1-4

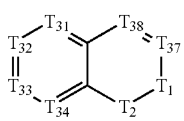

Formula 1-5

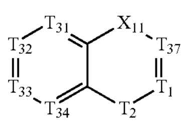

Formula 1-6

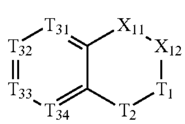

Formula 1-7

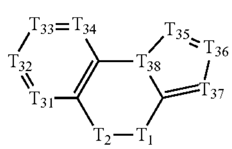

Formula 1-8

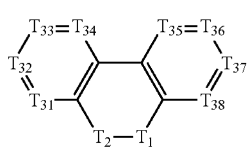

Formula 1-9

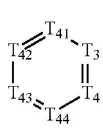

-continued

Formula 1-10

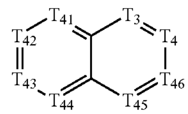

Formula 1-11

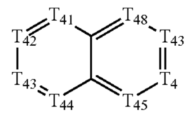

Formula 1-12

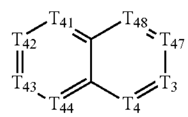

Formula 1-13

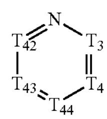

Formula 1-14

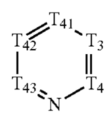

Formula 1-15

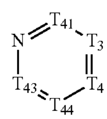

Formula 1-16

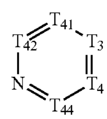

Formula 1-17

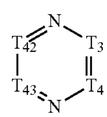

Formula 1-18

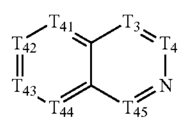

Formula 1-19

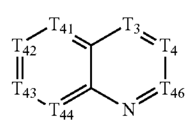

Formula 1-20

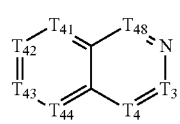

Formula 1-21

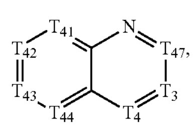

wherein, in Formulae 1-1 to 1-21, descriptions of $T_1$ to $T_4$ are the same as described herein, $X_{11}$ and $X_{12}$ may each independently be O or S, or may each independently be a moiety including C, and $T_{31}$ to $T_{38}$ and $T_{41}$ to $T_{48}$ may each independently be N or C, or may each independently be a moiety including C.

For example, in Formulae 1-1 to 1-21, $X_{11}$ may be O, S, or $C(R_{13})(R_{14})$, $X_{12}$ may be O, S, or $C(R_{15})(R_{16})$, $T_{31}$ to $T_{38}$ may each independently be N, C, or C-$[(L_{11})_{a11}$-$(R_{11})_{b11}]$ and $T_{41}$ to $T_{48}$ may each independently be N or C-$[(L_{12})_{a11}$-$(R_{12})_{b12}]$. $R_{13}$ to $R_{16}$ may each independently be selected from groups represented by *-$[(L_{11})_{a11}$-$(R_{11})_{b11}]$ as described herein.

In various embodiments, in Formulae 1B to 1D, ring $A_1$ may be selected from groups represented by Formulae 1-31 to 1-41, and ring $A_2$ may be selected from groups represented by Formulae 1-51 to 1-64:

Formula 1-31

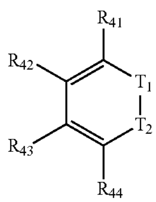

Formula 1-32

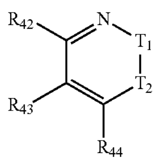

Formula 1-33

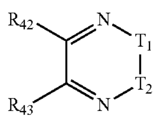

Formula 1-34

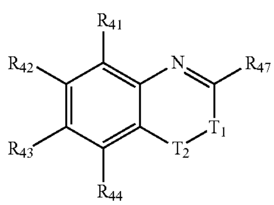

Formuula 1-35

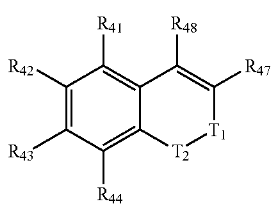

Formula 1-36

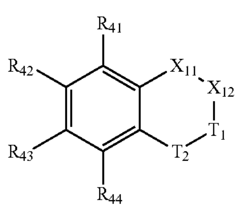

Formula 1-37

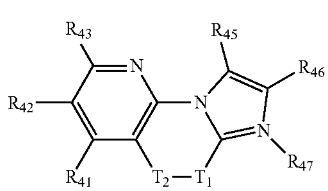

-continued

Formula 1-38

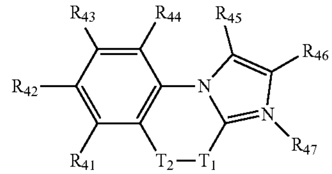

Formula 1-39

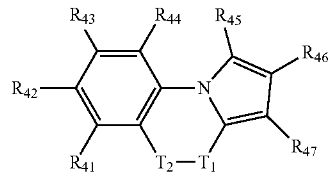

Formula 1-40

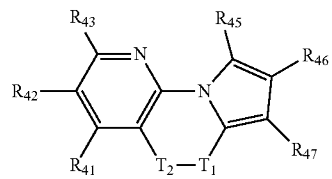

Formula 1-41

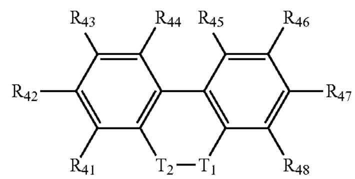

Formula 1-51

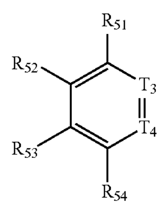

Formula 1-52

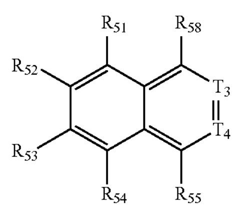

Formula 1-53

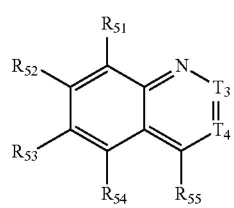

Formula 1-54

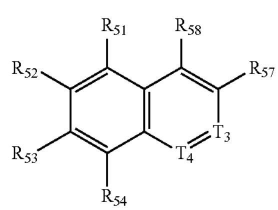

-continued

Formula 1-55

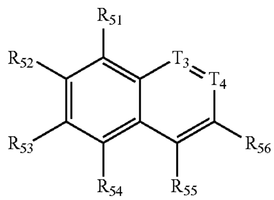

Formula 1-56

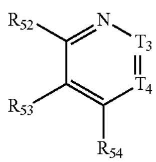

Formula 1-57

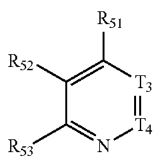

Formula 1-58

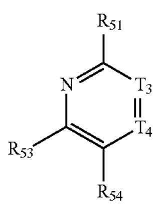

Formula 1-59

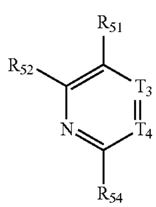

Formula 1-60

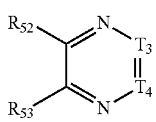

Formula 1-61

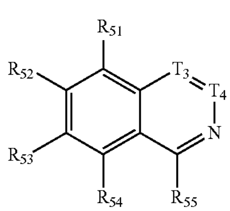

Formula 1-62

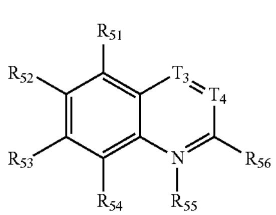

-continued

Formula 1-63

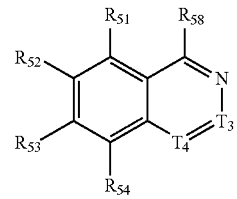

Formula 1-64

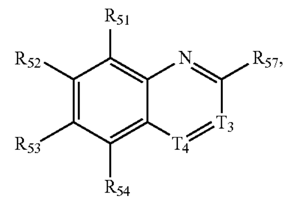

wherein, in Formulae 1-31 to 1-41 and 1-51 to 1-64, descriptions of $T_1$ to $T_4$ are the same as described herein, $X_{11}$ may be O, S, or $C(R_{13})(R_{14})$, $X_{12}$ may be O, S, or $C(R_{15})(R_{16})$, and $R_{41}$ to $R_{48}$ may each independently be selected from substituents represented by $*\text{-}[(L_{11})_{a11}\text{-}(R_{11})_{b11}]$ as described herein, and $R_{51}$ to $R_{58}$ may each independently be selected from substituents represented by $*\text{-}[(L_{12})_{a12}\text{-}(R_{12})_{b12}]$ as described herein. $R_{13}$ to $R_{16}$ may each independently be selected from groups represented by $*\text{-}[(L_{11})_{a11}\text{-}(R_{11})_{b11}]$ as described herein.

Rings $A_{21}$, $A_{22}$, and $A_{23}$ in Formulae 2A and 2B may each independently be a $C_5$-$C_{60}$ carbocyclic group or a $C_1$-$C_{60}$ heterocyclic group, each substituted with at least one $*\text{-}[(L_{22})_{a22}\text{-}(R_{22})_{b22}]$. $L_{22}$, a22, $R_{22}$, and b22 are the same as described below.

$T_{11}$ and $T_{12}$ in Formulae 2A and 2B may each independently be carbon or nitrogen; two or more selected from three $T_{11}$(s) in Formula 2A may be identical to or different from each other; $T_{13}$ may be N or $C(R_{27})$; $T_{14}$ may be N or $C(R_{28})$; two or more selected from three $T_{12}$(s) in Formula 2A may be identical to or different from each other; two $T_{11}$(s) in Formula 2B may be identical to or different from each other; two $T_{12}$ (s) in Formula 2B may be identical to or different from each other; a bond between $T_{11}$ and $T_{12}$ may be a single bond or a double bond; a case where three $T_{11}$(s) and three $T_{12}$(s) in Formula 2A are all nitrogen may be excluded; a case where two $T_{11}$(s), two $T_{12}$(s), $T_{13}$, and $T_{14}$ in Formula 2B are all nitrogen may be excluded; and rings $A_{21}$, $A_{22}$, and $A_{23}$ may each be condensed (e.g., fused) with a 7-membered ring in Formulae 2A and 2B, while sharing $T_{11}$ and $T_{12}$ therewith.

$*\text{-}[(L_{22})_{a22}\text{-}(R_{22})_{b22}]$ substituent in ring $A_{21}$, $*\text{-}[(L_{22})_{a22}\text{-}(R_{22})_{b22}]$ substituent in ring $A_{22}$, and $*\text{-}[(L_{22})_{a22}\text{-}(R_{22})_{b22}]$ substituent in ring $A_{23}$ may be identical to or different from one another.

In addition, when the number of $*\text{-}[(L_{22})_{a22\text{-}}(R_{22})_{b22}]$ substituents in ring $A_{21}$ is two or more, two or more $*\text{-}[(L_{22})_{a22}\text{-}(R_{22})_{b22}]$(s) may be identical to or different from each other; when the number of $*\text{-}[(L_{22})_{a22}\text{-}(R_{22})_{b22}]$ substituents in ring $A_{22}$ is two or more, two or more $*\text{-}[(L_{22})_{a22}\text{-}(R_{22})_{b22}1]$(s) may be identical to or different from each other; and when the number of $*\text{-}[(L_{22})_{a22}\text{-}(R_{22})_{b22}]$ substituents in ring $A_{23}$ is two or more, two or more $*\text{-}[(L_{22})_{a22}\text{-}(R_{22})_{b22}]$(s) may be identical to or different from each other.

In various embodiments, rings $A_{21}$, $A_{22}$, and $A_{23}$ in Formulae 2A and 2B may each independently be selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a pyrrolonaphthalene group, a cyclopentanaphthalene group, a silolonaphthalene group, a selenophenonaphthalene group, a furonaphthalene group, a thienonaphthalene group, a pyrroloquinoline group, a cyclopentaquinoline group, a siloloquinoline group, a selenophenoquinoline group, a furoquinoline group, a thienoquinoline group, a pyrroloisoquinoline group, a cyclopentaisoquinoline group, a siloloisoquinoline group, a selenopheno isoquinoline group, a furoisoquinoline group, a thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and an indolonaphthalene group, each substituted with at least one $*-[(L_{22})_{a22}-(R_{22})_{b22}]$.

In various embodiments, in the second compound represented by Formulae 2A and 2B, a case where rings $A_{21}$, $A_{22}$, and $A_{23}$ are all a benzene group substituted with at least one $*-[(L_{22})_{a22}-(R_{22})_{b22}]$ may be excluded.

In various embodiments, rings $A_{21}$, $A_{22}$, and $A_{23}$ in Formulae 2A and 2B may each independently be selected from groups represented by Formulae 2-1 to 2-36, each substituted with at least one $*-[(L_{22})_{a22}-(R_{22})_{b22}]$:

Formula 2-1

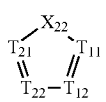

Formula 2-2

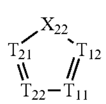

Formula 2-3

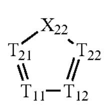

Formula 2-4

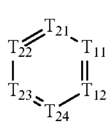

-continued

Formula 2-5

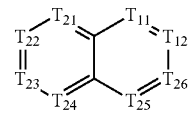

Formula 2-6

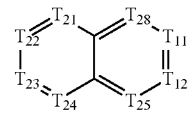

Formula 2-7

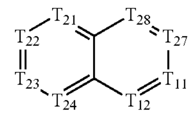

Formula 2-8

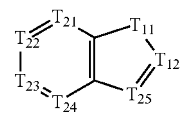

Formula 2-9

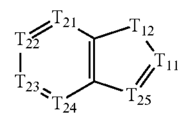

Formula 2-10

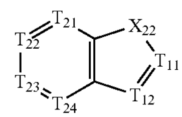

Formula 2-11

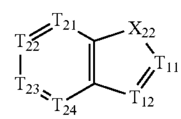

Formula 2-12

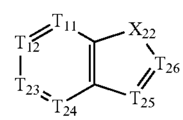

Formula 2-13

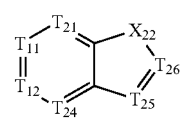

Formula 2-14

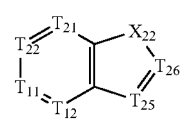

Formula 2-15

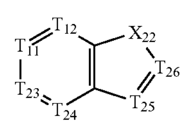

Formula 2-16

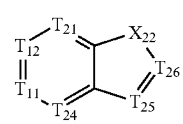

Formula 2-17

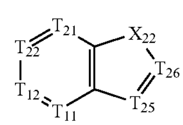

-continued
Formula 2-18
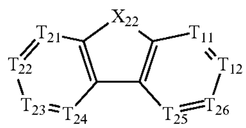
Formula 2-19
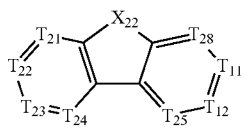
Formula 2-20
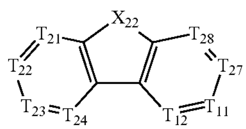
Formula 2-21
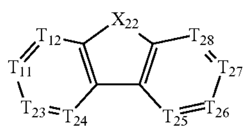
Formula 2-22
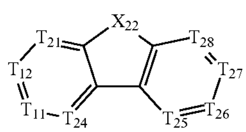
Formula 2-23
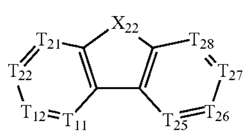
Formula 2-24
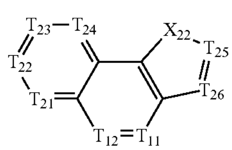
Formula 2-25
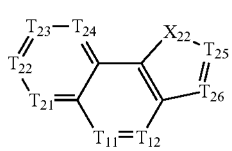
Formula 2-26
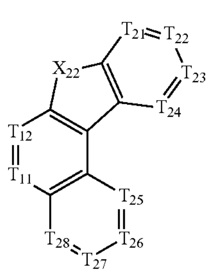
Formula 2-27
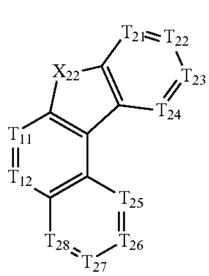
-continued
Formula 2-28
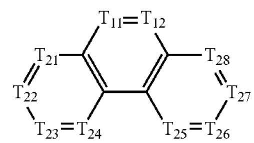
Formula 2-29
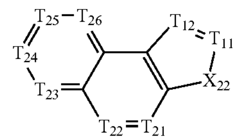
Formula 2-30
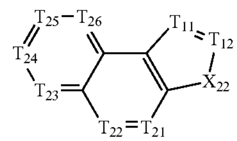
Formula 2-31
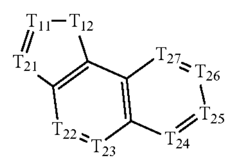
Formula 2-32
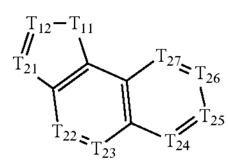
Formula 2-33
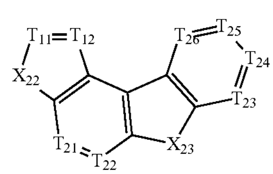
Formula 2-34
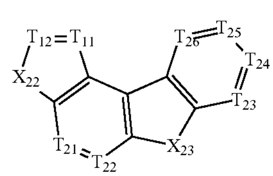
Formula 2-35
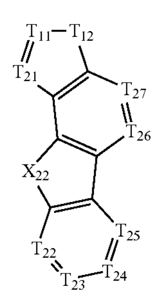

-continued

Formula 2-36

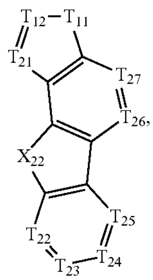

wherein, in Formulae 2-1 to 2-36, descriptions of $T_{11}$ and $T_{12}$ are the same as described herein, $X_{22}$ and $X_{23}$ may each independently be O, S, or Se, or may each independently be a moiety including C, N, or Si, and $T_{21}$ to $T_{28}$ may each independently be N, or may each independently be a moiety including C.

For example, in Formulae 2-1 to 2-36, $X_{22}$ and $X_{23}$ may each independently be O, S, Se, $C(R_{25})(R_{26})$, $N\text{-}[(L_{22})_{a22}\text{-}(R_{22})_{b22}]$, or $Si(R_{25})(R_{26})$; and $T_{21}$ to $T_{28}$ may each independently be N or $C\text{-}[(L_{22})_{a22}\text{-}(R_{22})_{b22}]$. $R_{25}$, $R_{26}$, and $R_{30}$ may each independently be selected from groups represented by $*\text{-}[(L_{22})_{a22}\text{-}(R_{22})_{b22})]$ as described herein.

In various embodiments, rings $A_{21}$, $A_{22}$, and $A_{23}$ in Formulae 2A and 2B may each independently be selected from groups represented by Formulae 2-101 to 2-229:

Formula 2-101

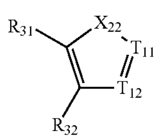

Formula 2-102

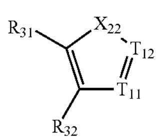

Formula 2-103

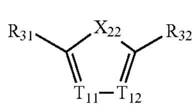

Formula 2-104

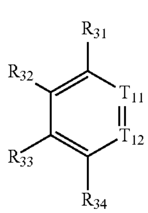

Formula 2-105

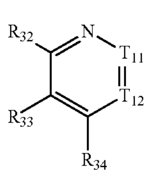

-continued

Formula 2-106

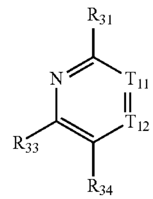

Formula 2-107

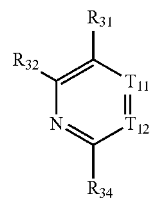

Formula 2-108

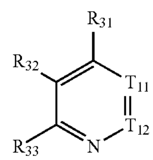

Formula 2-109

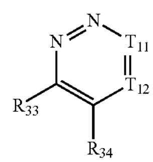

Formula 2-110

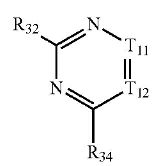

Formula 2-111

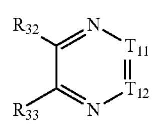

Formula 2-112

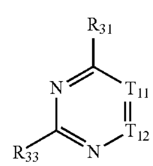

Formula 2-113

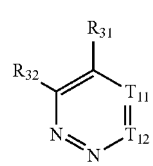

Formula 2-114

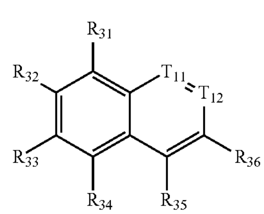

-continued
Formula 2-115
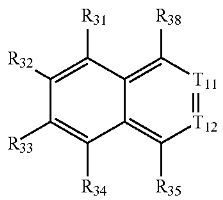
Formula 2-116
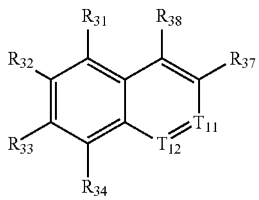
Formula 2-117
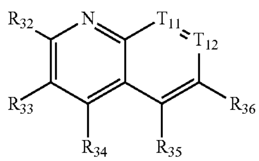
Formula 2-118
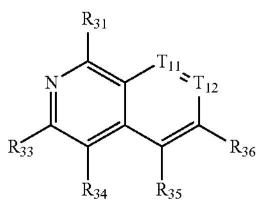
Formula 2-119
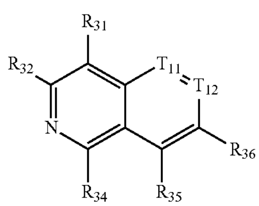
Formula 2-120
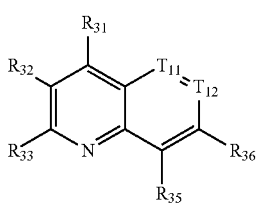
Formula 2-121
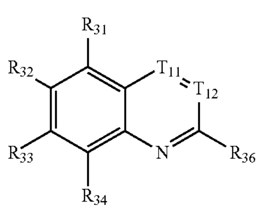
Formula 2-122
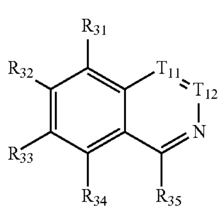
-continued
Formula 2-123
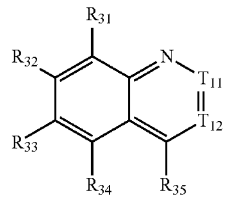
Formula 2-124
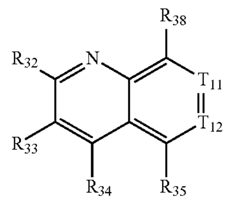
Formula 2-125
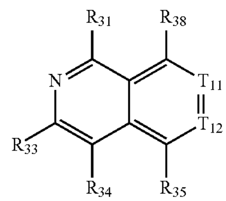
Formula 2-126
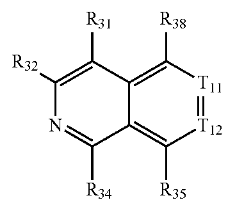
Formula 2-127
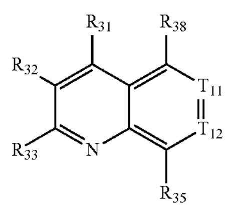
Formula 2-128
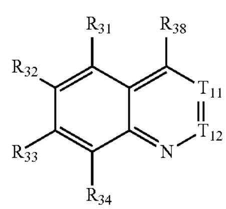
Formula 2-129
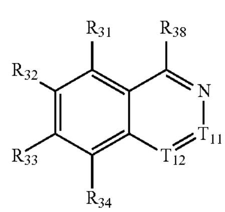

-continued
Formula 2-130
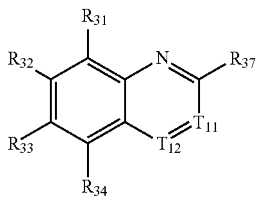
Formula 2-131
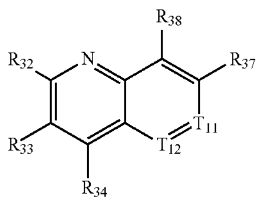
Formula 2-132
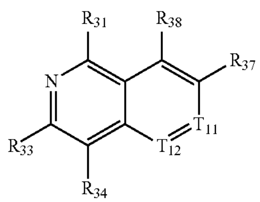
Formula 2-133
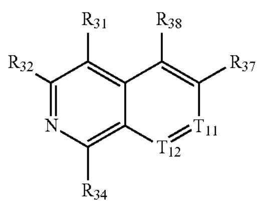
Formula 2-134
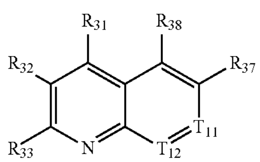
Formula 2-135
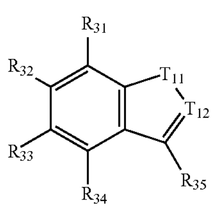
Formula 2-136
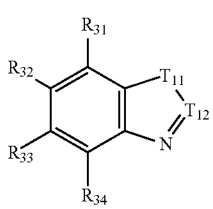
Formula 2-137
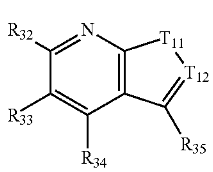
-continued
Formula 2-138
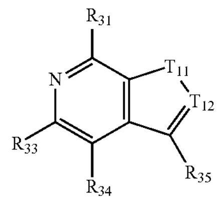
Formula 2-139
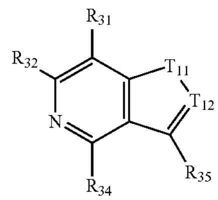
Formula 2-140
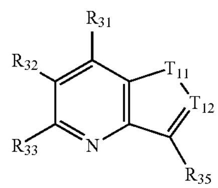
Formula 2-141
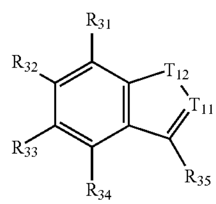
Formula 2-142
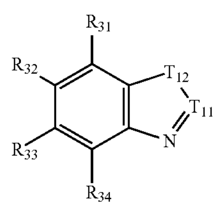
Formula 2-143
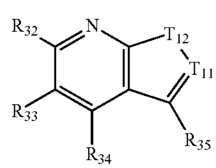
Formula 2-144
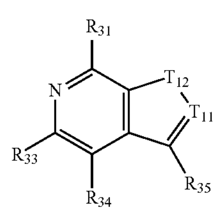
Formula 2-145
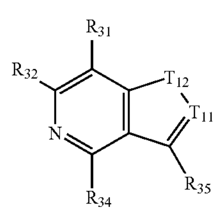

-continued
Formula 2-146
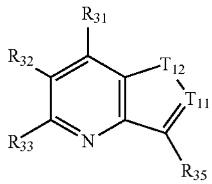
Formula 2-147
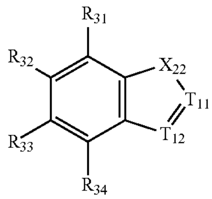
Formula 2-148
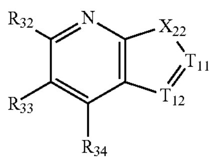
Formula 2-149
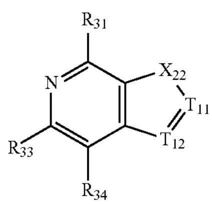
Formula 2-150
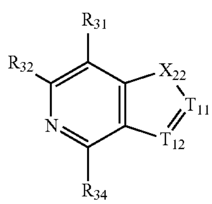
Formula 2-151
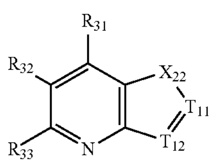
Formula 2-152
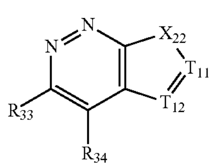
Formula 2-153
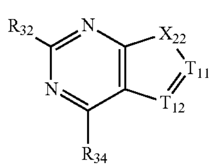
Formula 2-154
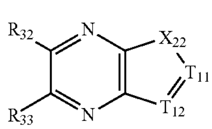
-continued
Formula 2-155
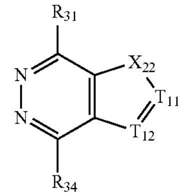
Formula 2-156
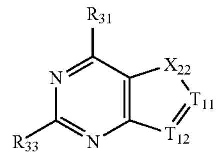
Formula 2-157
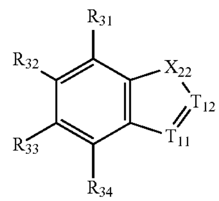
Formula 2-158
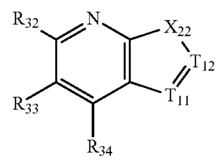
Formula 2-159
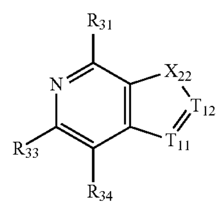
Formula 2-160
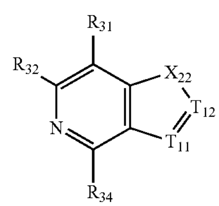
Formula 2-161
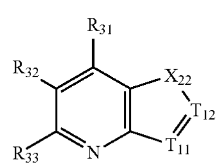
Formula 2-162
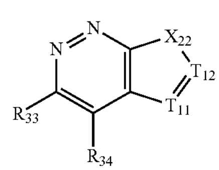

-continued
Formula 2-163
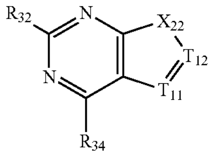
Formula 2-164
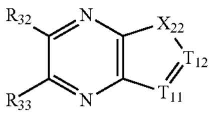
Formula 2-165
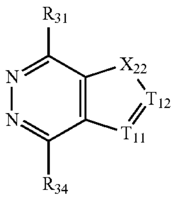
Formula 2-166
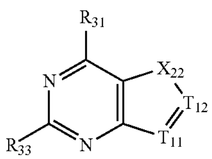
Formula 2-167
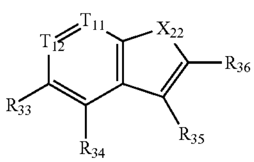
Formula 2-168
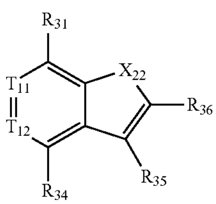
Formula 2-169
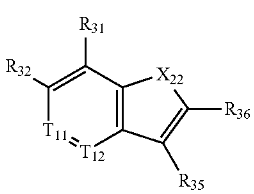
Formula 2-170
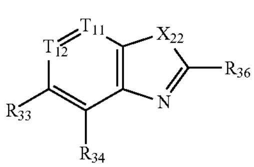
Formula 2-171
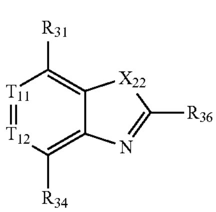
-continued
Formula 2-172
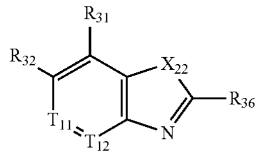
Formula 2-173
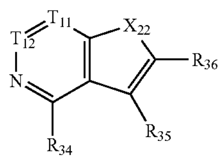
Formula 2-174
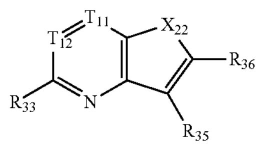
Formula 2-175
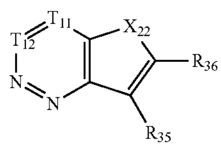
Formula 2-176
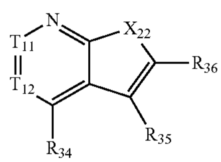
Formula 2-177
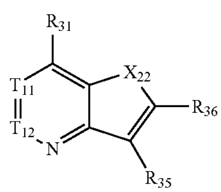
Formula 2-178
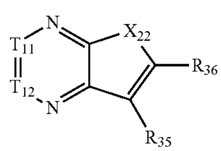
Formula 2-179
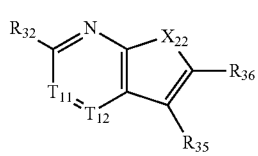
Formula 2-180
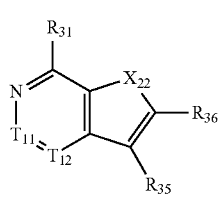

-continued
Formula 2-181
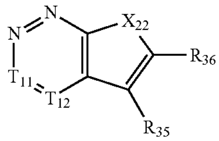
Formula 2-182
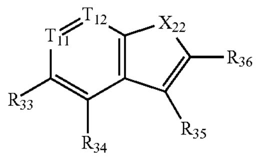
Formula 2-183
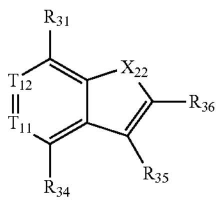
Formula 2-184
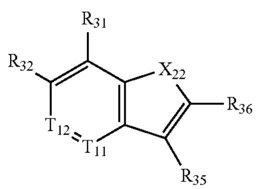
Formula 2-185
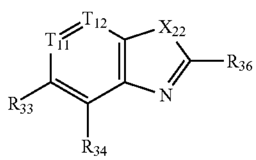
Formula 2-186
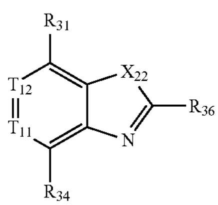
Formula 2-187
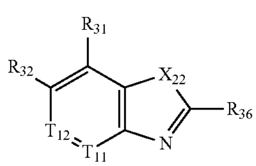
Formula 2-188
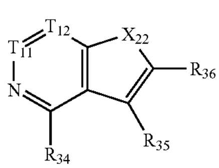
Formula 2-189
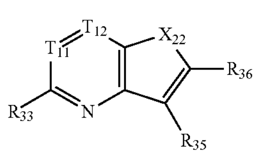
-continued
Formula 2-190
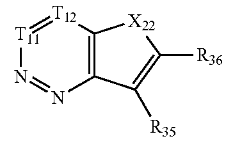
Formula 2-191
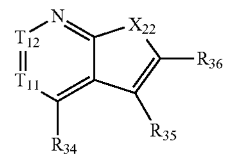
Formula 2-192
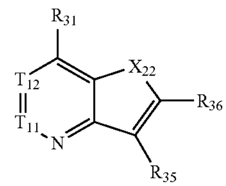
Formula 2-193
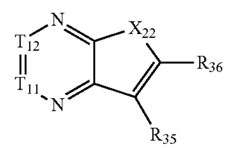
Formula 2-194
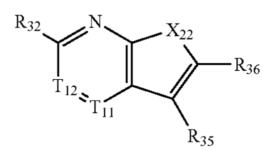
Formula 2-195
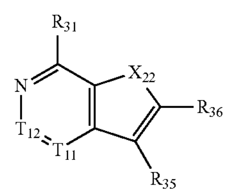
Formula 2-196
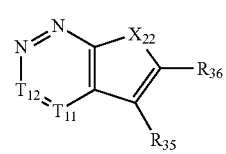
Formula 2-197
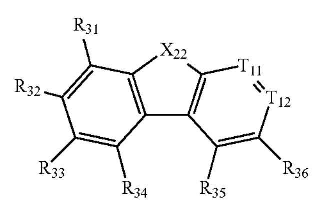
Formula 2-198
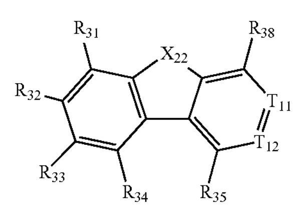

-continued
Formula 2-199
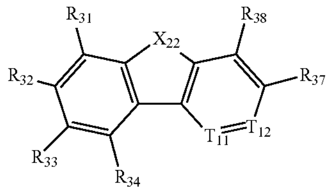
Formula 2-200
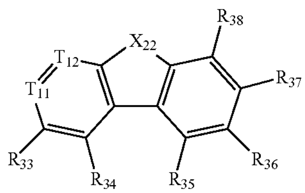
Formula 2-201
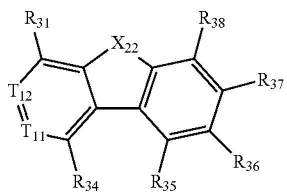
Formula 2-202
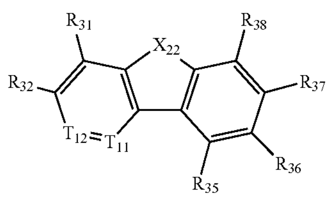
Formula 2-203
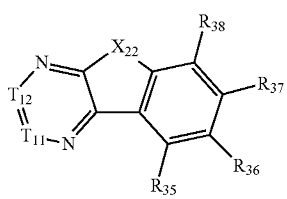
Formula 2-204
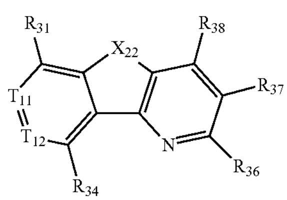
Formula 2-205
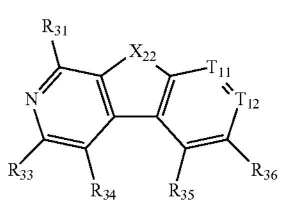
Formula 2-206
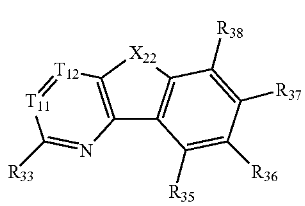
-continued
Formula 2-207
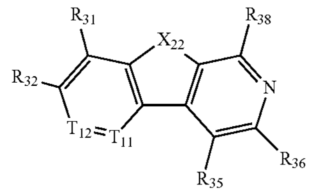
Formula 2-208
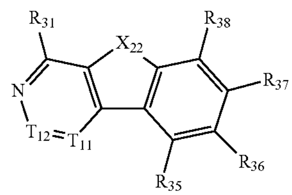
Formula 2-209
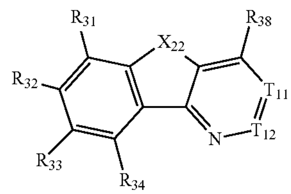
Formula 2-210
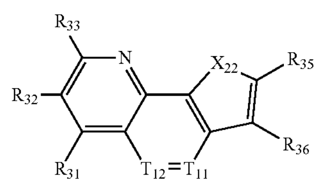
Formula 2-211
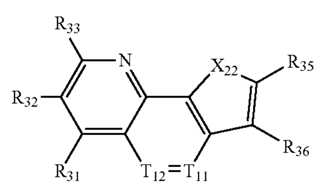
Formula 2-212
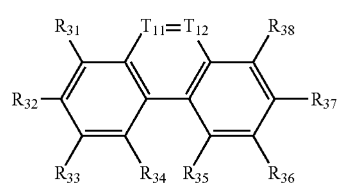
Formula 2-213
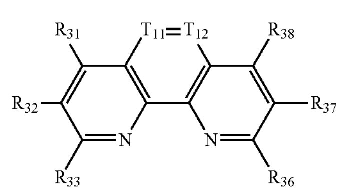

-continued
Formula 2-214
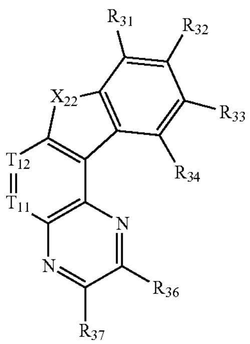
Formula 2-215
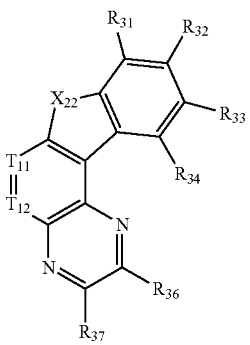
Formula 2-216
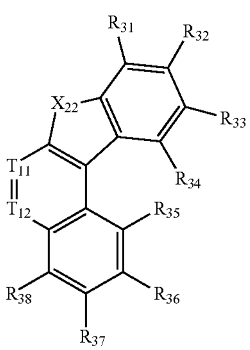
Formula 2-217
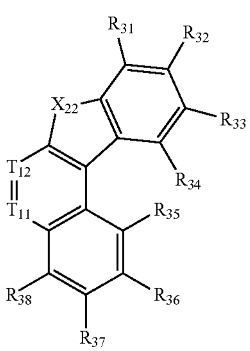
Formula 2-218
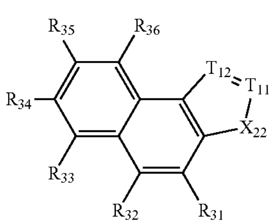
-continued
Formula 2-219
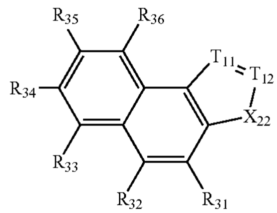
Formula 2-220
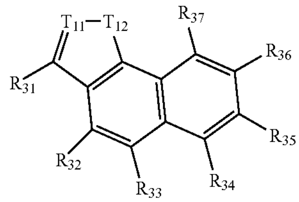
Formula 2-221
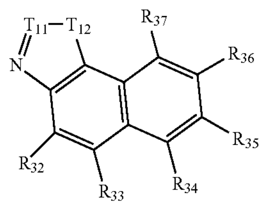
Formula 2-222
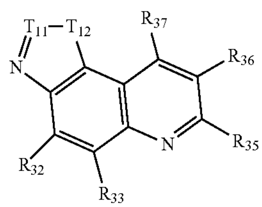
Formula 2-223
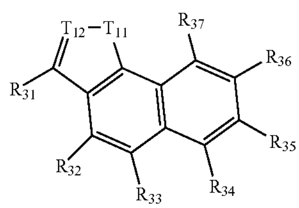
Formula 2-224
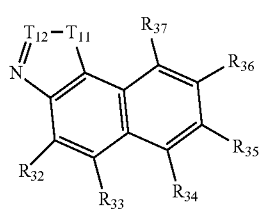
Formula 2-225
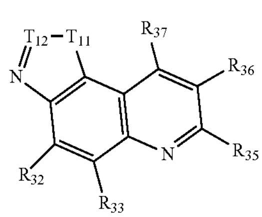

-continued

Formula 2-226

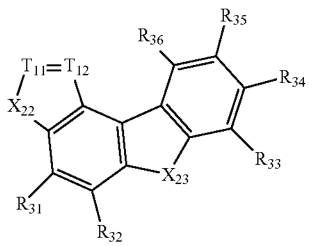

Formula 2-227

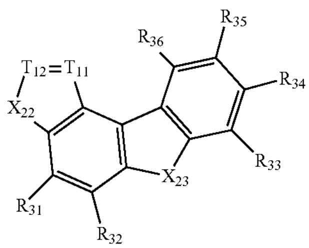

Formula 2-228

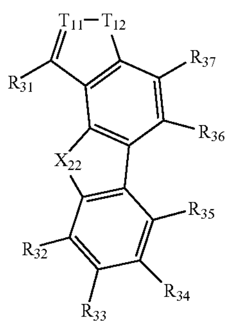

Formula 2-229

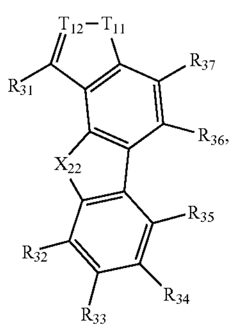

wherein, in Formulae 2-101 to 2-229, descriptions of $T_{11}$ and $T_{12}$ are the same as described herein, $X_{22}$ and $X_{23}$ may each independently be O, S or Se, or may each independently be a moiety including C, N, or Si, and $R_{31}$ to $R_{38}$ may each independently be selected from substituents represented by $*\text{-}[(L_{22})_{a22}\text{-}(R_{22})_{b22}]$ as described herein.

In various embodiments, the second compound may be represented by Formula 2A, wherein rings $A_{21}$, $A_{22}$, and $A_{23}$ may be selected from Formulae 2-1 to 2-36 and arranged as shown in Table 1 (the second compounds respectively corresponding to each arrangement of rings $A_{21}$, $A_{22}$, and $A_{23}$ shown in Table 1 are denoted as Formulae 2-201A to 2-269A).

TABLE 1

| Formula No. | Formula No. of ring $A_{21}$ | Formula No. of ring $A_{22}$ | Formula No. of ring $A_{23}$ |
|---|---|---|---|
| 2-201A | 2-2 | 2-4 | 2-4 |
| 2-202A | 2-4 | 2-4 | 2-1 |
| 2-203A | 2-4 | 2-4 | 2-2 |
| 2-204A | 2-4 | 2-4 | 2-3 |
| 2-205A | 2-4 | 2-1 | 2-4 |
| 2-206A | 2-4 | 2-2 | 2-4 |
| 2-207A | 2-4 | 2-4 | 2-10 |
| 2-208A | 2-11 | 2-4 | 2-4 |
| 2-209A | 2-4 | 2-4 | 2-11 |
| 2-210A | 2-4 | 2-10 | 2-4 |
| 2-211A | 2-4 | 2-4 | 2-8 |
| 2-212A | 2-4 | 2-9 | 2-4 |
| 2-213A | 2-4 | 2-4 | 2-14 |
| 2-214A | 2-17 | 2-4 | 2-4 |
| 2-215A | 2-4 | 2-4 | 2-15 |
| 2-216A | 2-13 | 2-4 | 2-4 |
| 2-217A | 2-4 | 2-4 | 2-16 |
| 2-218A | 2-4 | 2-4 | 2-13 |
| 2-219A | 2-16 | 2-4 | 2-4 |
| 2-220A | 2-4 | 2-4 | 2-12 |
| 2-221A | 2-4 | 2-4 | 2-17 |
| 2-222A | 2-4 | 2-16 | 2-4 |
| 2-223A | 2-4 | 2-15 | 2-4 |
| 2-224A | 2-4 | 2-14 | 2-4 |
| 2-225A | 2-4 | 2-17 | 2-4 |
| 2-226A | 2-19 | 2-4 | 2-4 |
| 2-227A | 2-22 | 2-4 | 2-4 |
| 2-228A | 2-18 | 2-4 | 2-4 |
| 2-229A | 2-23 | 2-4 | 2-4 |
| 2-230A | 2-21 | 2-4 | 2-4 |
| 2-231A | 2-20 | 2-4 | 2-4 |
| 2-232A | 2-4 | 2-23 | 2-4 |
| 2-233A | 2-4 | 2-18 | 2-4 |
| 2-234A | 2-4 | 2-21 | 2-4 |
| 2-235A | 2-4 | 2-19 | 2-4 |
| 2-236A | 2-5 | 2-2 | 2-4 |
| 2-237A | 2-5 | 2-1 | 2-4 |
| 2-238A | 2-2 | 2-2 | 2-4 |
| 2-239A | 2-4 | 2-23 | 2-1 |
| 2-240A | 2-6 | 2-10 | 2-4 |
| 2-241A | 2-4 | 2-4 | 2-29 |
| 2-242A | 2-7 | 2-4 | 2-10 |
| 2-243A | 2-11 | 2-4 | 2-10 |
| 2-244A | 2-4 | 2-10 | 2-6 |
| 2-245A | 2-11 | 2-11 | 2-4 |
| 2-246A | 2-11 | 2-11 | 2-5 |
| 2-247A | 2-11 | 2-11 | 2-10 |
| 2-248A | 2-7 | 2-9 | 2-4 |
| 2-249A | 2-4 | 2-4 | 2-25 |
| 2-250A | 2-11 | 2-15 | 2-4 |
| 2-251A | 2-18 | 2-28 | 2-4 |
| 2-252A | 2-23 | 2-10 | 2-4 |
| 2-253A | 2-4 | 2-27 | 2-4 |
| 2-254A | 2-6 | 2-18 | 2-4 |
| 2-255A | 2-4 | 2-23 | 2-5 |
| 2-256A | 2-23 | 2-4 | 2-14 |
| 2-257A | 2-17 | 2-4 | 2-14 |
| 2-258A | 2-14 | 2-4 | 2-12 |
| 2-259A | 2-17 | 2-4 | 2-12 |
| 2-260A | 2-14 | 2-16 | 2-2 |
| 2-261A | 2-17 | 2-5 | 2-14 |
| 2-262A | 2-17 | 2-13 | 2-17 |
| 2-263A | 2-17 | 2-14 | 2-12 |
| 2-264A | 2-17 | 2-12 | 2-12 |
| 2-265A | 2-5 | 2-1 | 2-18 |
| 2-266A | 2-4 | 2-29 | 2-4 |
| 2-267A | 2-4 | 2-31 | 2-4 |
| 2-268A | 2-4 | 2-33 | 2-4 |
| 2-269A | 2-4 | 2-35 | 2-4 |

In various embodiments, the second compound may be represented by Formula 2B, wherein rings $A_{21}$ and $A_{23}$ may be selected from Formulae 2-1 to 2-36 and arranged as shown in Table 2 (the second compounds respectively corresponding to each arrangement of rings $A_{21}$ and $A_{23}$ shown in Table 2 are denoted as Formulae 2-201B to 2-215B).

TABLE 2

| Formula No. | Formula No. or ring $A_{21}$ | Formula No. of ring $A_{22}$ | Formula No. of ring $A_{23}$ |
|---|---|---|---|
| 2-201B | 2-4 | — | 2-19 |
| 2-202B | 2-4 | — | 2-22 |
| 2-203B | 2-4 | — | 2-18 |
| 2-204B | 2-4 | — | 2-23 |
| 2-205B | 2-4 | — | 2-21 |
| 2-206B | 2-4 | — | 2-20 |
| 2-207B | 2-5 | — | 2-23 |
| 2-208B | 2-7 | — | 2-23 |
| 2-209B | 2-4 | — | 2-26 |
| 2-210B | 2-7 | — | 2-22 |
| 2-211B | 2-13 | — | 2-16 |
| 2-212B | 2-5 | — | 2-19 |
| 2-213B | 2-7 | — | 2-20 |
| 2-214B | 2-19 | — | 2-18 |
| 2-215B | 2-18 | — | 2-18 |

In various embodiments, the second compound may be represented by Formula 2A, wherein rings $A_{21}$, $A_{22}$, and $A_{23}$ may be selected from Formulae 2-101 to 2-229 and arranged as shown in Table 3 (the second compounds respectively corresponding to each arrangement of rings $A_{21}$, $A_{22}$, and $A_{23}$ shown in Table 3 are denoted as Formulae 2-301A to 2-432A).

TABLE 3

| Formula No. | Formula No. of ring $A_{21}$ | Formula No. of ring $A_{22}$ | Formula No. of ring $A_{23}$ |
|---|---|---|---|
| 2-301A | 2-104 | 2-147 | 2-104 |
| 2-302A | 2-102 | 2-104 | 2-104 |
| 2-303A | 2-104 | 2-104 | 2-101 |
| 2-304A | 2-104 | 2-104 | 2-102 |
| 2-305A | 2-104 | 2-104 | 2-103 |
| 2-306A | 2-104 | 2-101 | 2-104 |
| 2-307A | 2-104 | 2-102 | 2-104 |
| 2-308A | 2-104 | 2-104 | 2-147 |
| 2-309A | 2-157 | 2-104 | 2-104 |
| 2-310A | 2-104 | 2-104 | 2-157 |
| 2-311A | 2-104 | 2-147 | 2-107 |
| 2-312A | 2-104 | 2-149 | 2-104 |
| 2-313A | 2-104 | 2-156 | 2-104 |
| 2-314A | 2-107 | 2-147 | 2-106 |
| 2-315A | 2-104 | 2-151 | 2-104 |
| 2-316A | 2-104 | 2-147 | 2-106 |
| 2-317A | 2-104 | 2-148 | 2-104 |
| 2-318A | 2-104 | 2-150 | 2-104 |
| 2-319A | 2-106 | 2-147 | 2-104 |
| 2-320A | 2-104 | 2-106 | 2-147 |
| 2-321A | 2-157 | 2-107 | 2-104 |
| 2-322A | 2-106 | 2-104 | 2-147 |
| 2-323A | 2-104 | 2-107 | 2-147 |
| 2-324A | 2-107 | 2-104 | 2-147 |
| 2-325A | 2-104 | 2-104 | 2-160 |
| 2-326A | 2-104 | 2-111 | 2-157 |
| 2-327A | 2-108 | 2-104 | 2-158 |
| 2-328A | 2-111 | 2-104 | 2-157 |
| 2-329A | 2-107 | 2-147 | 2-104 |
| 2-330A | 2-104 | 2-104 | 2-135 |
| 2-331A | 2-104 | 2-141 | 2-104 |
| 2-332A | 2-104 | 2-142 | 2-104 |
| 2-333A | 2-107 | 2-104 | 2-135 |
| 2-334A | 2-104 | 2-111 | 2-135 |
| 2-335A | 2-104 | 2-143 | 2-104 |
| 2-336A | 2-106 | 2-142 | 2-104 |
| 2-337A | 2-107 | 2-142 | 2-106 |
| 2-338A | 2-104 | 2-104 | 2-169 |
| 2-339A | 2-184 | 2-104 | 2-104 |
| 2-340A | 2-104 | 2-104 | 2-182 |

TABLE 3-continued

| Formula No. | Formula No. of ring $A_{21}$ | Formula No. of ring $A_{22}$ | Formula No. of ring $A_{23}$ |
|---|---|---|---|
| 2-341A | 2-168 | 2-104 | 2-104 |
| 2-342A | 2-104 | 2-104 | 2-183 |
| 2-343A | 2-104 | 2-104 | 2-168 |
| 2-344A | 2-183 | 2-104 | 2-104 |
| 2-345A | 2-104 | 2-104 | 2-167 |
| 2-346A | 2-104 | 2-104 | 2-184 |
| 2-347A | 2-104 | 2-183 | 2-104 |
| 2-348A | 2-104 | 2-182 | 2-104 |
| 2-349A | 2-104 | 2-169 | 2-104 |
| 2-350A | 2-104 | 2-184 | 2-104 |
| 2-351A | 2-107 | 2-104 | 2-179 |
| 2-352A | 2-111 | 2-104 | 2-169 |
| 2-353A | 2-104 | 2-111 | 2-182 |
| 2-354A | 2-106 | 2-104 | 2-185 |
| 2-355A | 2-171 | 2-104 | 2-104 |
| 2-356A | 2-104 | 2-104 | 2-115 |
| 2-357A | 2-104 | 2-104 | 2-178 |
| 2-358A | 2-104 | 2-106 | 2-167 |
| 2-359A | 2-108 | 2-105 | 2-167 |
| 2-360A | 2-105 | 2-104 | 2-167 |
| 2-361A | 2-112 | 2-104 | 2-184 |
| 2-362A | 2-104 | 2-192 | 2-104 |
| 2-363A | 2-107 | 2-182 | 2-106 |
| 2-364A | 2-104 | 2-169 | 2-105 |
| 2-365A | 2-105 | 2-184 | 2-104 |
| 2-366A | 2-105 | 2-169 | 2-105 |
| 2-367A | 2-198 | 2-104 | 2-104 |
| 2-368A | 2-201 | 2-104 | 2-104 |
| 2-369A | 2-197 | 2-104 | 2-104 |
| 2-370A | 2-202 | 2-104 | 2-104 |
| 2-371A | 2-200 | 2-104 | 2-104 |
| 2-372A | 2-199 | 2-104 | 2-104 |
| 2-373A | 2-104 | 2-202 | 2-104 |
| 2-374A | 2-104 | 2-197 | 2-104 |
| 2-375A | 2-104 | 2-200 | 2-104 |
| 2-376A | 2-104 | 2-198 | 2-104 |
| 2-377A | 2-209 | 2-104 | 2-104 |
| 2-378A | 2-207 | 2-104 | 2-104 |
| 2-379A | 2-200 | 2-106 | 2-104 |
| 2-380A | 2-104 | 2-208 | 2-104 |
| 2-381A | 2-105 | 2-198 | 2-108 |
| 2-382A | 2-202 | 2-102 | 2-104 |
| 2-383A | 2-202 | 2-101 | 2-106 |
| 2-384A | 2-102 | 2-102 | 2-107 |
| 2-385A | 2-104 | 2-202 | 2-101 |
| 2-386A | 2-123 | 2-147 | 2-104 |
| 2-387A | 2-104 | 2-104 | 2-218 |
| 2-388A | 2-116 | 2-104 | 2-147 |
| 2-389A | 2-157 | 2-104 | 2-147 |
| 2-390A | 2-107 | 2-147 | 2-115 |
| 2-391A | 2-157 | 2-157 | 2-104 |
| 2-392A | 2-157 | 2-157 | 2-114 |
| 2-393A | 2-157 | 2-157 | 2-147 |
| 2-394A | 2-116 | 2-147 | 2-104 |
| 2-395A | 2-104 | 2-104 | 2-210 |
| 2-396A | 2-157 | 2-182 | 2-104 |
| 2-397A | 2-197 | 2-213 | 2-104 |
| 2-398A | 2-202 | 2-167 | 2-104 |
| 2-399A | 2-104 | 2-216 | 2-104 |
| 2-400A | 2-124 | 2-197 | 2-104 |
| 2-401A | 2-104 | 2-202 | 2-114 |
| 2-402A | 2-168 | 2-104 | 2-169 |
| 2-403A | 2-184 | 2-104 | 2-169 |
| 2-404A | 2-169 | 2-104 | 2-167 |
| 2-405A | 2-184 | 2-106 | 2-167 |
| 2-406A | 2-169 | 2-183 | 2-102 |
| 2-407A | 2-184 | 2-114 | 2-169 |
| 2-408A | 2-184 | 2-168 | 2-184 |
| 2-409A | 2-184 | 2-104 | 2-167 |
| 2-410A | 2-184 | 2-167 | 2-167 |
| 2-411A | 2-114 | 2-101 | 2-197 |
| 2-412A | 2-104 | 2-149 | 2-104 |
| 2-413A | 2-106 | 2-104 | 2-147 |
| 2-414A | 2-104 | 2-104 | 2-168 |
| 2-415A | 2-200 | 2-106 | 2-104 |
| 2-416A | 2-104 | 2-104 | 2-183 |
| 2-417A | 2-104 | 2-104 | 2-101 |

TABLE 3-continued

| Formula No. | Formula No. of ring $A_{21}$ | Formula No. of ring $A_{22}$ | Formula No. of ring $A_{23}$ |
|---|---|---|---|
| 2-418A | 2-105 | 2-169 | 2-105 |
| 2-419A | 2-104 | 2-147 | 2-107 |
| 2-420A | 2-104 | 2-218 | 2-104 |
| 2-421A | 2-104 | 2-226 | 2-104 |
| 2-422A | 2-104 | 2-222 | 2-104 |
| 2-423A | 2-104 | 2-228 | 2-104 |
| 2-424A | 2-104 | 2-151 | 2-104 |
| 2-425A | 2-106 | 2-147 | 2-107 |
| 2-426A | 2-104 | 2-147 | 2-106 |
| 2-427A | 2-107 | 2-150 | 2-104 |
| 2-428A | 2-104 | 2-143 | 2-104 |
| 2-429A | 2-107 | 2-142 | 2-106 |
| 2-430A | 2-104 | 2-142 | 2-104 |
| 2-431A | 2-104 | 2-104 | 2-104 |

In various embodiments, the second compound may be represented by Formula 2B, wherein rings $A_{21}$ and $A_{23}$ may be selected from Formulae 2-101 to 2-229 and arranged as shown in Table 4 (the second compounds respectively corresponding to each arrangement of rings $A_{21}$ and $A_{23}$ shown in Table 4 are denoted as Formulae 2-301B to 2-320B).

TABLE 4

| Formula No. | Formula No. or ring $A_{21}$ | Formula No. of ring $A_{22}$ | Formula No. of ring $A_{23}$ |
|---|---|---|---|
| 2-301B | 2-104 | — | 2-198 |
| 2-302B | 2-104 | — | 2-201 |
| 2-303B | 2-104 | — | 2-197 |
| 2-304B | 2-104 | — | 2-202 |
| 2-305B | 2-104 | — | 2-200 |
| 2-306B | 2-104 | — | 2-199 |
| 2-307B | 2-104 | — | 2-203 |
| 2-308B | 2-104 | — | 2-204 |
| 2-309B | 2-106 | — | 2-205 |
| 2-310B | 2-104 | — | 2-206 |
| 2-311B | 2-112 | — | 2-199 |
| 2-312B | 2-114 | — | 2-202 |
| 2-313B | 2-116 | — | 2-202 |
| 2-314B | 2-104 | — | 2-214 |
| 2-315B | 2-130 | — | 2-201 |
| 2-316B | 2-168 | — | 2-183 |
| 2-317B | 2-114 | — | 2-198 |
| 2-318B | 2-116 | — | 2-199 |
| 2-319B | 2-198 | — | 2-197 |
| 2-320B | 2-197 | — | 2-197 |

In Formulae 1A to 1D, $X_1$ may be selected from O, S, and N-$[(L_1)_{a1}$-$(R_1)_{b1}]$, $X_2$ may be N or C-$(L_2)_{a2}$-$(R_2)_{b1}$, $X_3$ may be N or C-$(L_3)_{a3}$-$(R_3)_{b3}$, $X_4$ may be N or C-$(L_4)_{a4}$-$(R_4)_{b4}$, and $X_5$ may be N or C-$(L_5)_{a5}$-$(R_5)_{c5}$.

For example, i) in Formula 1A, $X_1$ may be O, S, or N-$[(L_1)_{a1}$-$(R_1)_{b1}]$, $X_2$ may be C-$(L_2)_{a2}$-$(R_2)_{b2}$, $X_3$ may be N, $X_4$ may be C-$(L_4)$-$(R_4)_{b4}$, and $X_5$ may be N, $X_1$ may be O, S, or N-$[(L_1)_{a1}$-$(R_1)_{b1}]$, $X_2$ may be N, $X_3$ may be C-$(L_3)_{a3}$-$(R_3)_{b3}$, $X_4$ may be C-$(L_4)_{a4}$-$(R_4)_{b4}$, and $X_5$ may be N, $X_1$ may be N-$[(L_1)_{a1}$-$(R_1)_{b1}]$, $X_2$ may be C-$(L_2)_{a2}$-$(R_2)_{b2}$, $X_3$ may be C-$(L_3)_{a3}$-$(R_3)_{b3}$, $X_4$ may be N, and $X_5$ may be N, $X_1$ may be N-$[(L_1)_{a1}$-$(R_1)_{b1}]$, $X_2$ may be N, $X_3$ may be C-$(L_3)_{a3}$-$(R_3)_{b3}$, $X_4$ may be N, and $X_5$ may be C-$(L_5)_{a5}$-$(R_5)_{b5}$, $X_1$ may be N-$[(L_1)_{a1}$-$(R_1)_{b1}]$, $X_2$ may be C-$(L_2)_{a2}$-$(R_2)_{b2}$, $X_3$ may be C-$(L_3)_{a3}$-$(R_3)_{b3}$, $X_4$ may be C-$(L_4)_{a4}$-$(R_4)_{b4}$, and $X_5$ may be C-$(L_5)_{a5}$-$(R_5)_{b5}$, or $X_1$ may be N-$[(L_1)_{a1}$-$(R_1)_{b1}]$, $X_2$ may be C-$(L_2)_{a2}$-$(R_2)_{b2}$, $X_3$ may be N, $X_4$ may be C-$(L_4)_{a4}$-$(R_4)_{b4}$, and $X_5$ may be C-$(L_5)_{a5}$-$(R_5)_{b5}$, ii) in Formula 1B, $T_1$ may be N, $T_2$ may be C, $X_2$ may be C-$(L_2)_{a2}$-$(R_2)_{b2}$, $X_3$ may be C-$(L_3)_{a3}$-$(R_3)_{b3}$, and $X_4$ may be N; or $T_1$ may be N, $T_2$ may be C, $X_2$ may be C-$(L_2)_{a2}$-$(R_2)_{b2}$, $X_3$ may be N, and $X_4$ may be N, iii) in the Formula 1C, $X_1$ may be O, S, or N-$[(L_1)_{a1}$-$(R_1)_{b1}]$, $T_3$ and $T_4$ may be C, $X_4$ may be N, and $X_5$ may be C-$(L_5)_{a5}$-$(R_5)_{c5}$, or iv) in Formula 1D, $T_1$ may be N, $T_2$ may be C, $T_3$ and $T_4$ may be C, $X_4$ may be N or C-$(L_4)_{a4}$-$(R_4)_{b4}$.

$X_{21}$ in Formulae 2A and 2B may be selected from O, S, Se, $C(R_{23})(R_{24})$, $Si(R_{23})(R_{24})$, and N-$[(L_{21})_{a21}$-$(R_{21})_{b21}]$.

In various embodiments, $X_{21}$ in Formulae 2A and 2B may be N$[(L_{21})_{a21}$-$(R_{21})_{b21}]$.

In various embodiments, $X_{21}$ in Formulae 2A and 2B may be O, S, Se, $C(R_{23})(R_{24})$, or $Si(R_{23})(R_{24})$, and at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-1 to 2-3, 2-10 to 2-27, and 2-33 to 2-36, and $X_{22}$ or $X_{23}$ in Formulae 2-1 to 2-3, 2-10 to 2-27, and 2-33 to 2-36 may be N-$[(L_{22})_{a22}$-$(R_{22})_{b22}]$.

In various embodiments, $X_{21}$ in Formulae 2A and 2B may be O, S, Se, $C(R_{23})(R_{24})$, or $Si(R_{23})(R_{24})$, and at least one selected from rings $A_{21}$, $A_{22}$, and $A_{23}$ in Formula 2A and at least one selected from rings $A_{21}$ and $A_{23}$ in Formula 2B may be selected from groups represented by Formulae 2-101 to 2-103, 2-147 to 2-211, 2-214 to 2-219, and 2-226 to 2-229, and $X_{22}$ or $X_{23}$ in Formulae 2-101 to 2-103, 2-147 to 2-21 1, 2-214 to 2-219, and 2-226 to 2-229 may be N-$[(L_{22})_{a22}$-$(R_{22})_{b22}]$, but embodiments are not limited thereto.

In Formulae 2A and 2B, $X_{21}$ may be O, S, Se, $C(R_{23})(R_{24})$, $Si(R_{23})(R_{24})$, or N-$[(L_{21})_{a21}$-$(R_{21})_{b21}]$, and $X_{22}$ and $X_{23}$ may each independently be O, S, Se, $C(R_{25})(R_{26})$, $Si(R_{25})(R_{26})$, or N-$[(L_{22})_{a22}$-$(R_{22})_{b22}]$. Descriptions of $L_{21}$, $L_{22}$, a21, a22, $R_{21}$ to $R_{26}$, b21, and b22 are the same as described below.

$L_1$ to $L_5$, $L_{11}$, $L_{12}$, $L_{21}$, and $L_{22}$ in Formulae 1A to 1D, 2A, and 2B may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1A to 1D, 2A, and 2B, $L_1$ to $L_5$, $L_{11}$, $L_{12}$, $L_{21}$, and $L_{22}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group, but embodiments are not limited thereto.

In various embodiments, $L_1$ to $L_5$, $L_{11}$, $L_{12}$, $L_{21}$, and $L_{22}$ in Formulae 1A to 1D, 2A, and 2B may each independently be selected from groups represented by Formulae 3-1 to 3-101:

Formula 3-1

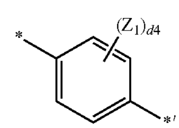

Formula 3-2

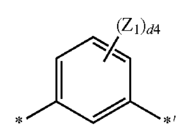

Formula 3-3

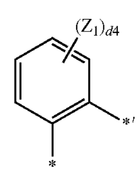

Formula 3-4

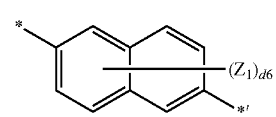

Formula 3-5

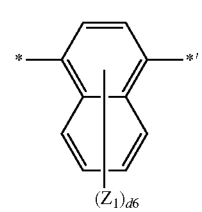

-continued
Formula 3-6
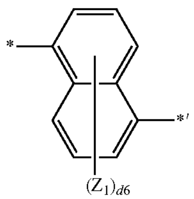
Formula 3-7
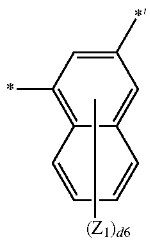
Formula 3-8
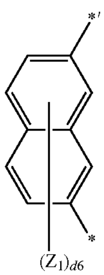
Formula 3-9
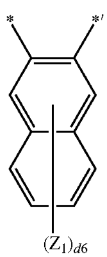
Formula 3-10
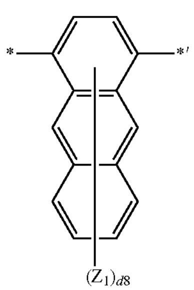
Formula 3-11
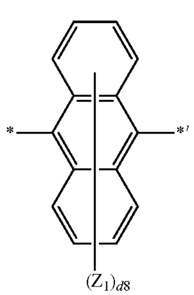
-continued
Formula 3-12
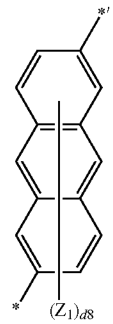
Formula 3-13
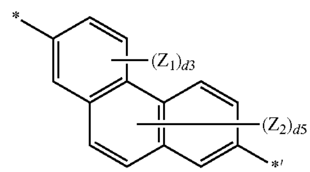
Formula 3-14
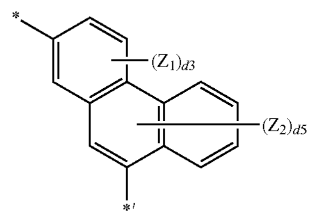
Formula 3-15
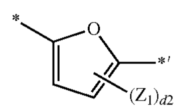
Formula 3-16
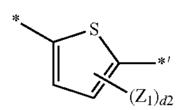
Formula 3-17
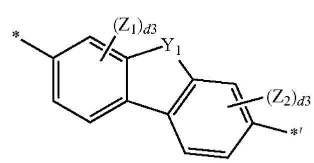
Formula 3-18
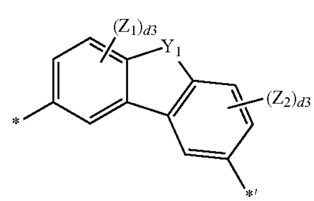
Formula 3-19
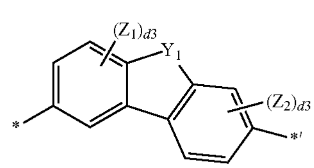

-continued
Formula 3-20
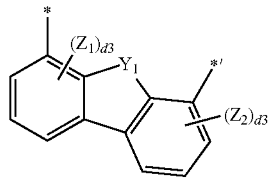
Formula 3-21
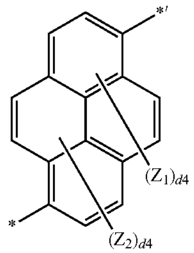
Formula 3-22
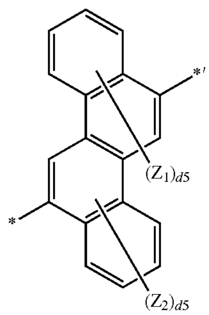
Formula 3-23
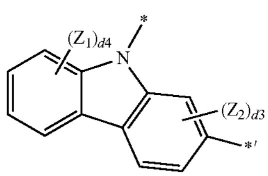
Formula 3-24
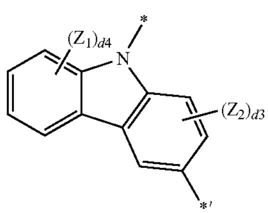
Formula 3-25
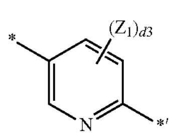
Formula 3-26
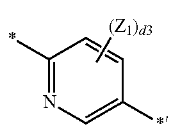
Formula 3-27
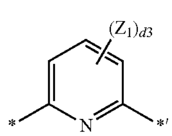
-continued
Formula 3-28
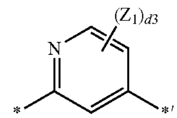
Formula 3-29
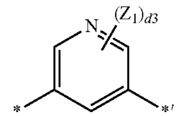
Formula 3-30
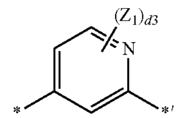
Formula 3-31
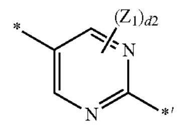
Formula 3-32
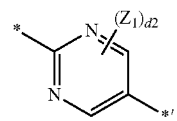
Formula 3-33
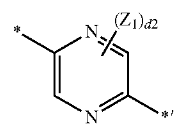
Formula 3-34
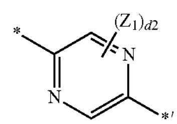
Formula 3-35
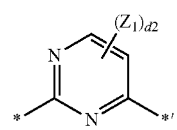
Formula 3-36
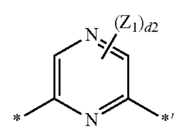
Formula 3-37
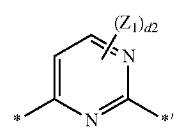
Formula 3-38
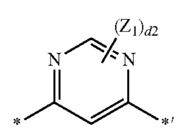
Formula 3-39
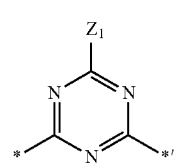

-continued
Formula 3-40
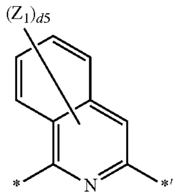
Formula 3-41
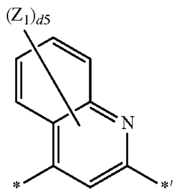
Formula 3-42
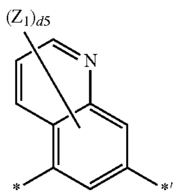
Formula 3-43
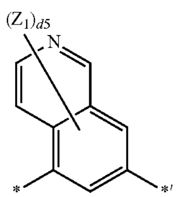
Formula 3-44
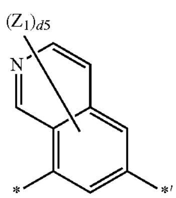
Formula 3-45
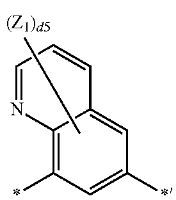
Formula 3-46
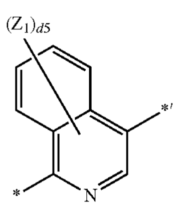
Formula 3-47
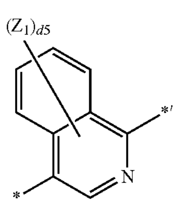
-continued
Formula 3-48
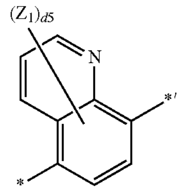
Formula 3-49
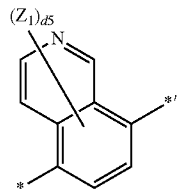
Formula 3-50
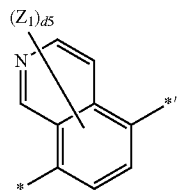
Formula 3-51
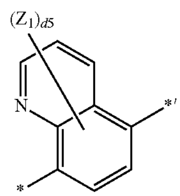
Formula 3-52
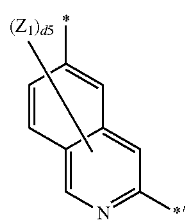
Formula 3-53
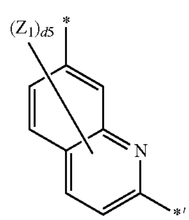
Formula 3-54
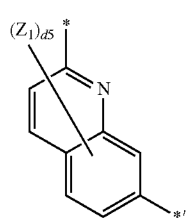

-continued
Formula 3-55
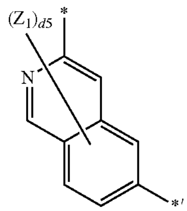
Formula 3-56
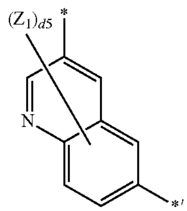
Formula 3-57
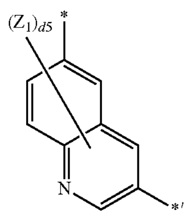
Formula 3-58
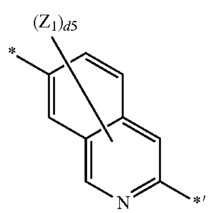
Formula 3-59
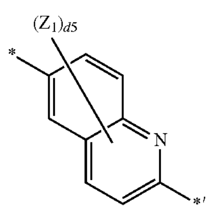
Formula 3-61
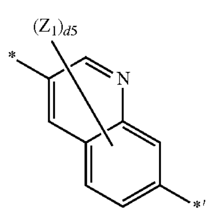
Formula 3-62
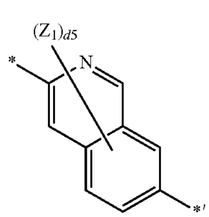
-continued
Formula 3-63
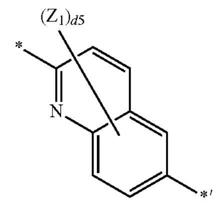
Formula 3-64
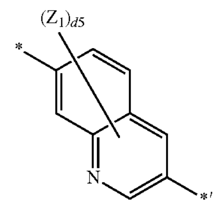
Formula 3-65
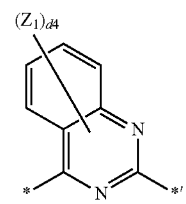
Formula 3-66
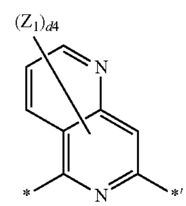
Formula 3-67
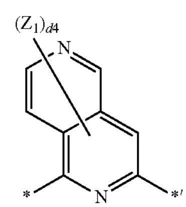
Formula 3-68
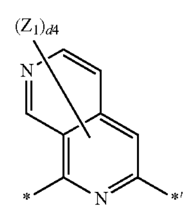
Formula 3-69
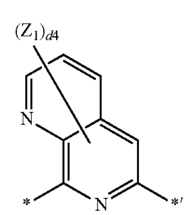

-continued
Formula 3-70
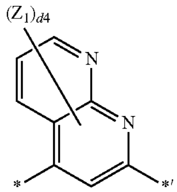
Formula 3-71
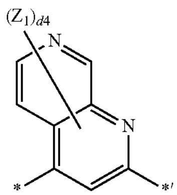
Formula 3-72
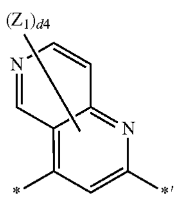
Formula 3-73
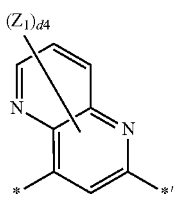
Formula 3-74
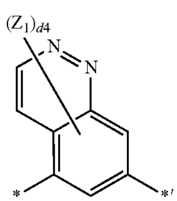
Formula 3-75
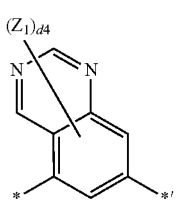
Formula 3-76
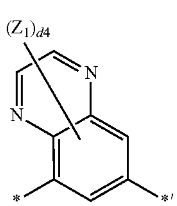
Formula 3-77
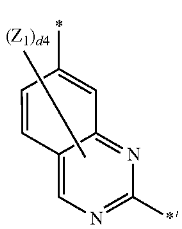
-continued
Formula 3-78
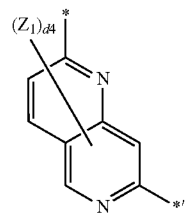
Formula 3-79
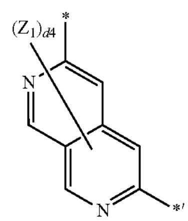
Formula 3-80
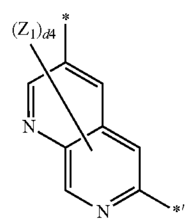
Formula 3-81
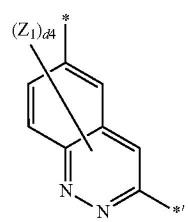
Formula 3-82
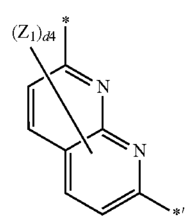
Formula 3-83
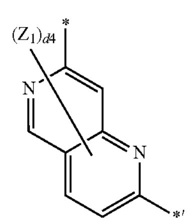
Formula 3-84
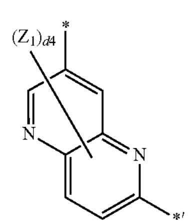

-continued
Formula 3-85
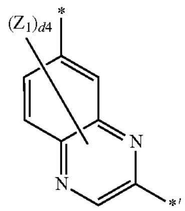
Formula 3-86
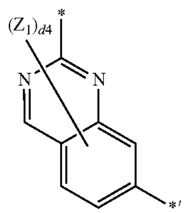
Formula 3-87
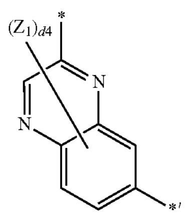
Formula 3-88
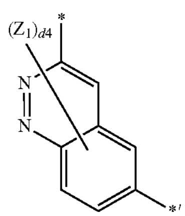
Formula 3-89
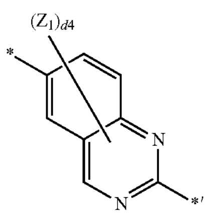
Formula 3-90
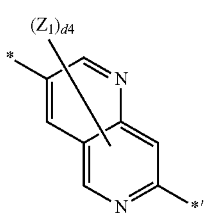
Formula 3-91
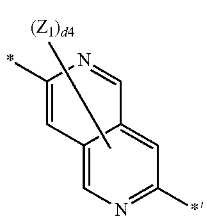
-continued
Formula 3-92
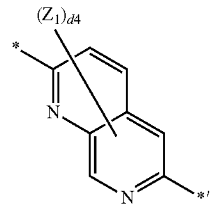
Formula 3-93
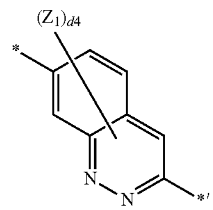
Formula 3-94
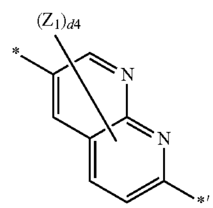
Formula 3-95
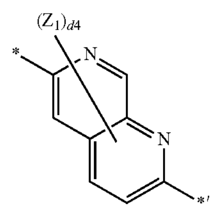
Formula 3-96
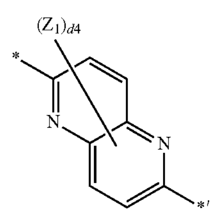
Formula 3-97
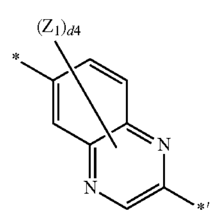
Formula 3-98
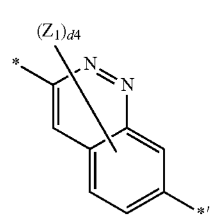

-continued

Formula 3-99

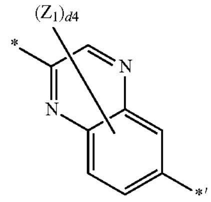

Formula 3-100

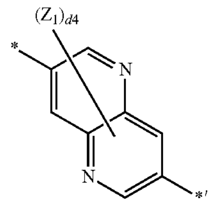

Formula 3-101

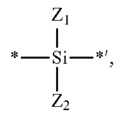

wherein, in Formulae 3-1 to 3-101, $Y_1$ may be O, S, $C(Z_3)(Z_4)$, $N(Z_5)$, or $Si(Z_6)(Z_7)$, $Z_1$ to $Z_7$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, $Z_3$ and $Z_4$ may be optionally connected to each other to form a saturated or unsaturated ring, descriptions of $Q_{31}$ to $Q_{33}$ are the same as described herein, d2 may be an integer selected from 0 to 2, d3 may be an integer selected from 0 to 3, d4 may be an integer selected from 0 to 4, d5 may be an integer selected from 0 to 5, d6 may be an integer selected from 0 to 6, d8 may be an integer selected from 0 to 8, and

* and *' each independently indicate a binding site to a neighboring atom.

a1 in Formulae 1A to 1D, 2A, and 2B indicates the number of $L_1$(s) and may be an integer selected from 0 to 5. When a1 is zero, *-$(L_1)_{a1}$-*' may be a single bond, and when a1 is two or more, two or more $L_1$(s) may be identical to or different from each other. Descriptions of a2 to a5, a11, a12, a21, and a22 may each independently be understood by referring to the description presented in connection with a1 and the corresponding structures of Formulae 1A to 1D, 2A, and 2B.

For example, a1 to a5, a11, a12, a21, and a22 may each independently be 0, 1, 2, or 3.

$R_1$ to $R_5$, $R_{11}$, $R_{12}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, wherein $Q_1$ to $Q_3$ are defined below.

For example, $R_1$ to $R_5$, $R_{11}$, and $R_{12}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, and a hydrazono group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothiopheno pyrimidyl group, a pyrimidinoquinoxalinyl group, and an azaindenopyridinyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothiophenopyrimidyl group, a pyrimidinoquinoxalinyl group, and an azaindenopyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$ and $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

Descriptions of $Q_1$ to $Q_3$ and $Q_{31}$ to $Q_{33}$ may be the same as described herein.

In various embodiments, $R_{21}$ to $R_{24}$, $R_{27}$, and $R_{28}$ may each independently be selected from the group consisting of:

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $R_{22}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, —Si($Q_1$)($Q_2$)($Q_3$), —S(═O)$_2$($Q_1$), and —P(═O)($Q_1$)($Q_2$), wherein descriptions of $Q_1$ to $Q_3$ and $Q_{31}$ to $Q_{33}$ are the same as described herein.

In various embodiments, $R_{21}$, $R_{23}$, $R_{24}$, $R_{27}$, and $R_{28}$ in Formulae 2A and 2B may each independently be selected from groups represented by Formulae 5-1 to 5-49 and 6-1 to 6-124, and $R_1$ to $R_5$, $R_{11}$, $R_{12}$, and $R_{22}$ in Formulae 1A to 1D, 2A, and 2B may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 5-1 to 5-49 and 6-1 to 6-124, —Si($Q_1$)($Q_2$)($Q_3$), —S(═O)$_2$($Q_1$), and —P(═O)($Q_1$)($Q_2$), but embodiments are not limited thereto:

Formula 5-1

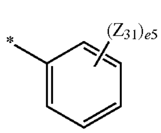

-continued

Formula 5-2

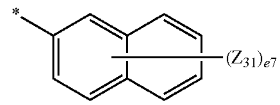

Formula 5-3

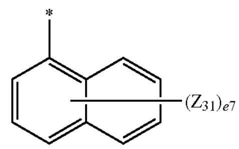

Formula 5-4

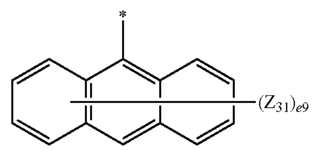

Formula 5-5

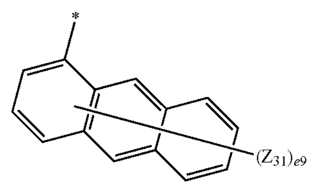

Formula 5-6

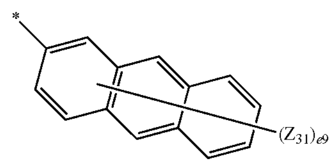

Formula 5-7

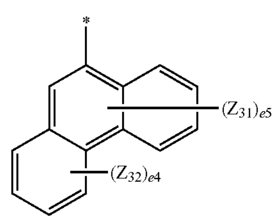

Formula 5-8

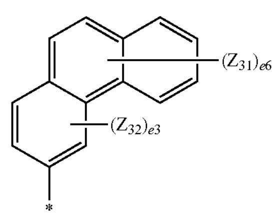

Formula 5-9

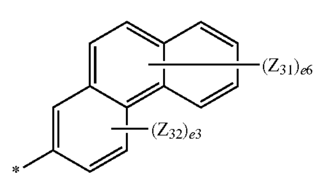

-continued
Formula 5-10
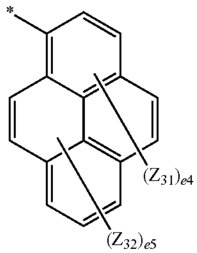
Formula 5-11
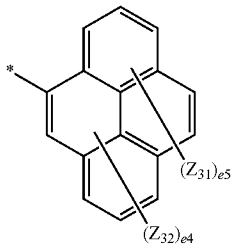
Formula 5-12
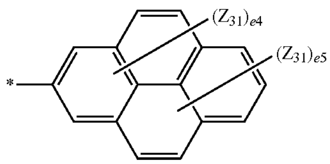
Formula 5-13
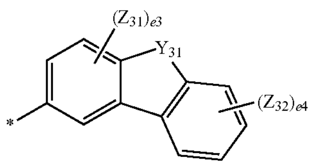
Formula 5-14
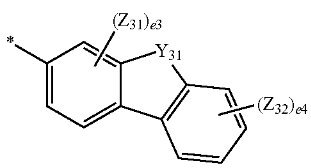
Formula 5-15
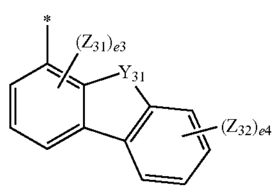
Formula 5-16
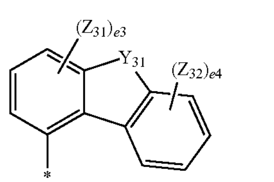
Formula 5-17
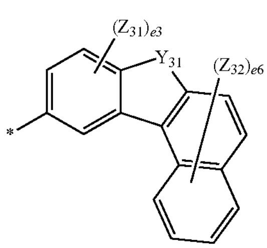
-continued
Formula 5-18
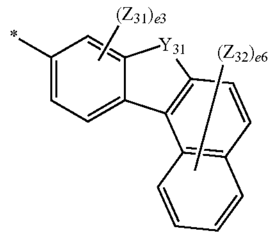
Formula 5-19
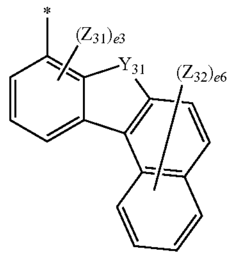
Formula 5-20
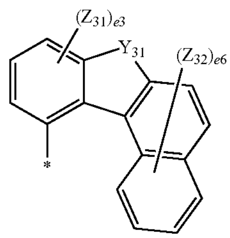
Formula 5-21
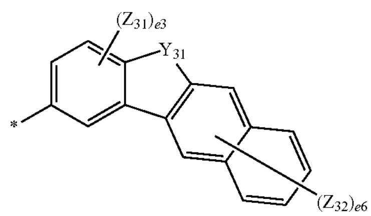
Formula 5-22
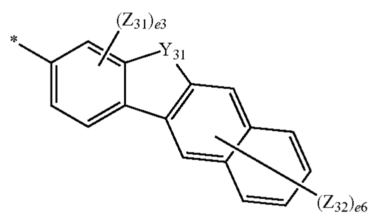
Formula 5-23
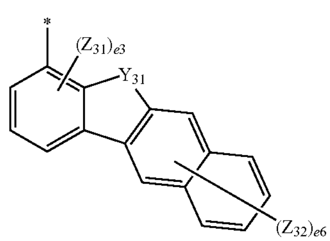
Formula 5-24
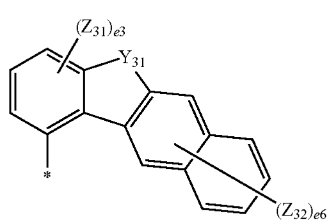

-continued
Formula 5-25
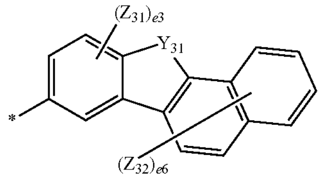
Formula 5-26
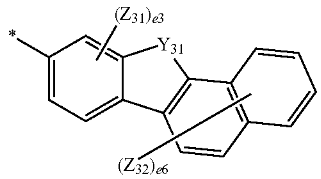
Formula 5-27
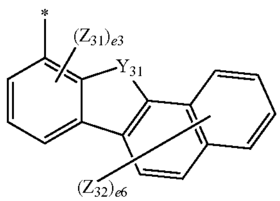
Formula 5-28
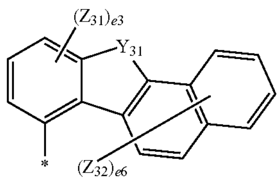
Formula 5-29
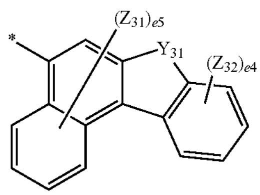
Formula 5-30
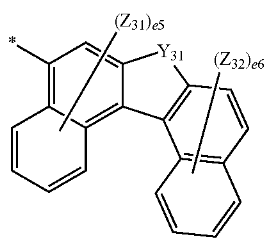
Formula 5-31
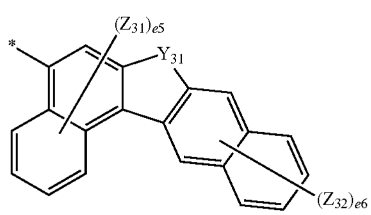
Formula 5-32
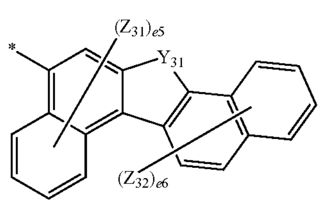
-continued
Formula 5-33
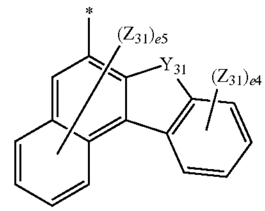
Formula 5-34
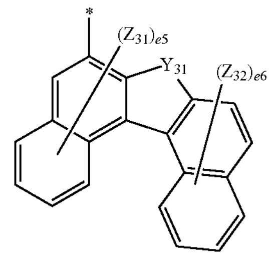
Formula 5-35
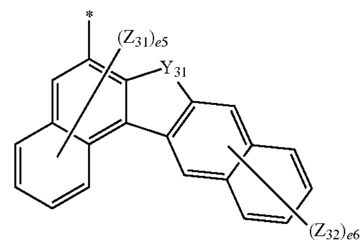
Formula 5-36
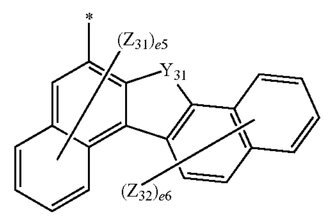
Formula 5-37
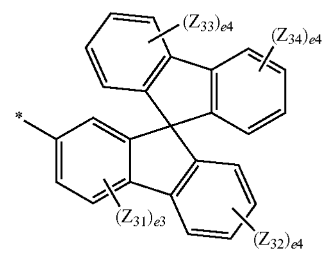
Formula 5-38
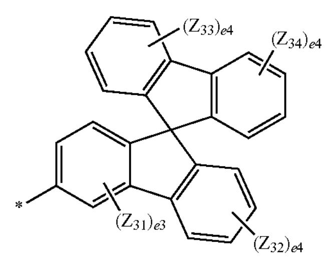

Formula 5-39
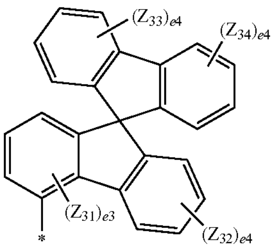
Formula 5-40
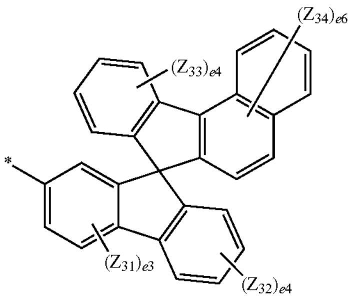
Formula 5-41
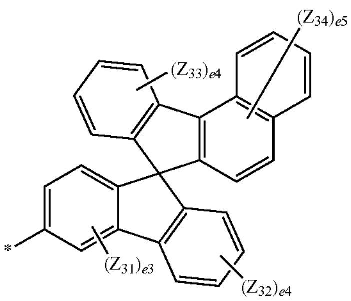
Formula 5-42
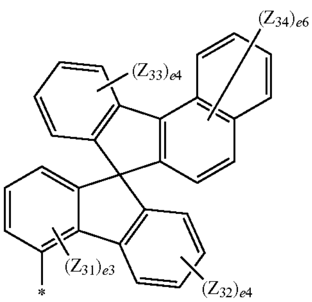
Formula 5-43
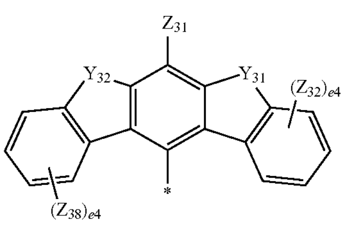
Formula 5-44
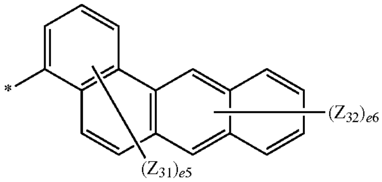
Formula 5-45
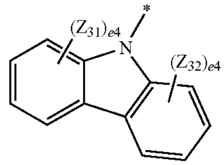
Formula 5-46
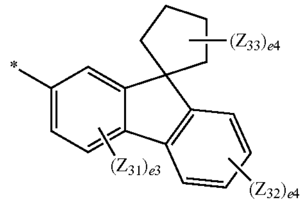
Formula 5-47
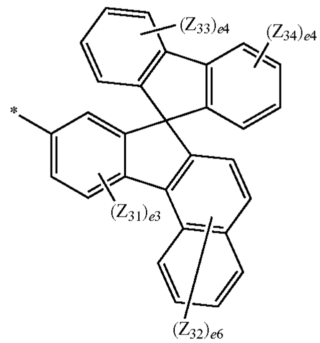
Formula 5-48
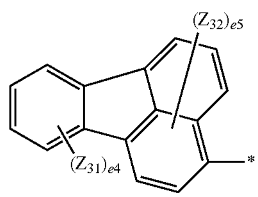
Formula 5-49
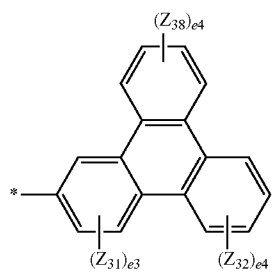
Formula 6-1
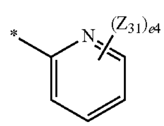
Formula 6-2
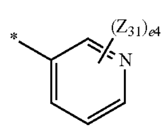
Formula 6-3
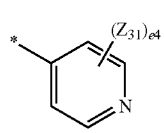

-continued
Formula 6-4
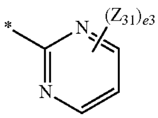
Formula 6-5
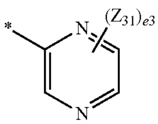
Formula 6-6
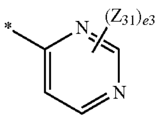
Formula 6-7
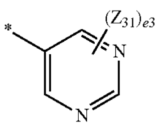
Formula 6-8
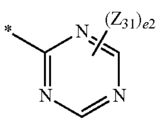
Formula 6-9
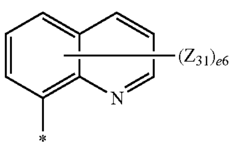
Formula 6-10
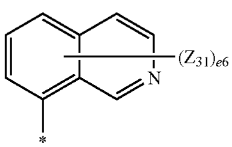
Formula 6-11
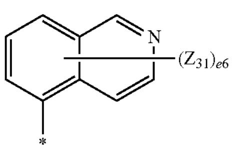
Formula 6-12
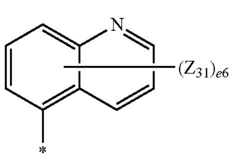
Formula 6-13
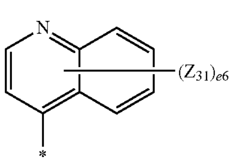
Formula 6-14
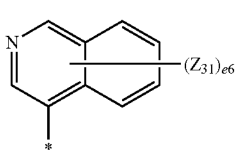
-continued
Formula 6-15
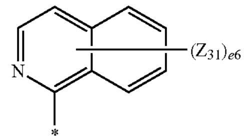
Formula 6-16
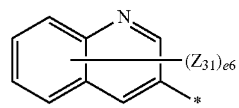
Formula 6-17
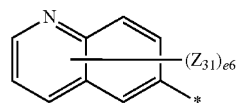
Formula 6-18
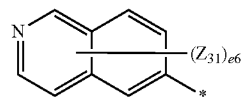
Formula 6-19
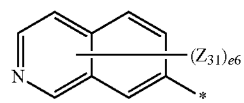
Formula 6-20
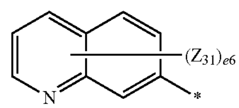
Formula 6-21
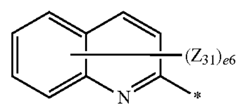
Formula 6-22
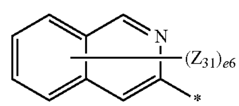
Formula 6-23
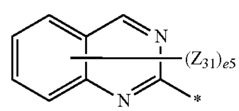
Formula 6-24
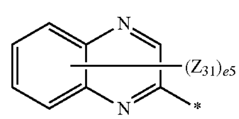
Formula 6-25
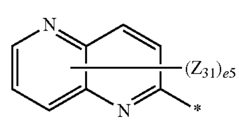
Formula 6-26
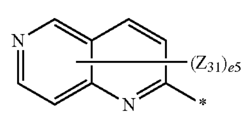
Formula 6-27
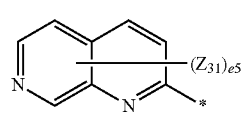

-continued
Formula 6-28
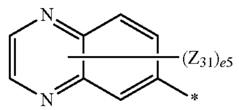
Formula 6-29
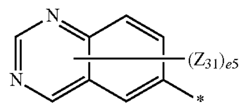
Formula 6-30
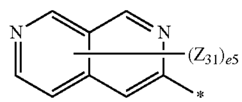
Formula 6-31
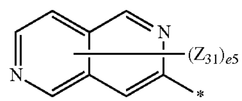
Formula 6-32
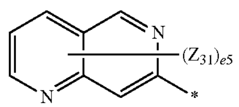
Formula 6-33
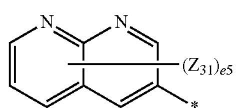
Formula 6-34
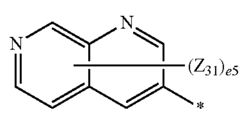
Formula 6-35
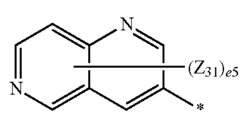
Formula 6-36
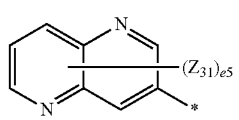
Formula 6-37
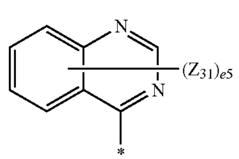
Formula 6-38
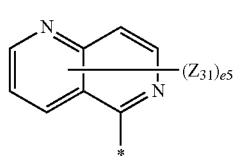
Formula 6-39
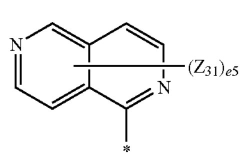
-continued
Formula 6-40
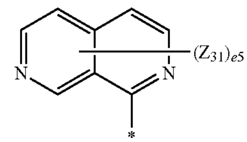
Formula 6-41
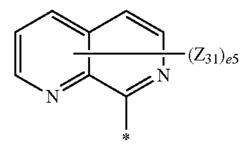
Formula 6-42
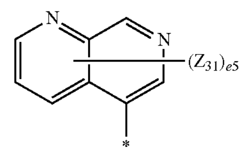
Formula 6-43
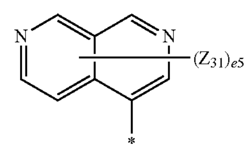
Formula 6-44
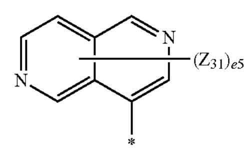
Formula 6-45
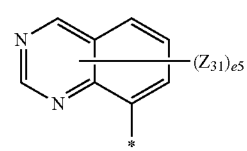
Formula 6-46
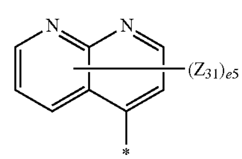
Formula 6-47
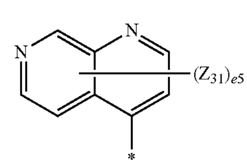
Formula 6-48
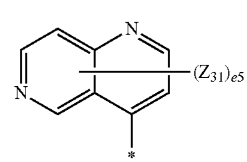
Formula 6-49
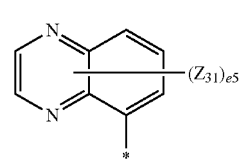

-continued
Formula 6-50
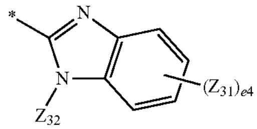
Formula 6-51
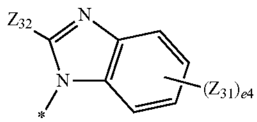
Formula 6-52
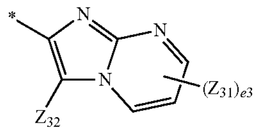
Formula 6-53
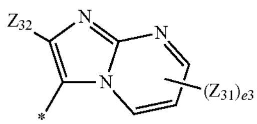
Formula 6-54
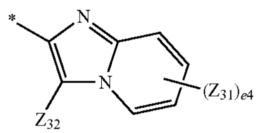
Formula 6-55
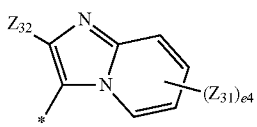
Formula 6-56
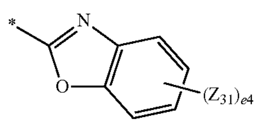
Formula 6-57
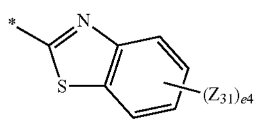
Formula 6-58
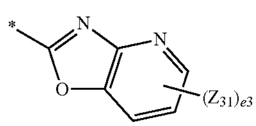
Formula 6-59
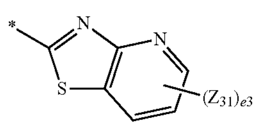
Formula 6-60
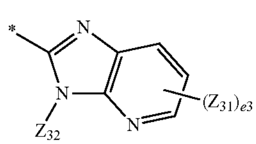
Formula 6-61
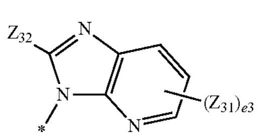
-continued
Formula 6-62
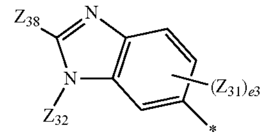
Formula 6-63
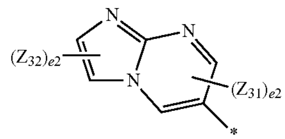
Formula 6-64
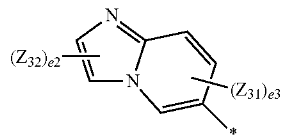
Formula 6-65
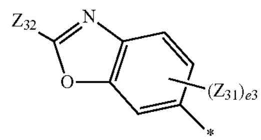
Formula 6-66
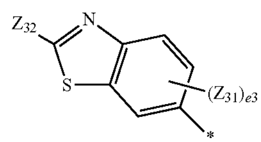
Formula 6-67
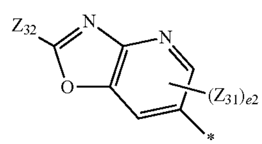
Formula 6-68
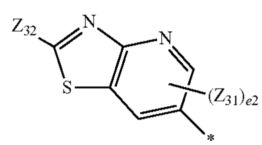
Formula 6-69
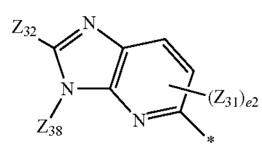
Formula 6-70
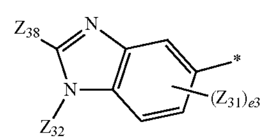
Formula 6-71
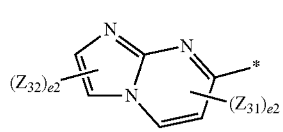
Formula 6-72
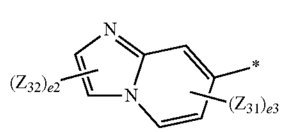

-continued
Formula 6-73
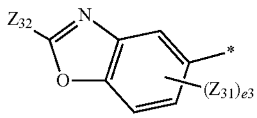
Formula 6-74
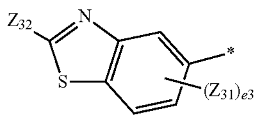
Formula 6-75
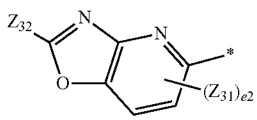
Formula 6-76
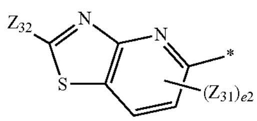
Formula 6-77
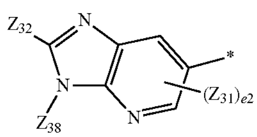
Formula 6-78
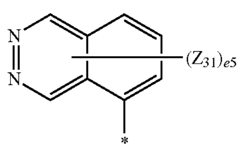
Formula 6-79
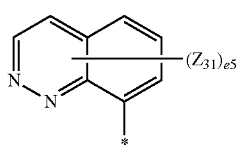
Formula 6-80
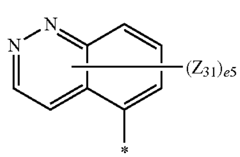
Formula 6-81
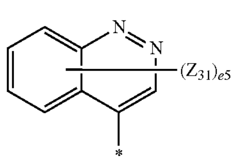
Formula 6-82
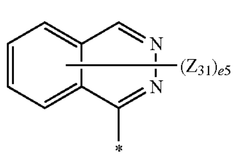
Formula 6-83
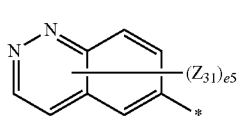
-continued
Formula 6-84
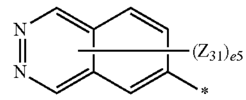
Formula 6-85
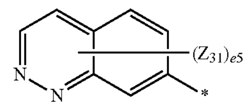
Formula 6-86
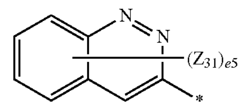
Formula 6-87
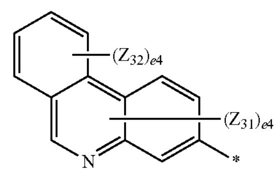
Formula 6-88
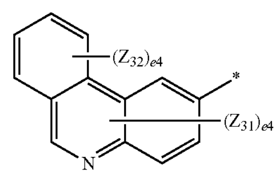
Formula 6-89
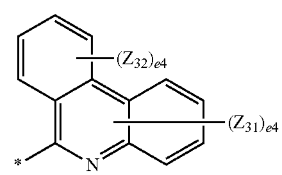
Formula 6-90
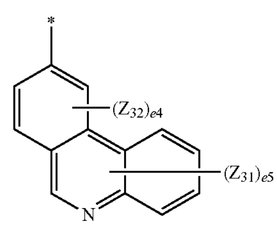
Formula 6-91
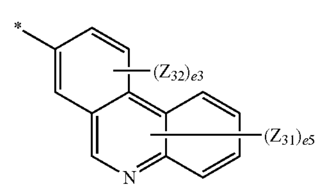
Formula 6-92
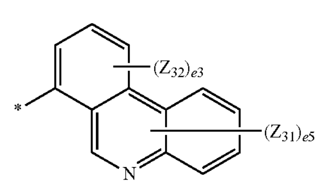

-continued
Formula 6-93
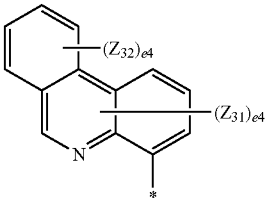
Formula 6-94
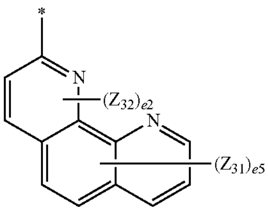
Formula 6-95
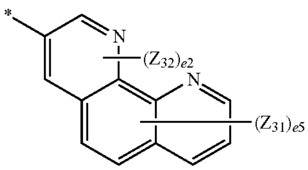
Formula 6-96
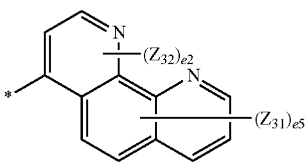
Formula 6-97
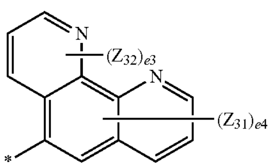
Formula 6-98
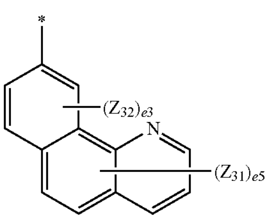
Formula 6-99
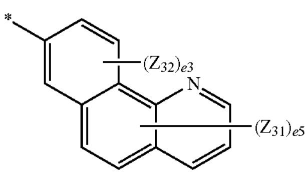
Formula 6-100
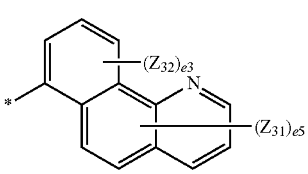
-continued
Formula 6-101
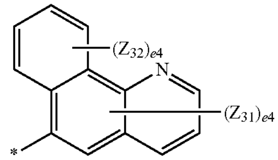
Formula 6-102
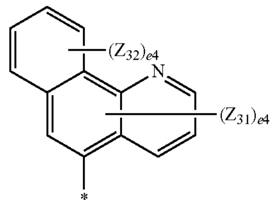
Formula 6-103
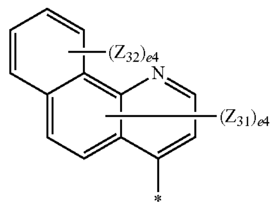
Formula 6-104
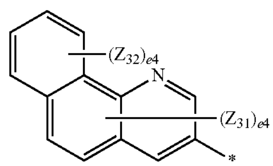
Formula 6-105
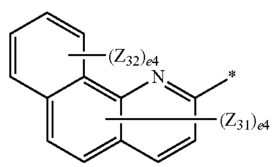
Formula 6-106
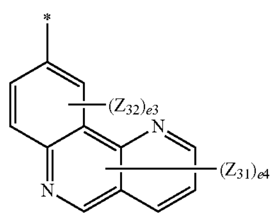
Formula 6-107
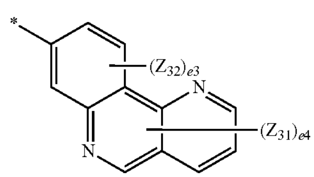
Formula 6-108
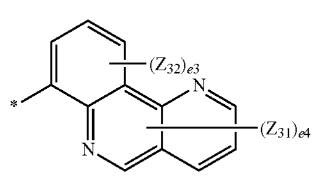

-continued
Formula 6-109
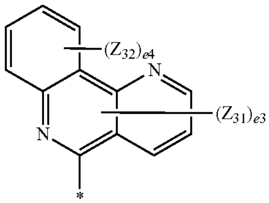
Formula 6-110
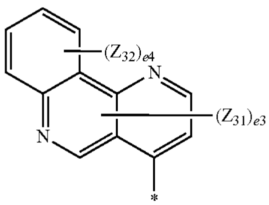
Formula 6-111
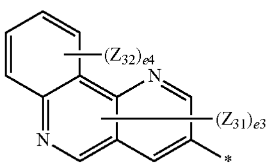
Formula 6-112
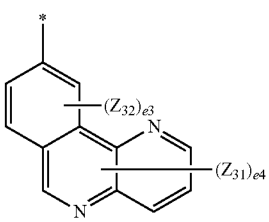
Formula 6-113
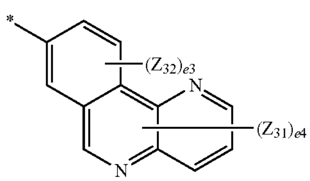
Formula 6-114
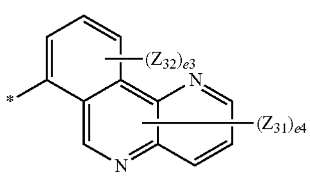
Formula 6-115
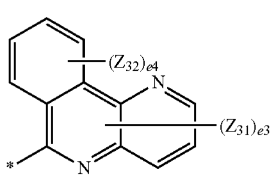
Formula 6-116
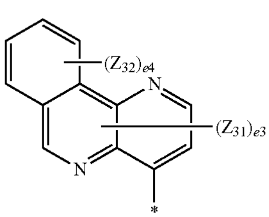
-continued
Formula 6-117
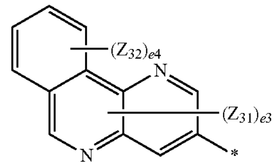
Formula 6-118
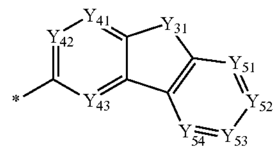
Formula 6-119
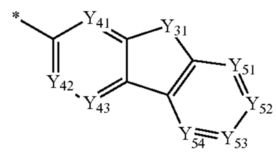
Formula 6-120
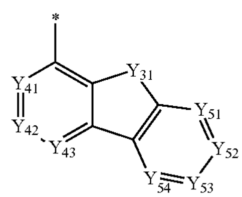
Formula 6-121
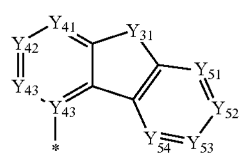
Formula 6-122
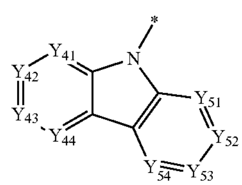
Formula 6-123
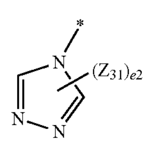
Formula 6-124
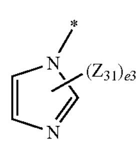
Formula 6-125
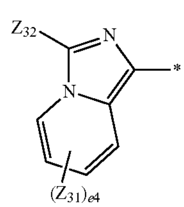

-continued

Formula 6-126

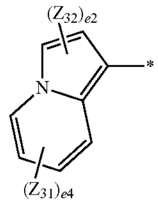

Formula 6-127

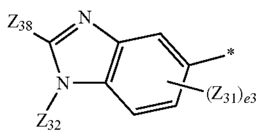

Formula 6-128

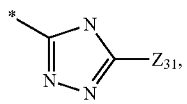

wherein, in Formulae 5-1 to 5-49 and 6-1 to 6-128, $Y_{31}$ and $Y_{32}$ may each independently be O, S, $C(Z_{33})(Z_{34})$, $N(Z_{35})$, or $Si(Z_{36})(Z_{37})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, at least one selected from $Y_{41}$ to $Y_{43}$ and $Y_{51}$ to $Y_{54}$ in Formulae 6-118 to 6-121 may be N, and $Y_{41}$ to $Y_{44}$ and $Y_{51}$ to $Y_{54}$ in Formula 6-122 may be N, $Z_{31}$ to $Z_{38}$, $Z_{41}$ to $Z_{44}$, and $Z_{51}$ to $Z_{54}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, $—Si(Q_{31})(Q_{32})(Q_{33})$, and $—P(=O)(Q_{31})(Q_{32})$, wherein descriptions of $Q_{31}$ to $Q_{33}$ are the same as described herein, and descriptions of $Q_1$ to $Q_3$ are the same as the description provided above in connection with $Q_{31}$, e2 may be an integer selected from 0 to 2, e3 may be an integer selected from 0 to 3, e4 may be an integer selected from 0 to 4, e5 may be an integer selected from 0 to 5, e6 may be an integer selected from 0 to 6, e7 may be an integer selected from 0 to 7, e9 may be an integer selected from 0 to 9, and

* indicates a binding site to a neighboring atom.

In various embodiments, $R_{21}$, $R_{23}$, $R_{24}$, $R_{27}$, and $R_{28}$ in Formulae 2A and 2B may each independently be selected from groups represented by Formulae 9-1 to 9-100 and 10-1 to 10-121, $R_1$ to $R_5$, $R_{11}$, $R_{12}$, and $R_{22}$ in Formulae 1A to 1D, 2A, and 2B may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 9-1 to 9-100 and 10-1 to 10-121, $—Si(Q_1)(Q_2)(Q_3)$, $—S(=O)_2(Q_1)$, and $—P(=O)(Q_1)(Q_2)$, but embodiments are not limited thereto:

Formula 9-1

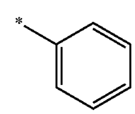

Formula 9-2

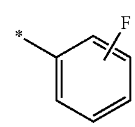

Formula 9-3

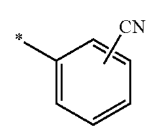

Formula 9-4

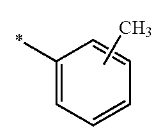

Formula 9-5

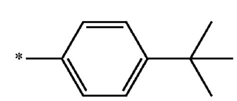

Formula 9-6

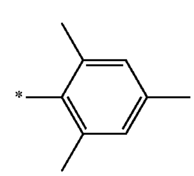

-continued
Formula 9-7
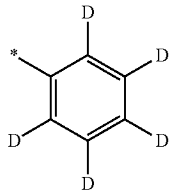
Formula 9-8
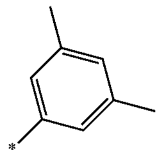
Formula 9-9
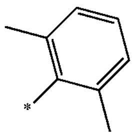
Formula 9-10
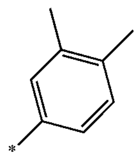
Formula 9-11
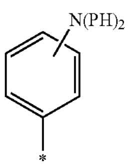
Formula 9-12
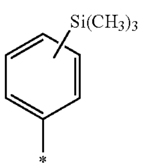
Formula 9-13
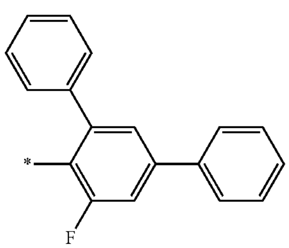
Formula 9-14
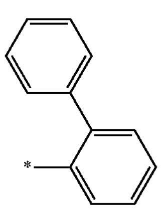
-continued
Formula 9-15
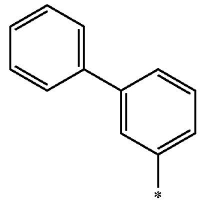
Formula 9-16
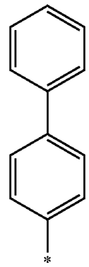
Formula 9-17
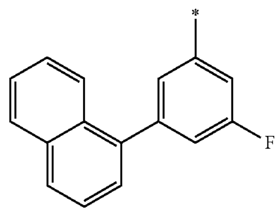
Formula 9-18
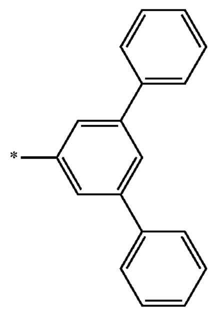
Formula 9-19
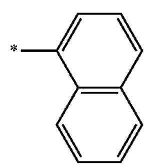
Formula 9-20
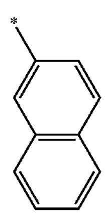
Formula 9-21
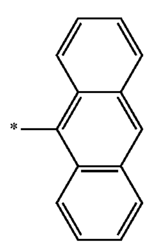

-continued
Formula 9-22
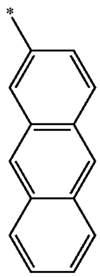
Formula 9-23
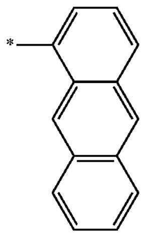
Formula 9-24
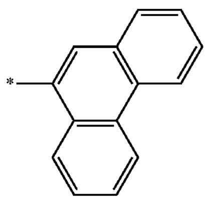
Formula 9-25
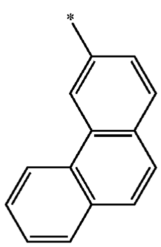
Formula 9-26
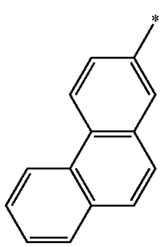
Formula 9-27
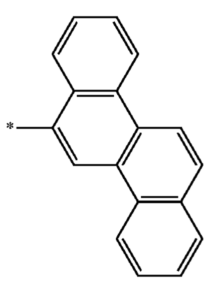
-continued
Formula 9-28
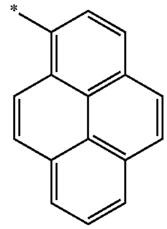
Formula 9-29
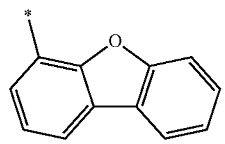
Formula 9-30
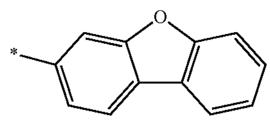
Formula 9-31
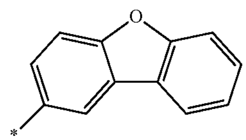
Formula 9-32
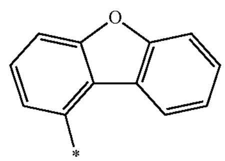
Formula 9-33
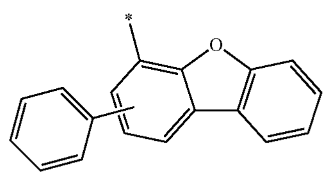
Formula 9-34
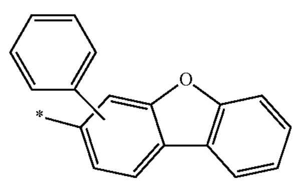
Formula 9-35
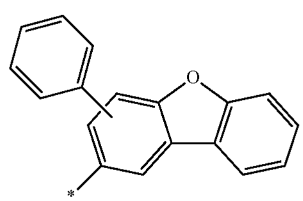
Formula 9-36
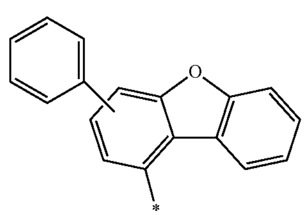

Formula 9-37
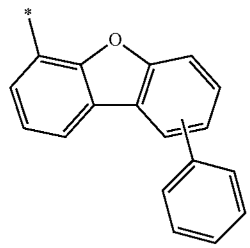
Formula 9-38
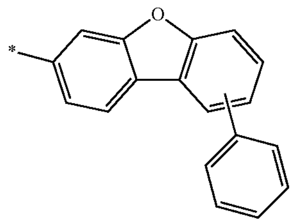
Formula 9-39
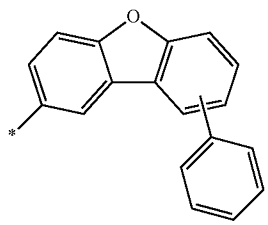
Formula 9-40
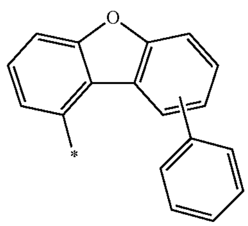
Formula 9-41
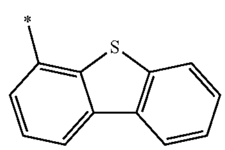
Formula 9-42
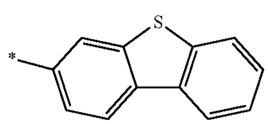
Formula 9-43
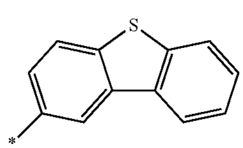
Formula 9-44
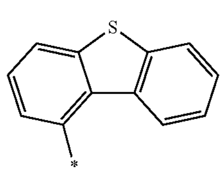
Formula 9-45
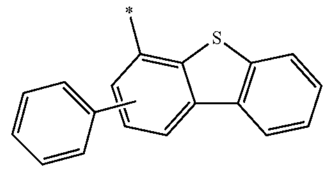
Formula 9-46
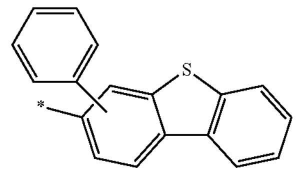
Formula 9-47
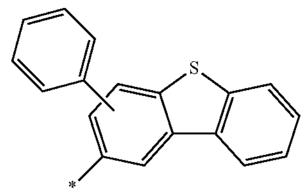
Formula 9-48
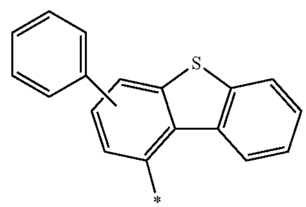
Formula 9-49
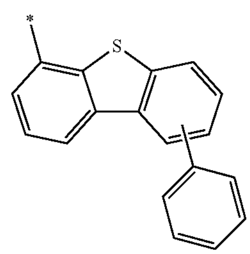
Formula 9-50
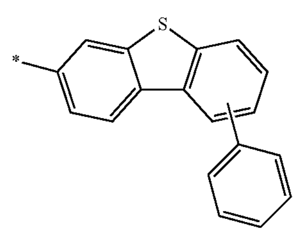
Formula 9-51
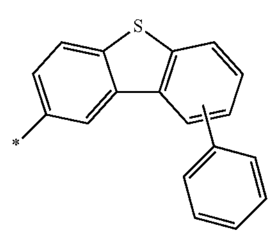

-continued
Formula 9-52
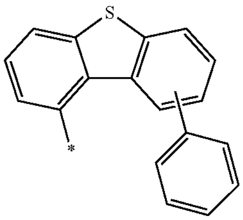
Formula 9-53
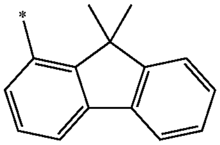
Formula 9-54
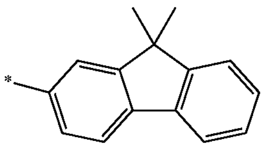
Formula 9-55
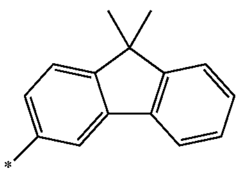
Formula 9-56
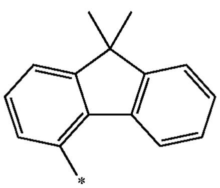
Formula 9-57
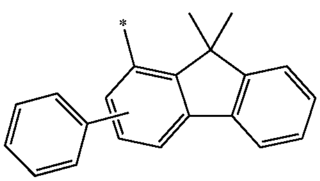
Formula 9-58
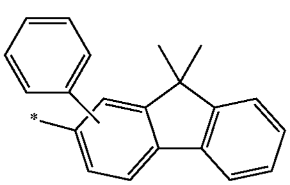
Formula 9-59
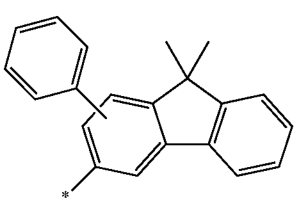
-continued
Formula 9-60
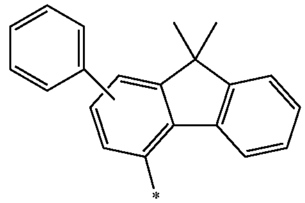
Formula 9-61
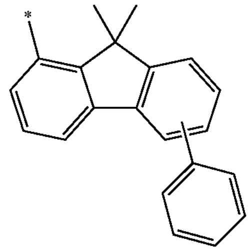
Formula 9-62
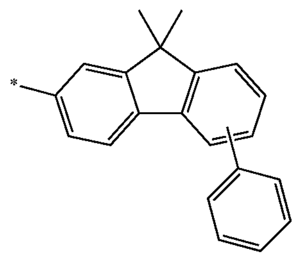
Formula 9-63
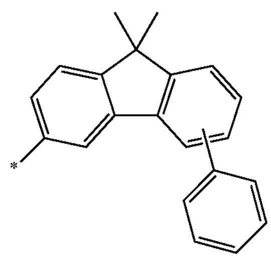
Formula 9-64
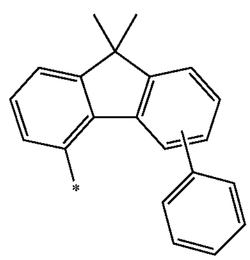
Formula 9-65
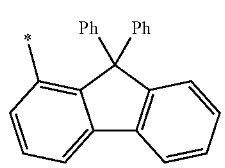
Formula 9-66
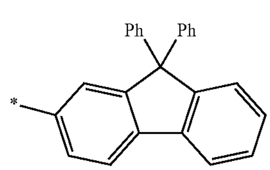

Formula 9-67
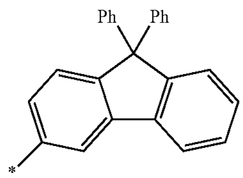
Formula 9-68
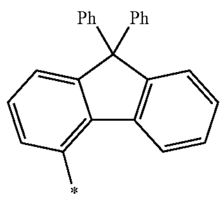
Formula 9-69
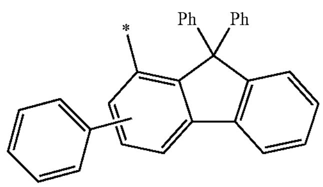
Formula 9-70
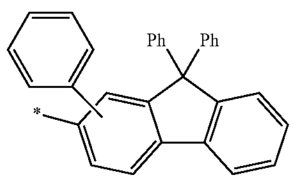
Formula 9-71
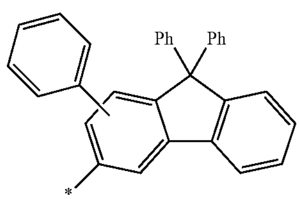
Formula 9-72
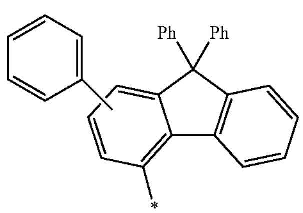
Formula 9-73
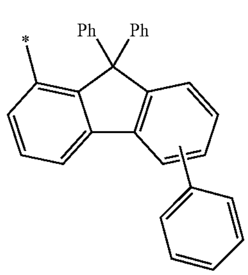
Formula 9-74
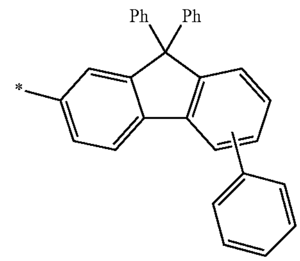
Formula 9-75
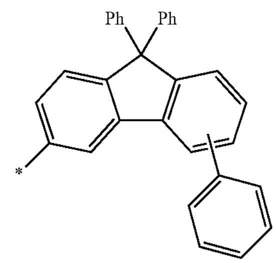
Formula 9-76
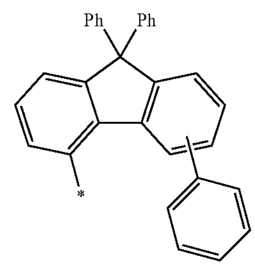
Formula 9-77
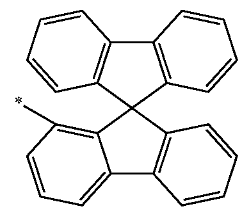
Formula 9-78
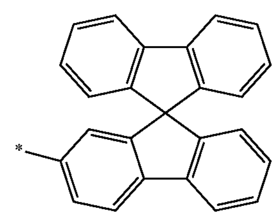
Formula 9-79
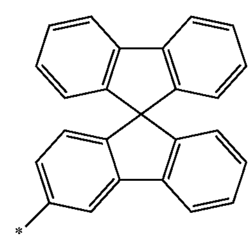

-continued
Formula 9-80
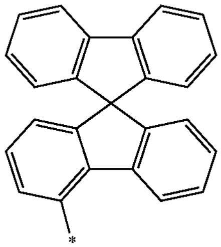
Formula 9-81
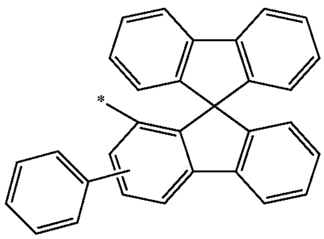
Formula 9-82
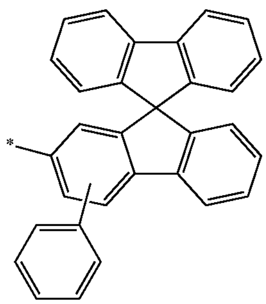
Formula 9-83
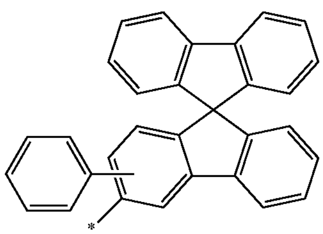
Formula 9-84
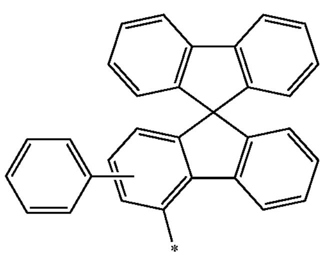
Formula 9-85
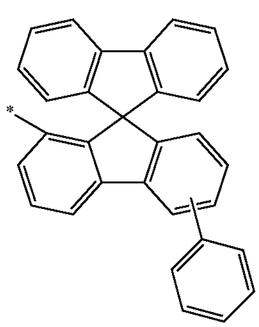
-continued
Formula 9-86
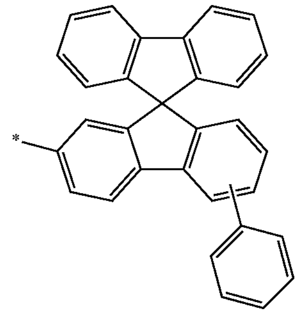
Formula 9-87
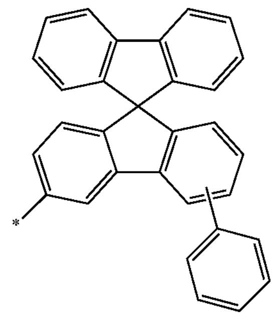
Formula 9-88
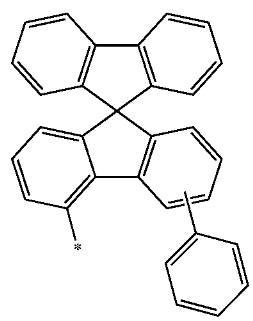
Formula 9-89
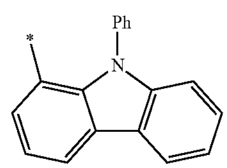
Formula 9-90
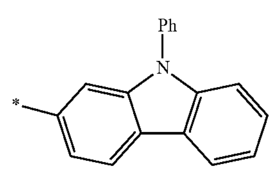
Formula 9-91
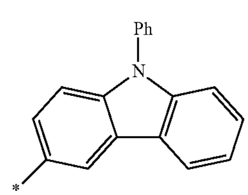

Formula 9-92
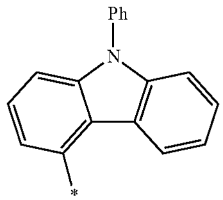
Formula 9-93
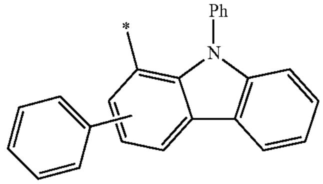
Formula 9-94
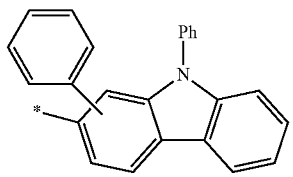
Formula 9-95
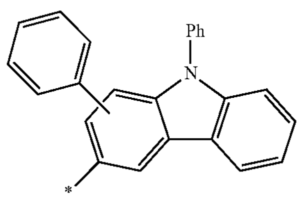
Formula 9-96
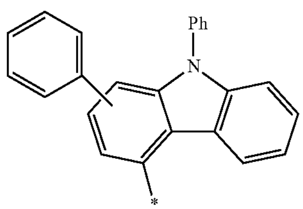
Formula 9-97
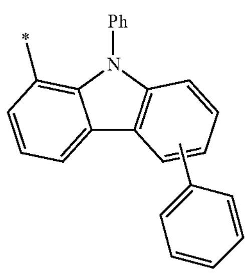
Formula 9-98
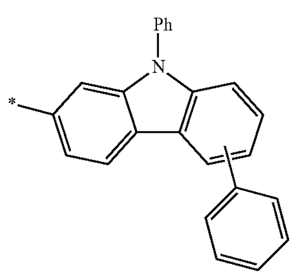
Formula 9-99
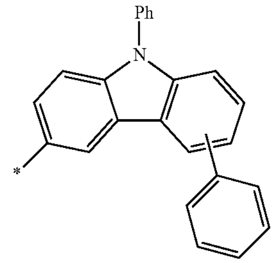
Formula 9-100
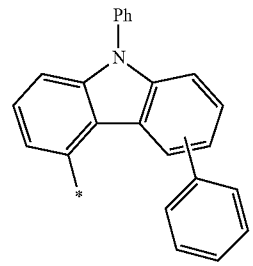
Formula 10-1
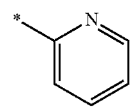
Formula 10-2
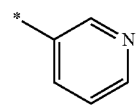
Formula 10-3
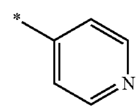
Formula 10-4
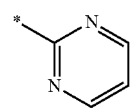
Formula 10-5
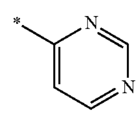
Formula 10-6
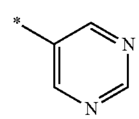
Formula 10-7
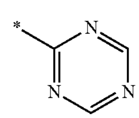
Formula 10-8
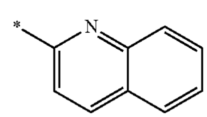
Formula 10-9
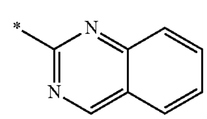

-continued
Formula 10-10
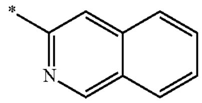
Formula 10-11
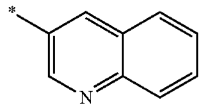
Formula 10-12
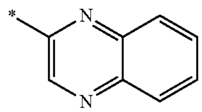
Formula 10-13
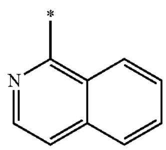
Formula 10-14
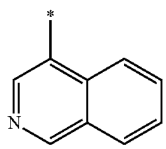
Formula 10-15
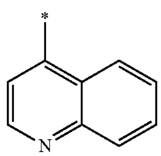
Formula 10-16
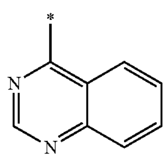
Formula 10-17
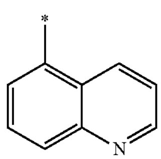
Formula 10-18
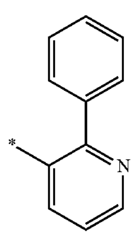
Formula 10-19
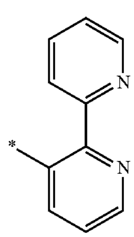
-continued
Formula 10-20
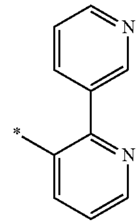
Formula 10-21
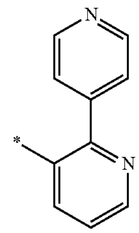
Formula 10-22
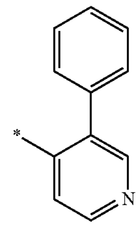
Formula 10-23
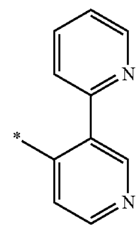
Formula 10-24
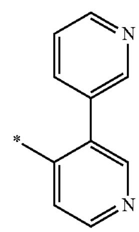
Formula 10-25
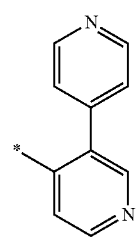
Formula 10-26
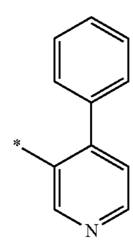

-continued
Formula 10-27
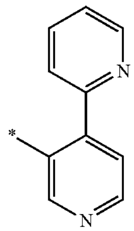
Formula 10-28
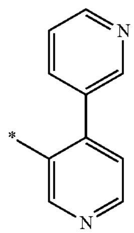
Formula 10-29
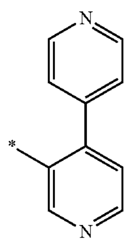
Formula 10-30
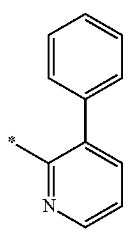
Formula 10-31
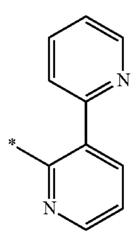
Formula 10-32
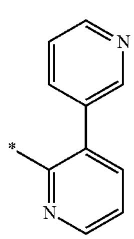
-continued
Formula 10-33
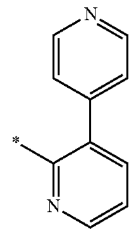
Formula 10-34
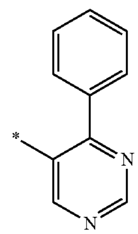
Formula 10-35
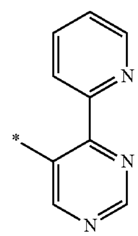
Formula 10-36
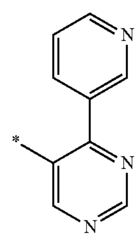
Formula 10-37
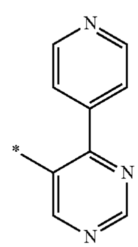
Formula 10-38
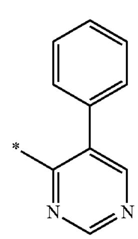

-continued
Formula 10-39
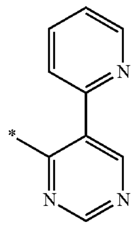
Formula 10-40
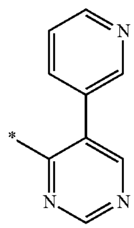
Formula 10-41
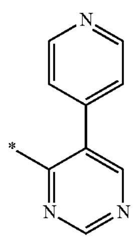
Formula 10-42
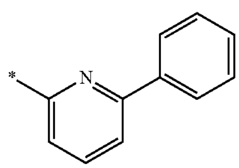
Formula 10-43
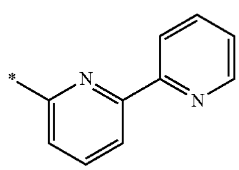
Formula 10-44
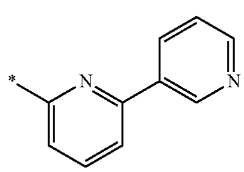
Formula 10-45
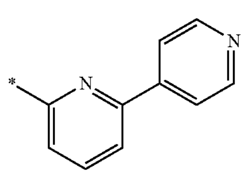
Formula 10-46
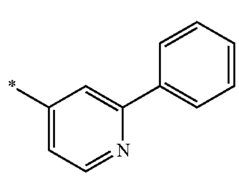
-continued
Formula 10-47
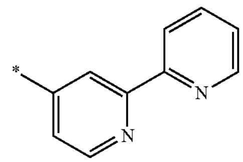
Formula 10-48
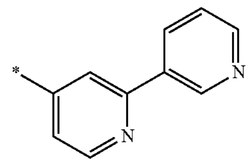
Formula 10-49
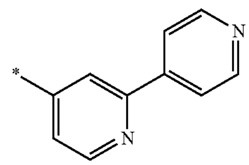
Formula 10-50
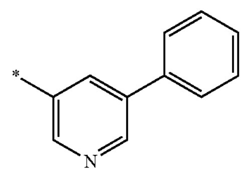
Formula 10-51
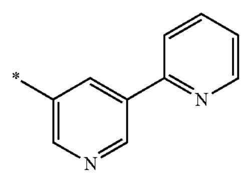
Formula 10-52
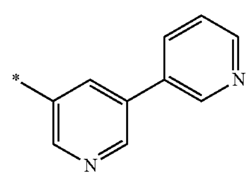
Formula 10-53
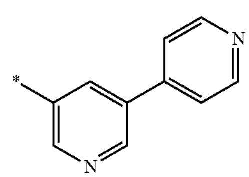
Formula 10-54
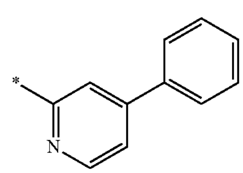
Formula 10-55
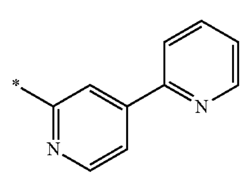

-continued
Formula 10-56
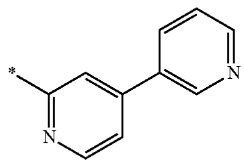
Formula 10-57
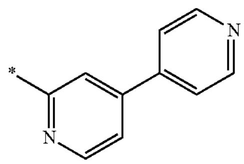
Formula 10-58
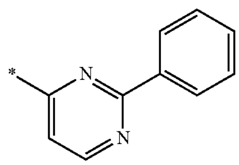
Formula 10-59
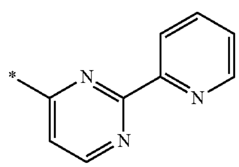
Formula 10-60
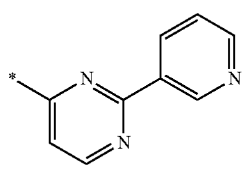
Formula 10-61
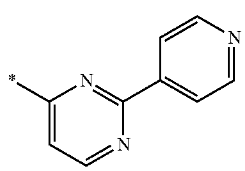
Formula 10-62
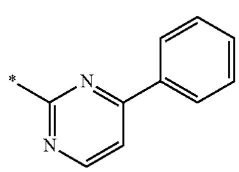
Formula 10-63
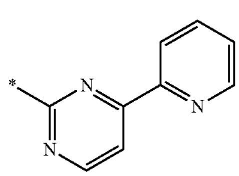
Formula 10-64
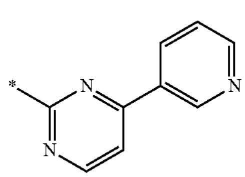
-continued
Formula 10-65
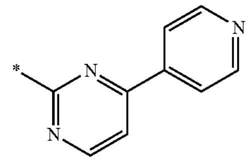
Formula 10-66
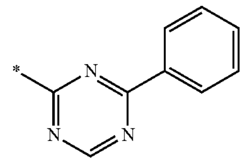
Formula 10-67
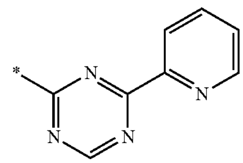
Formula 10-68
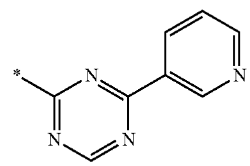
Formula 10-69
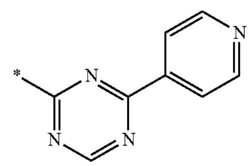
Formula 10-70
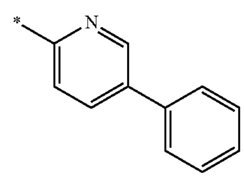
Formula 10-71
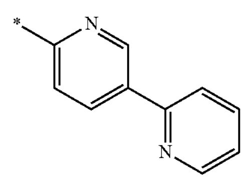
Formula 10-72
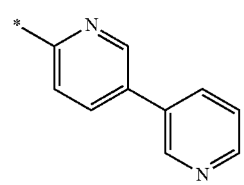
Formula 10-73
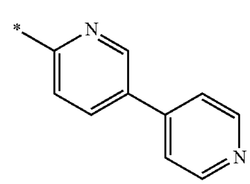

-continued
Formula 10-74
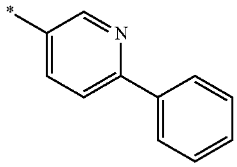
Formula 10-75
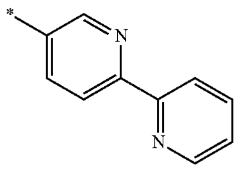
Formula 10-76
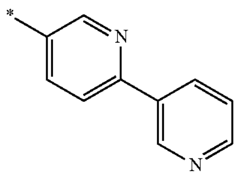
Formula 10-77
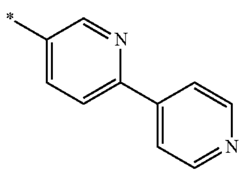
Formula 10-78
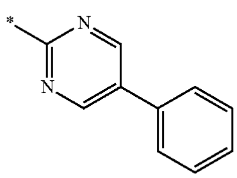
Formula 10-79
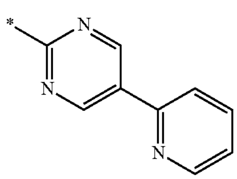
Formula 10-80
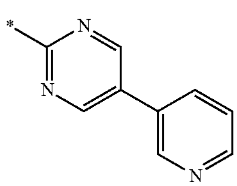
Formula 10-81
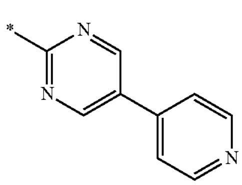
Formula 10-82
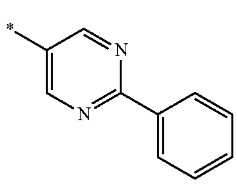
-continued
Formula 10-83
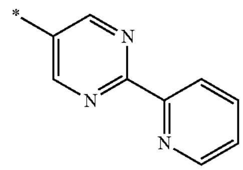
Formula 10-84
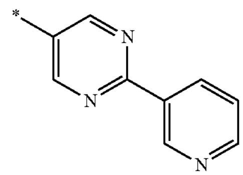
Formula 10-85
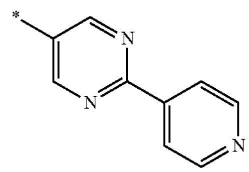
Formula 10-86
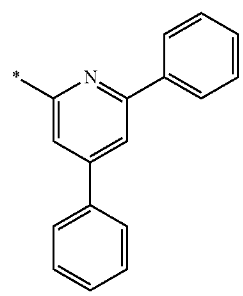
Formula 10-87
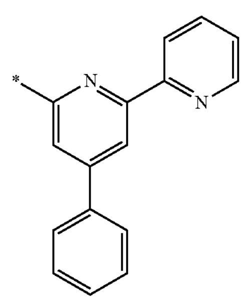
Formula 10-88
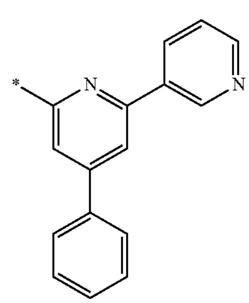

-continued
Formula 10-89
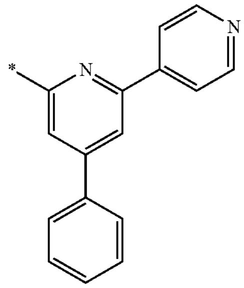
Formula 10-90
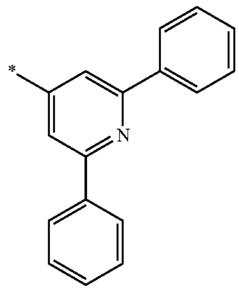
Formula 10-91
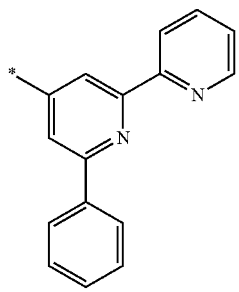
Formula 10-92
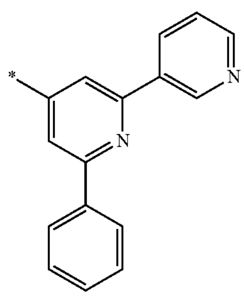
Formula 10-93
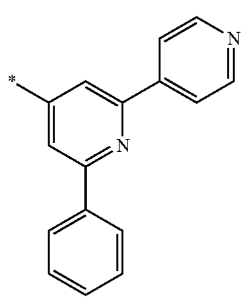
-continued
Formula 10-94
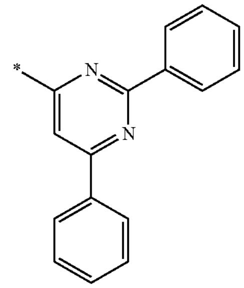
Formula 10-95
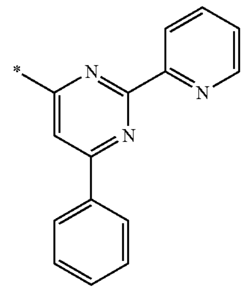
Formula 10-96
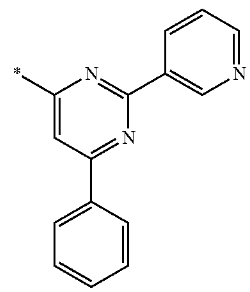
Formula 10-97
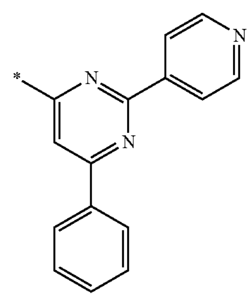
Formula 10-98
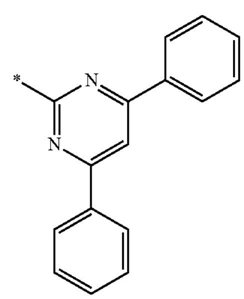

-continued
Formula 10-99
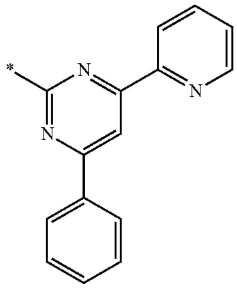
Formula 10-100
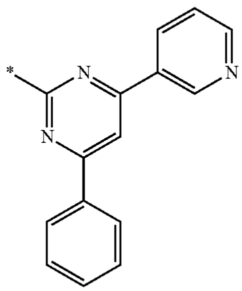
Formula 10-101
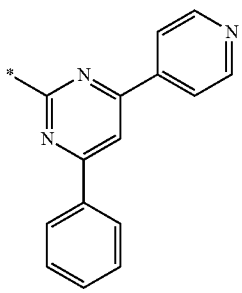
Formula 10-102
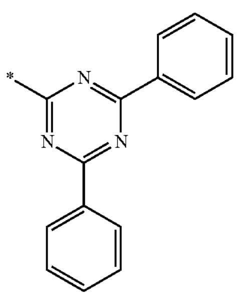
Formula 10-103
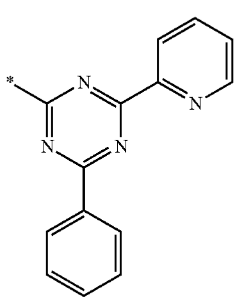
-continued
Formula 10-104
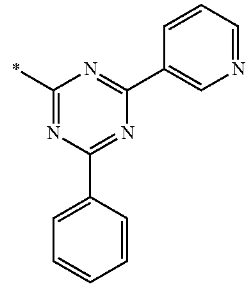
Formula 10-105
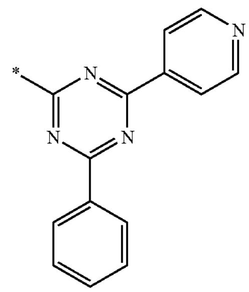
Formula 10-106
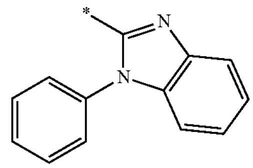
Formula 10-107
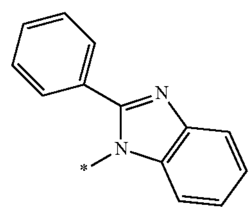
Formula 10-108
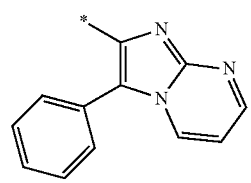
Formula 10-109
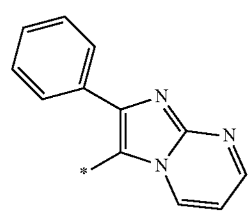
Formula 10-110
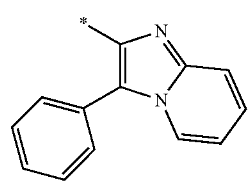

-continued
Formula 10-111
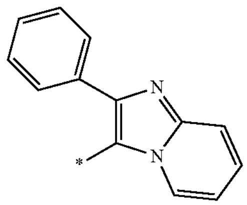
Formula 10-112
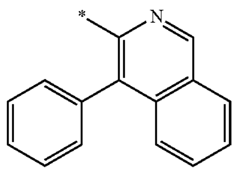
Formula 10-113
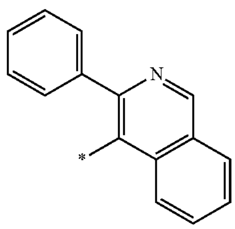
Formula 10-114
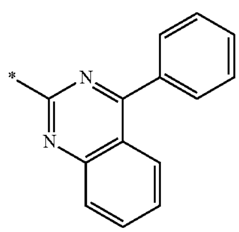
Formula 10-115
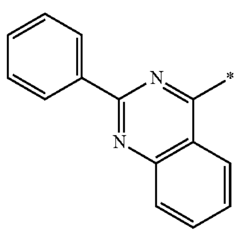
Formula 10-116
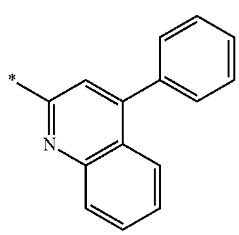
Formula 10-117
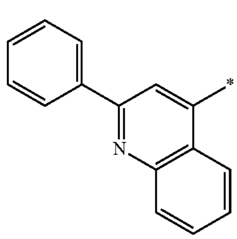
-continued
Formula 10-118
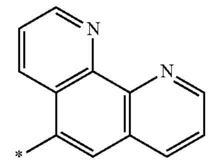
Formula 10-119
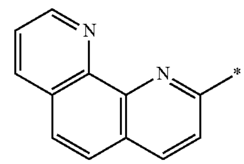
Formula 10-120
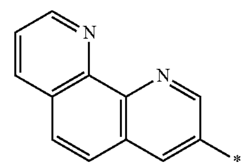
Formula 10-121
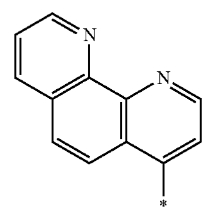
Formula 10-114
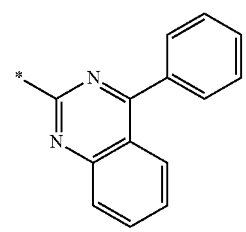
Formula 10-115
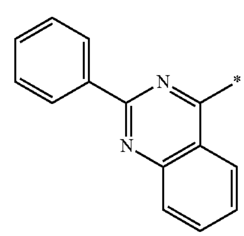
Formula 10-116
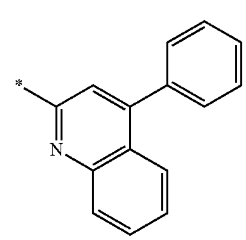

-continued

Formula 10-117

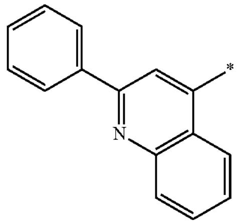

Formula 10-118

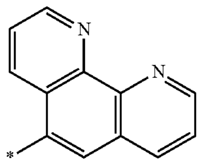

Formula 10-119

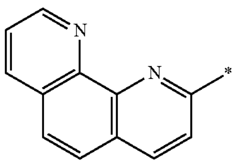

Formula 10-120

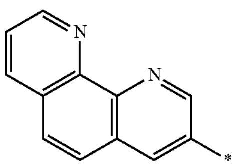

Formula 10-121

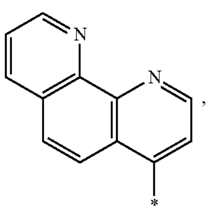

wherein, in Formulae 9-1 to 9-100 and 10-1 to 10-121, Ph may refer to a phenyl group, "D" may refer to deuterium, and * indicates a binding site to a neighboring atom.

$R_4$ and $R_5$ in Formulae 1A to 1D may be optionally connected to each other to form a saturated or unsaturated ring.

b1 in Formulae 1A to 1D indicates the number of $R_1$(s), wherein when b1 is two or more, two or more $R_1$(s) may be identical to or different from each other. Descriptions of b2 to b5, b11, and b12 may each independently be understood by referring to the description presented in connection with b1 and the corresponding structures of Formulae 1A to 1D.

b1 to b5, b11, and b12 in Formulae 1A to 1D may each independently be an integer selected from 0 to 4. For example, b1 to b5, b11, and b12 may each independently be 0 or 1, but are not limited thereto.

b21 in Formulae 2A and 2B indicates the number of $R_{21}$(s), wherein when b21 is two or more, two or more $R_{21}$(s) may be identical to or different from each other. Description of b22 may be understood by referring to the description presented in connection with b21 and the corresponding structures of Formulae 2A and 2B.

b21 and b22 in Formulae 2A and 2B may each independently be an integer selected from 0 to 4. For example, b21 and b22 may each independently be 1 or 2, but are not limited thereto.

In various embodiments, the first compound may be represented by one selected from Formulae 1A(1) to 1A(11), 1B(1), 1B(2), 1C(1) to 1C(4), 1D(1), and 1D(2):

Formula 1A(1)

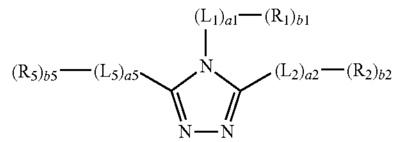

Formula 1A(2)

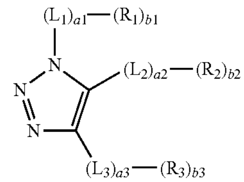

Formula 1A(3)

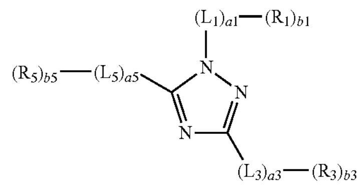

Formula 1A(4)

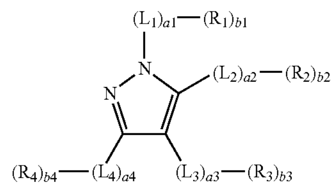

Formula 1A(5)

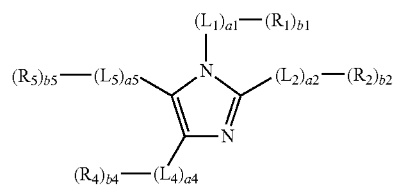

Formula 1A(6)

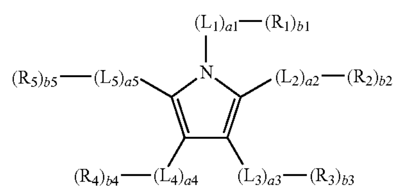

Formula 1A(7)

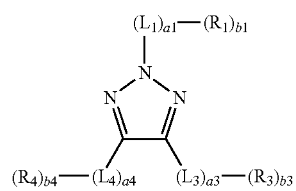

Formula 1A(8)

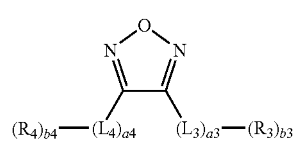

-continued
Formula 1A(9)
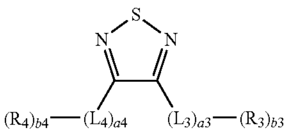
Formula 1A(10)
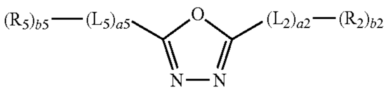
Formula 1A(11)
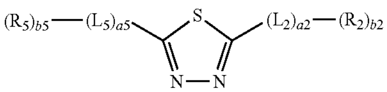
Formula 1B(1)
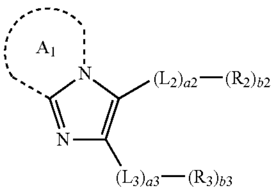
Formula 1B(2)
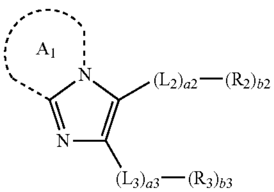
Formula 1C(1)
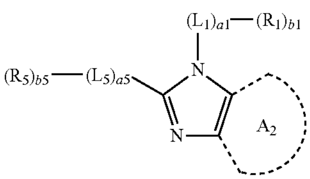
Formula 1C(2)
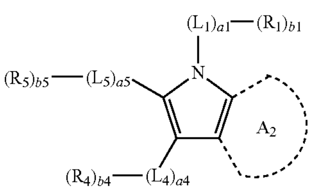
-continued
Formula 1C(3)
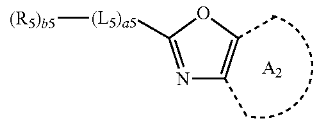
Formula 1C(4)
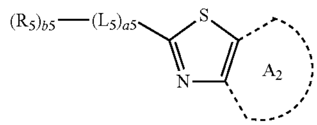
Formula 1D(1)
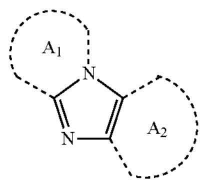
Formula 1D(2)
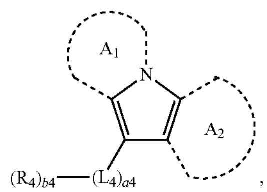
,
wherein descriptions of ring $A_1$, ring $A_2$, $L_1$ to $L_5$, a1 to a5, $R_1$ to $R_5$, and b1 to b5 in Formulae 1A(1) to 1A(11), 1B(1), 1B(2), 1C(1) to 1C(4), 1D(1), and 1D(2) are the same as described herein.
In various embodiments, the first compound may be one selected from Compounds 1-1 to 1-284:
1-1
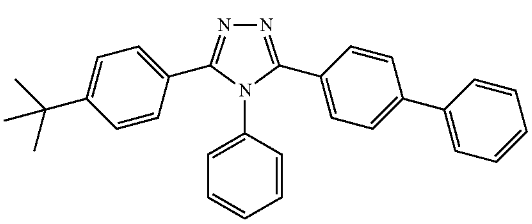
1-2
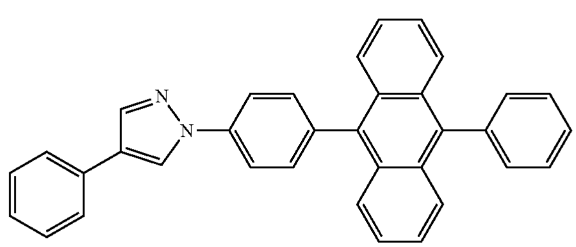

-continued
1-3
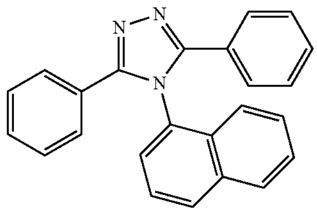
1-4
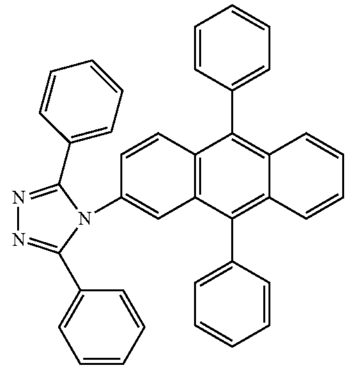
1-5
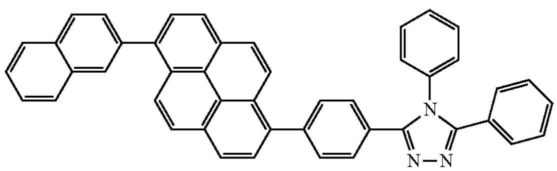
1-6
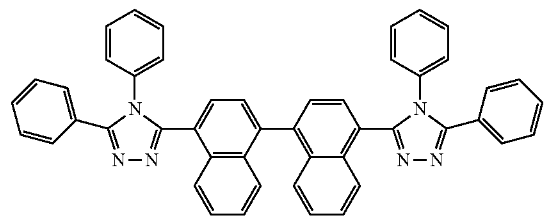
1-7
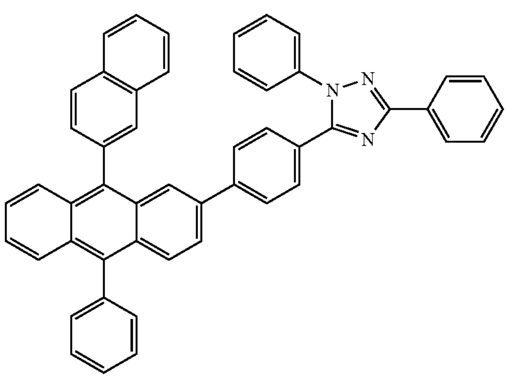
1-8
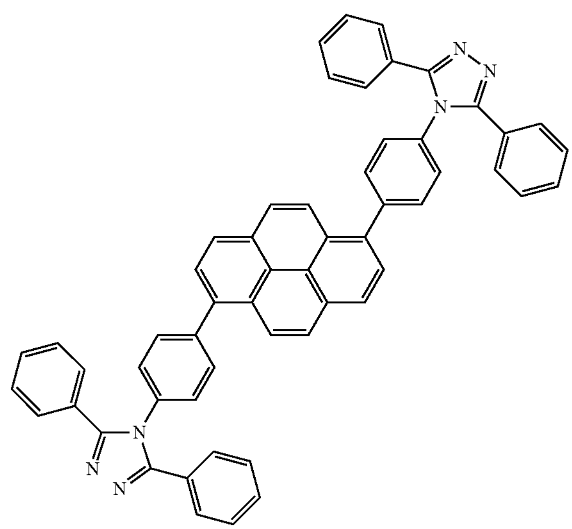

-continued
1-9
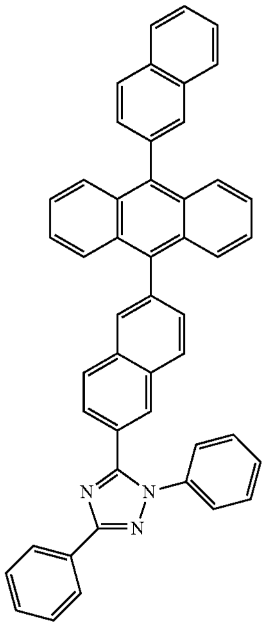
1-10
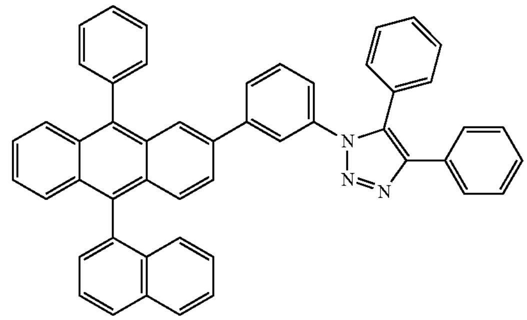
1-11
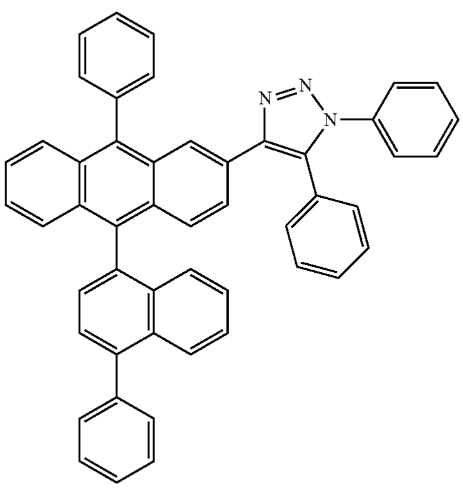
1-12
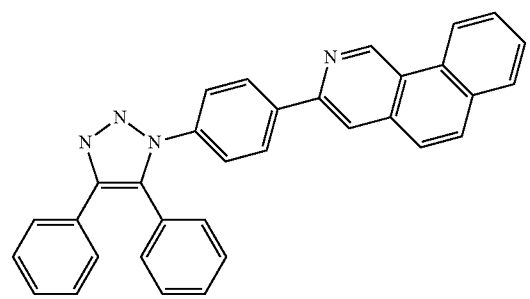
1-13
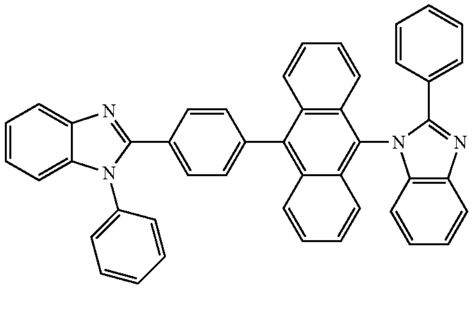
1-14
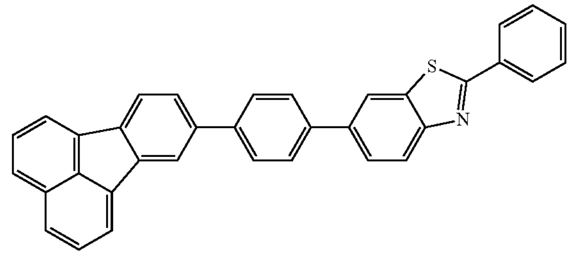

-continued
1-15
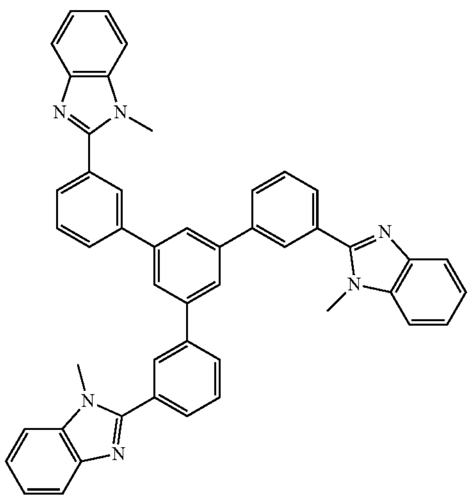
1-16
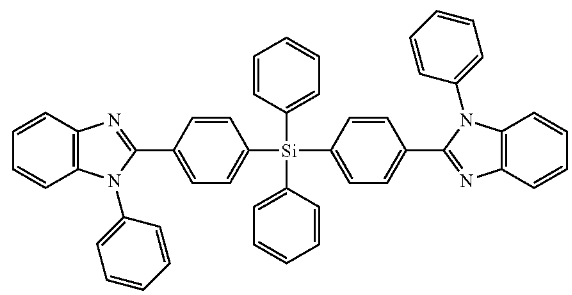
1-17
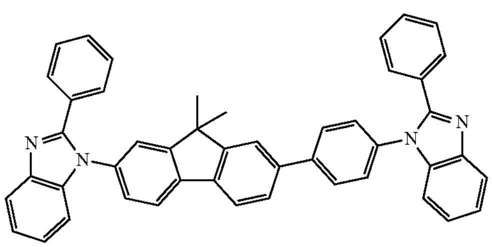
1-18
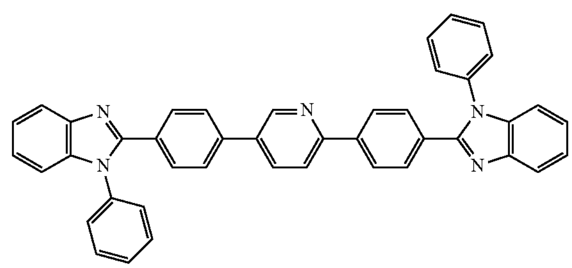
1-19
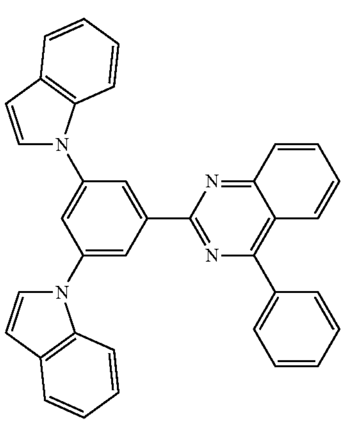
1-20
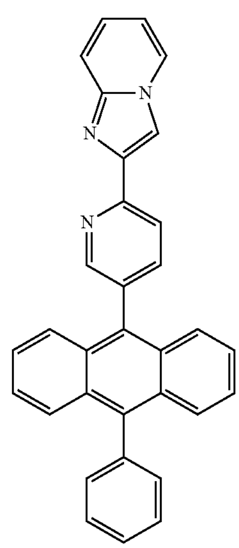

-continued
1-21
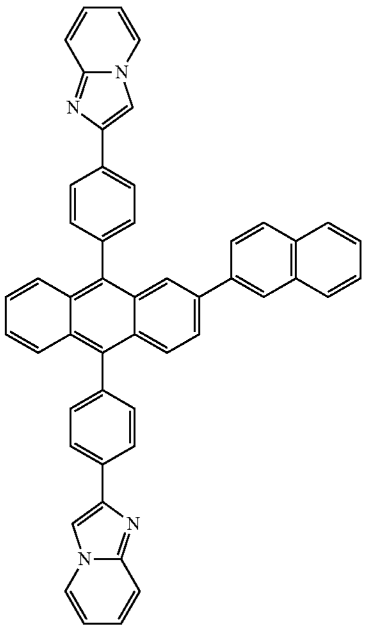
1-22
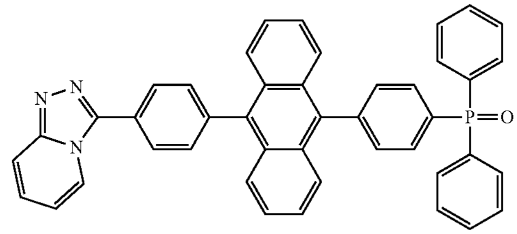
1-23
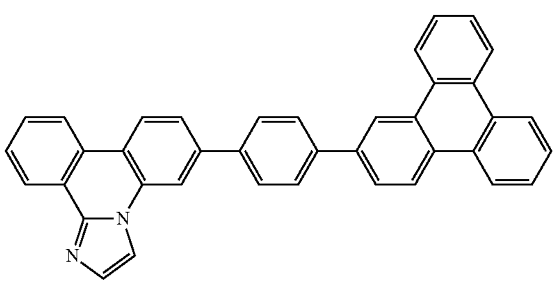
1-24
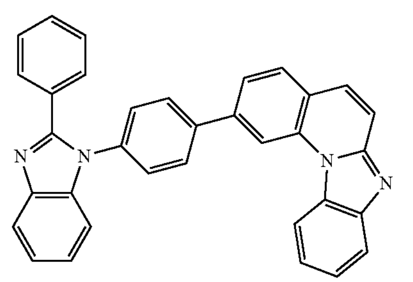
1-25
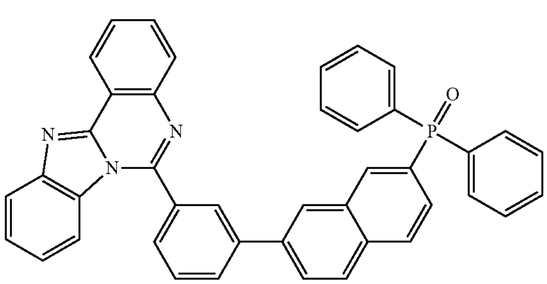
1-26
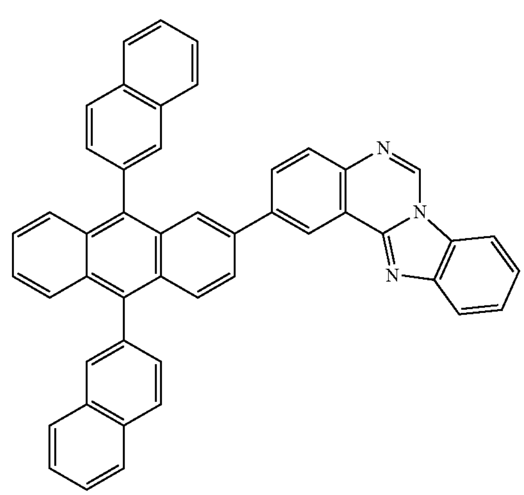

-continued
1-27
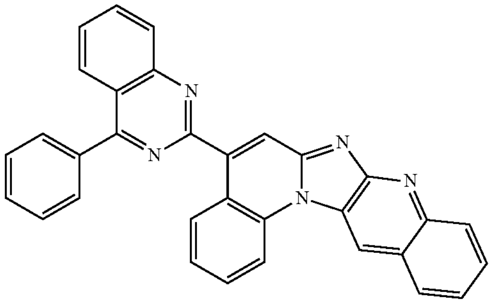
1-28
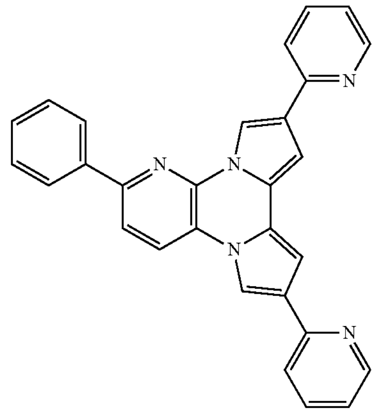
1-29
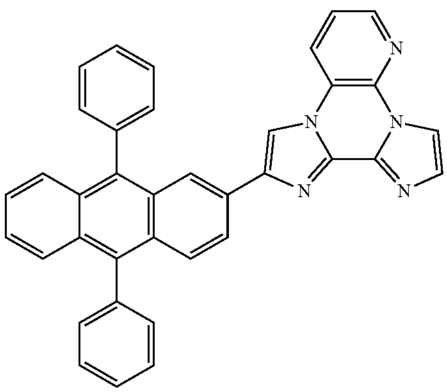
1-30
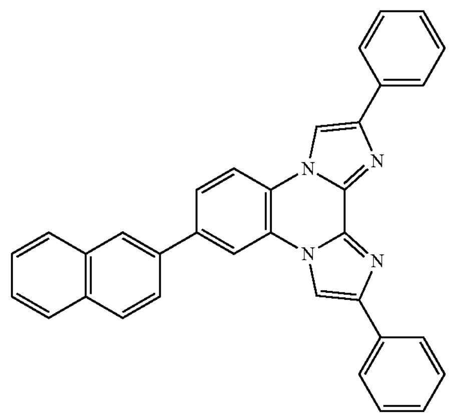
1-31
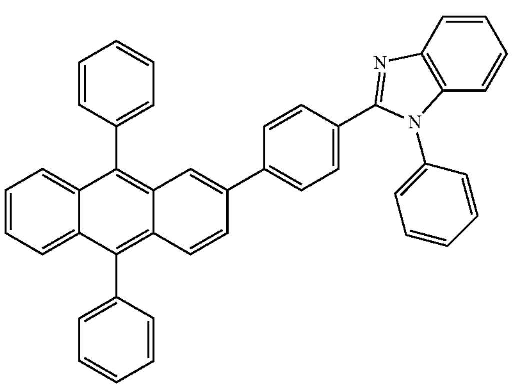
1-32
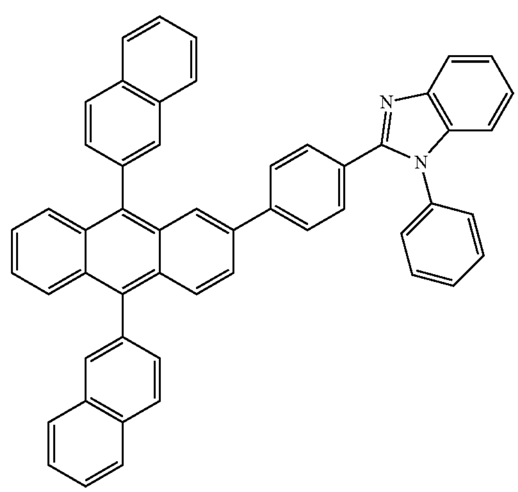

-continued
1-33
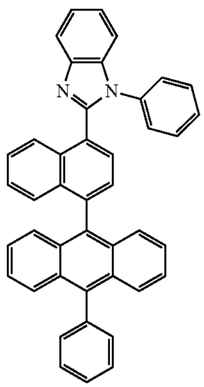
1-34
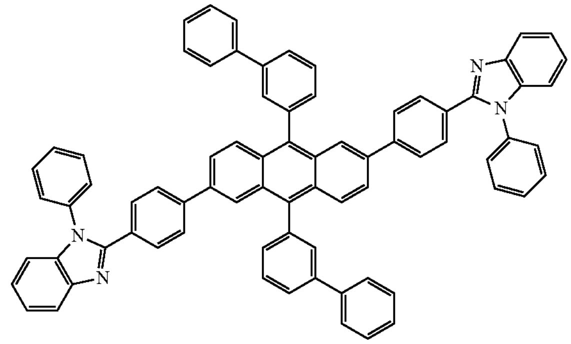
1-35
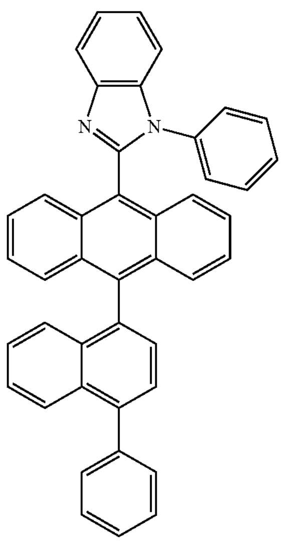
1-36
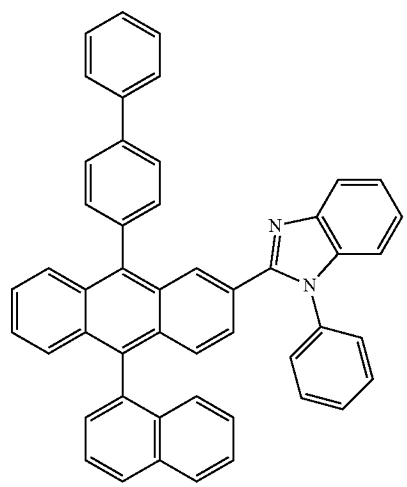
1-37
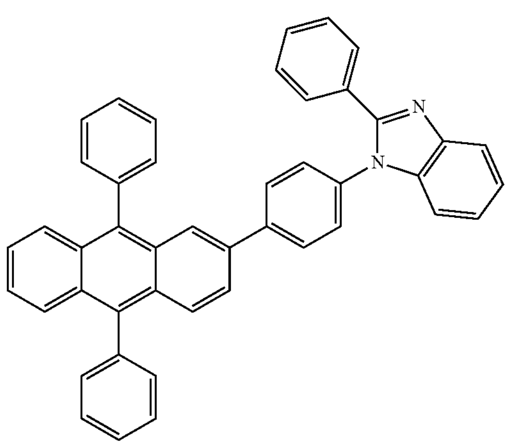
1-38
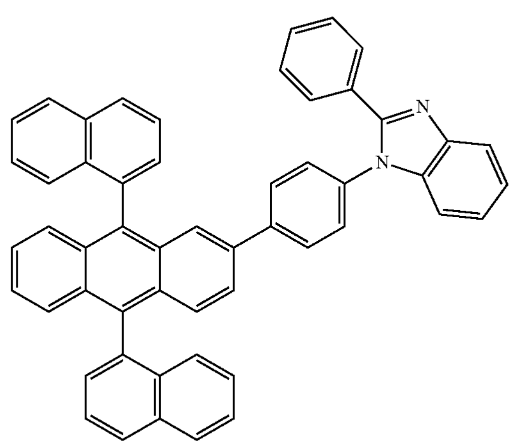

-continued
1-39
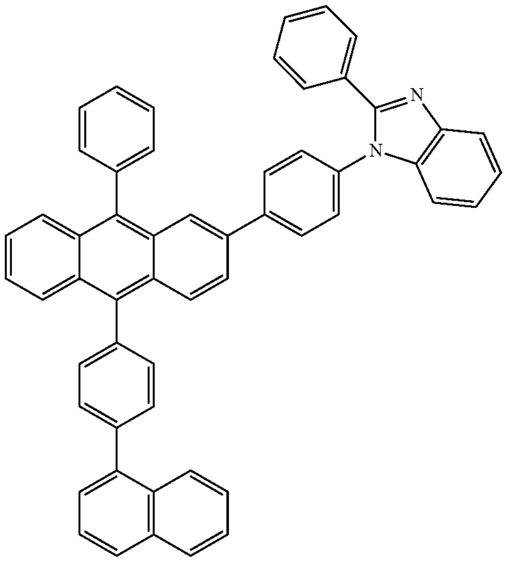
1-40
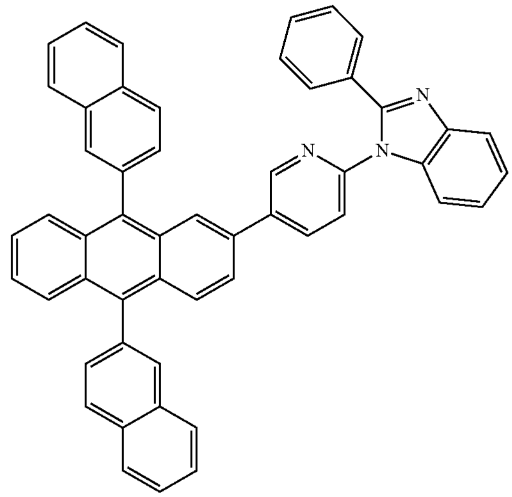
1-41
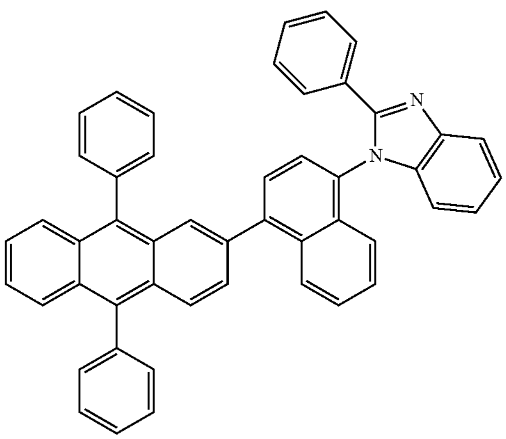
1-42
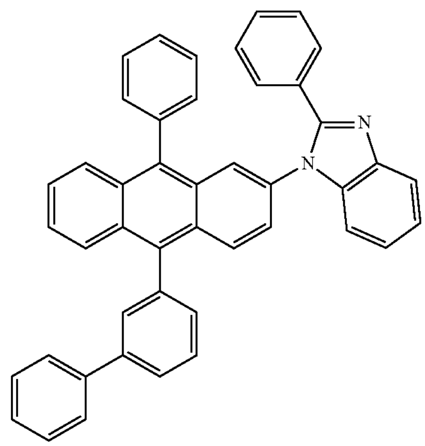
1-43
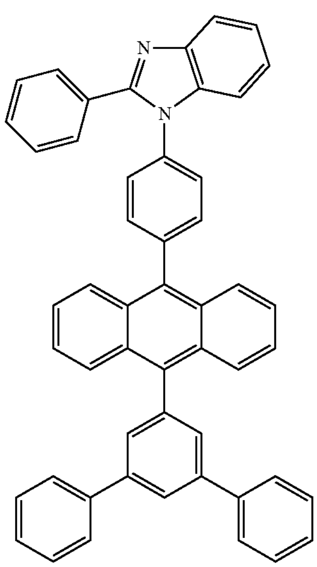
1-44
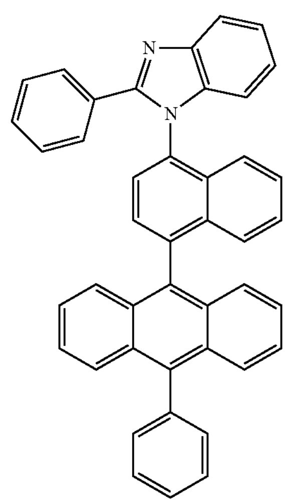

-continued
1-45
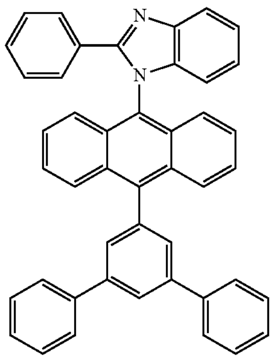
1-46
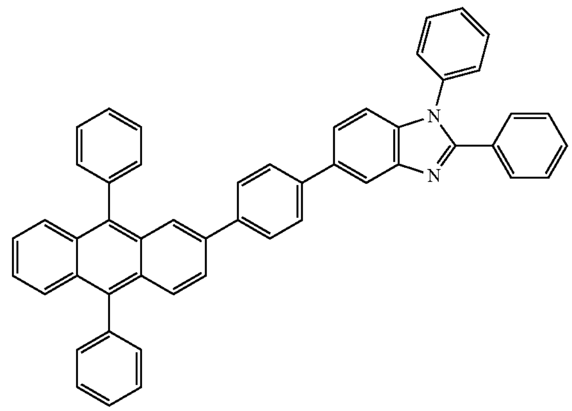
1-47
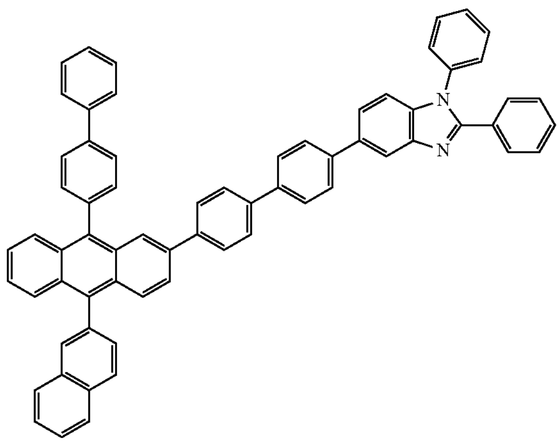
1-48
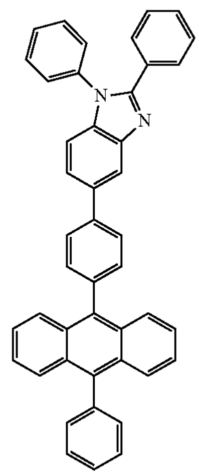
1-49
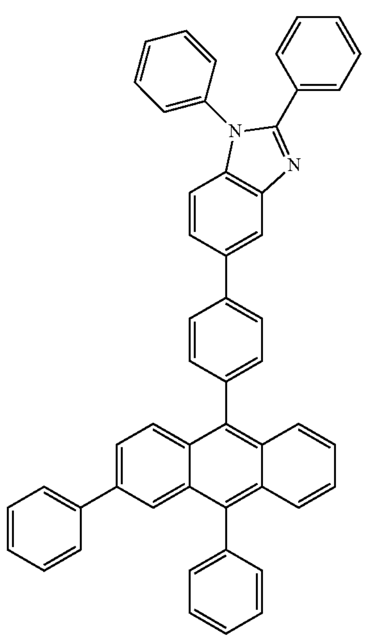
1-50
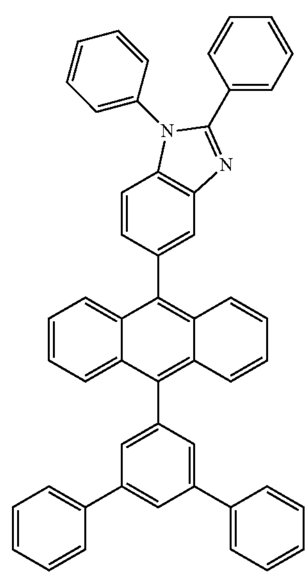

-continued
1-51
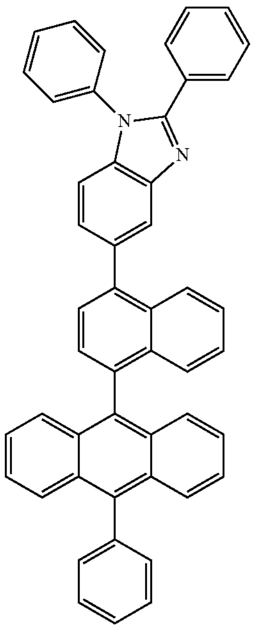
1-52
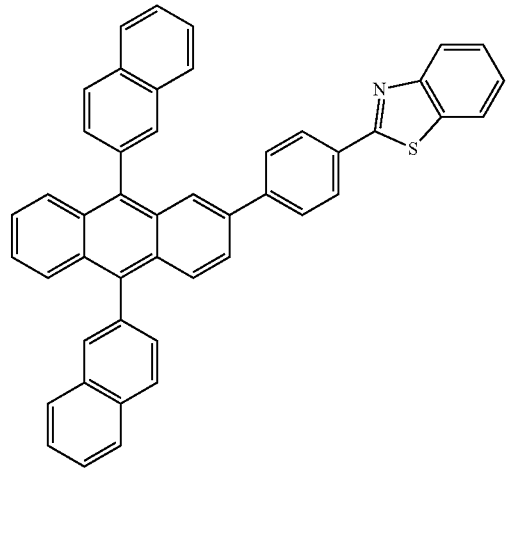
1-53
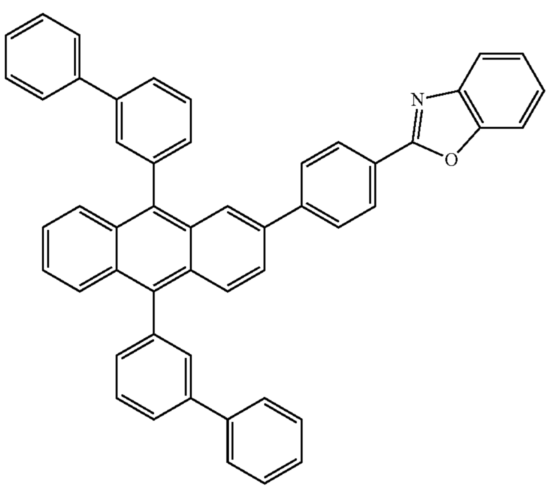
1-54
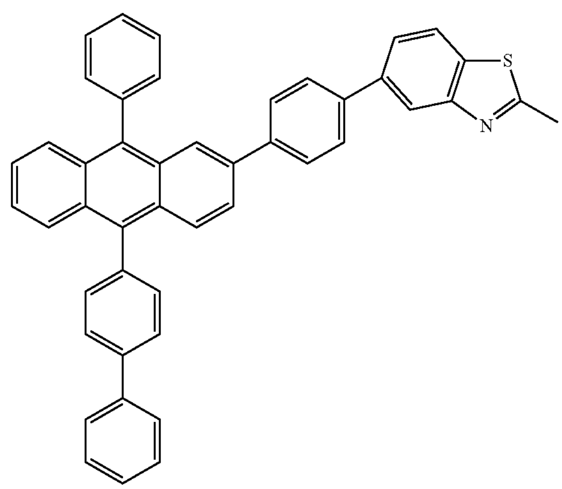

-continued
1-55
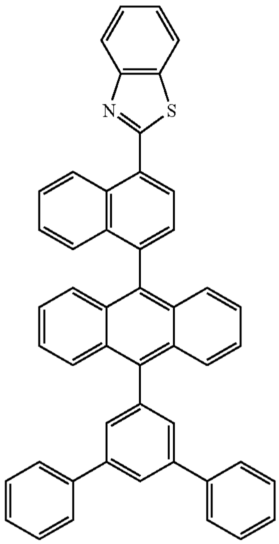
1-56
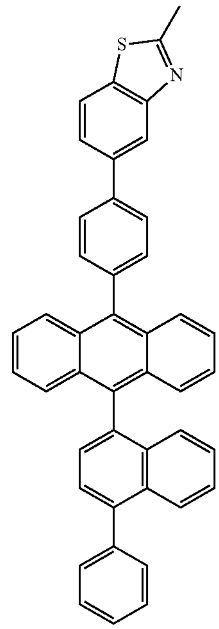
1-57
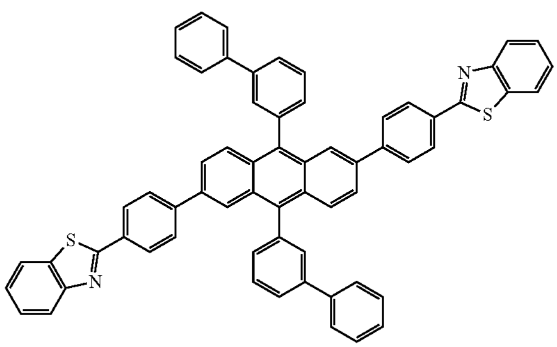
1-58
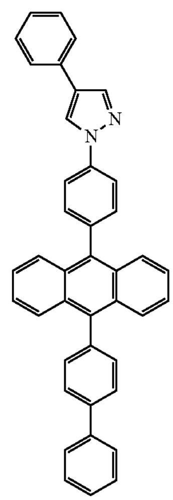
1-59
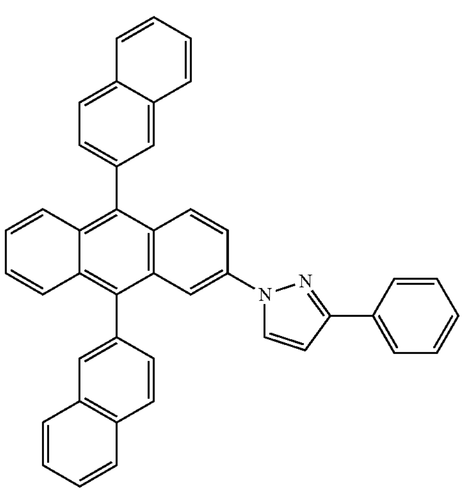
1-60
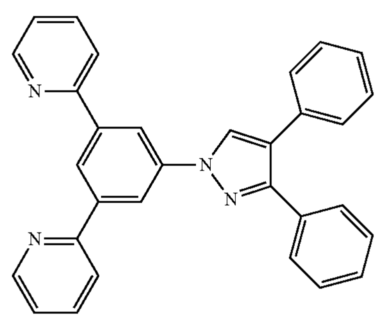

-continued
1-61
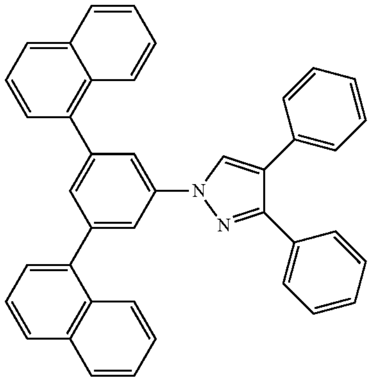
1-62
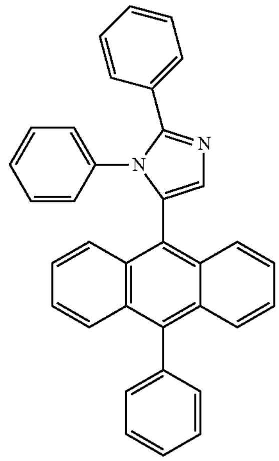
1-63
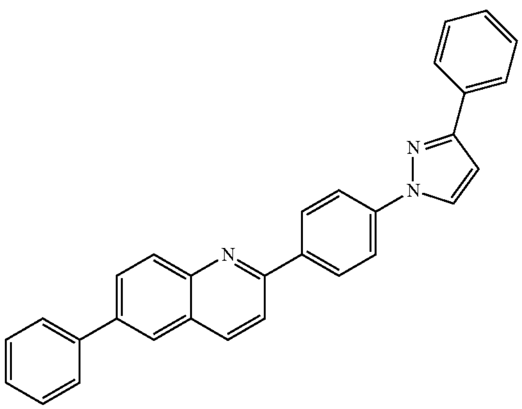
1-64
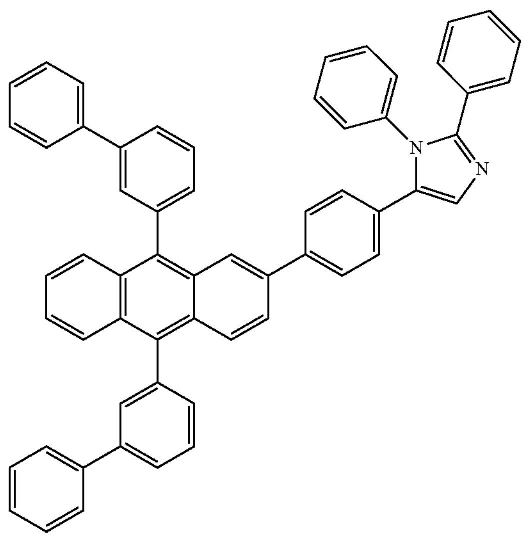
1-65
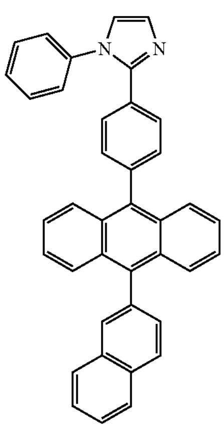
1-66
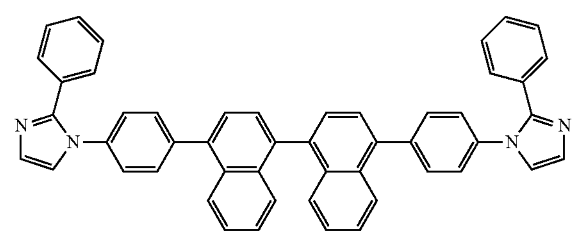

-continued
1-67
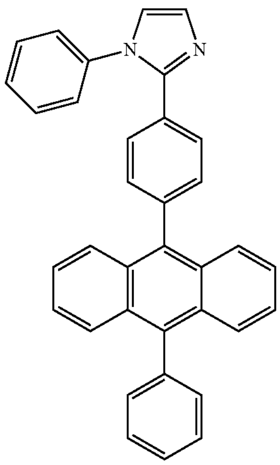
1-68
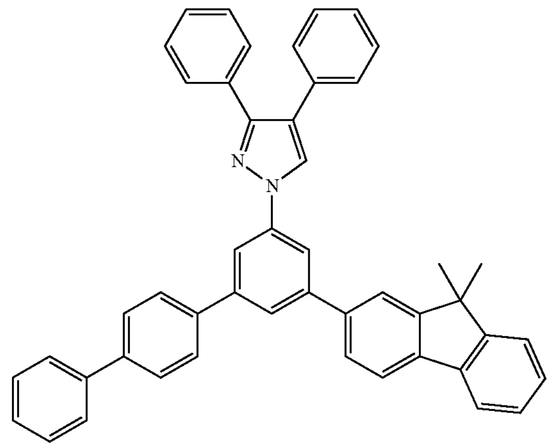
1-69
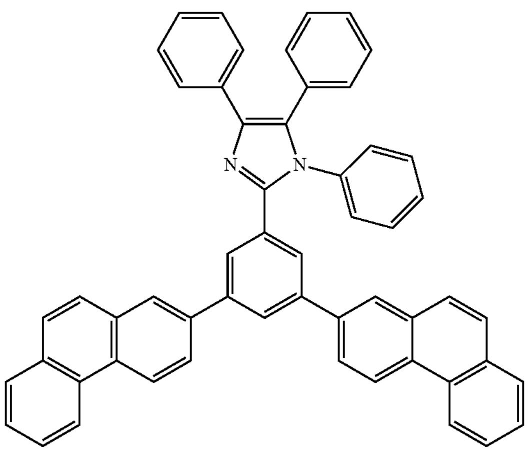
1-70
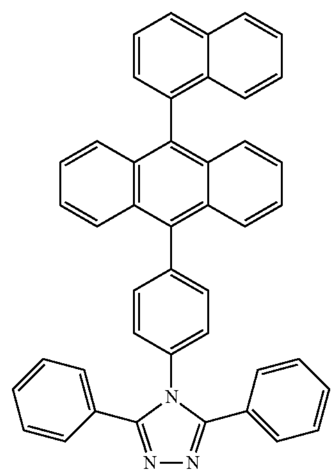
1-71
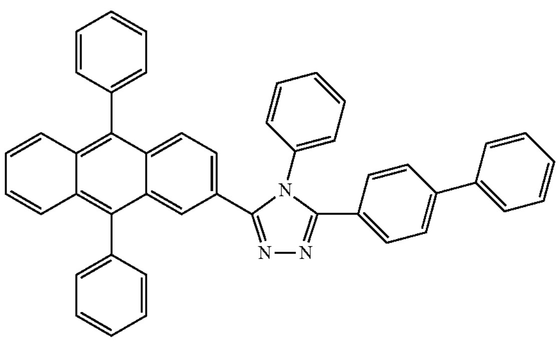
1-72
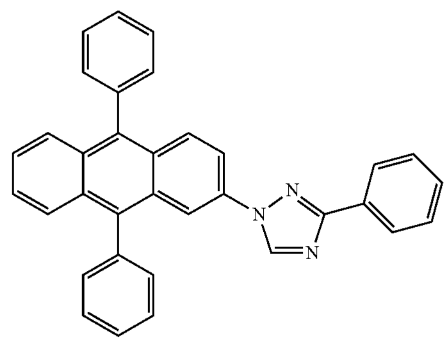

-continued
1-73
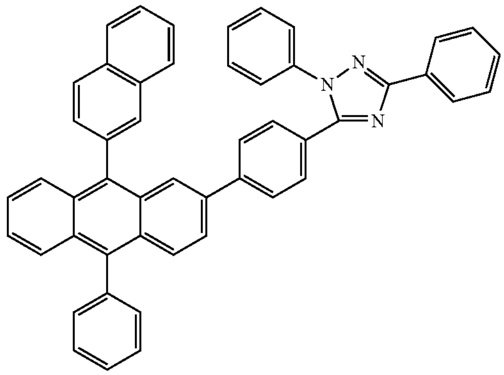
1-74
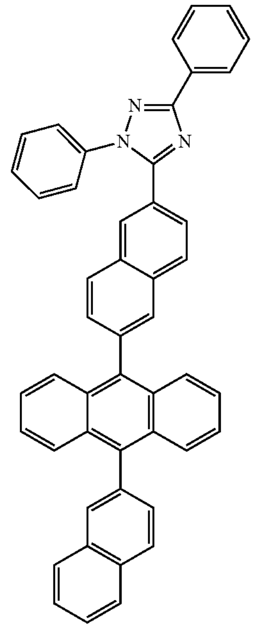
1-75
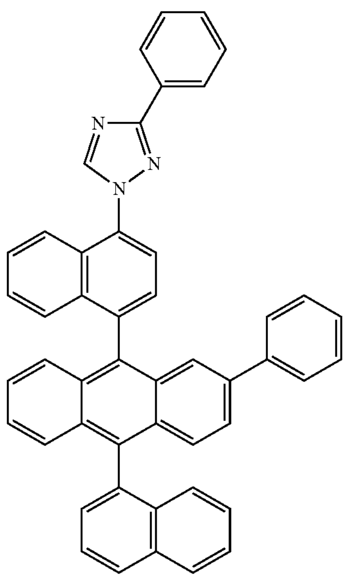
1-76
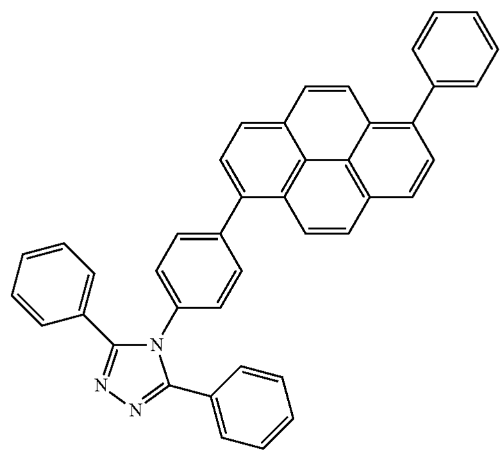
1-77
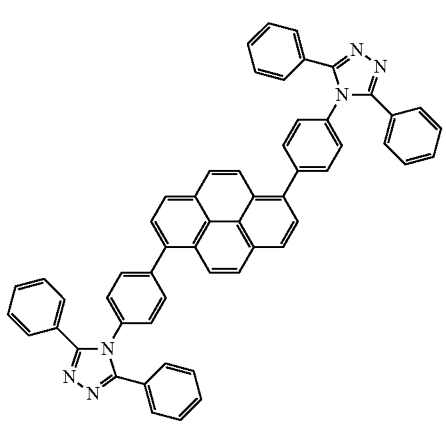
1-78
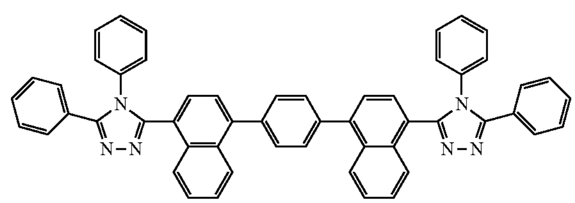

-continued
1-79
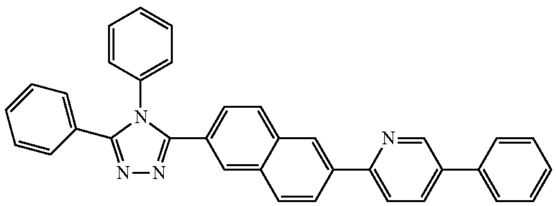
1-80
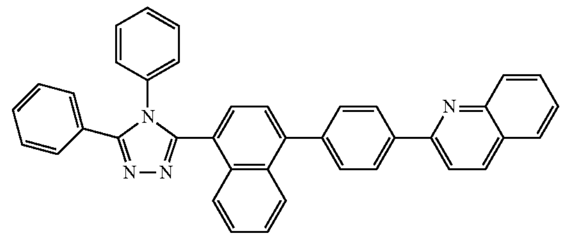
1-81
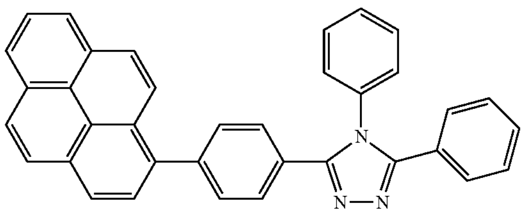
1-82
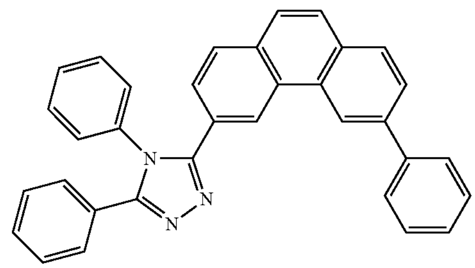
1-83
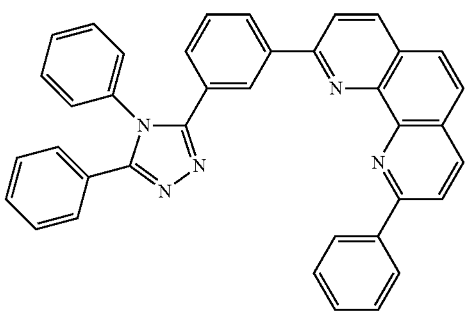
1-84
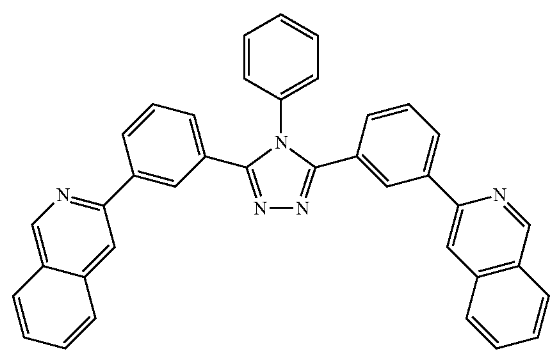
1-85
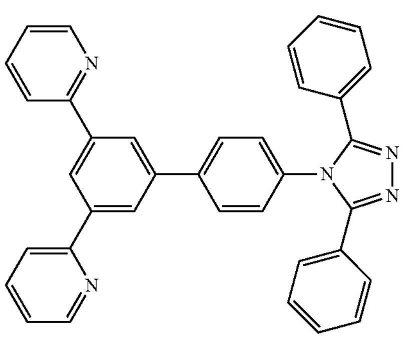
1-86
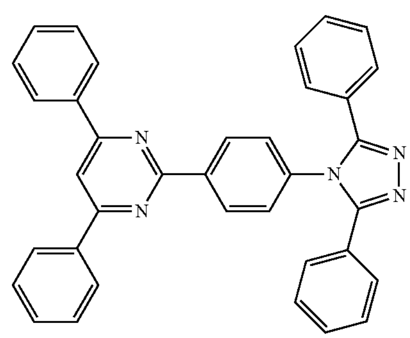

-continued
1-87
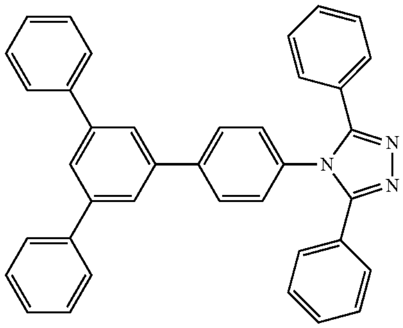
1-88
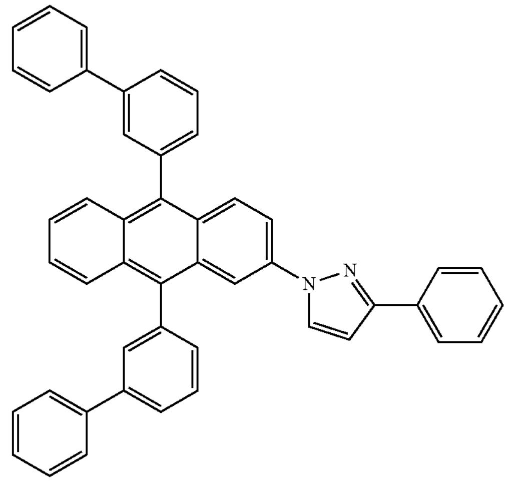
1-89
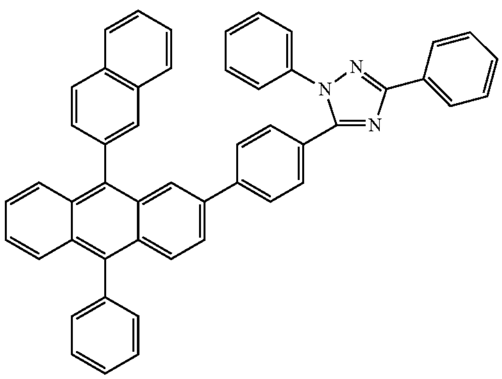
1-90
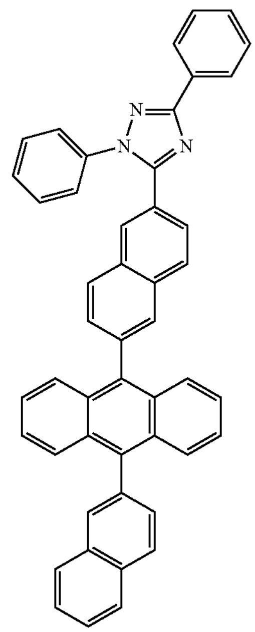
1-91
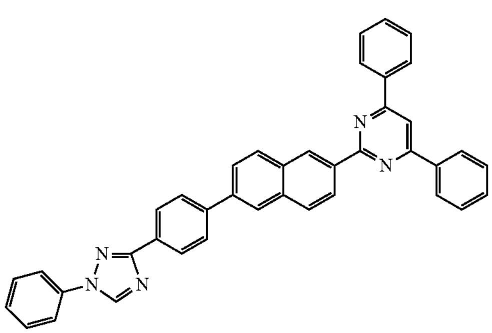
1-92
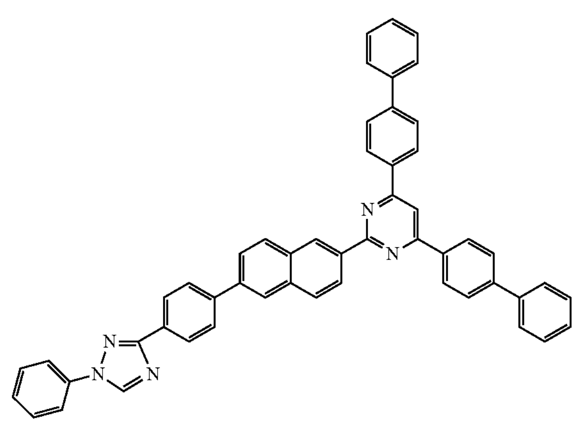

-continued
1-93
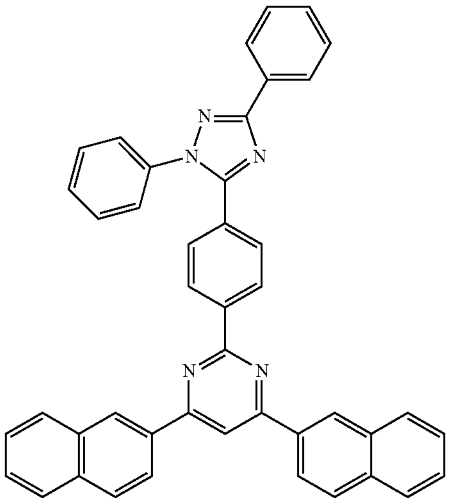
1-94
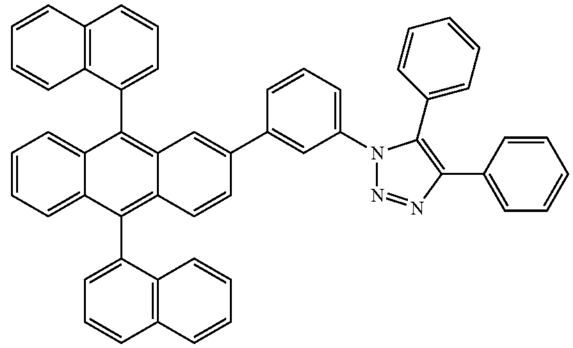
1-95
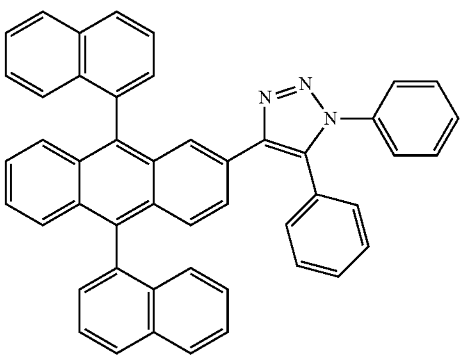
1-96
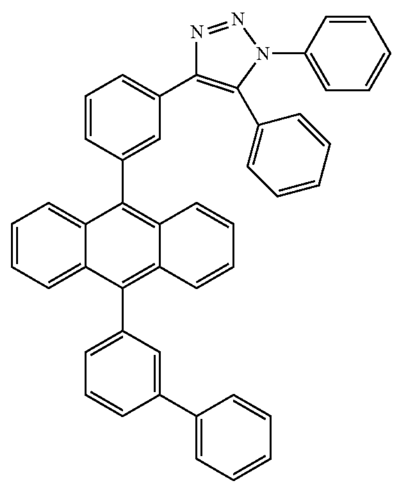
1-97
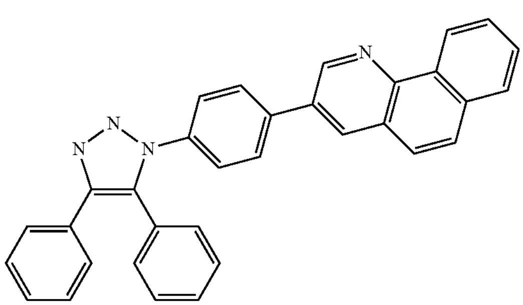
1-98
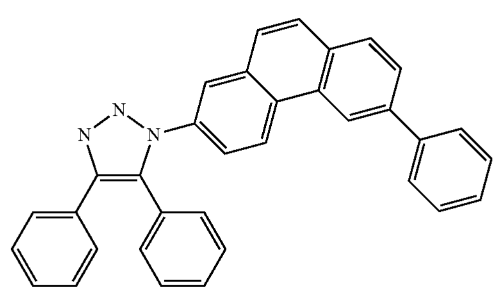

-continued
1-99
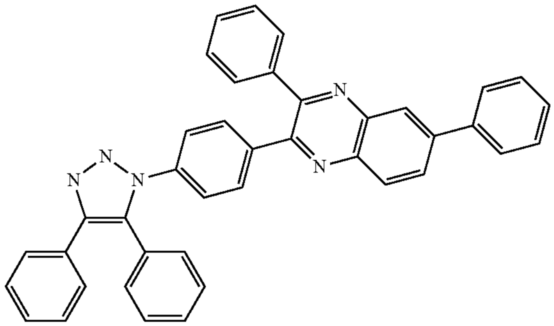
1-100
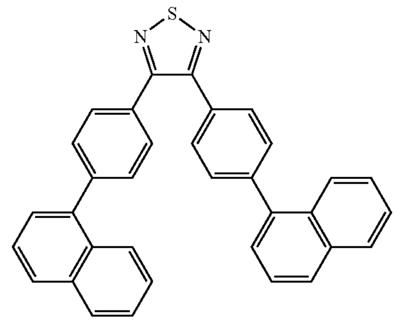
1-101
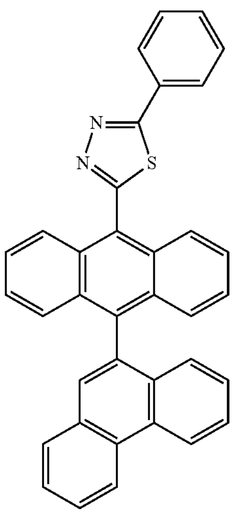
1-102
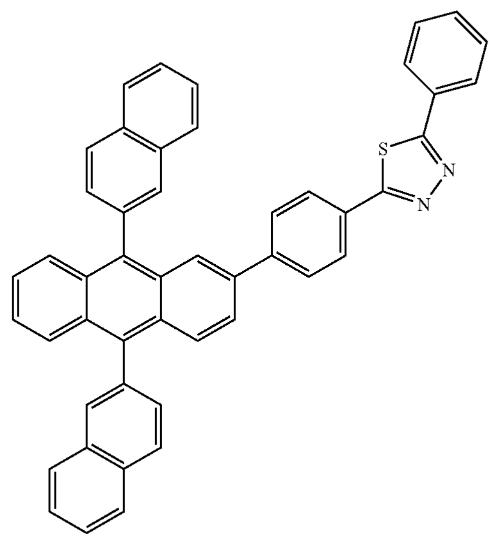
1-103
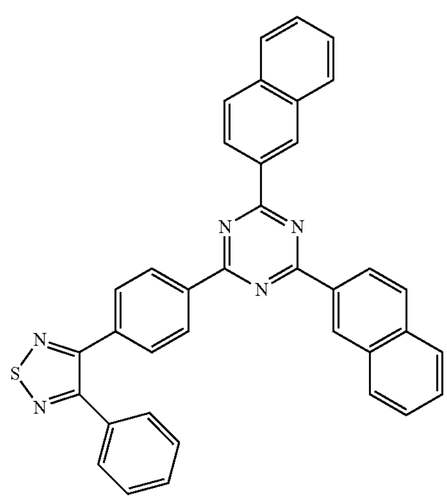
1-104
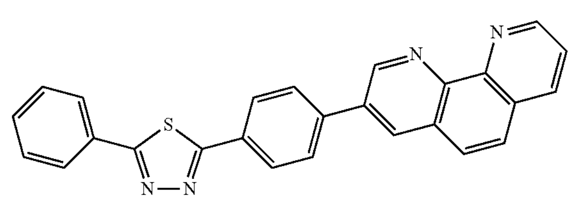

-continued
1-105
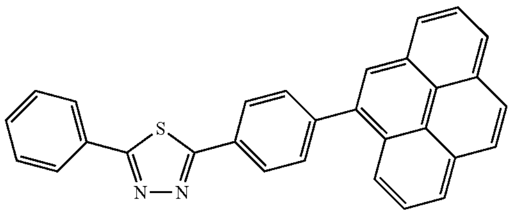
1-106
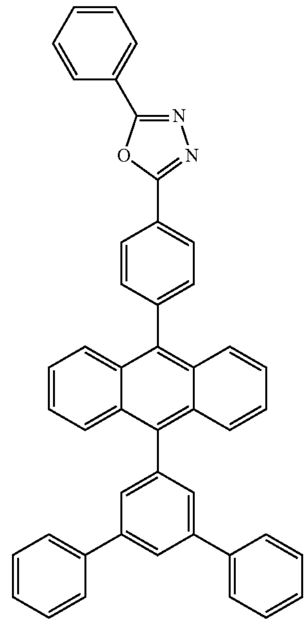
1-107
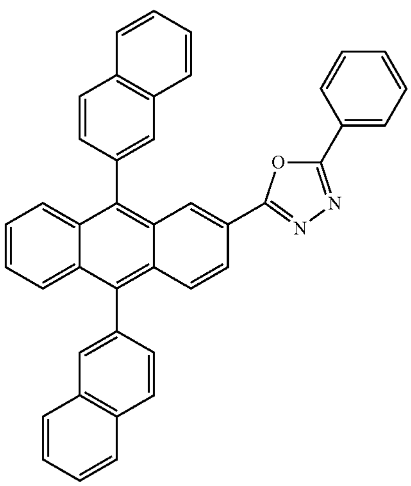
1-108
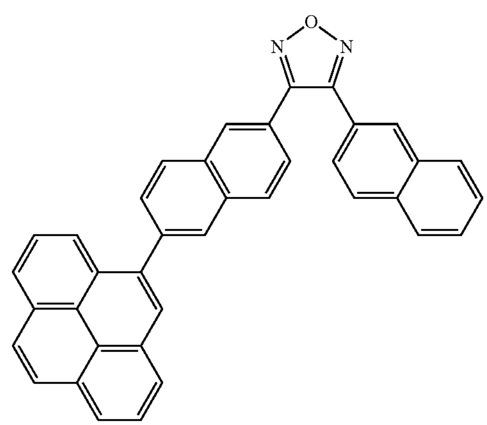
1-109
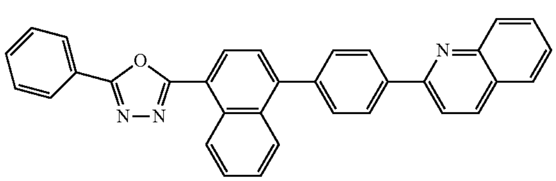
1-110
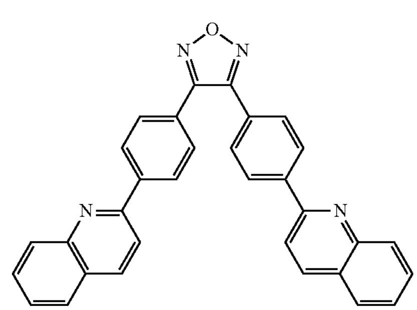

-continued
1-111
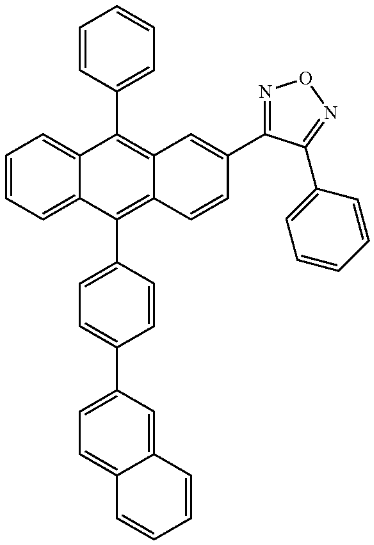
1-112
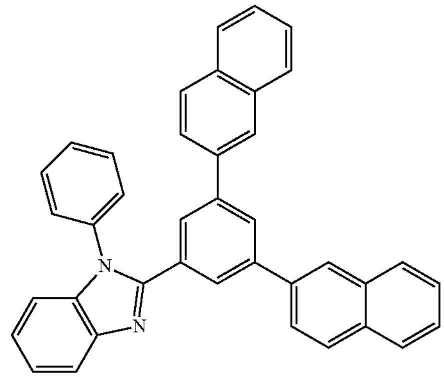
1-113
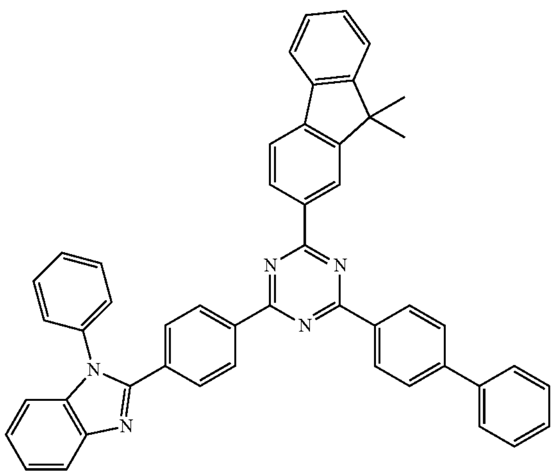
1-114
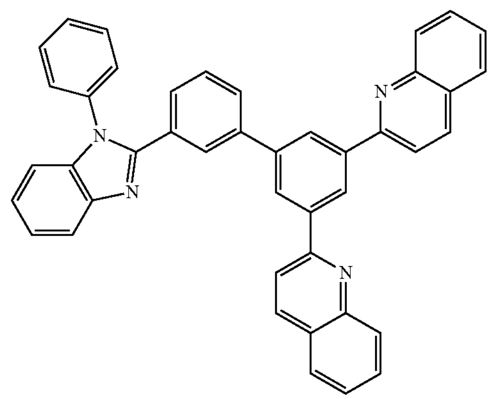
1-115
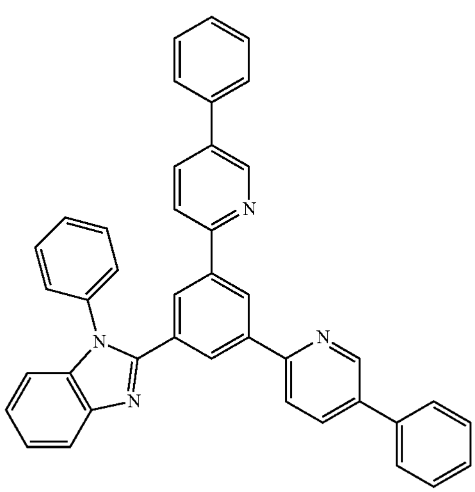
1-116
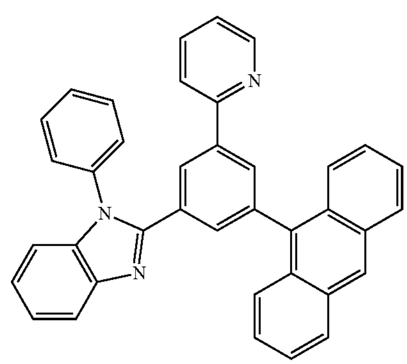

-continued
1-117
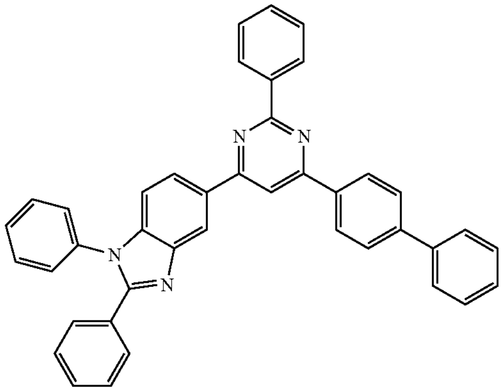
1-118
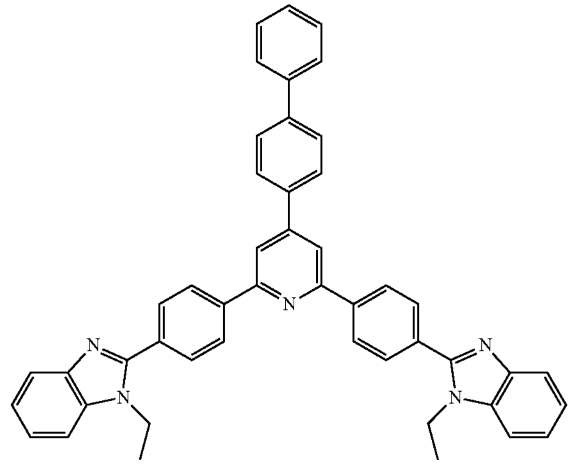
1-119
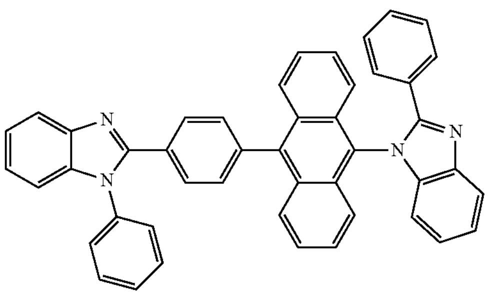
1-120
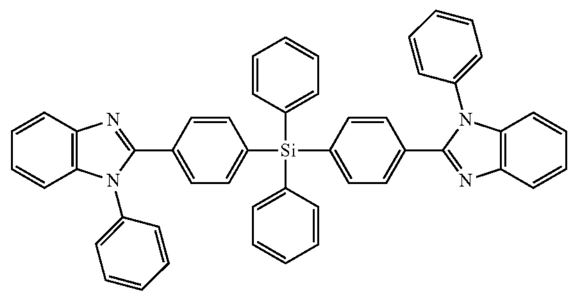
1-121
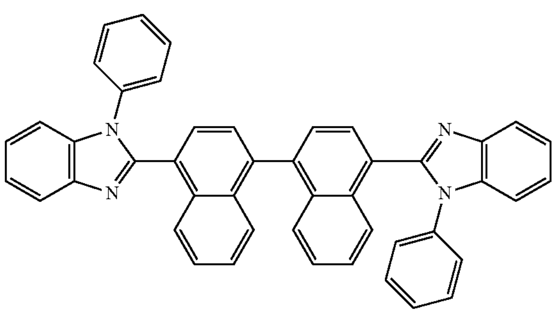
1-122
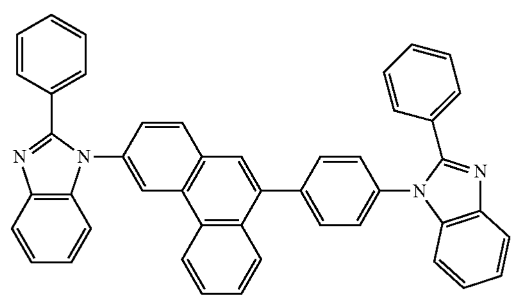
1-123
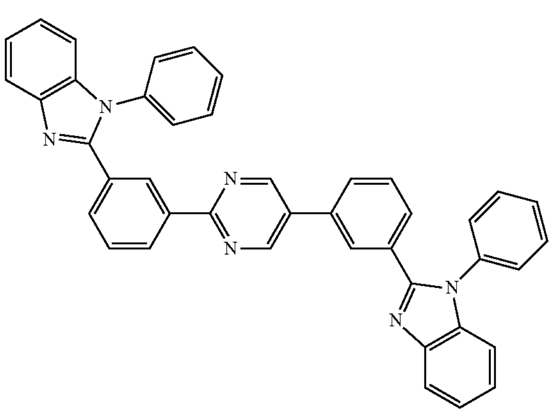
1-124
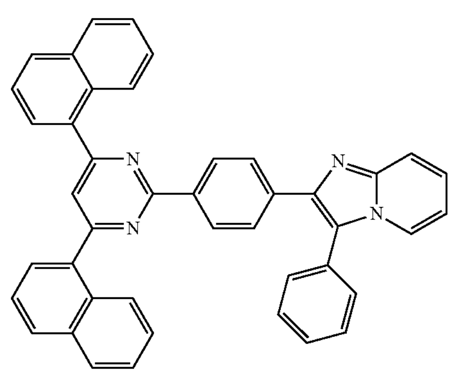

-continued
1-125
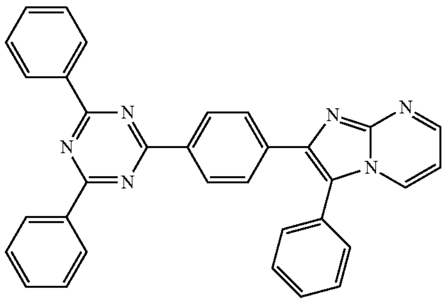
1-126
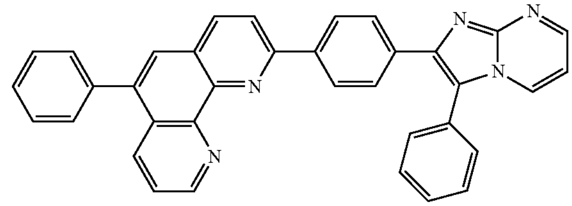
1-127
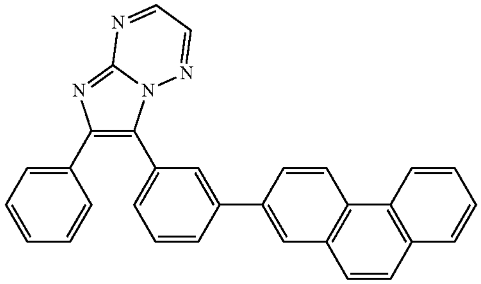
1-128
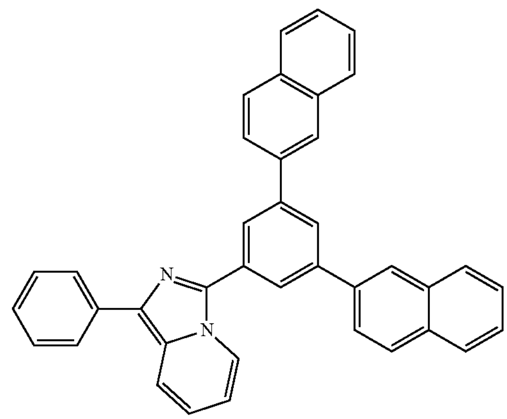
1-129
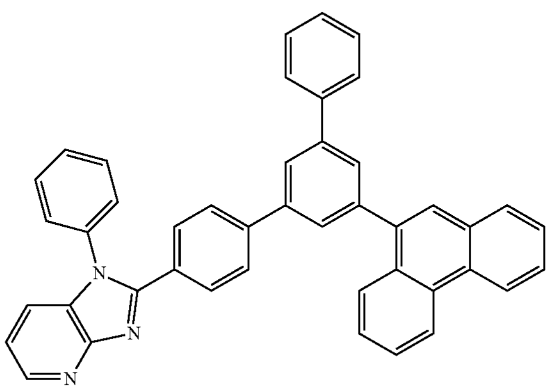
1-130
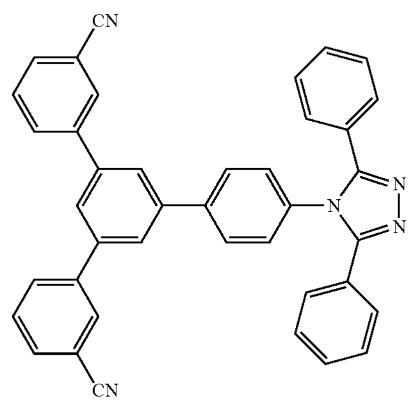
1-131
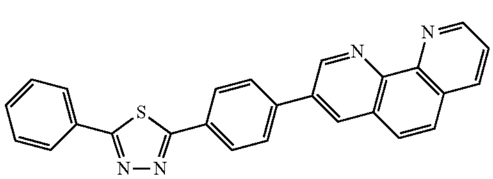
1-132
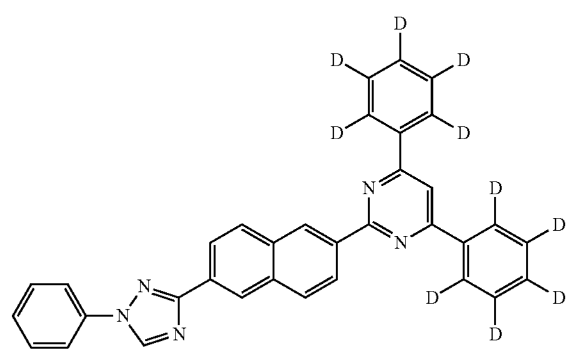

-continued
1-133
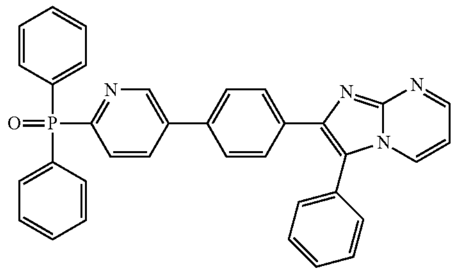
1-134
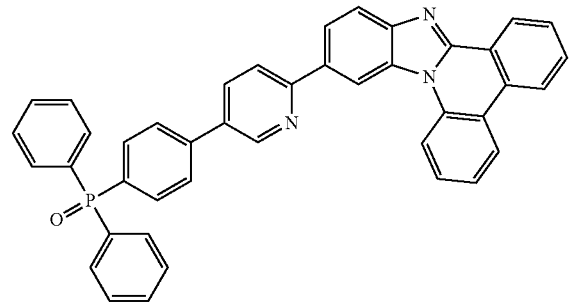
1-135
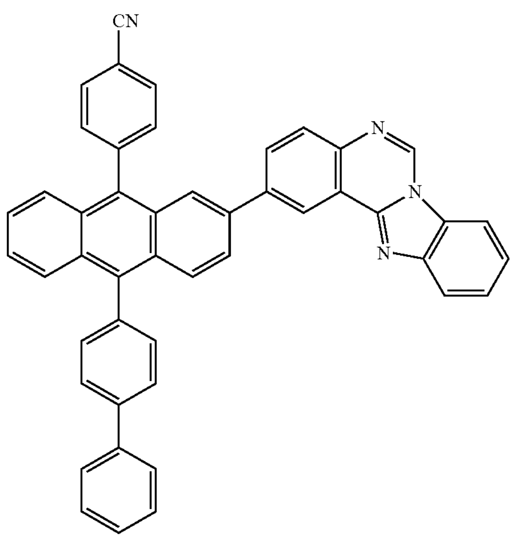
1-136
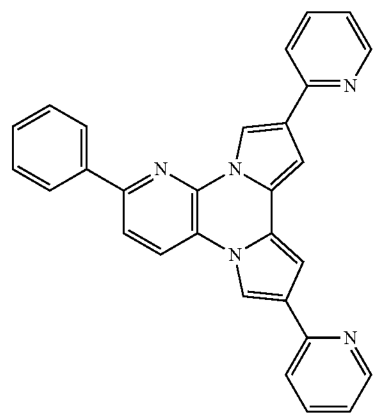
1-137
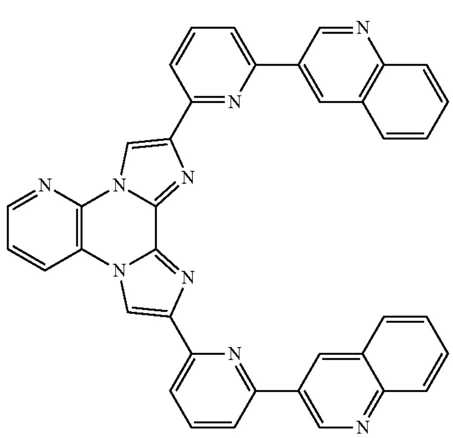
1-138
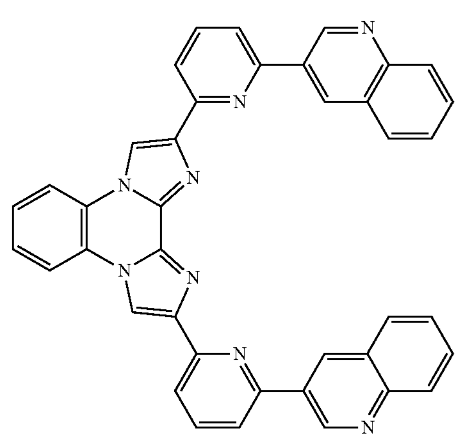

-continued
1-139
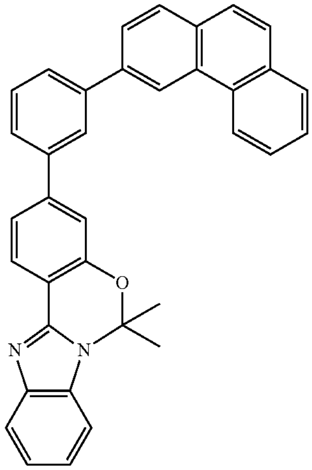
1-140
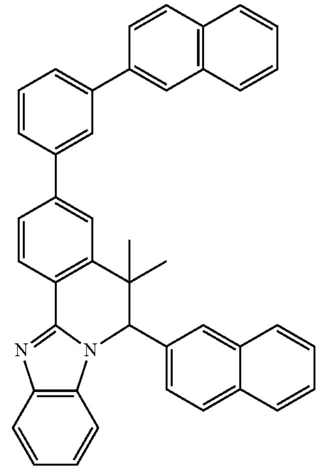
1-141
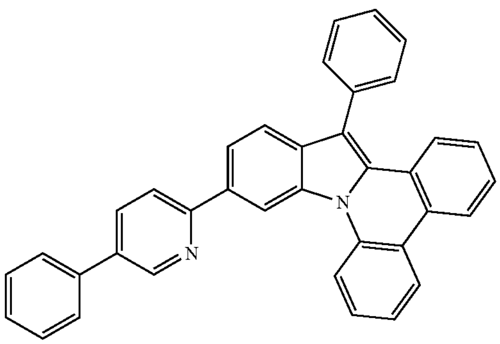
1-142
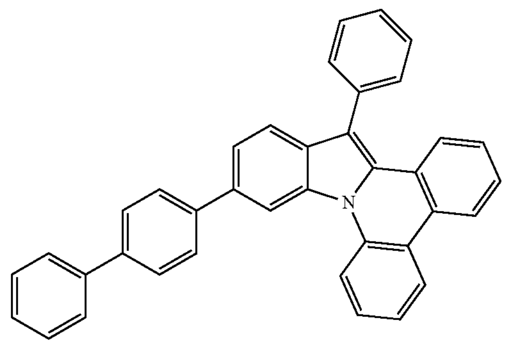
1-143
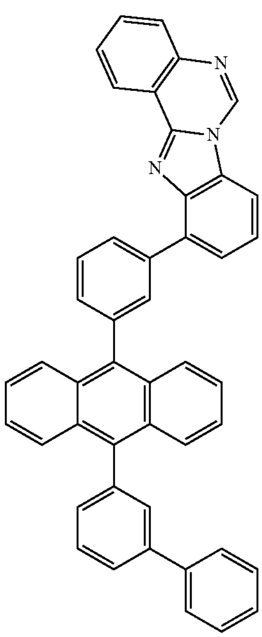
1-144
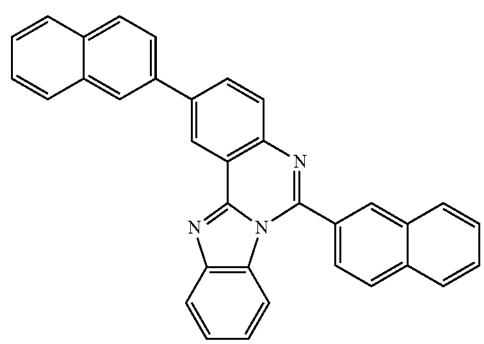

-continued
1-145
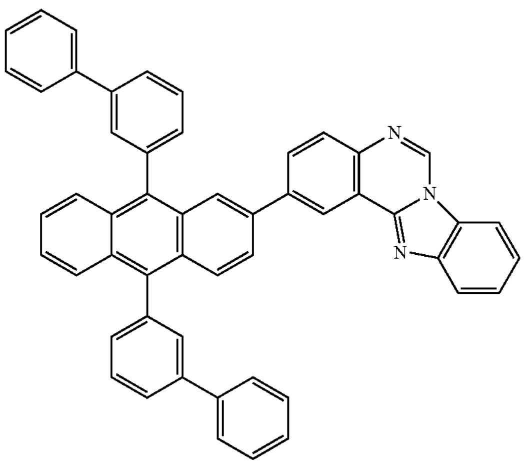
1-146
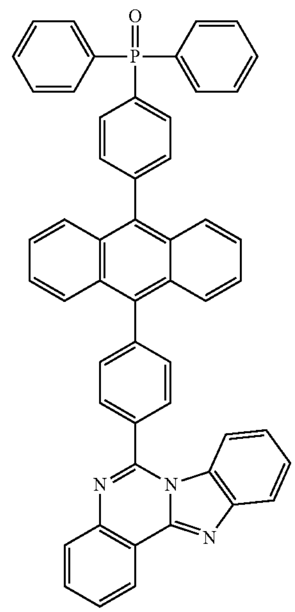
1-147
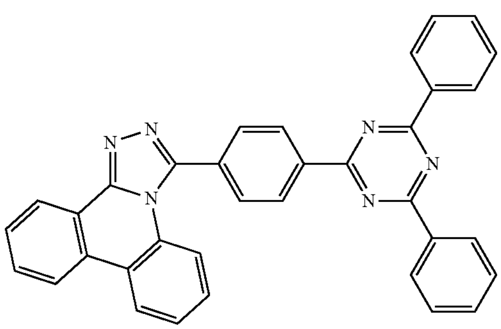
1-148
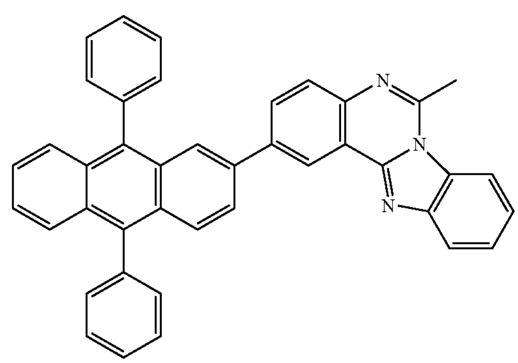
1-149
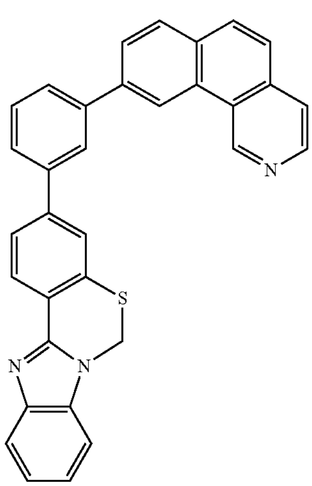
1-150
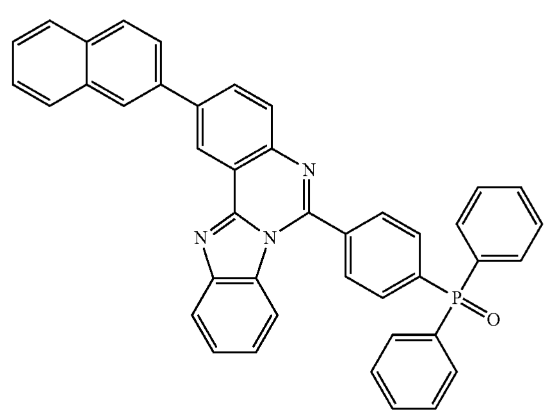

-continued
1-151
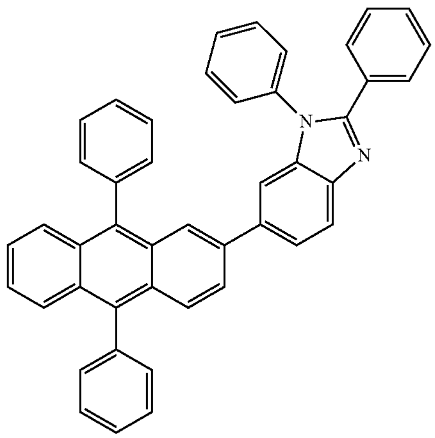
1-152
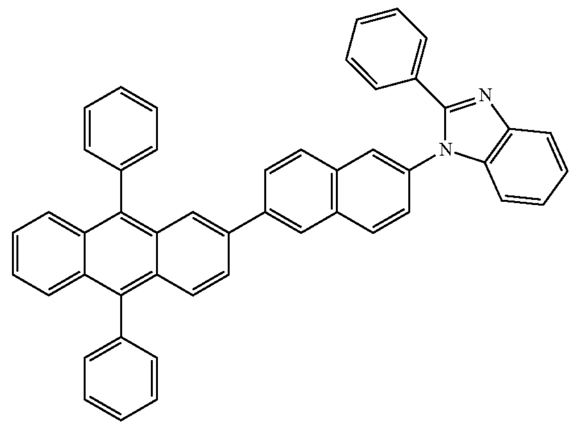
1-153
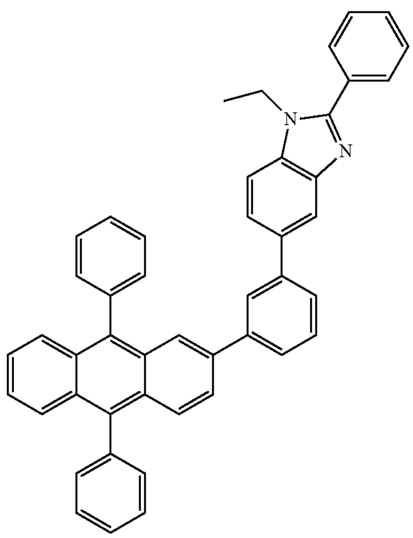
1-154
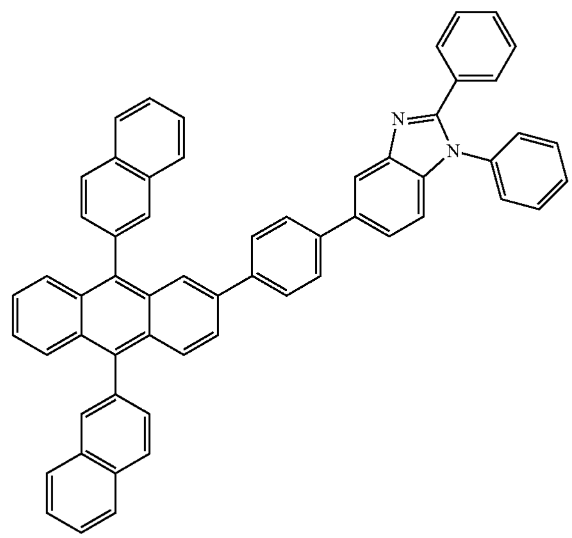
1-155
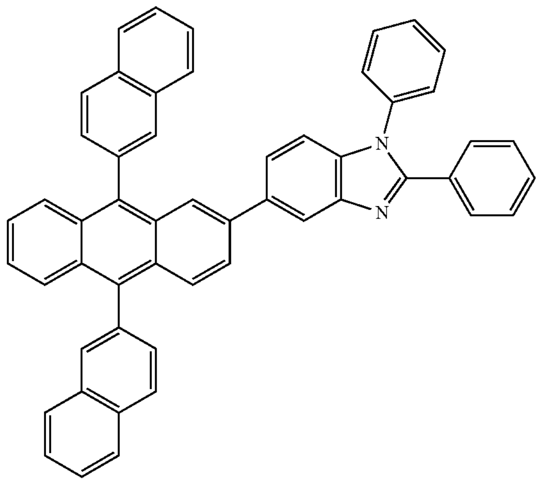
1-156
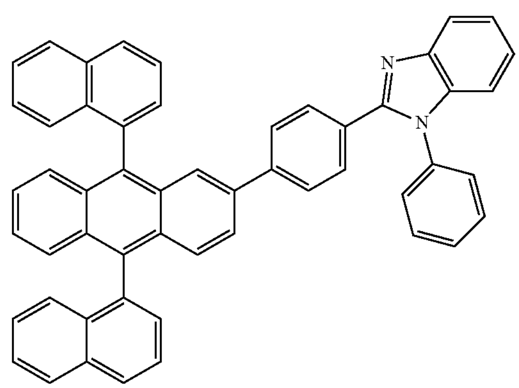

-continued
1-157
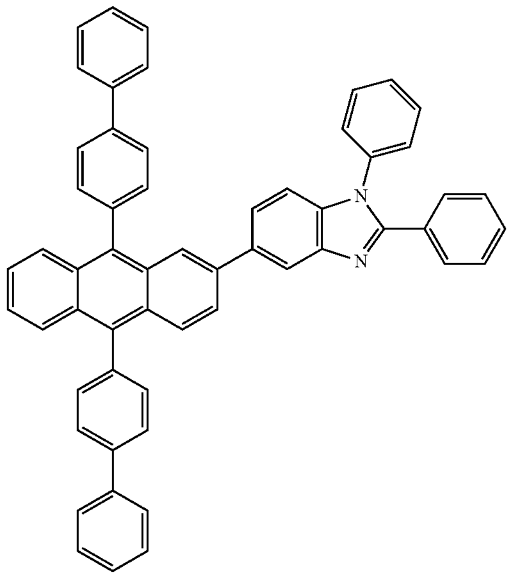
1-158
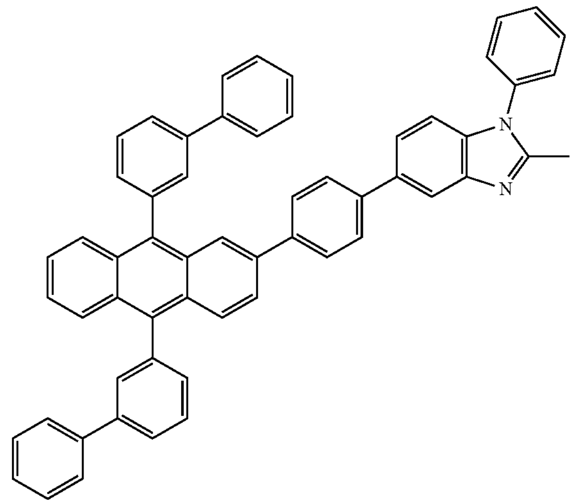
1-159
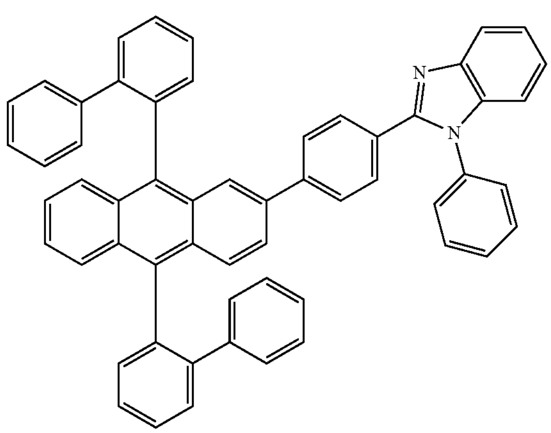
1-160
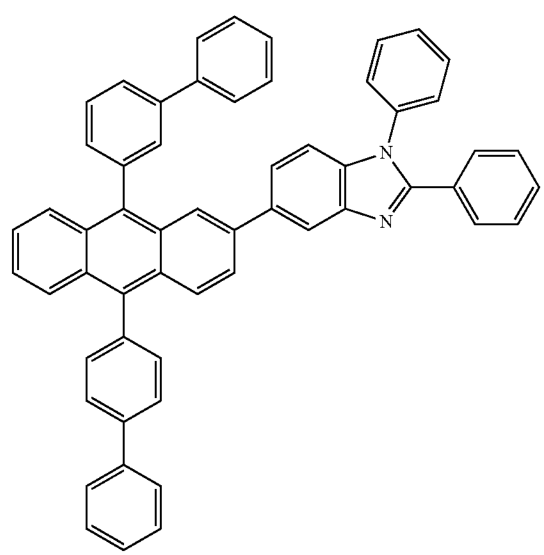

-continued
1-161
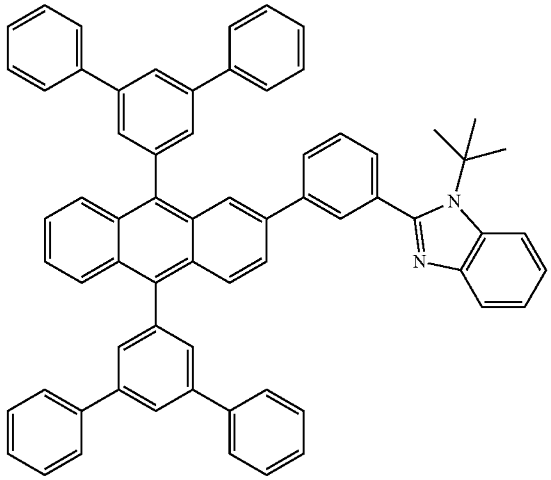
1-162
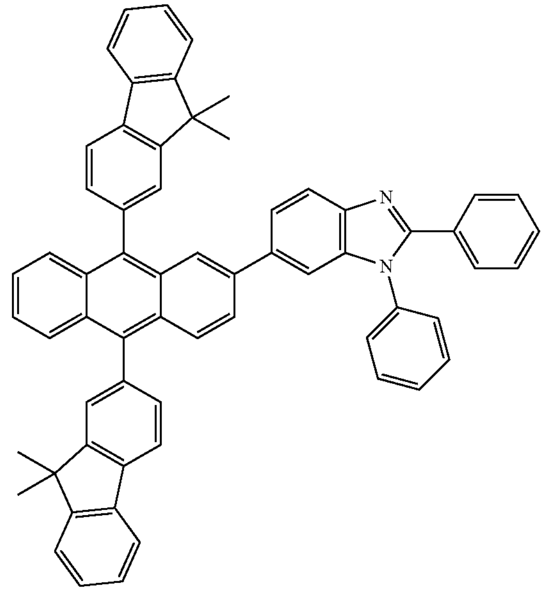
1-163
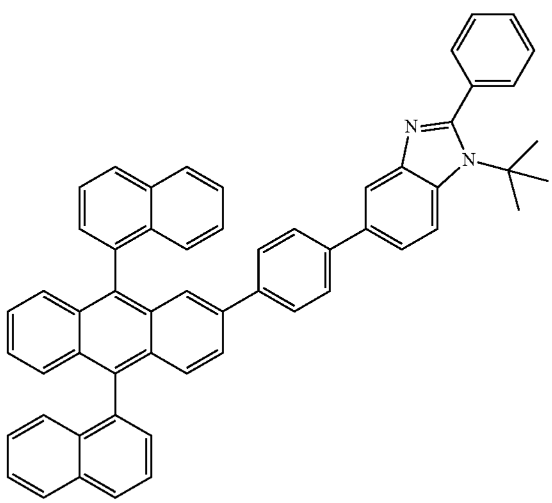
1-164
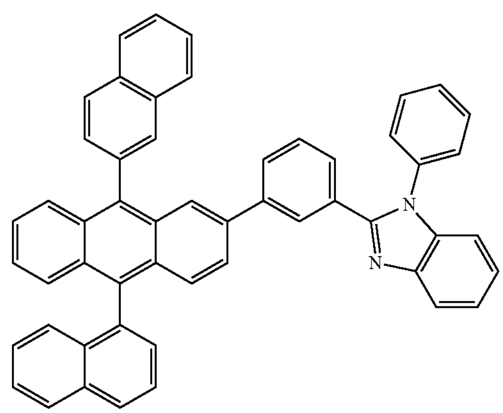
1-165
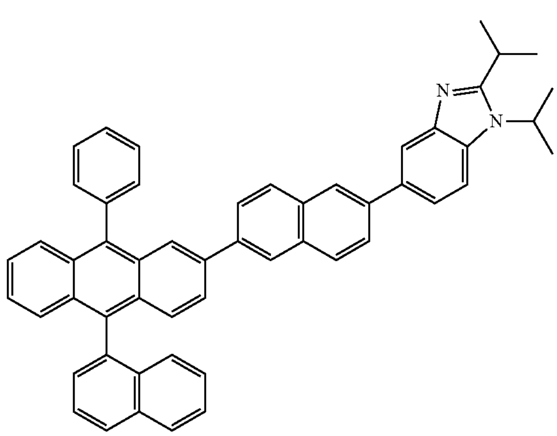
1-166
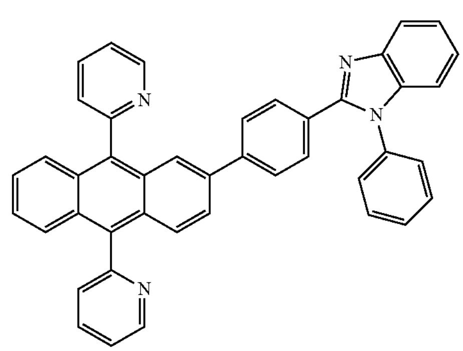

-continued
1-167
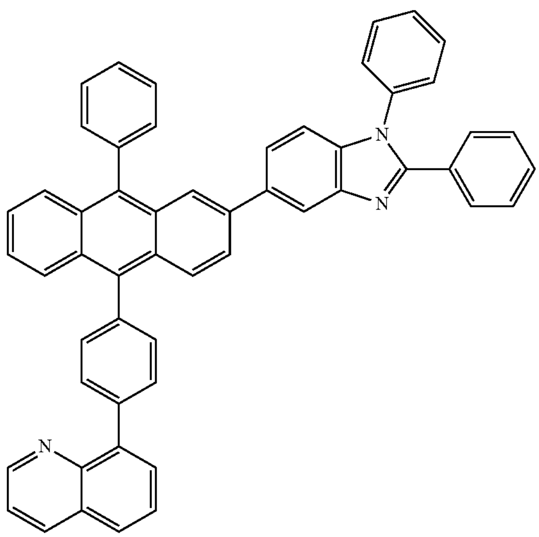
1-168
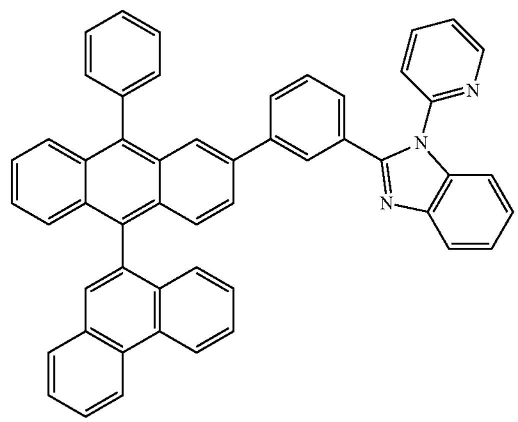
1-169
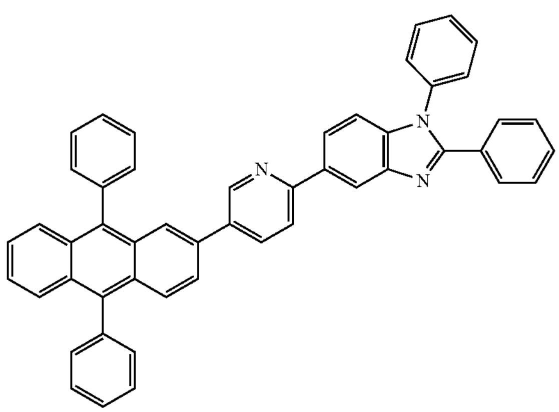
1-170
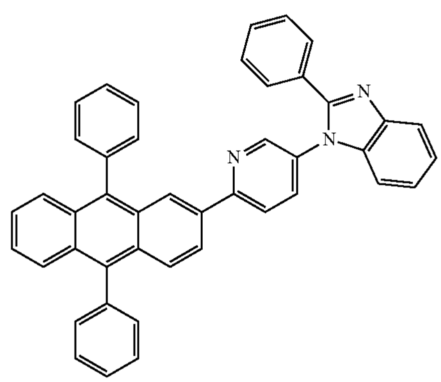
1-171
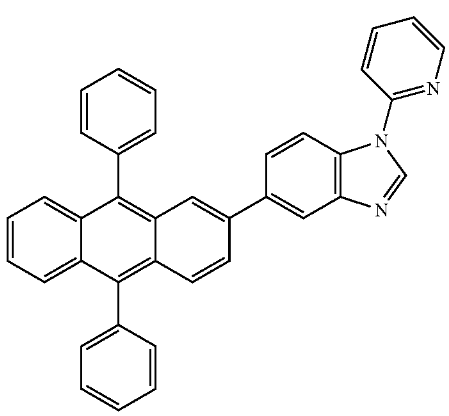
1-172
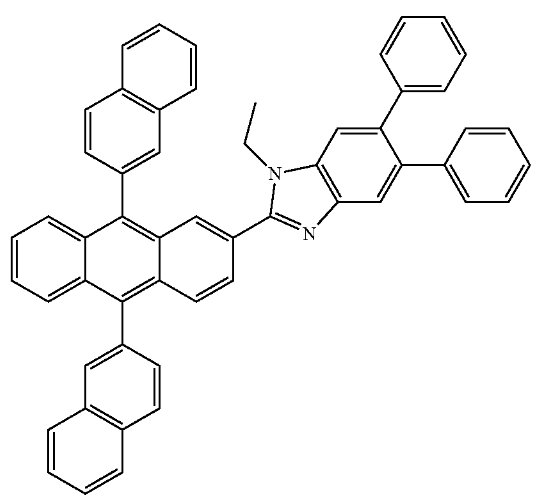

-continued
1-173
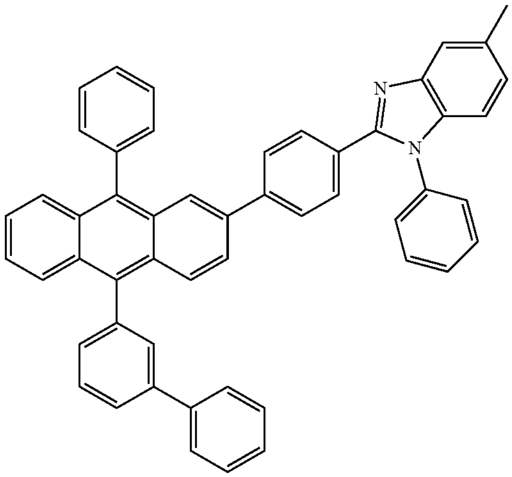
1-174
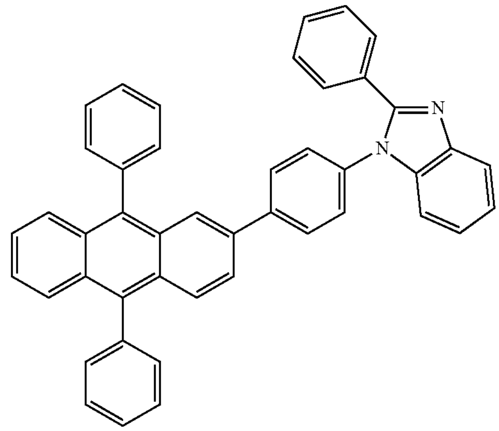
1-175
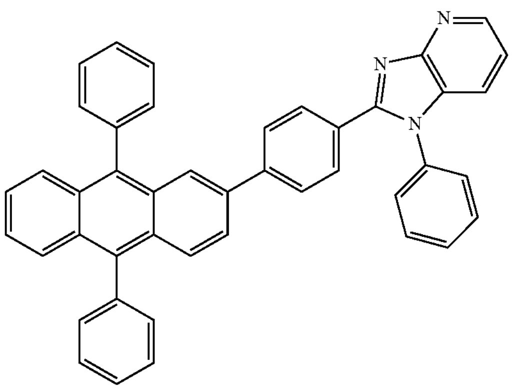
1-176
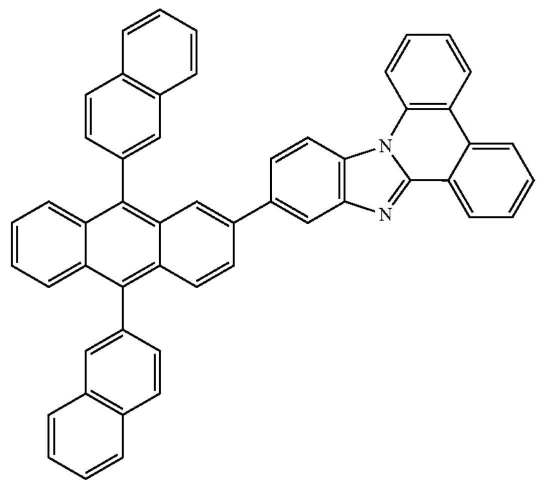
1-177
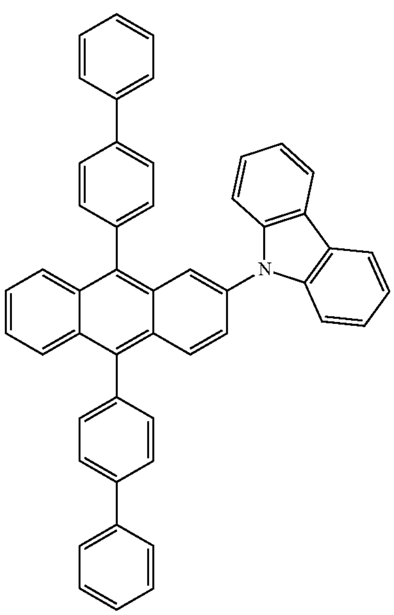
1-178
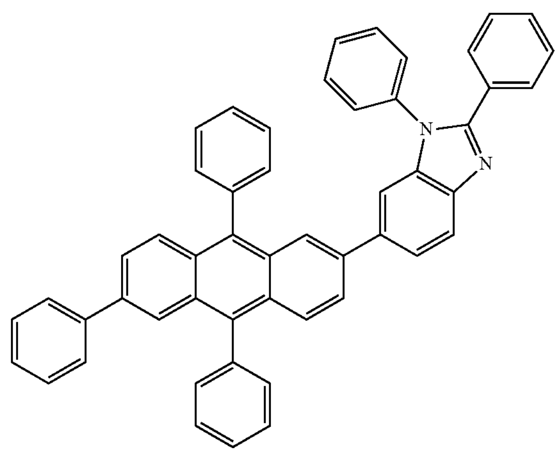

-continued
1-179
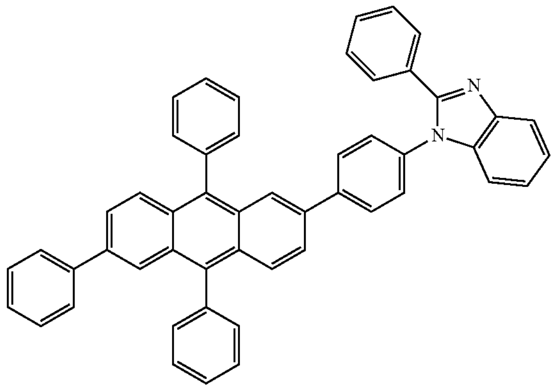
1-180
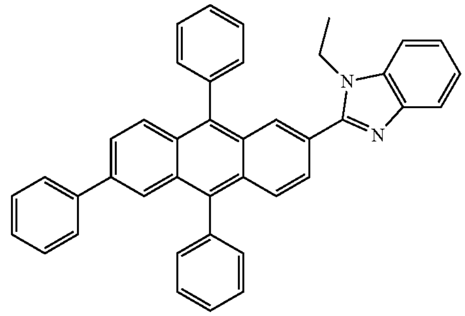
1-181
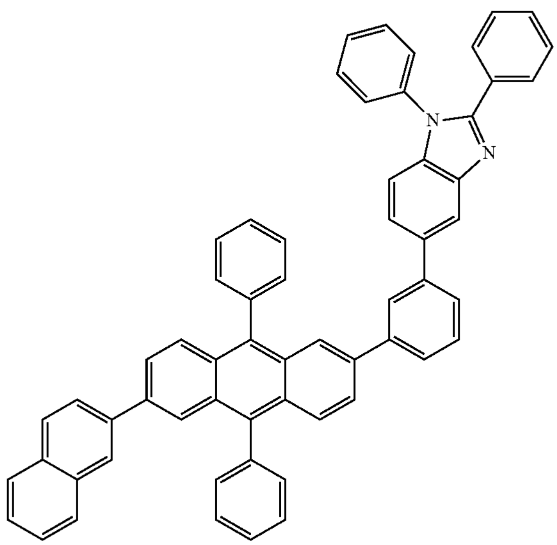
1-182
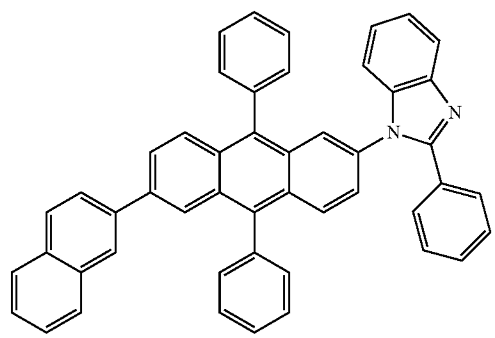
1-183
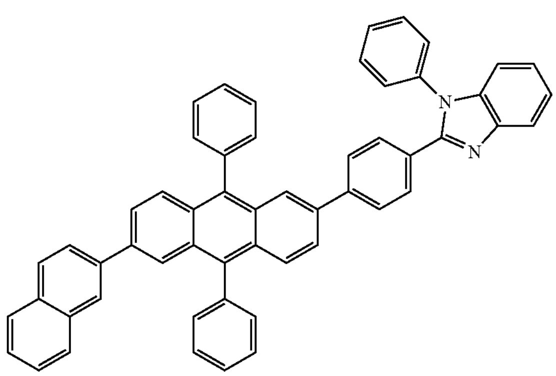
1-184
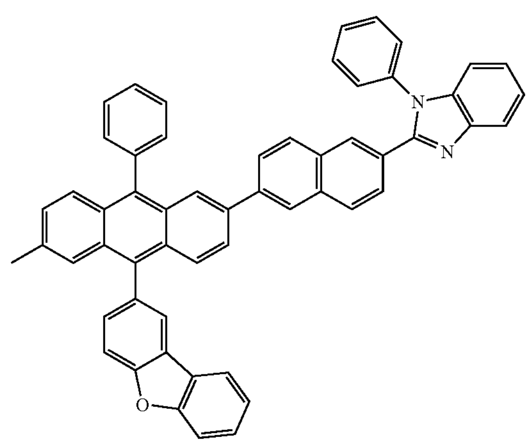

-continued
1-185
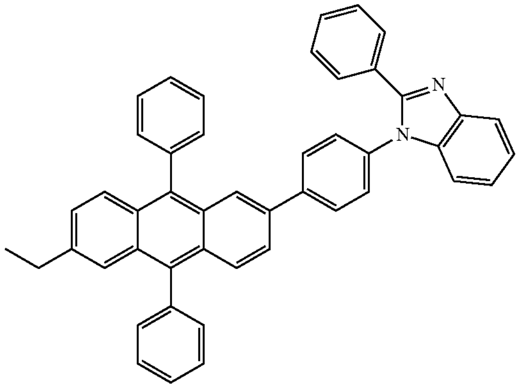
1-186
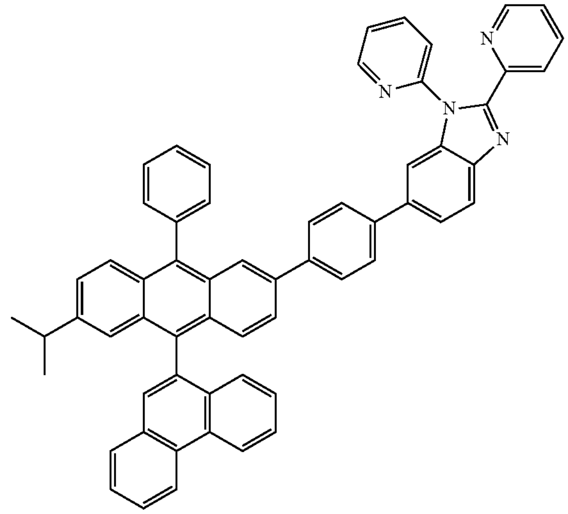
1-187
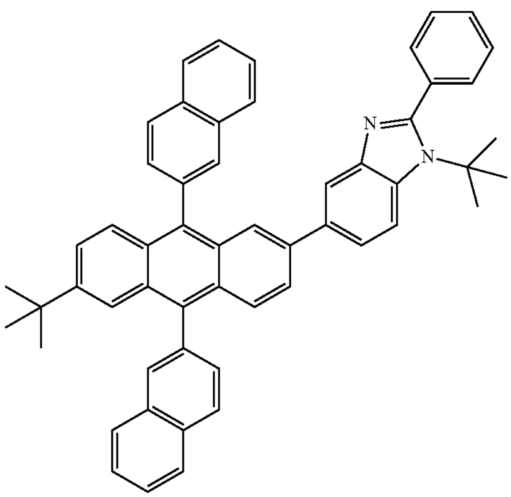
1-188
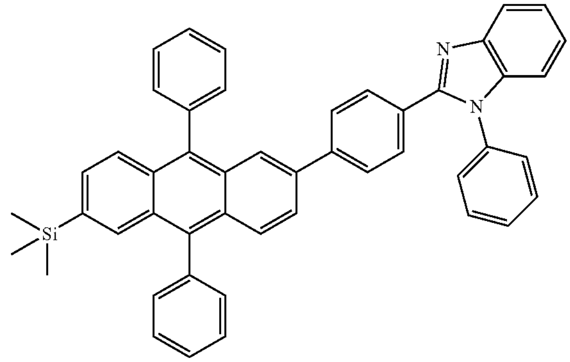
1-189
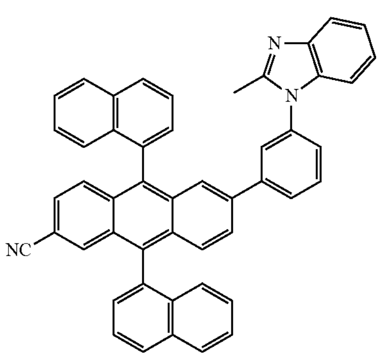
1-190
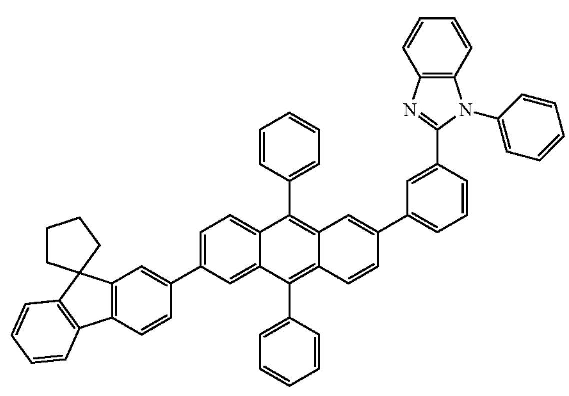

-continued
1-191
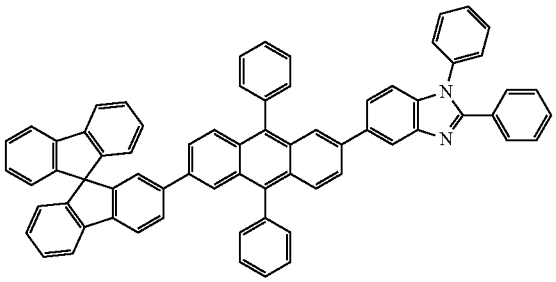
1-192
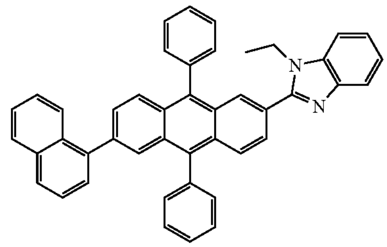
1-193
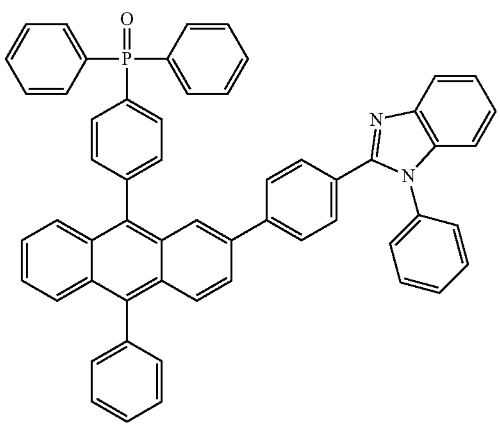
1-194
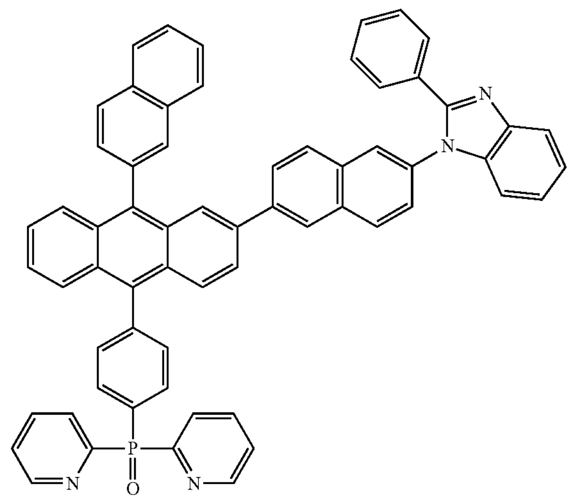
1-195
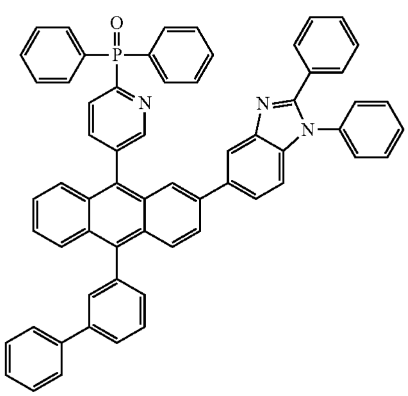
1-196
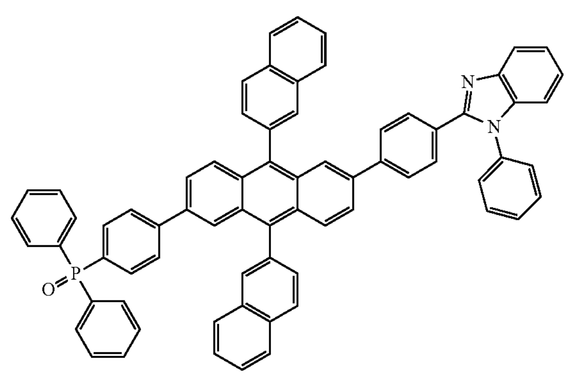

-continued
1-197
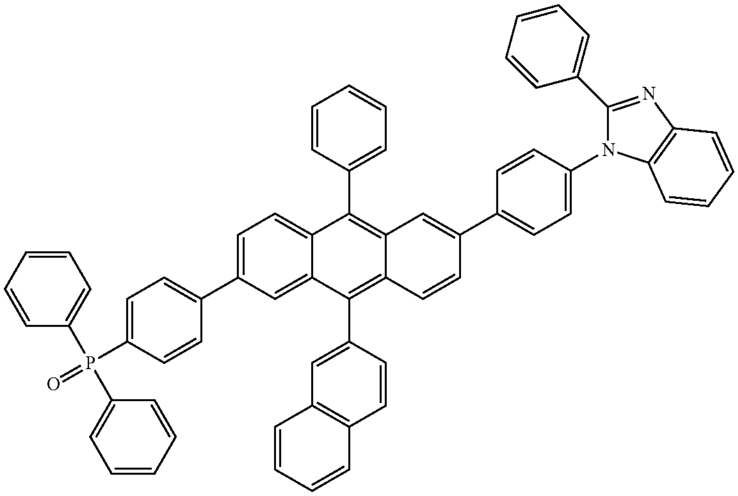
1-198
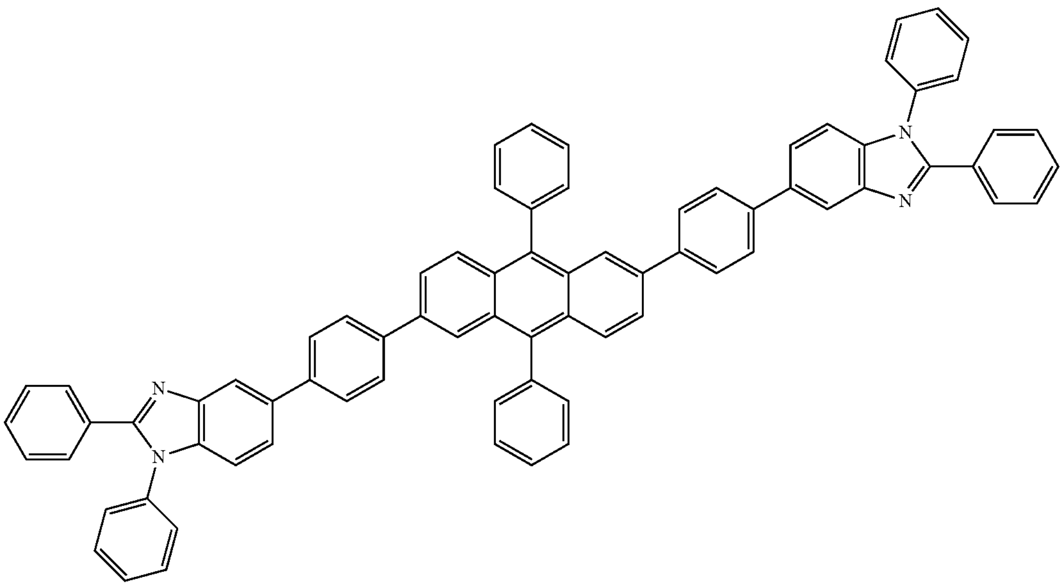
1-199
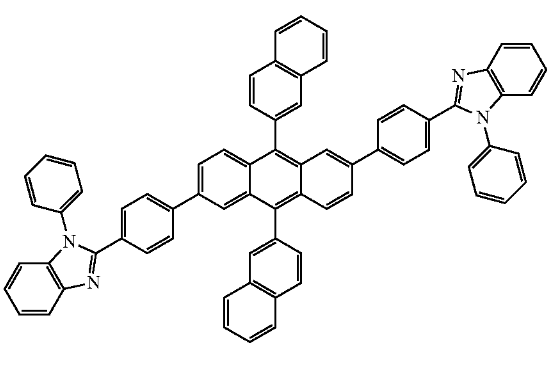
1-200
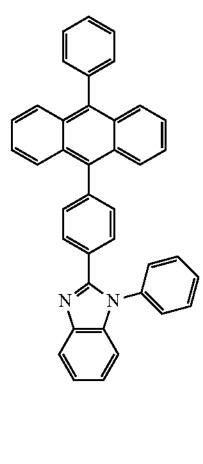

-continued
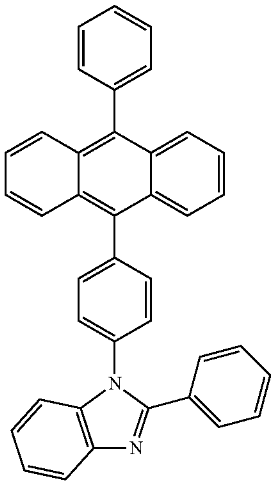
1-201
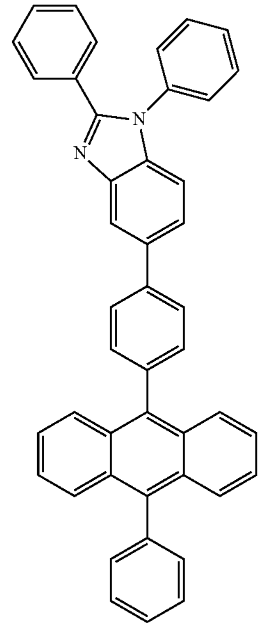
1-202
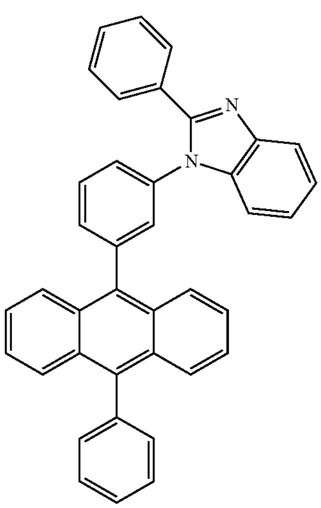
1-203
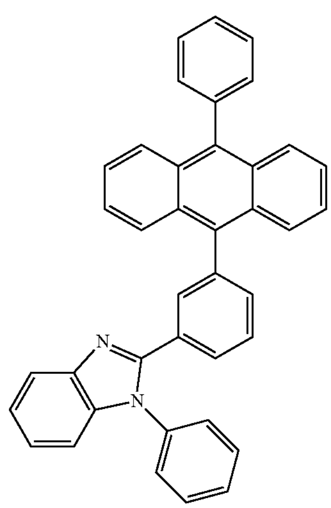
1-204

-continued
1-205
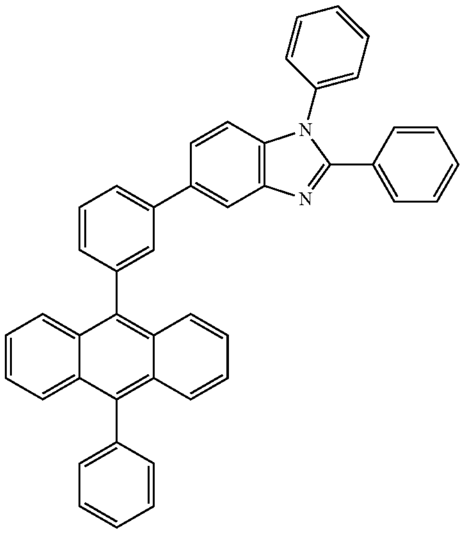
1-206
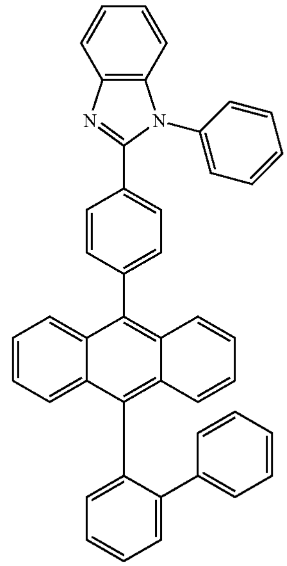
1-207
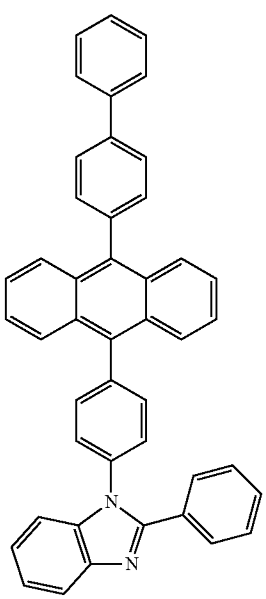
1-208
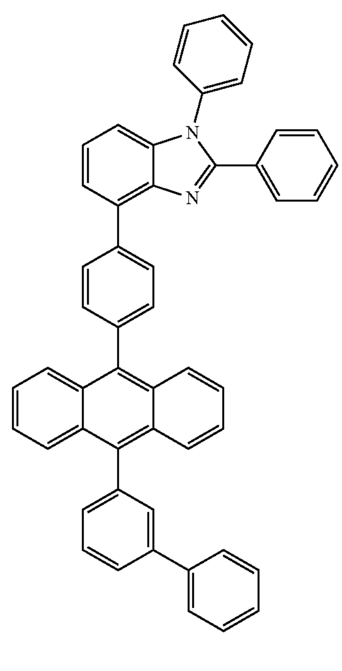

-continued
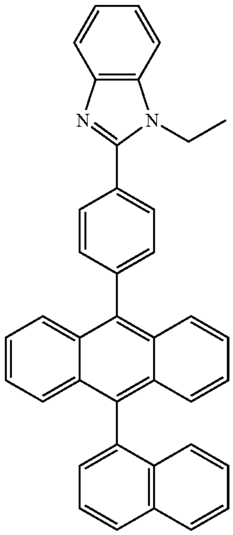
1-209
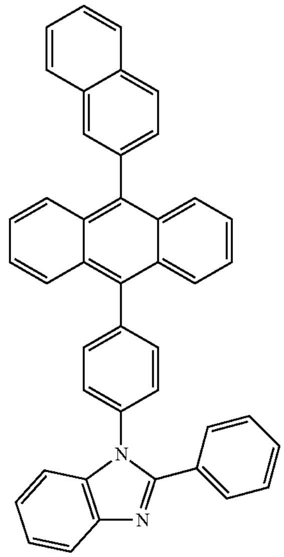
1-210
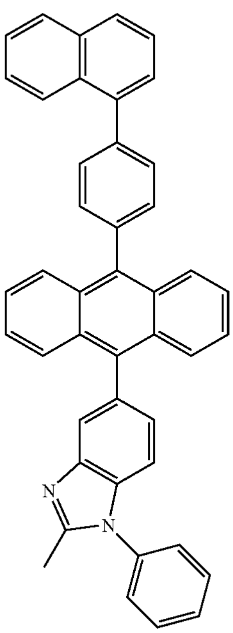
1-211
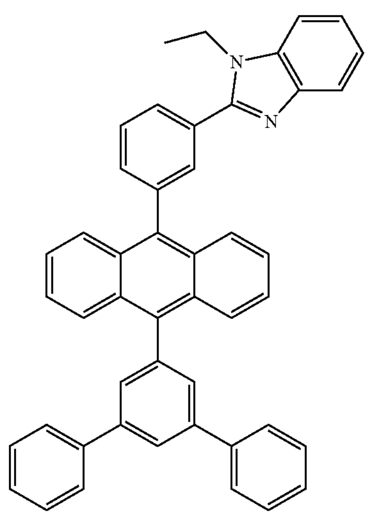
1-212

-continued
1-213
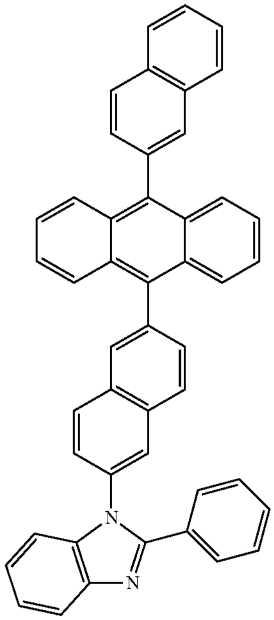
1-214
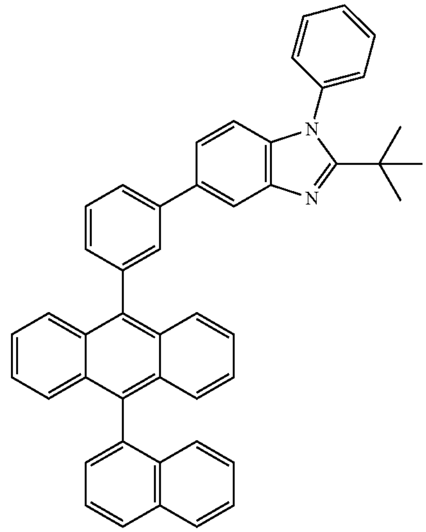
1-215
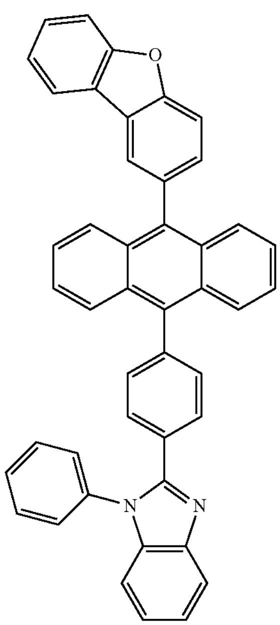
1-216
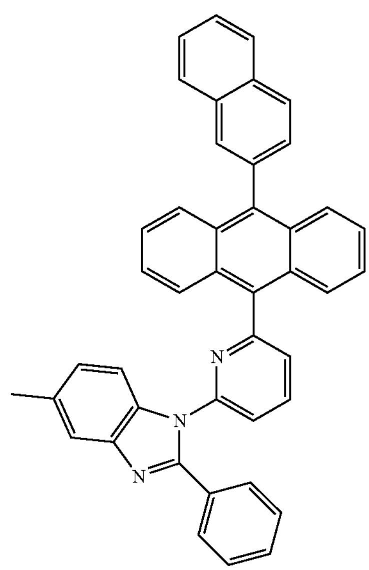

-continued
1-217
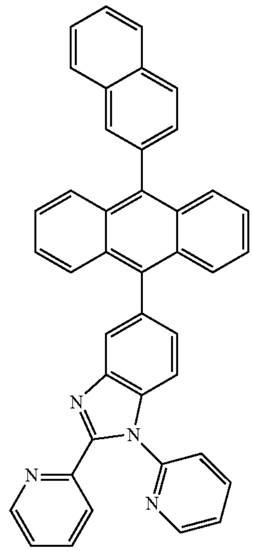
1-218
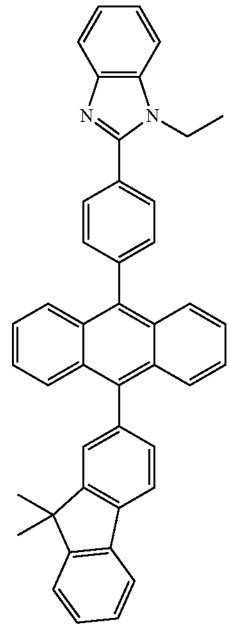
1-219
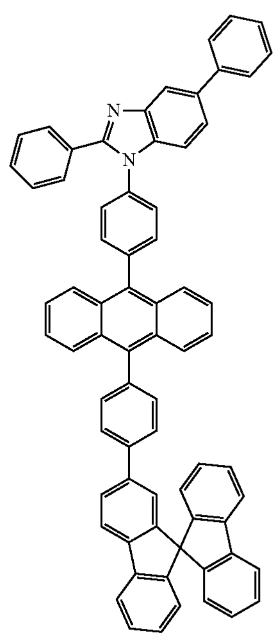
1-220
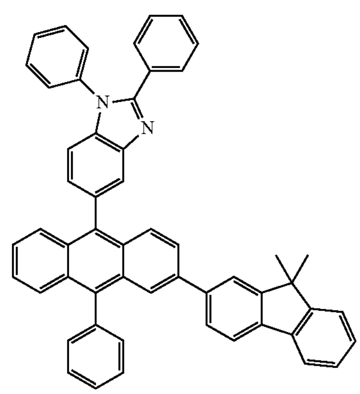

-continued
1-221
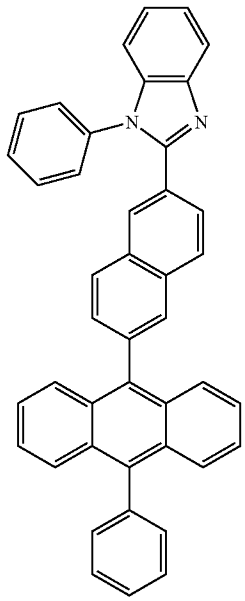
1-222
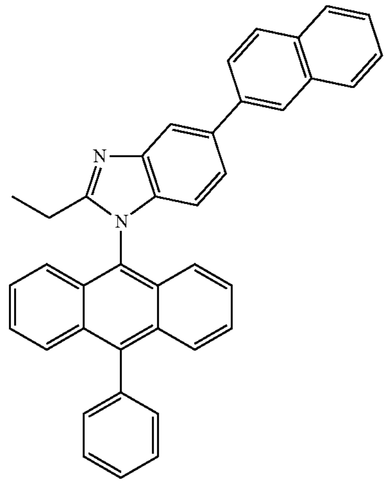
1-223
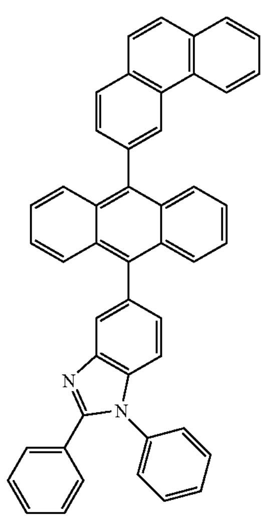
1-224
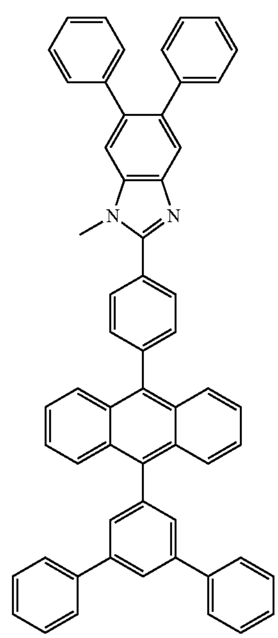

-continued
1-225
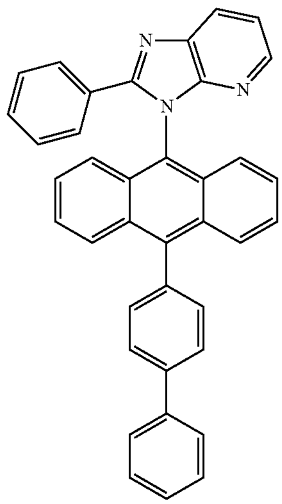
1-226
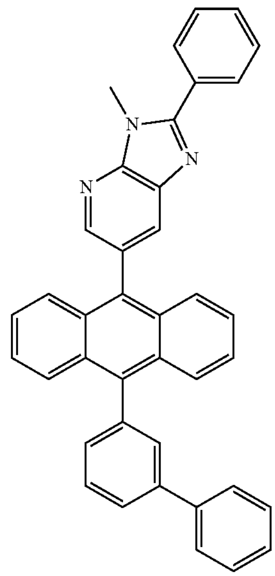
1-227
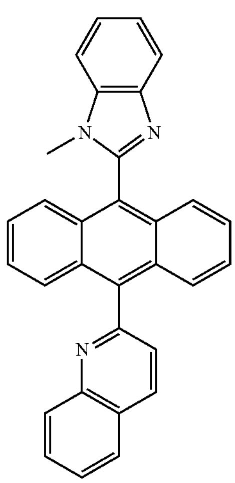
1-228
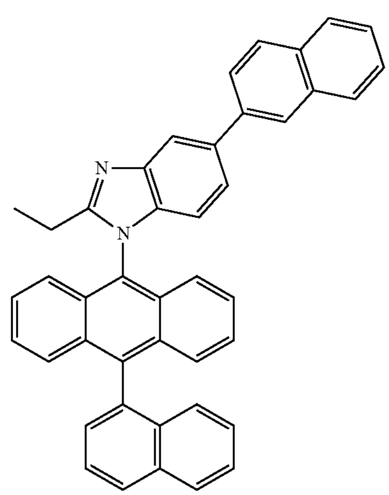

-continued
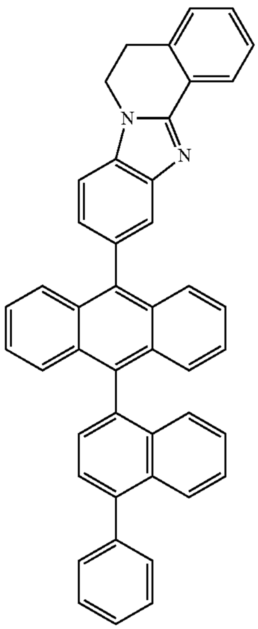
1-229
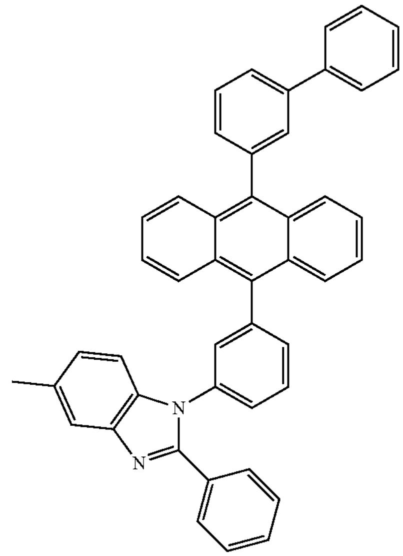
1-230
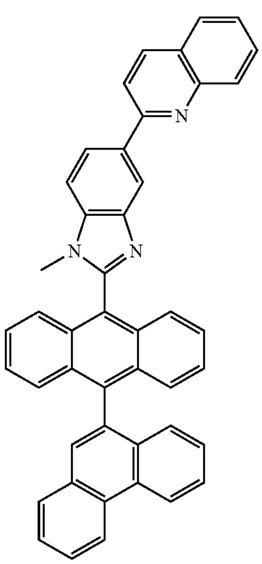
1-231
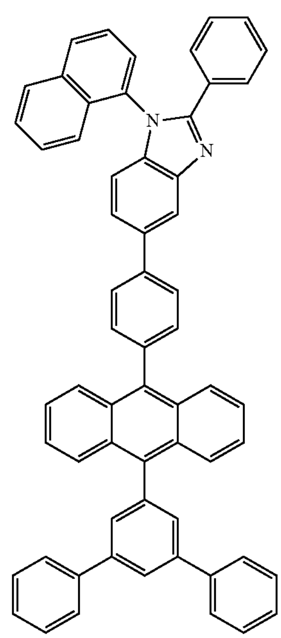
1-232

-continued
1-233
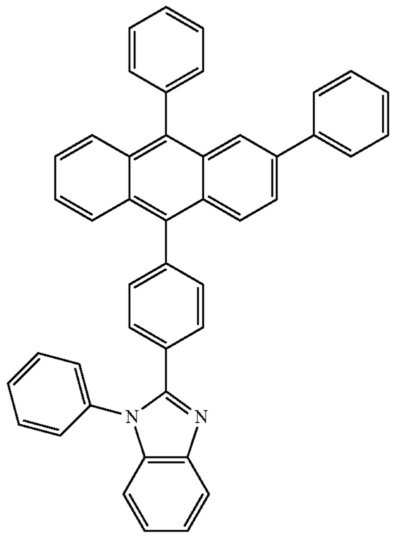
1-234
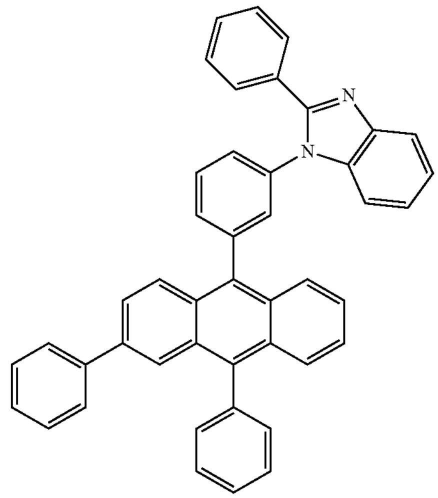
1-235
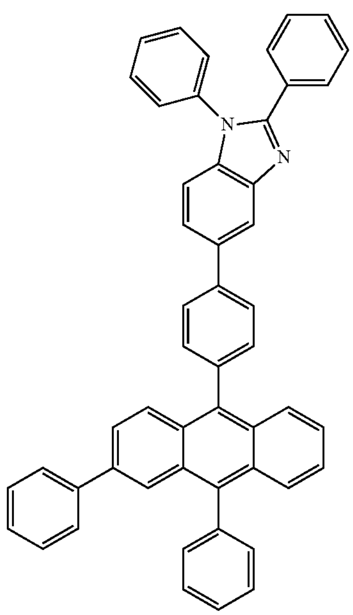
1-236
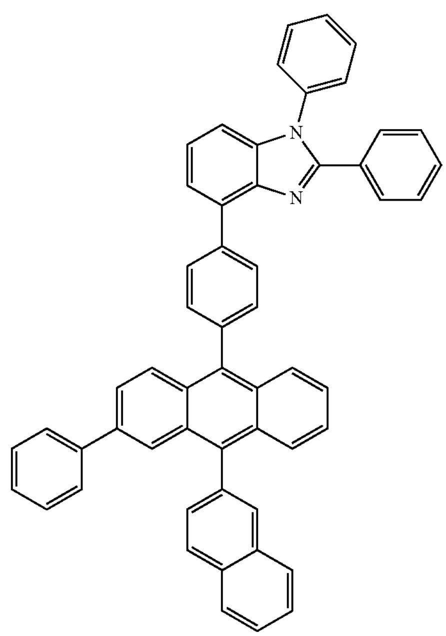

-continued
1-237
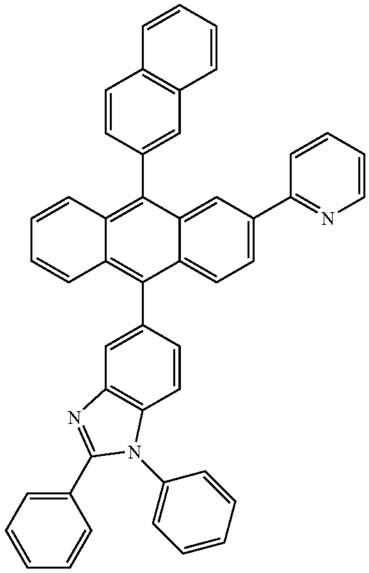
1-238
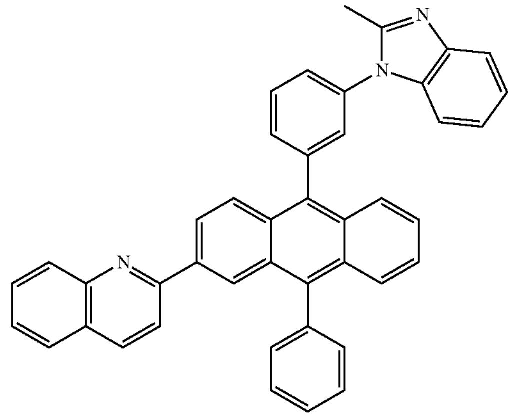
1-239
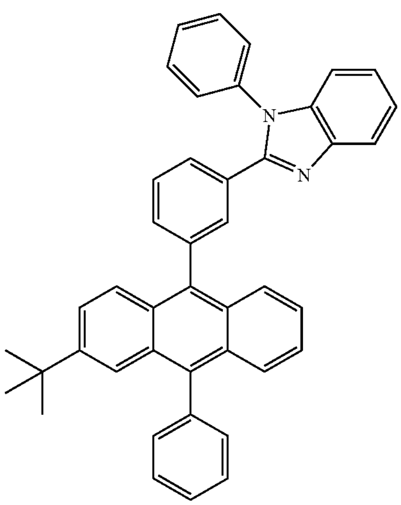
1-240
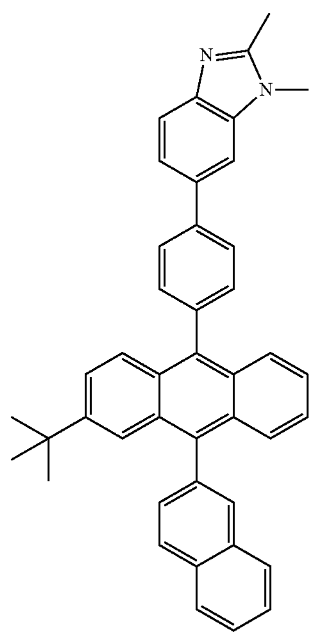

-continued
1-241
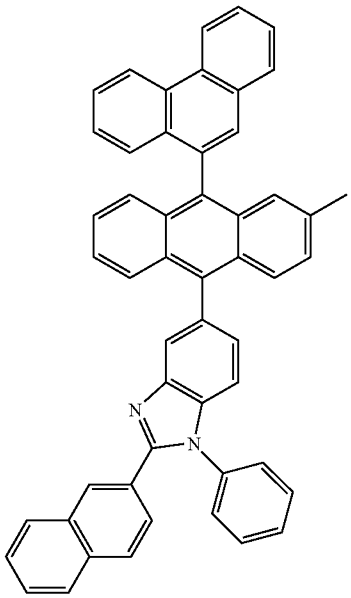
1-242
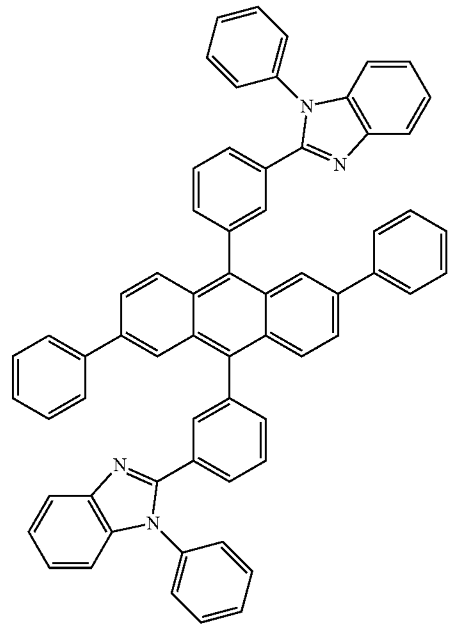
1-243
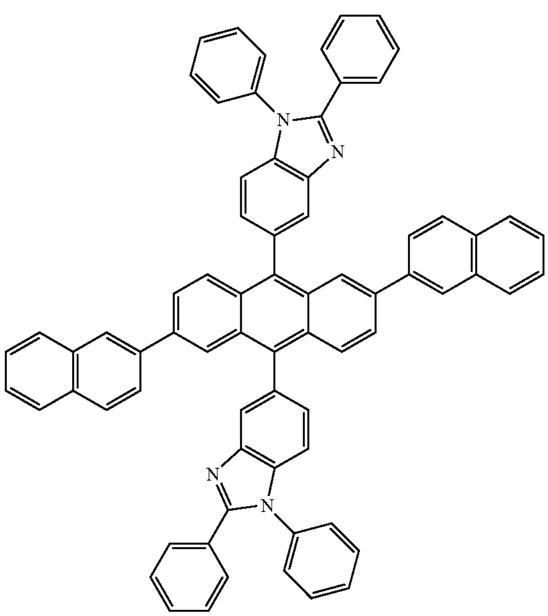
1-244
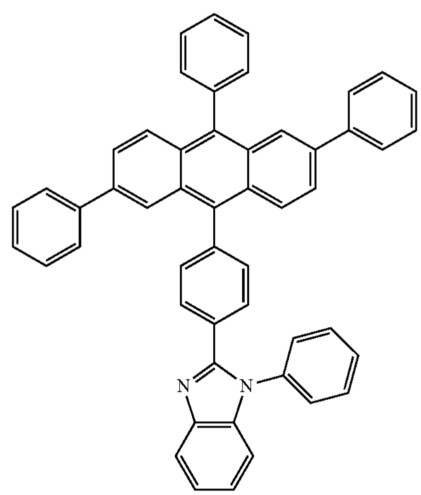

-continued
1-245
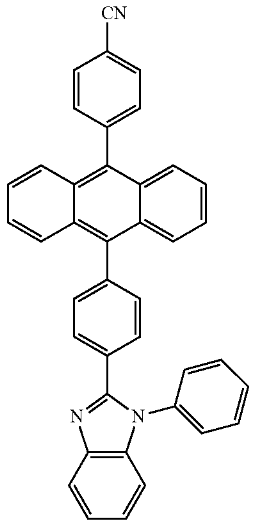
1-246
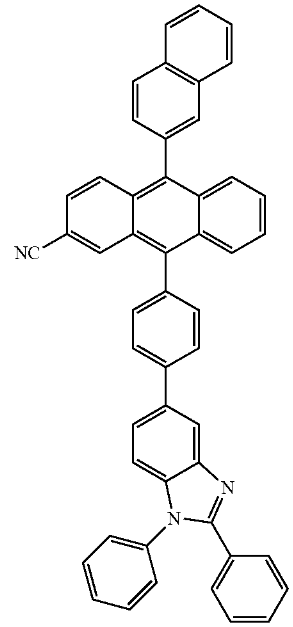
1-247
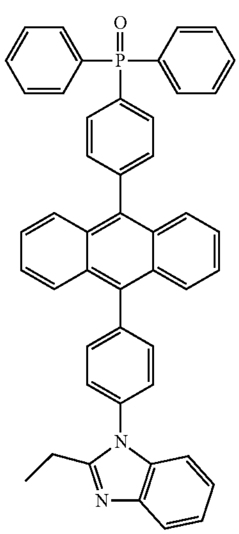
1-248
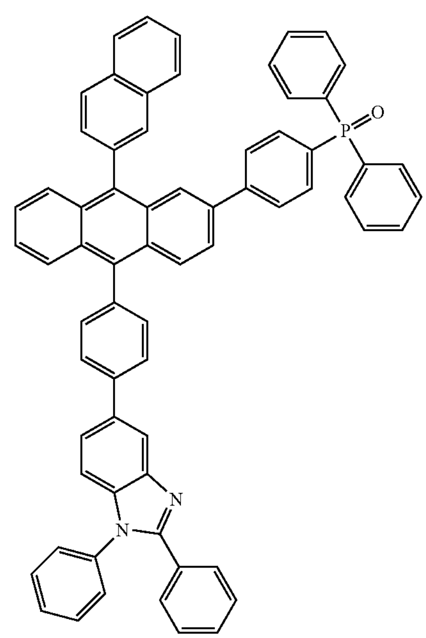

-continued
1-249
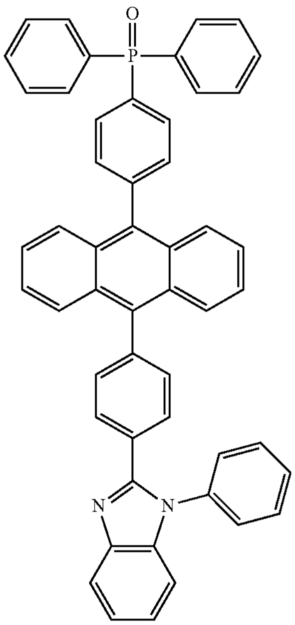
1-250
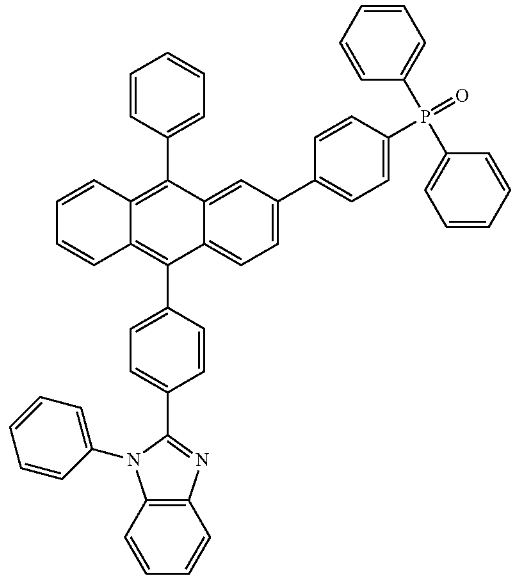
1-251
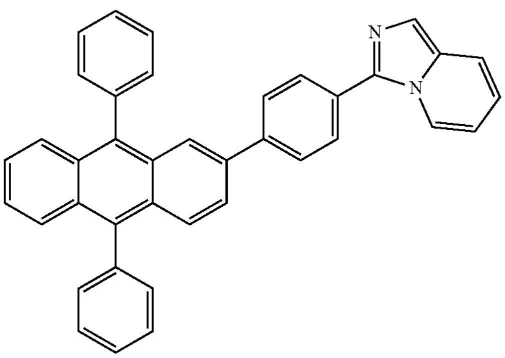
1-252
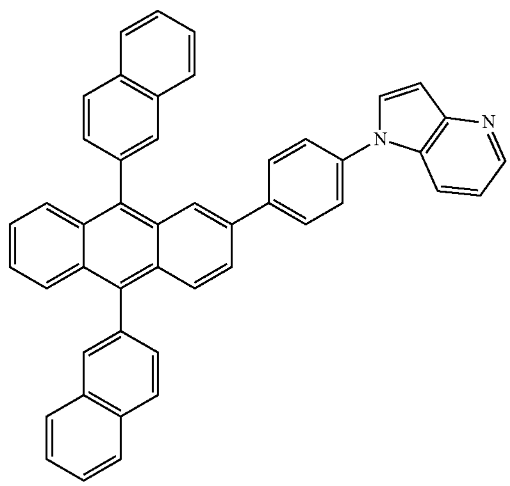
1-253
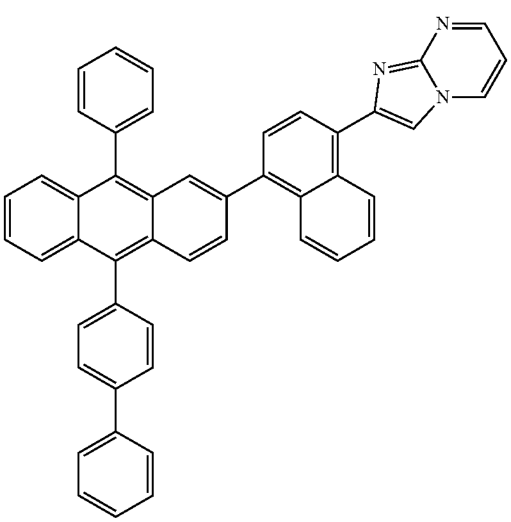
1-254
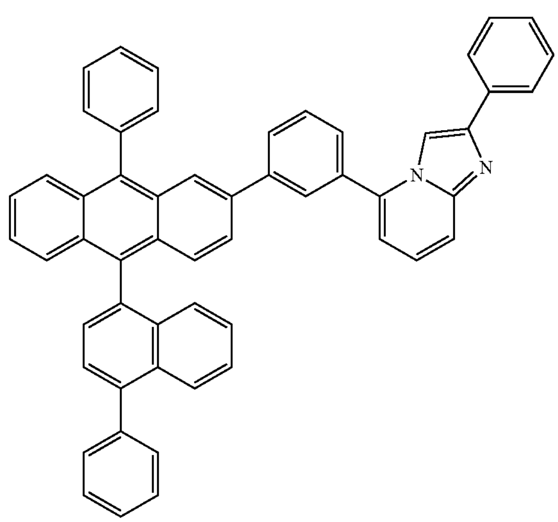

-continued
1-255
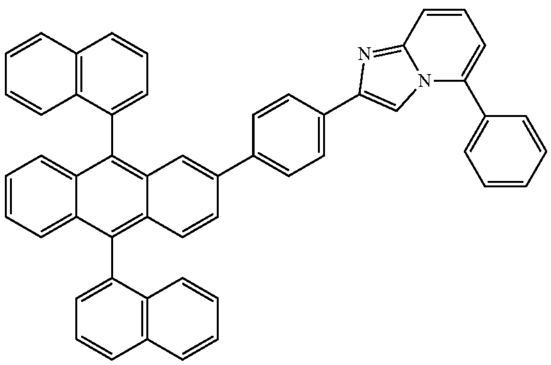
1-256
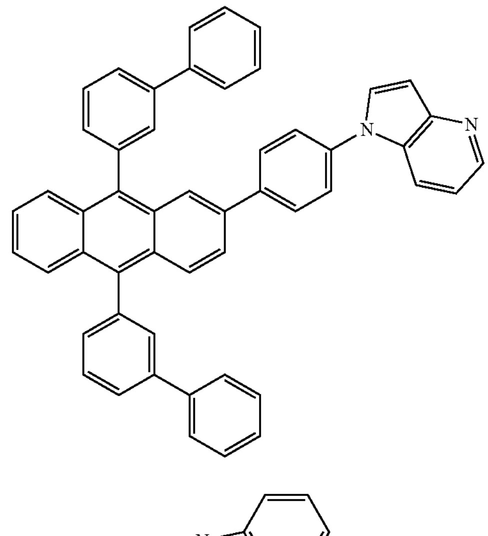
1-257
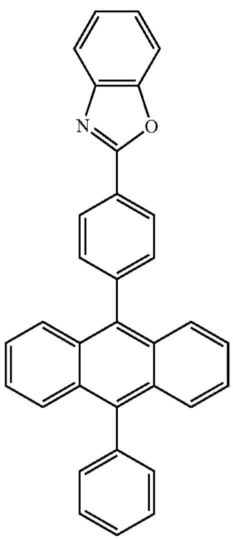
1-258
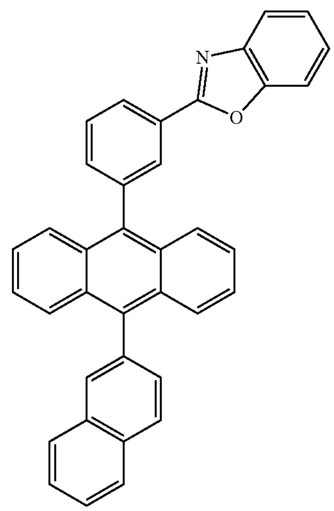
1-259
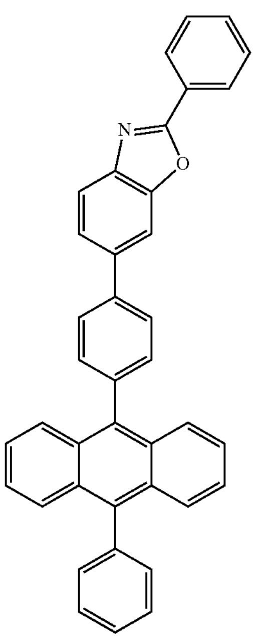
1-260
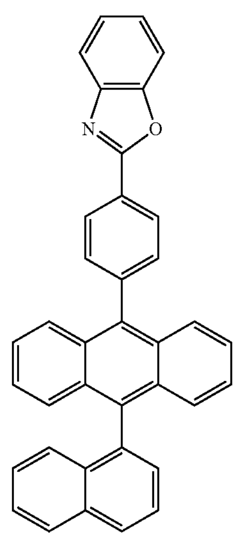

-continued
1-261
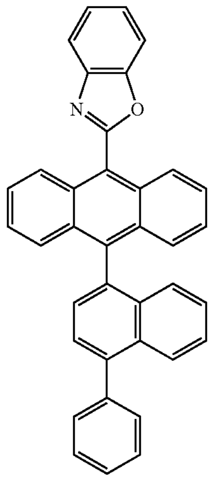
1-262
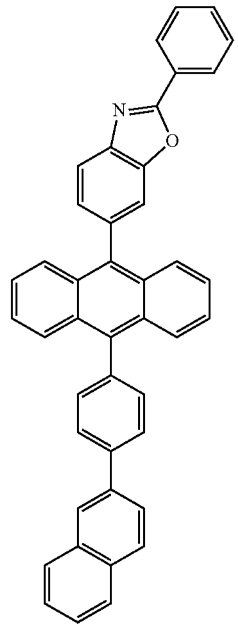
1-263
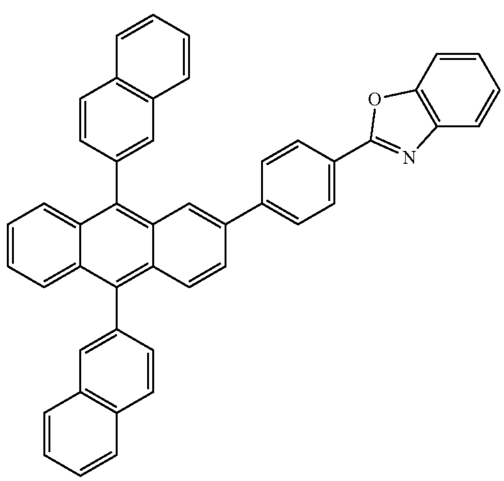
1-264
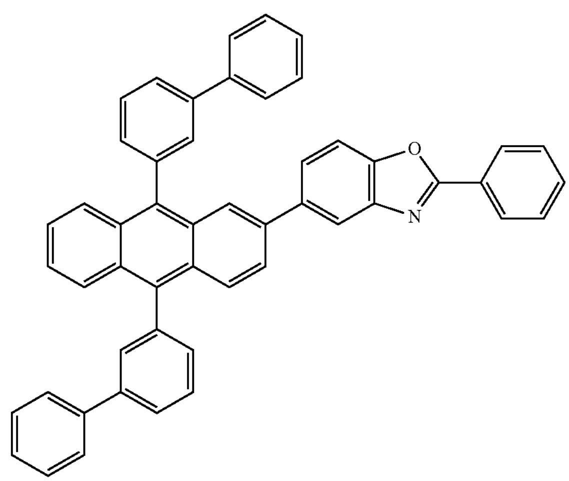

-continued
1-265
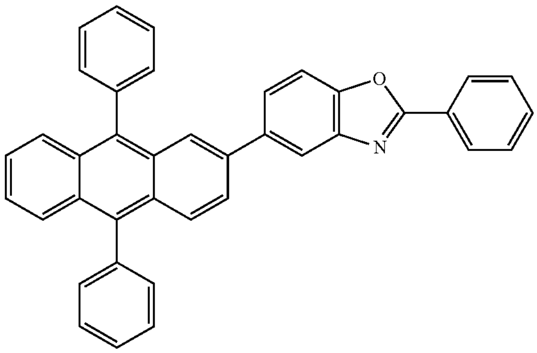
1-266
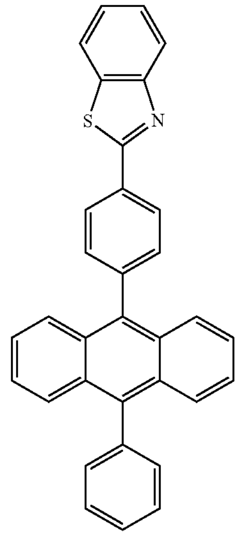
1-267
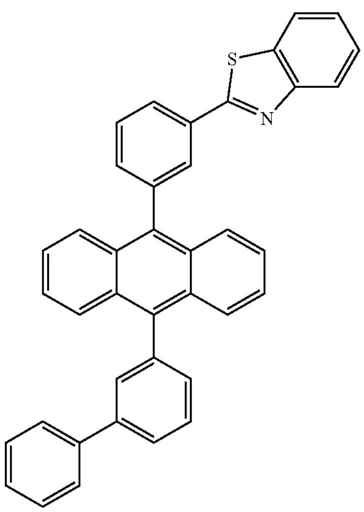
1-268
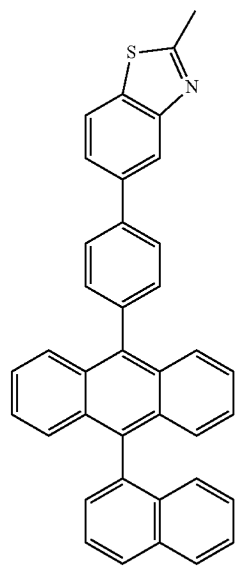
1-269
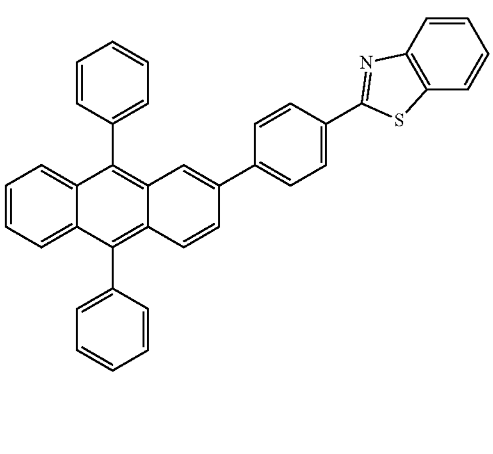
1-270
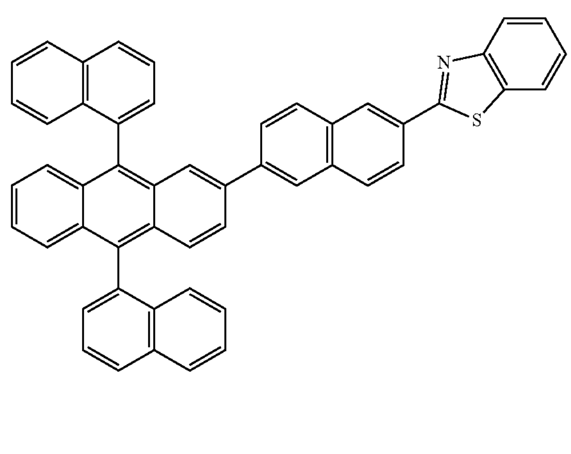

-continued
1-271
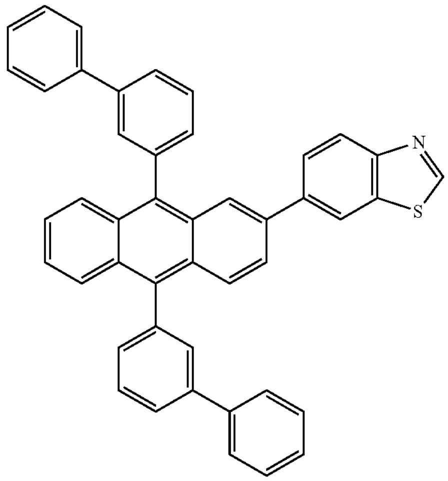
1-272
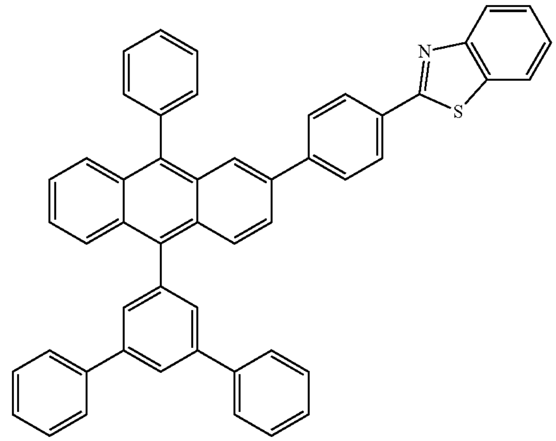
1-273
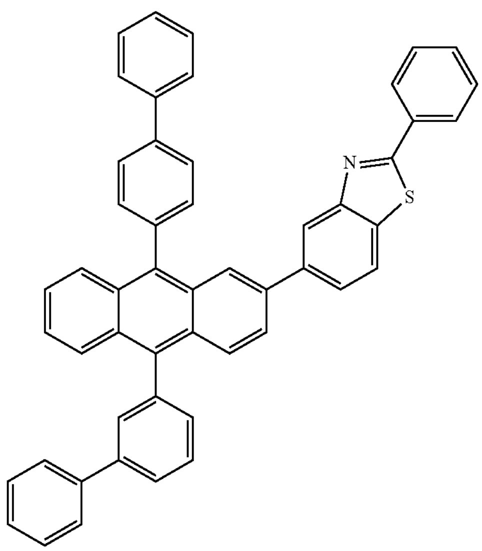
1-274
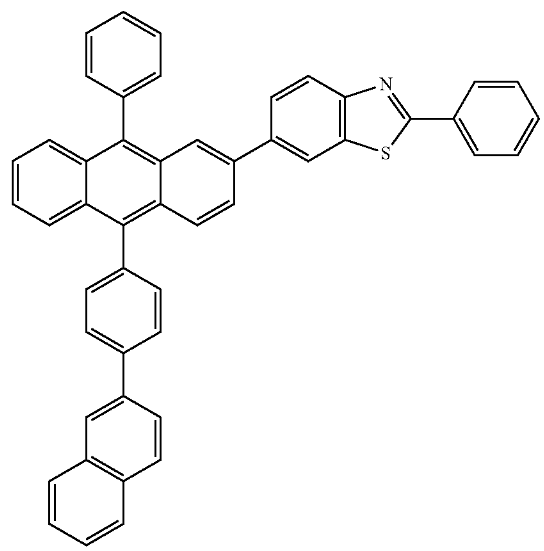
1-275
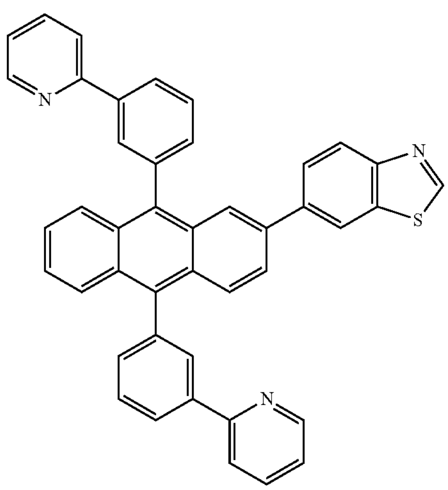
1-276
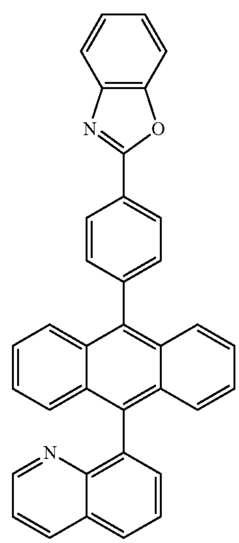

-continued
1-277
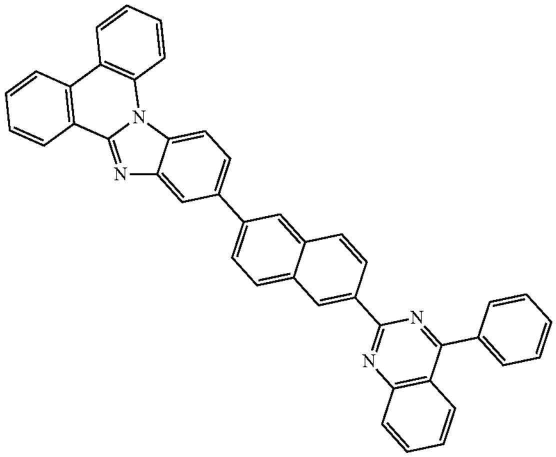
1-278
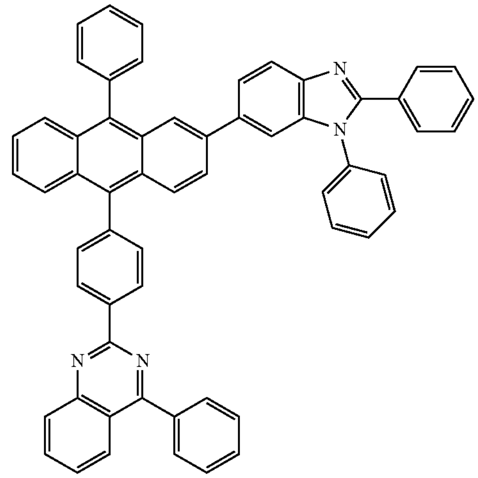
1-279
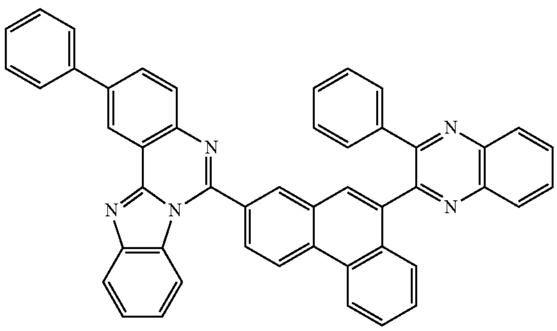
1-280
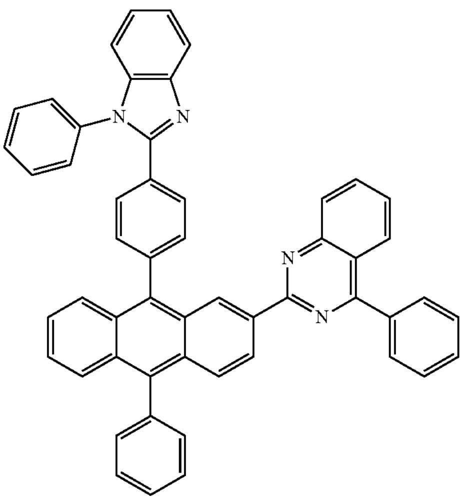
1-281
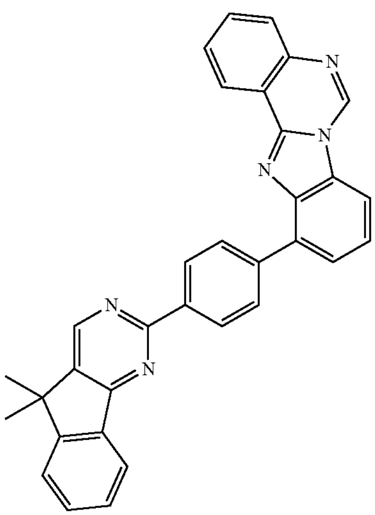
1-282
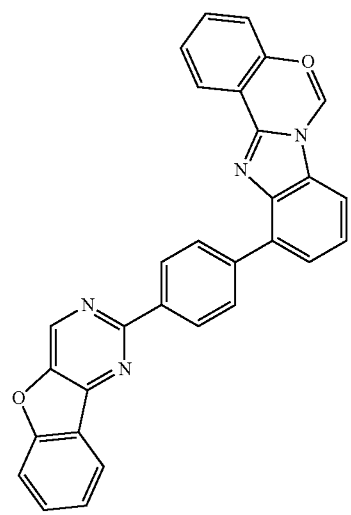

-continued
1-283
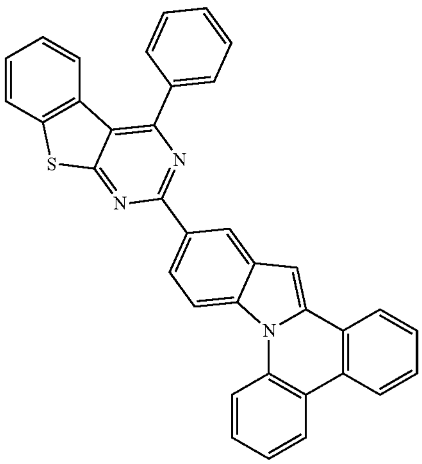
1-284
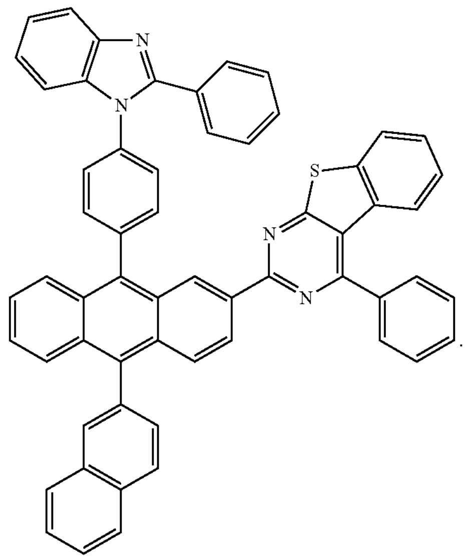
In various embodiments, the second compound may be selected from Compounds 2-1a to 2-172a and 2-1 to 2-262, but is not limited thereto:
2-1a
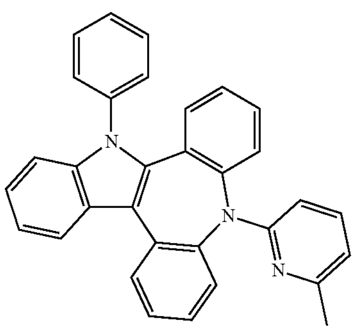
2-2a
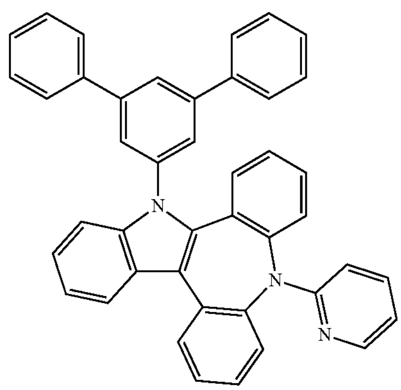
2-3a
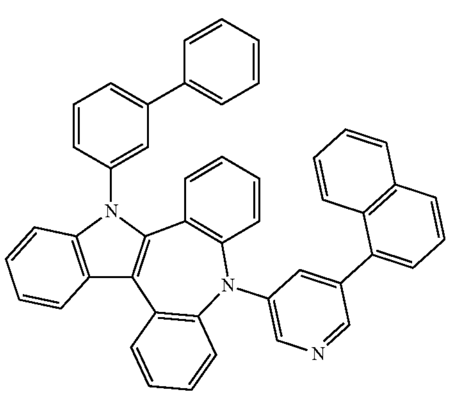
2-4a
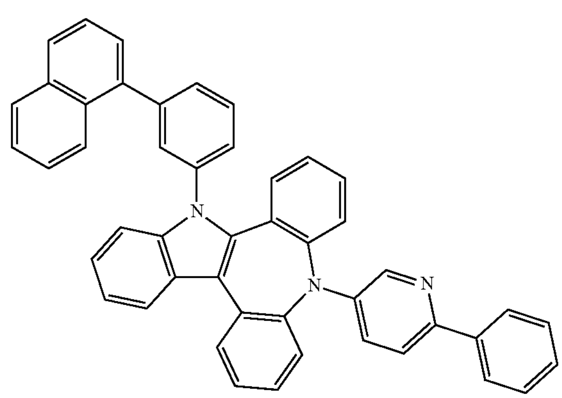

-continued
2-5a
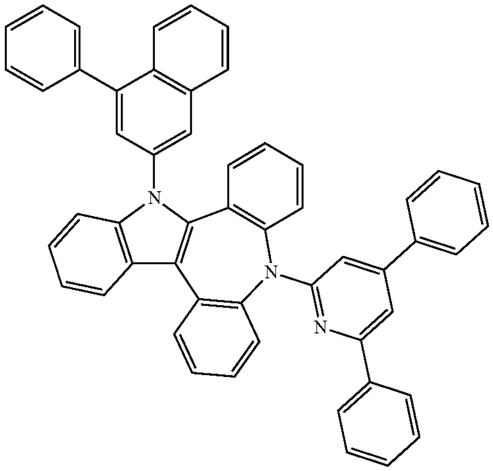
2-6a
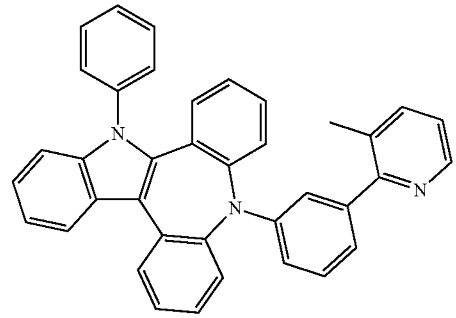
2-7a
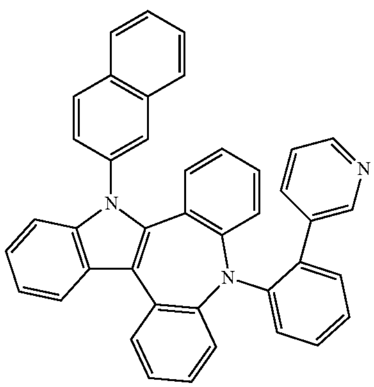
2-8a
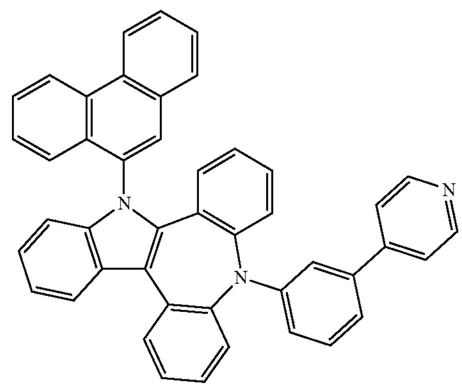
2-9a
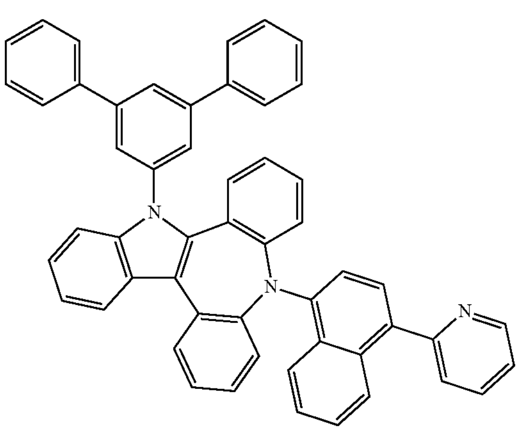
2-10a
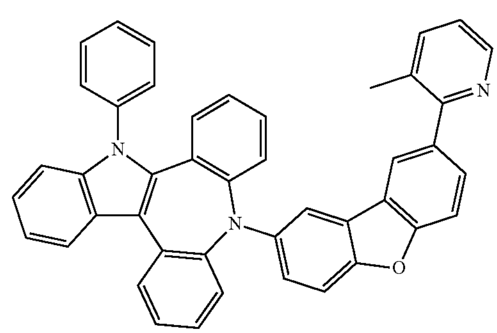

-continued
2-11a
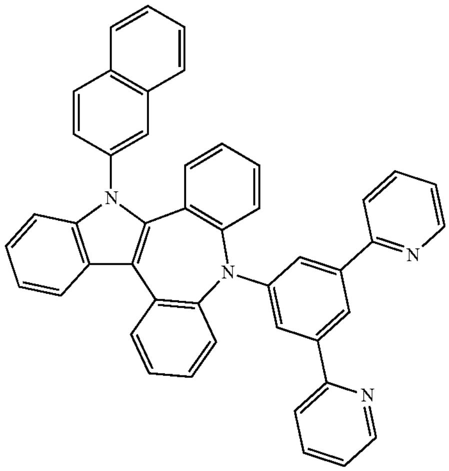
2-12a
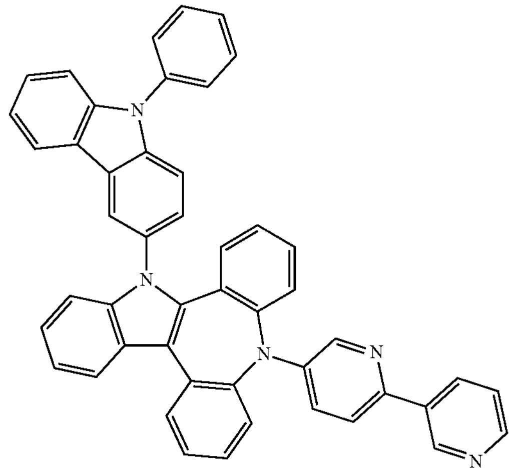
2-13a
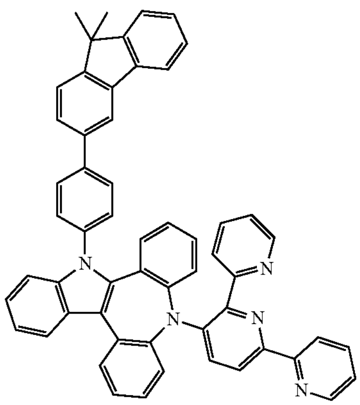
2-14a
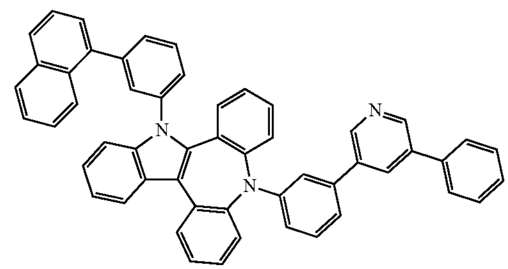
2-15a
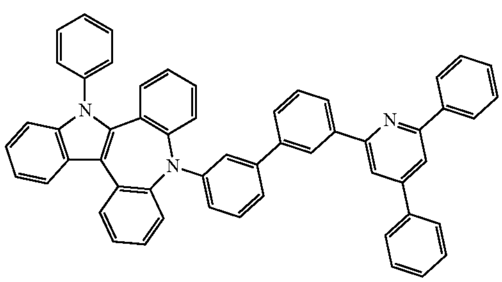
2-16a
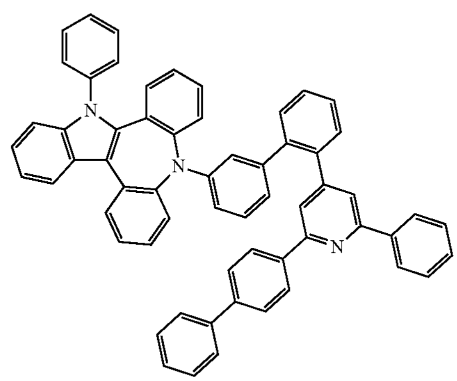

-continued
2-17a
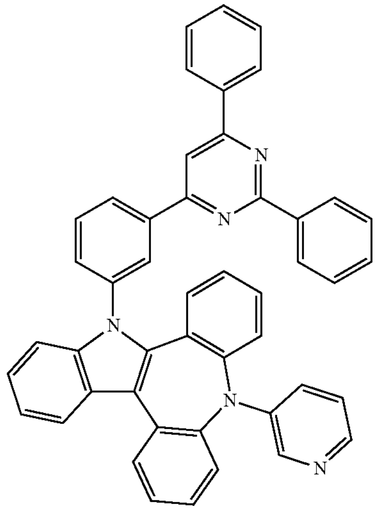
2-18a
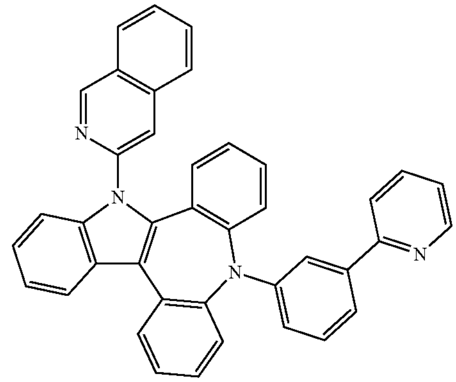
2-19a
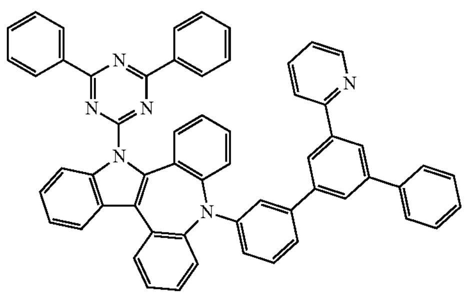
2-20a
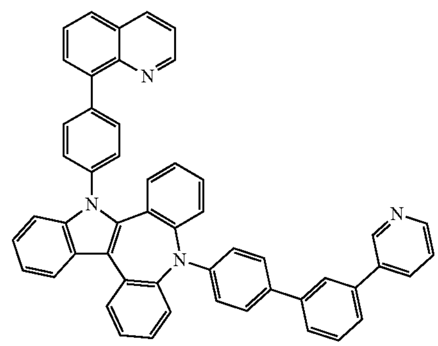
2-21a
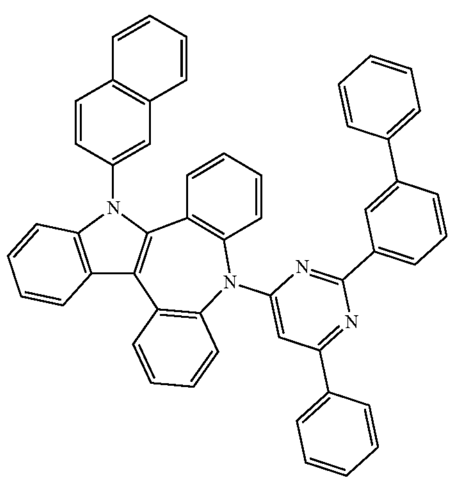
2-22a
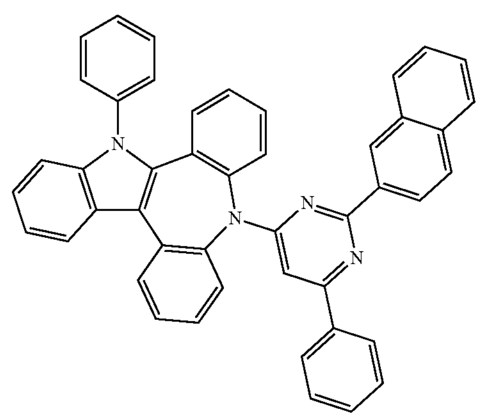

-continued
2-23a
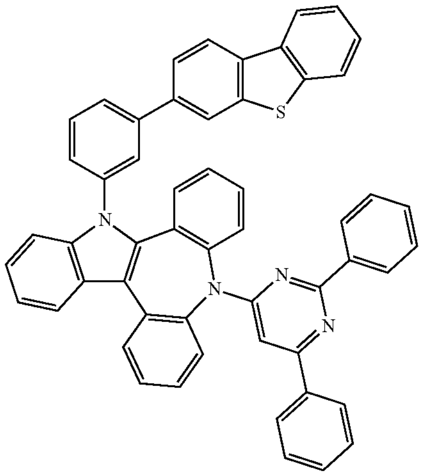
2-24a
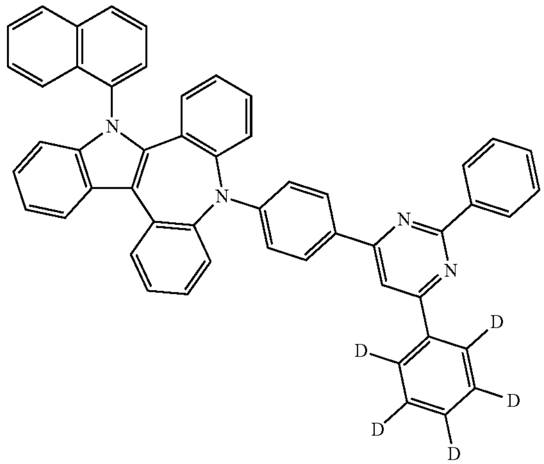
2-25a
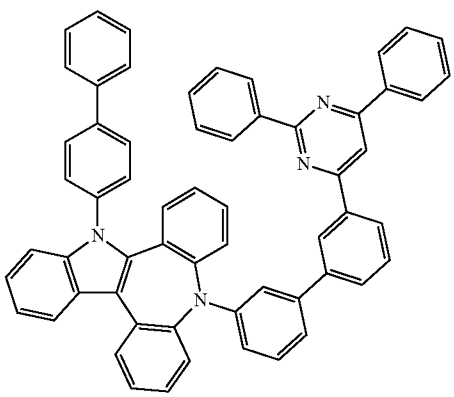
2-26a
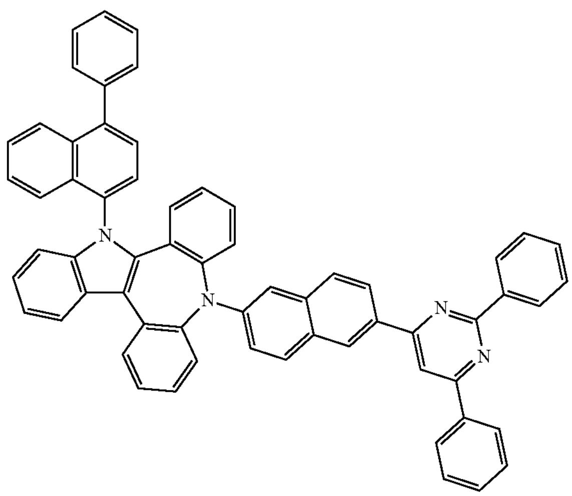
2-27a
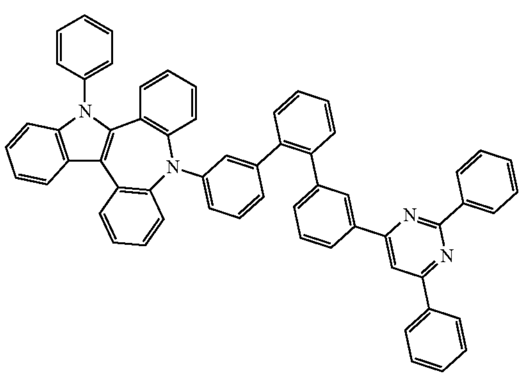
2-28a
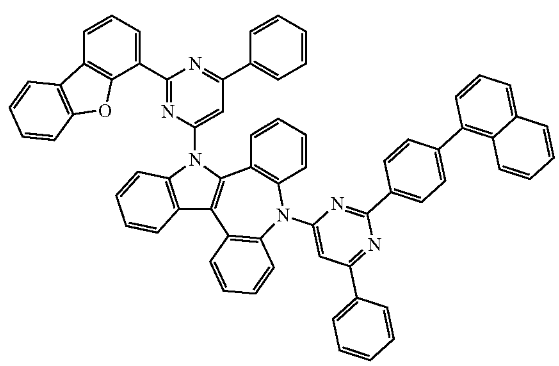

-continued
2-29a
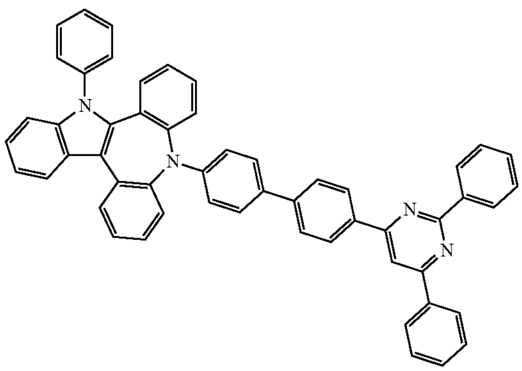
2-30a
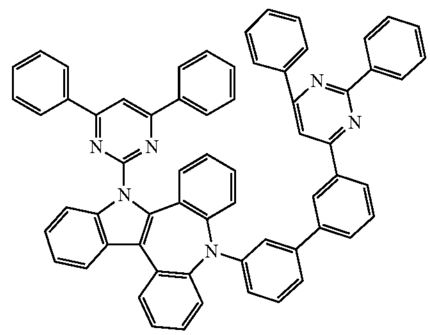
2-31a
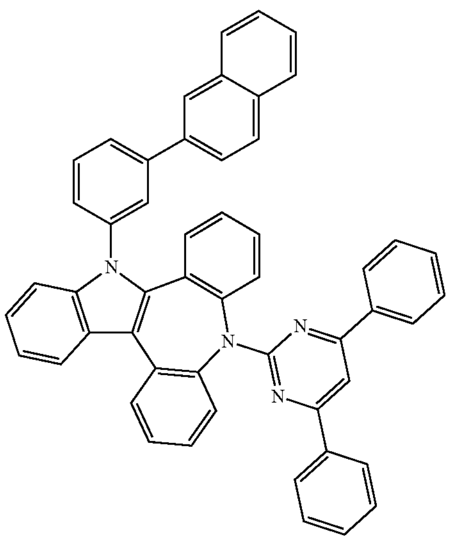
2-32a
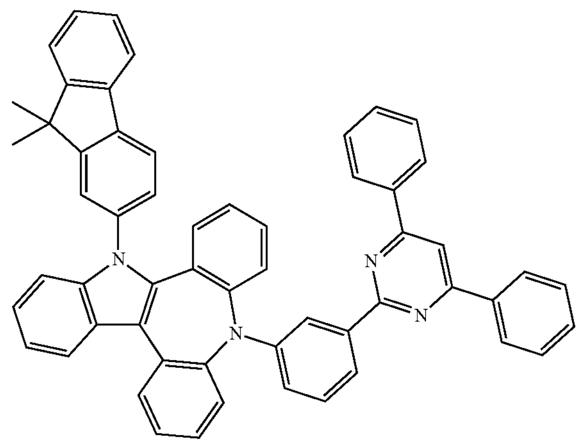
2-33a
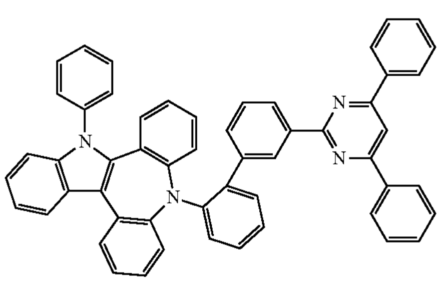
2-34a
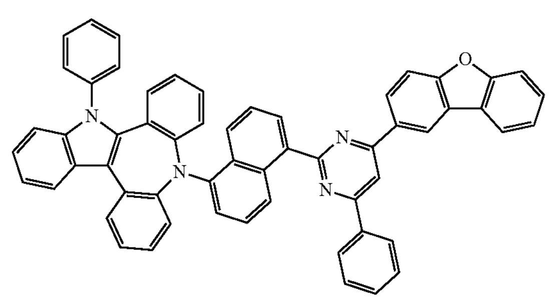
2-35a
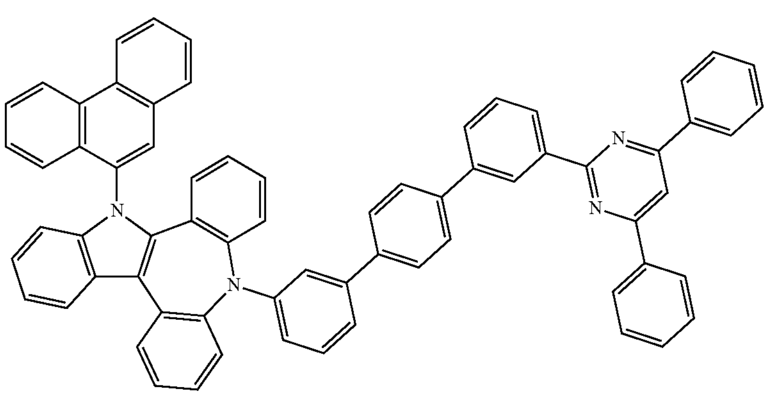

-continued
2-36a
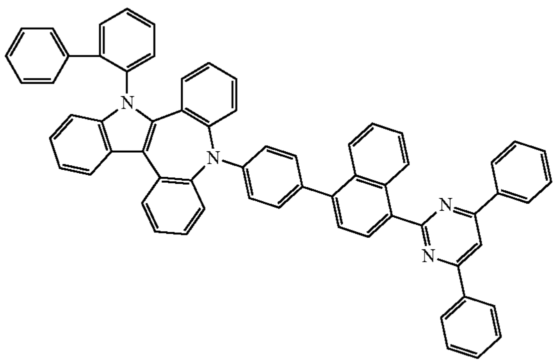
2-37a
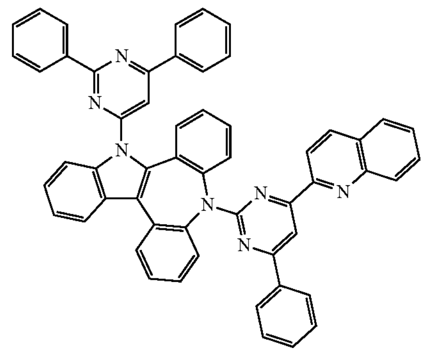
2-38a
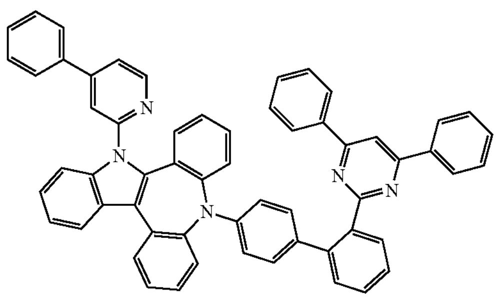
2-39a
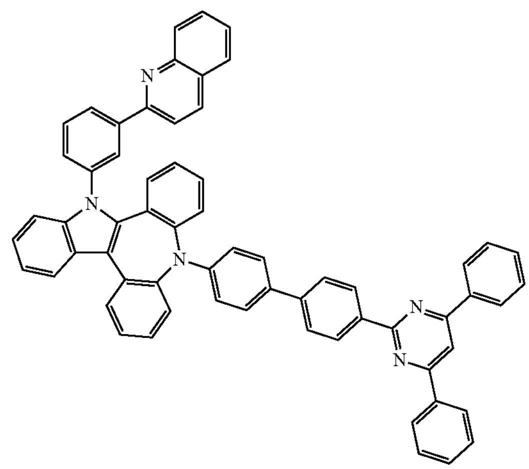
2-40a
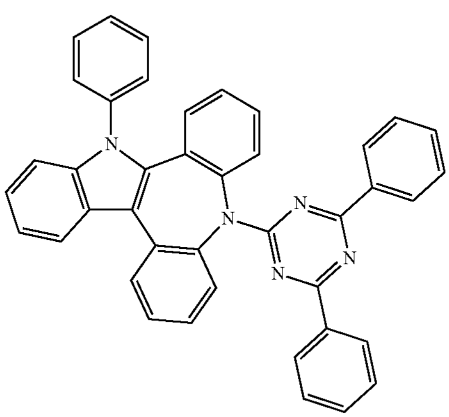
2-41a
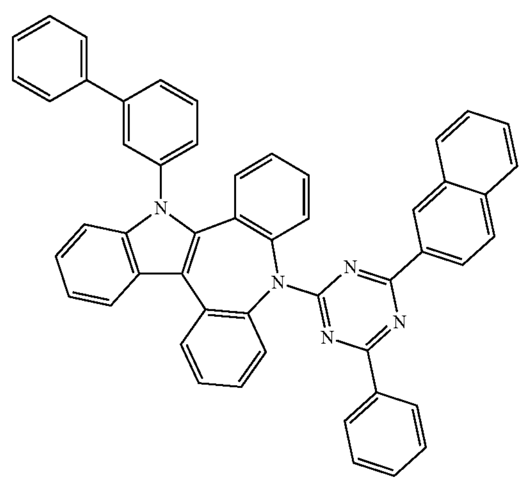

-continued
2-42a
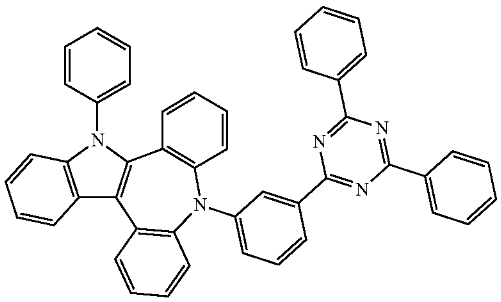
2-43a
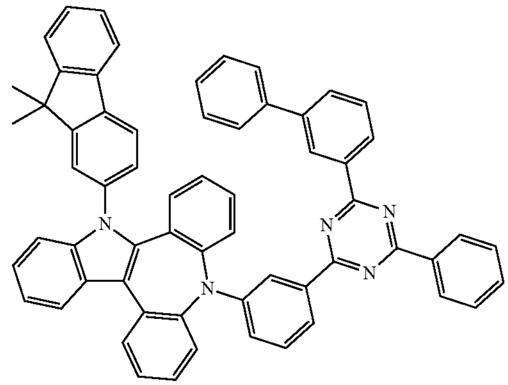
2-44a
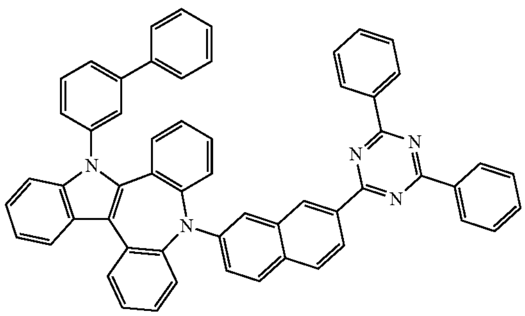
2-45a
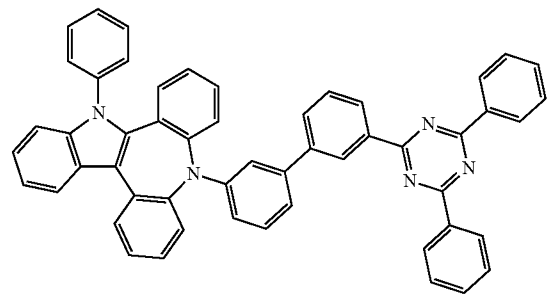
2-46a
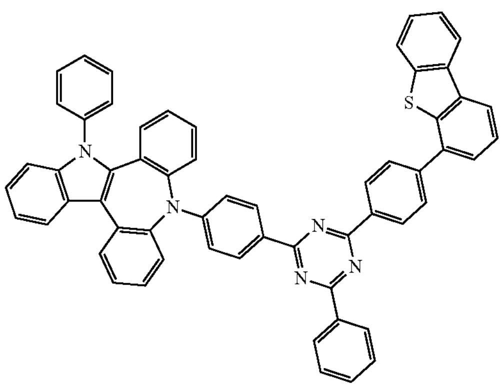
2-47a
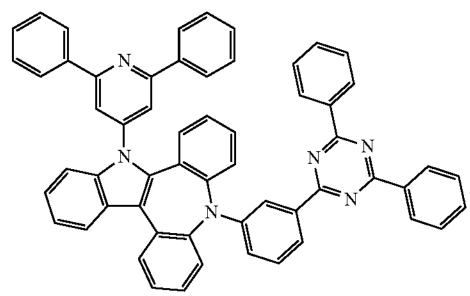
2-48a
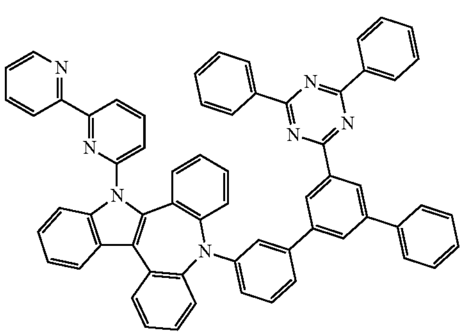
2-49a
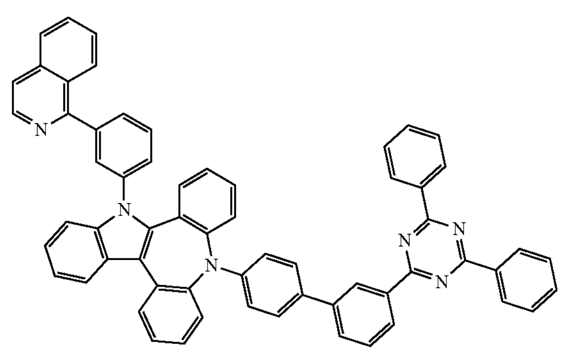

-continued
2-50a
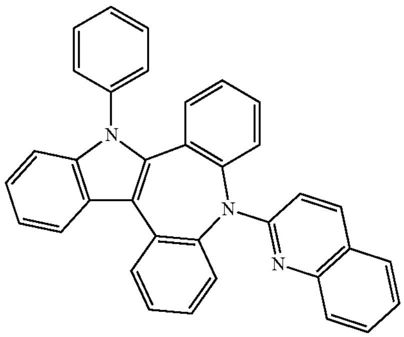
2-51a
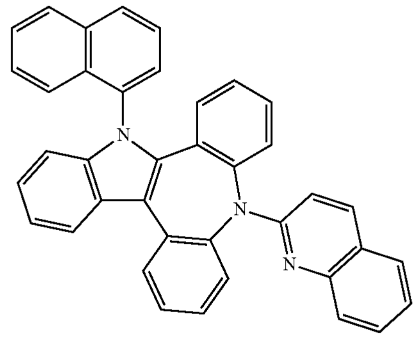
2-52a
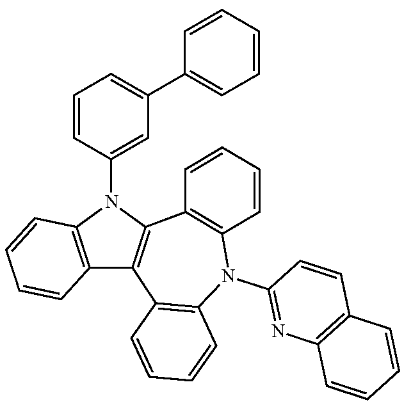
2-53a
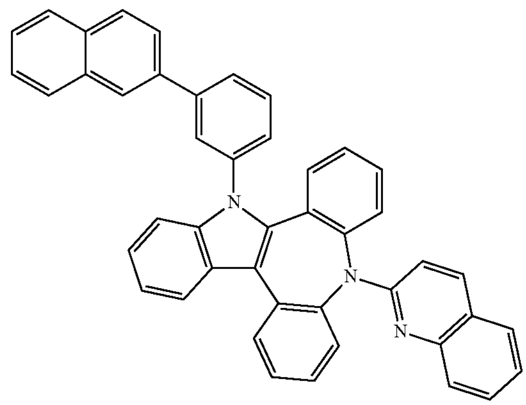
2-54a
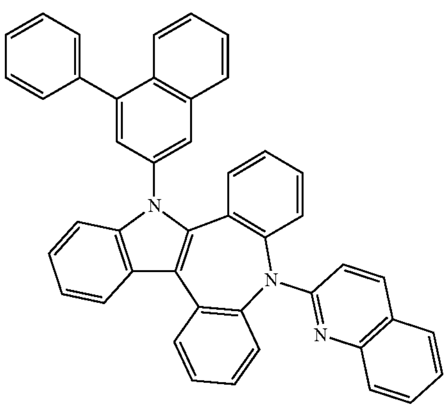
2-55a
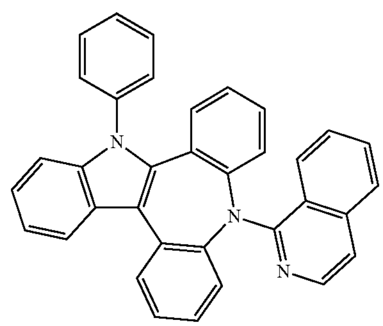
2-56a
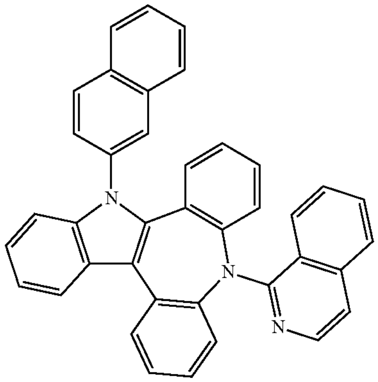
2-57a
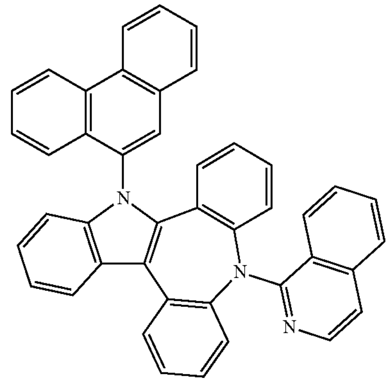

-continued
2-58a
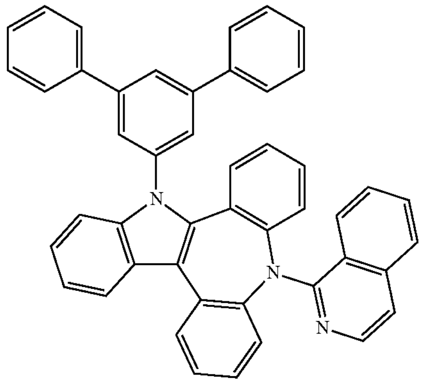
2-59a
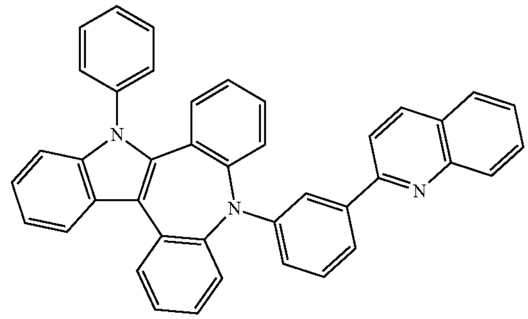
2-60a
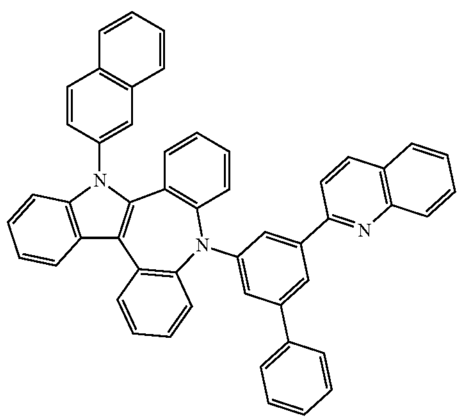
2-61a
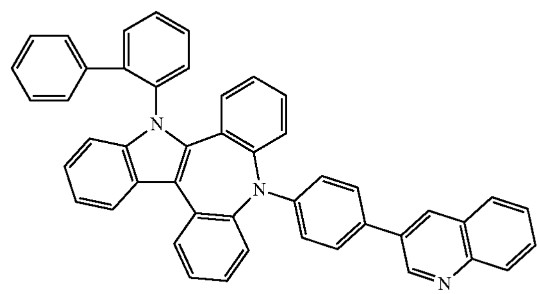
2-62a
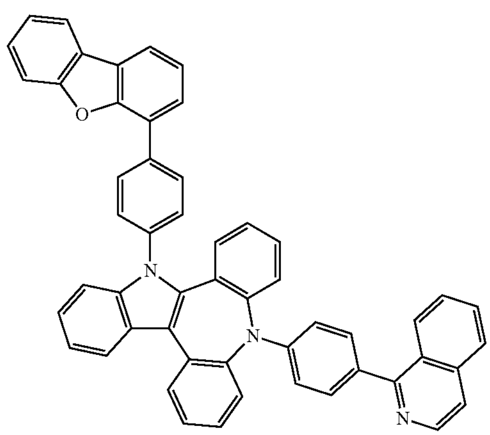
2-63a
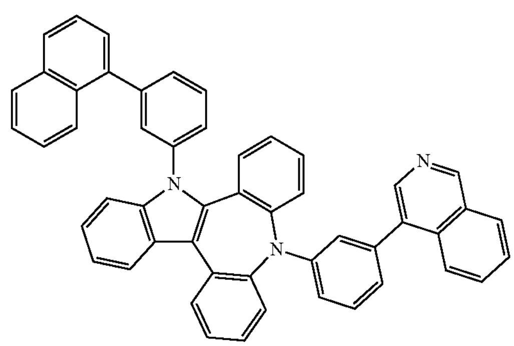

-continued
2-64a
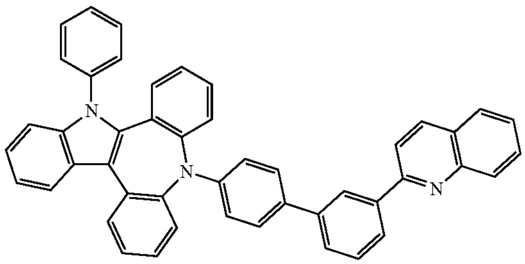
2-65a
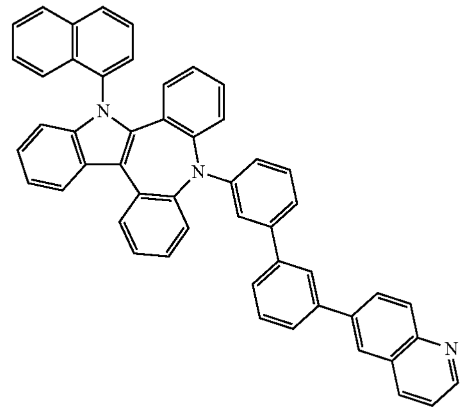
2-66a
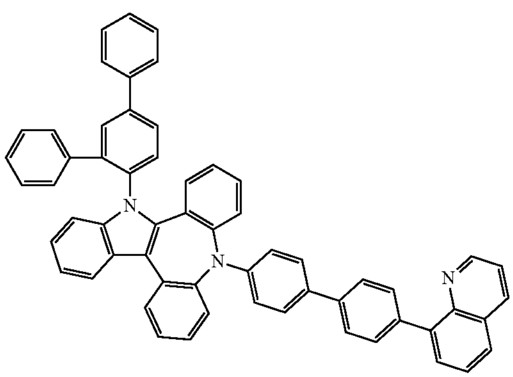
2-67a
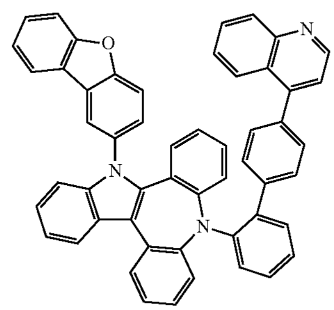
2-68a
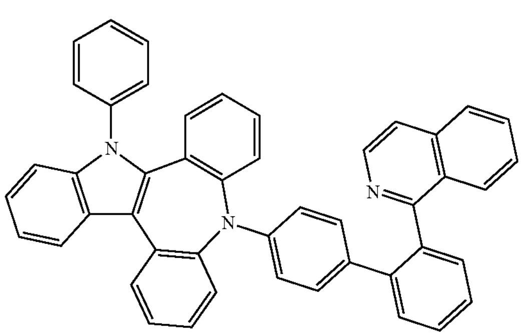
2-69a
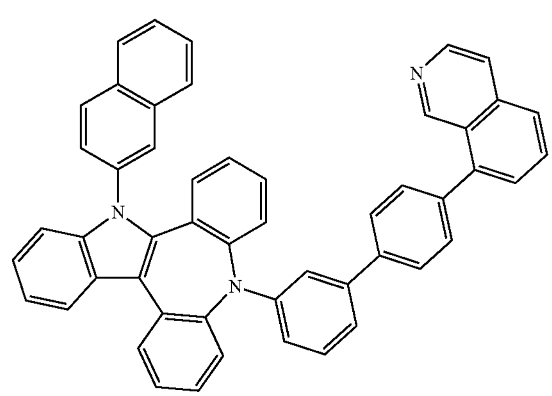

-continued
2-70a
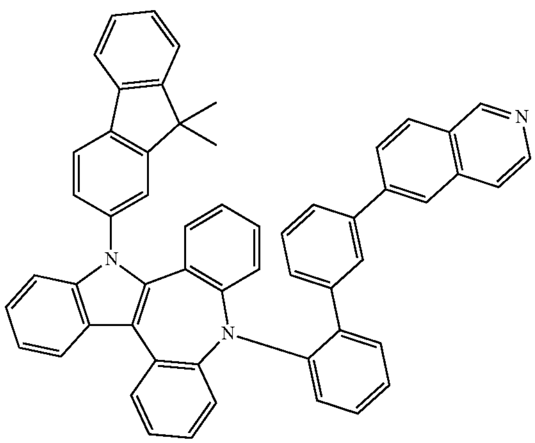
2-71a
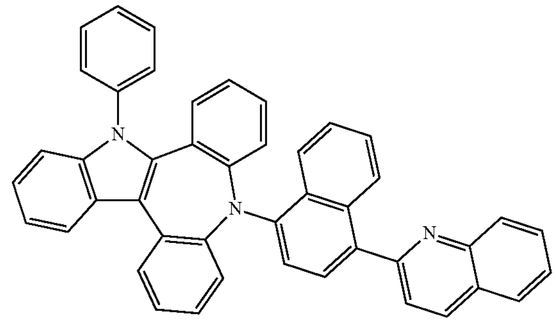
2-72a
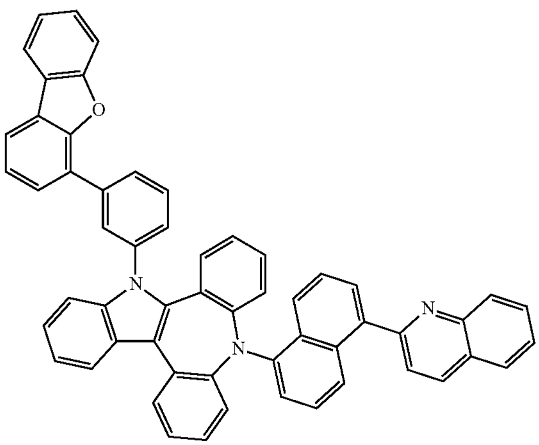
2-73a
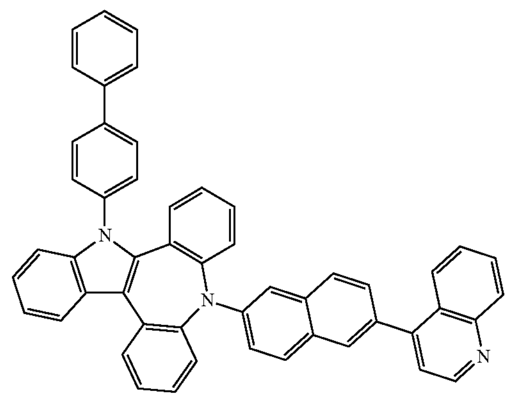
2-74a
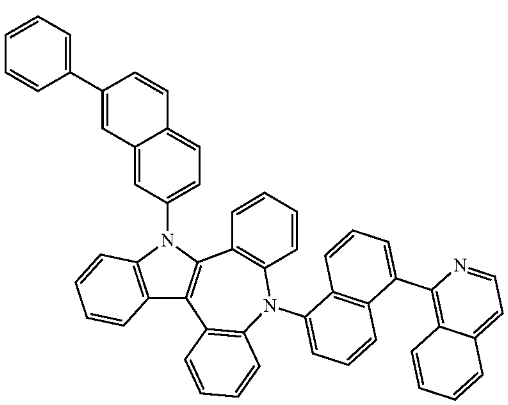
2-75a
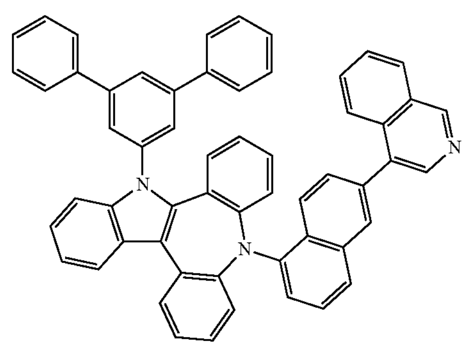

-continued
2-76a
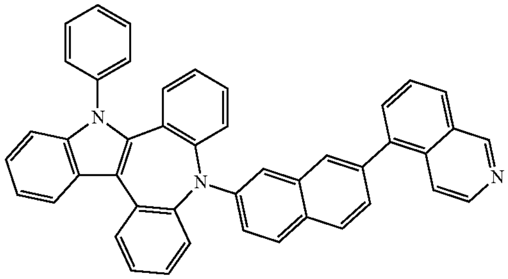
2-77a
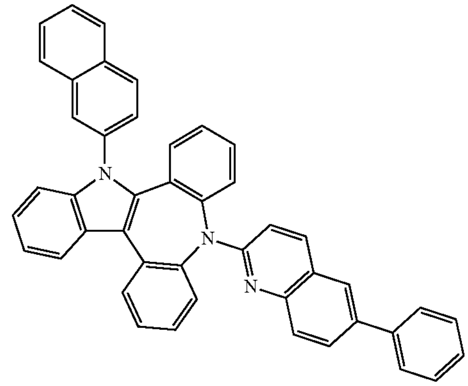
2-78a
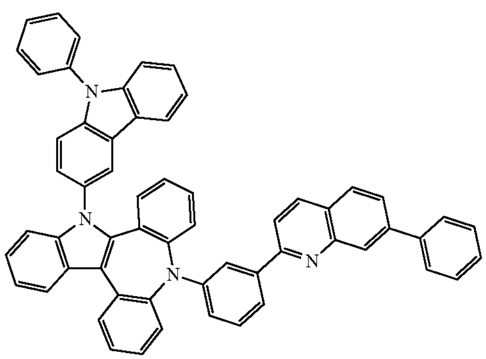
2-79a
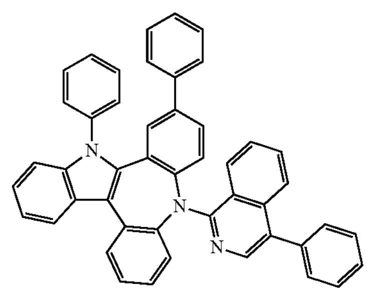
2-80a
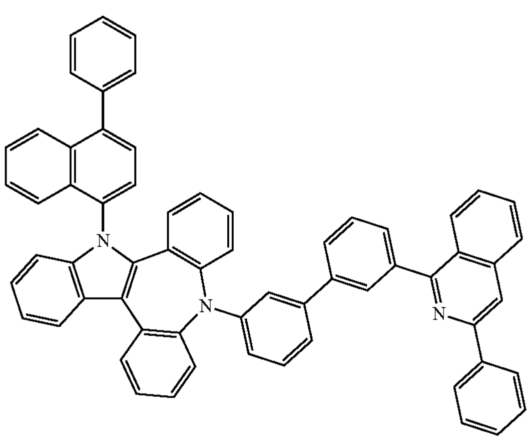
2-81a
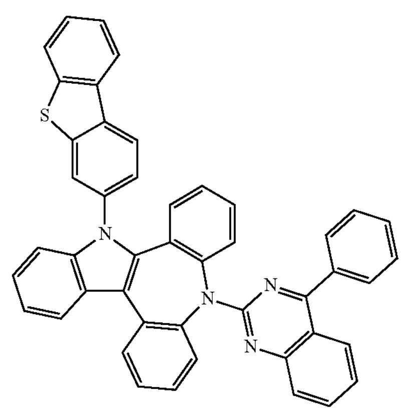

-continued
2-82a
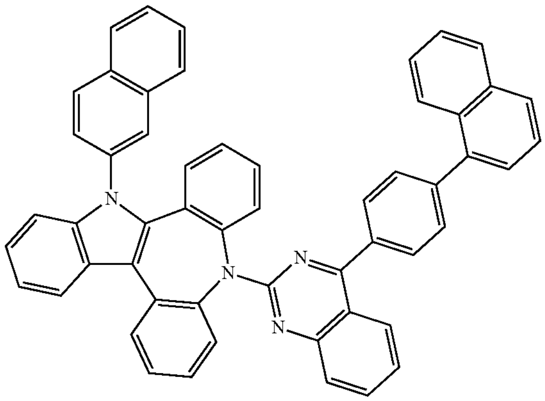
2-83a
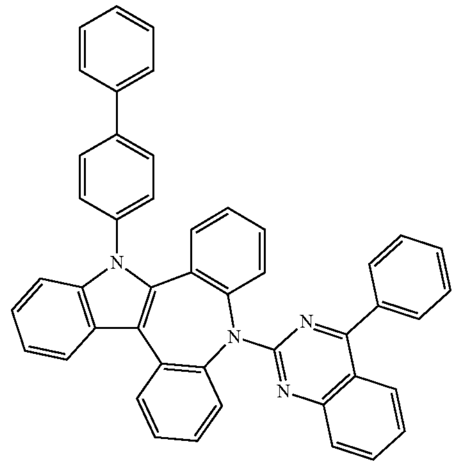
2-84a
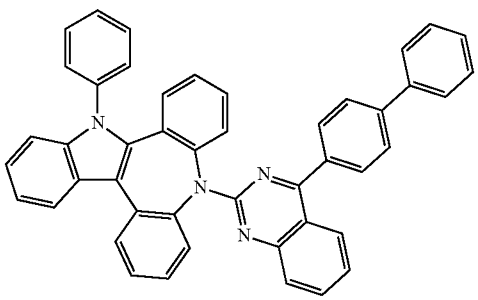
2-85a
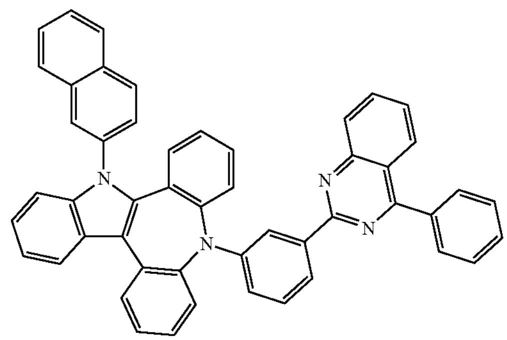
2-86a
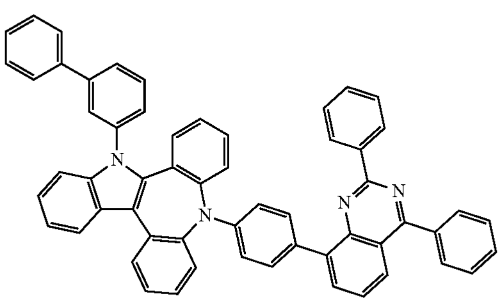
2-87a
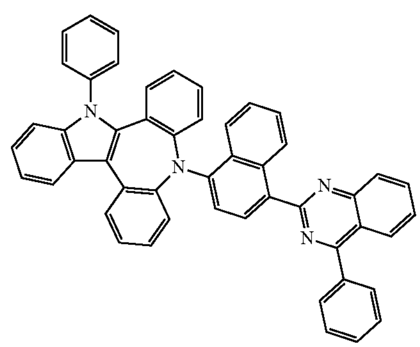
2-88a
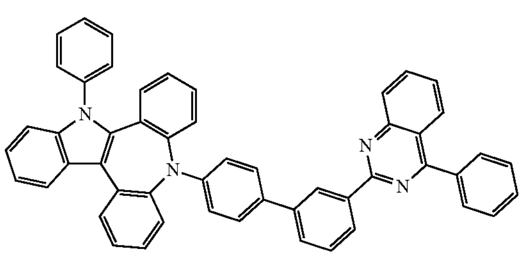
2-89a
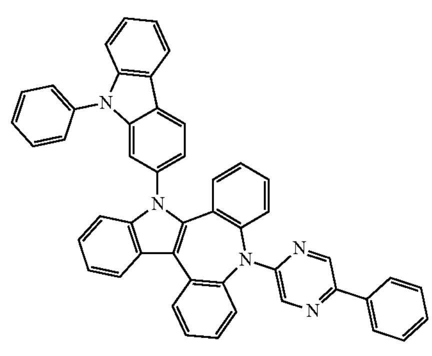

-continued
2-90a
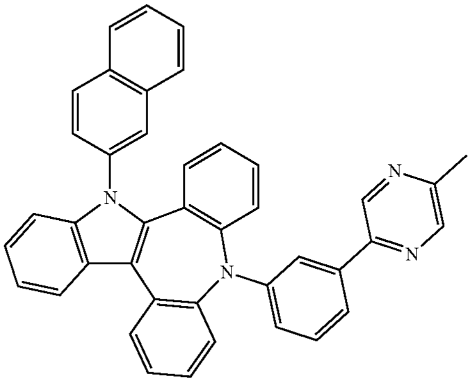
2-91a
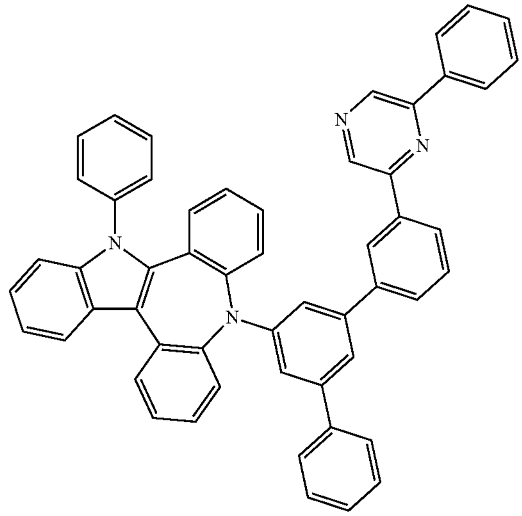
2-92a
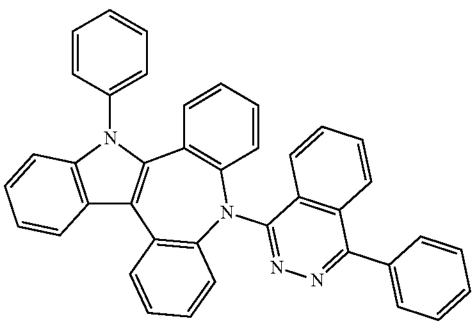
2-93a
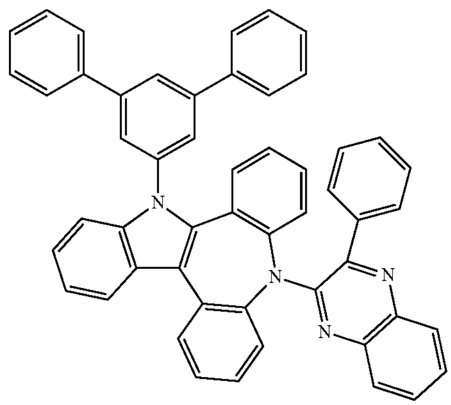
2-94a
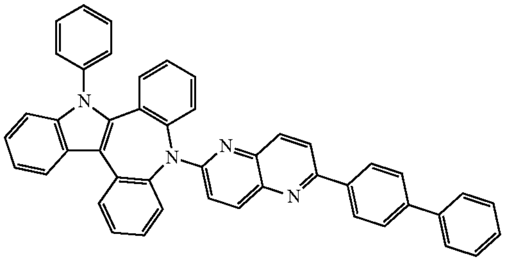
2-95a
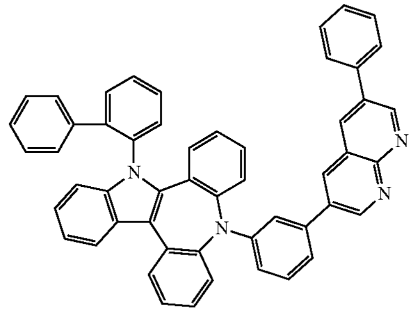

-continued
2-96a
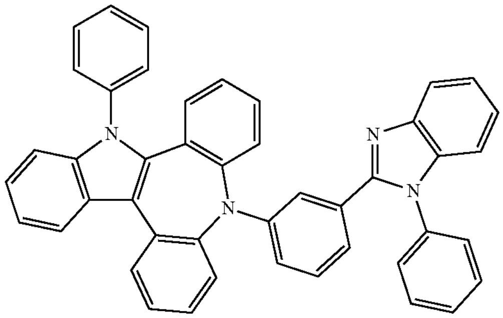
2-97a
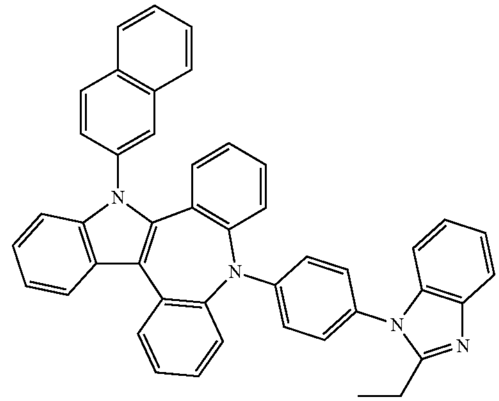
2-98a
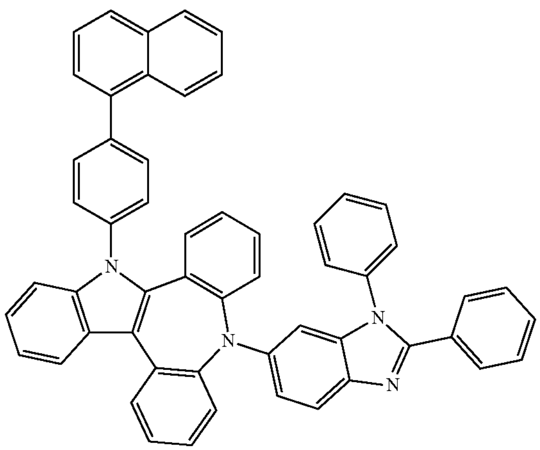
2-99a
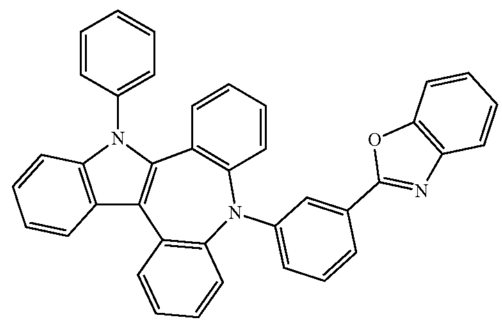
2-100a
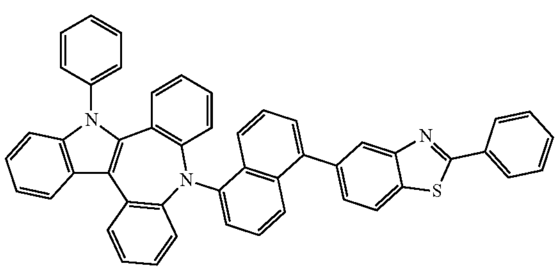
2-101a
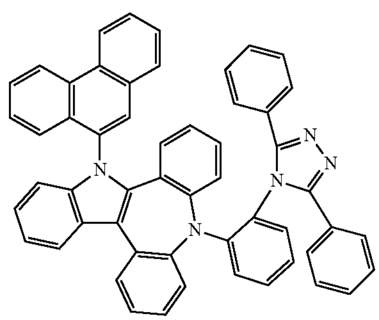
2-102a
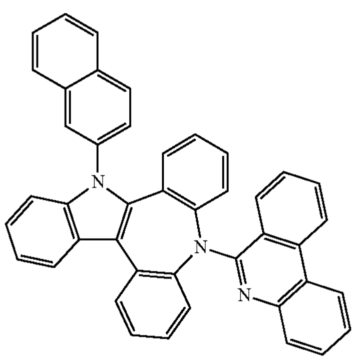
2-103a
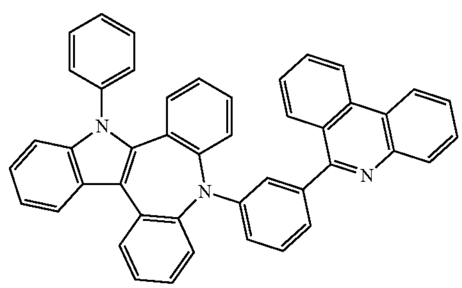

-continued
2-104a
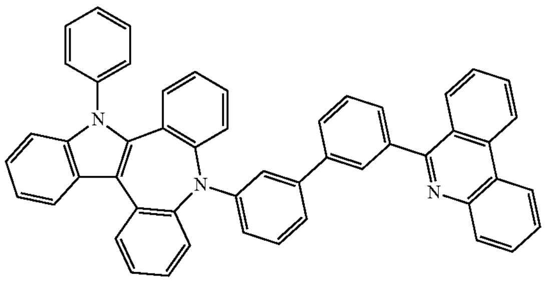
2-105a
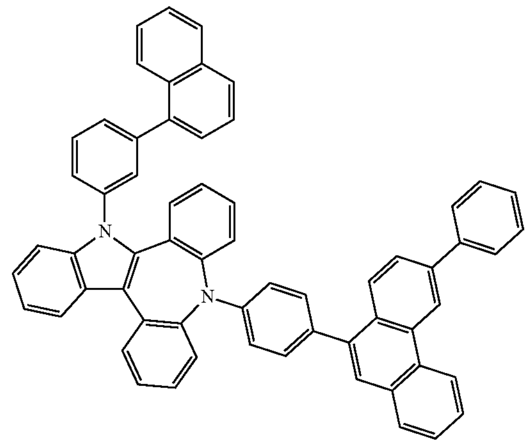
2-106a
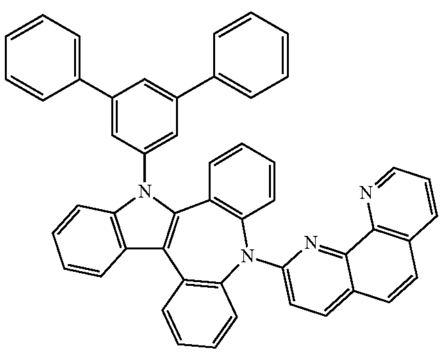
2-107a
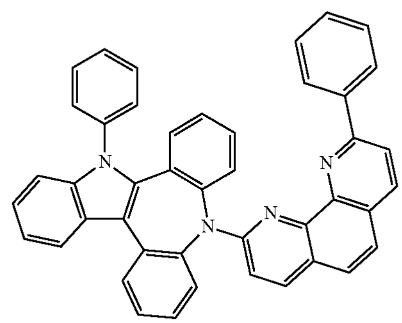
2-108a
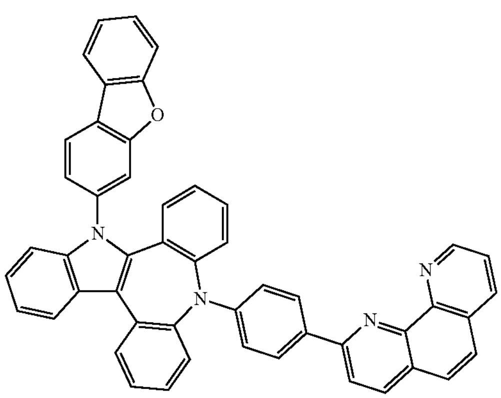
2-109a
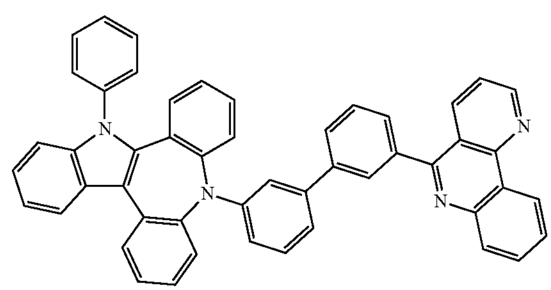

-continued
2-110a
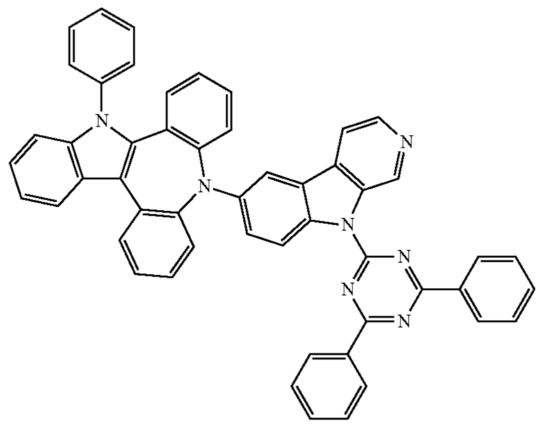
2-111a
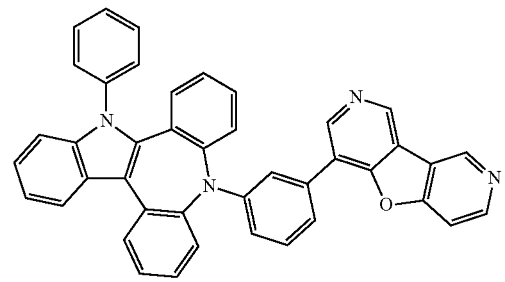
2-112a
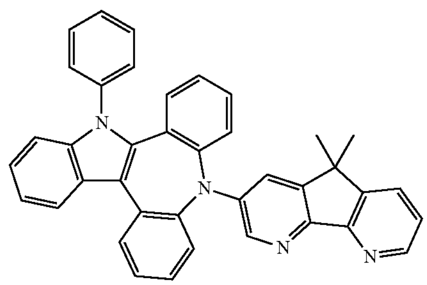
2-113a
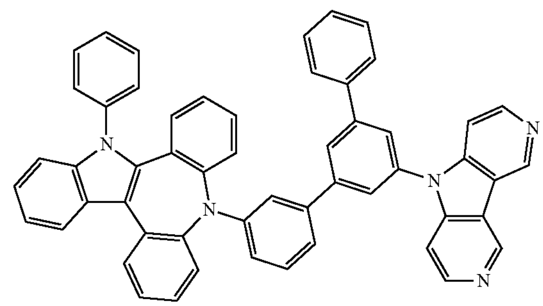
2-114a
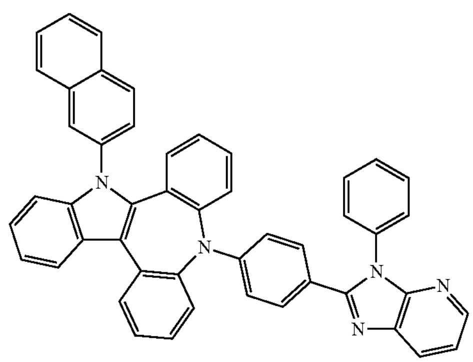
2-115a
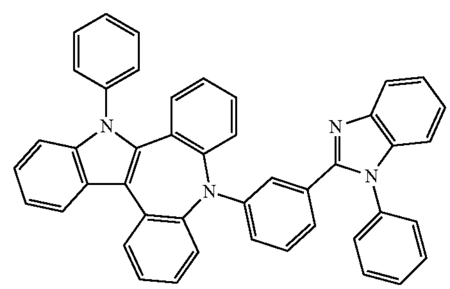
2-116a
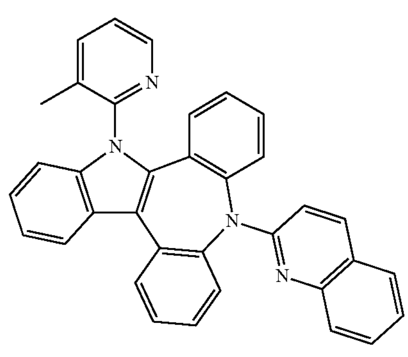
2-117a
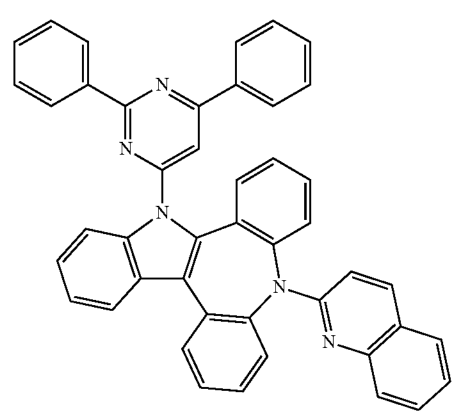

-continued
2-118a
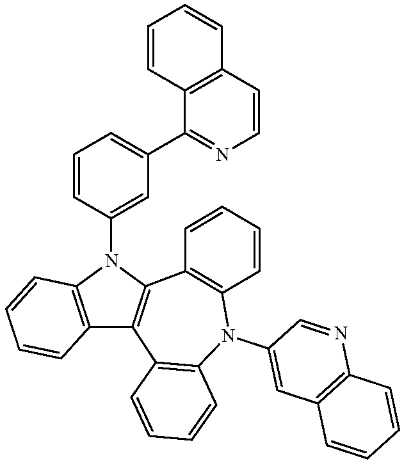
2-119a
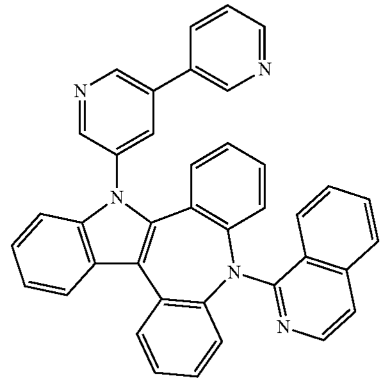
2-120a
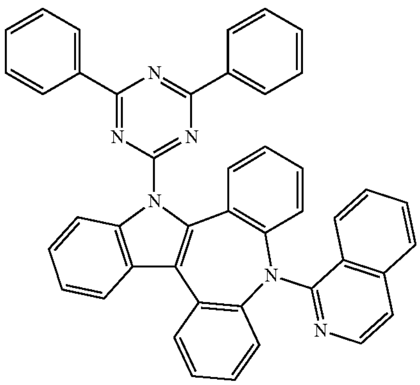
2-121a
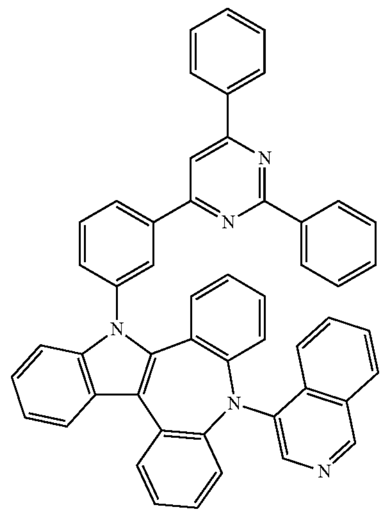
2-122a
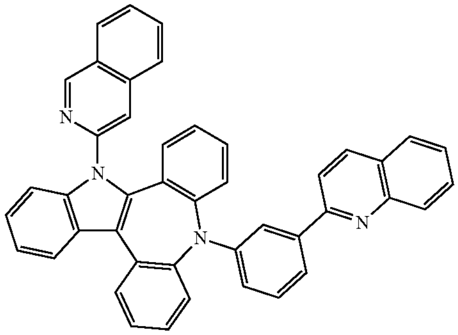
2-123a
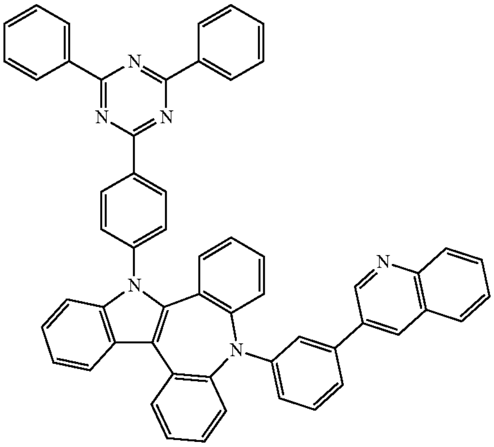

-continued
2-124a
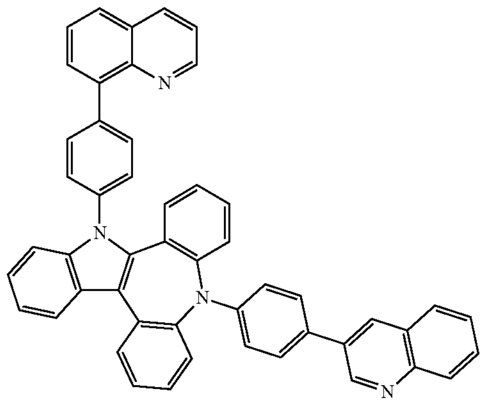
2-125a
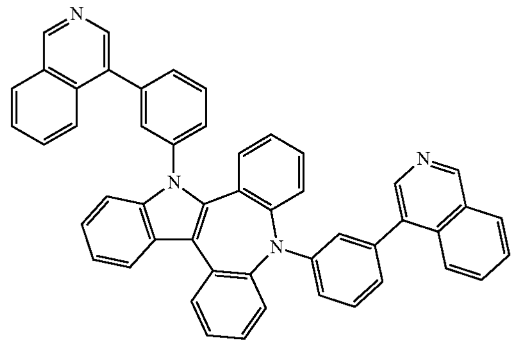
2-126a
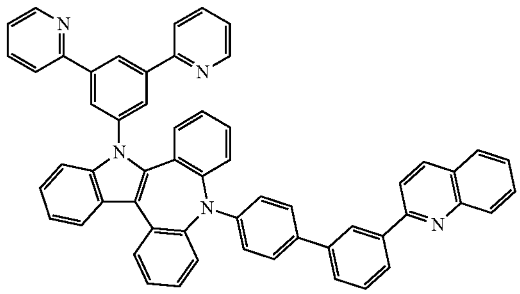
2-127a
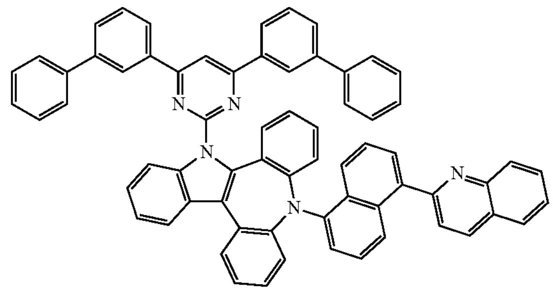
2-128a
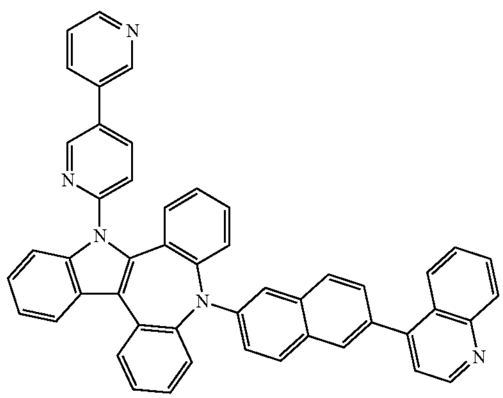
2-129a
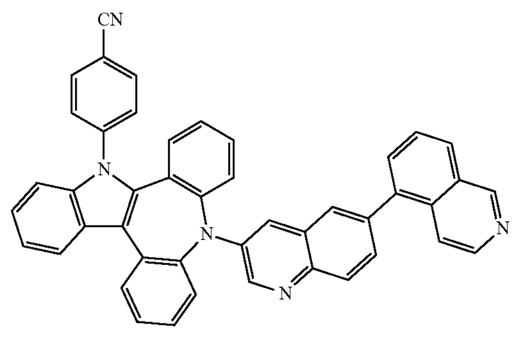
2-130a
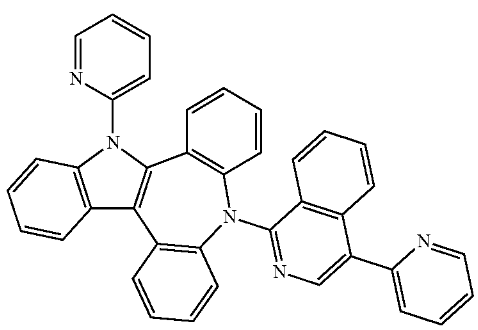
2-131a
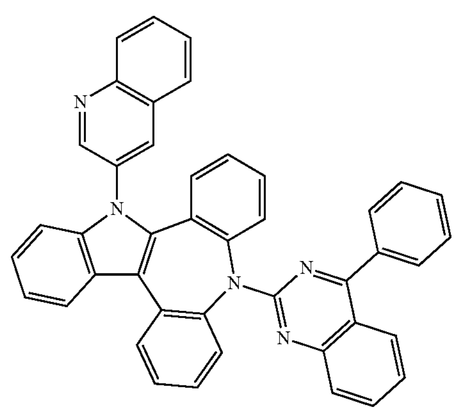

-continued
2-132a
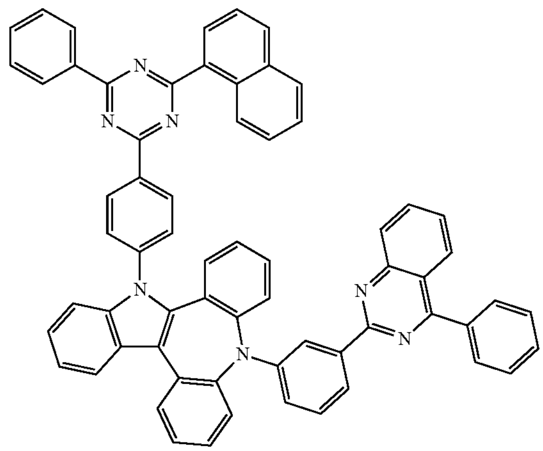
2-133a
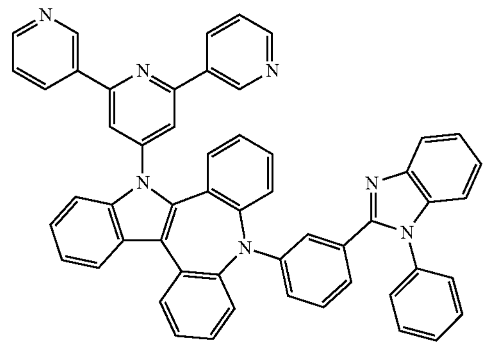
2-134a
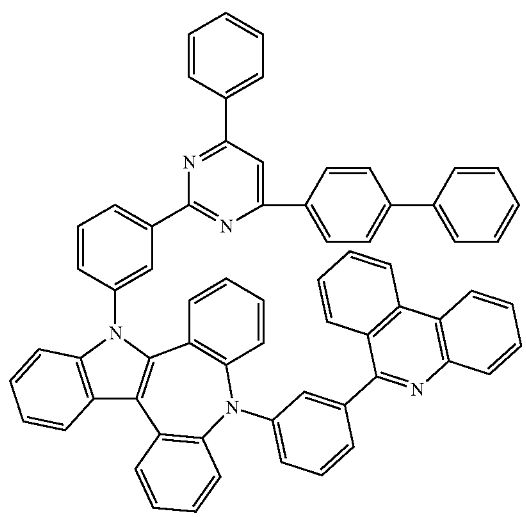
2-135a
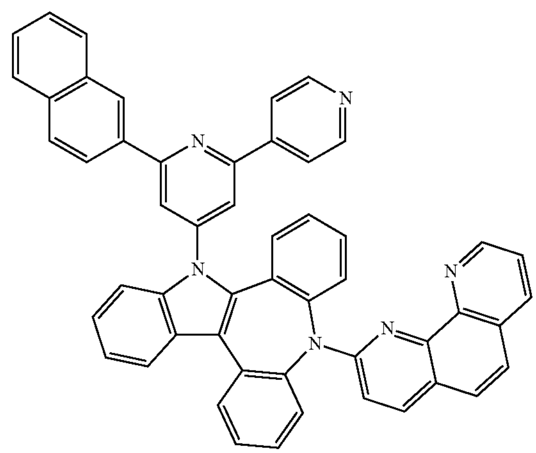
2-136a
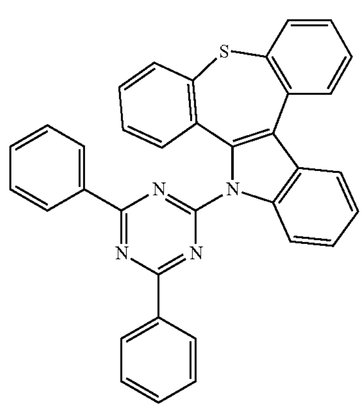
2-137a
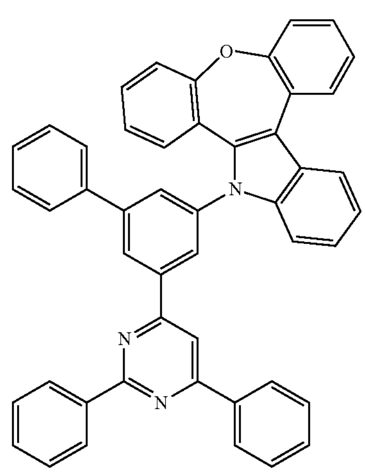

-continued
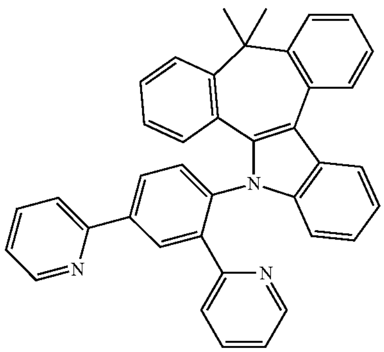
2-138a
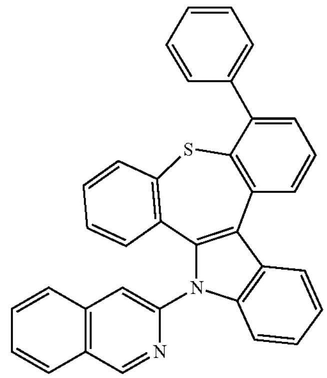
2-139a
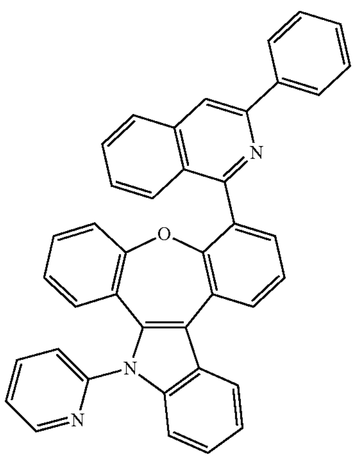
2-140a
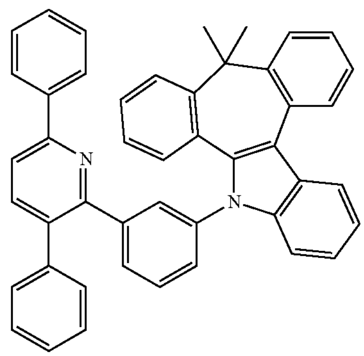
2-141a
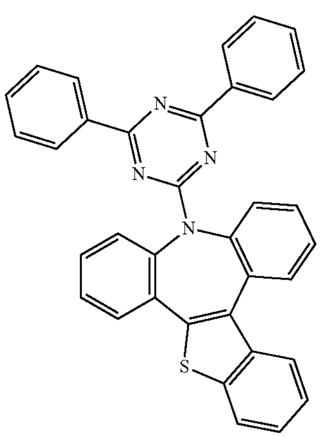
2-142a
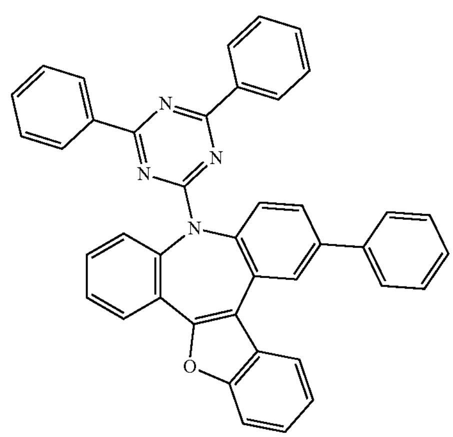
2-143a -continued
2-144a
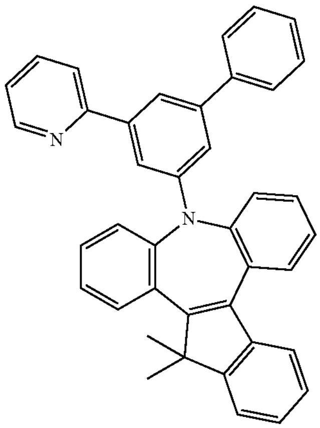
2-145a
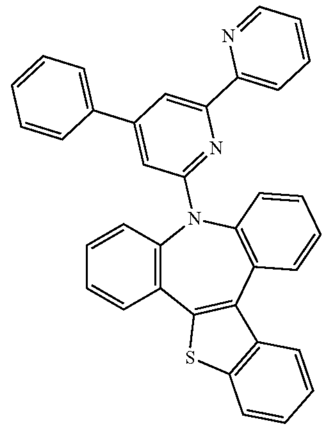
2-146a
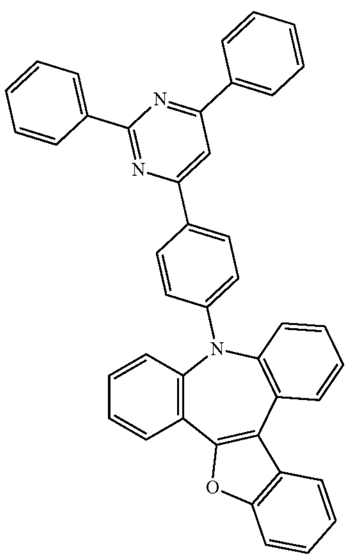
2-147a
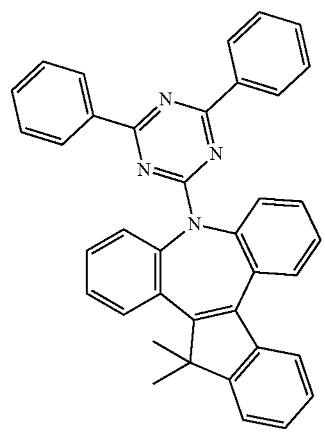
2-148a
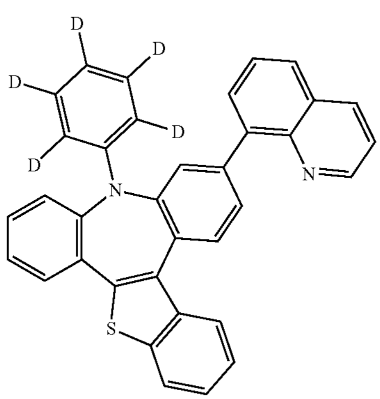
2-149a
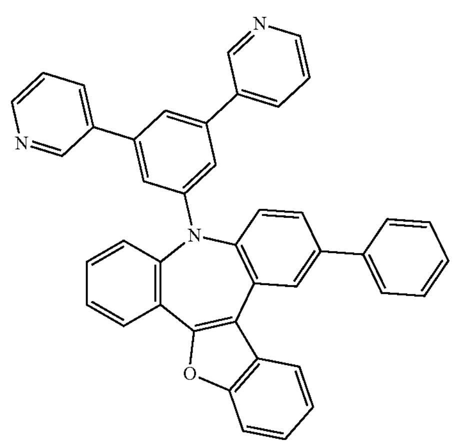

-continued
2-150a
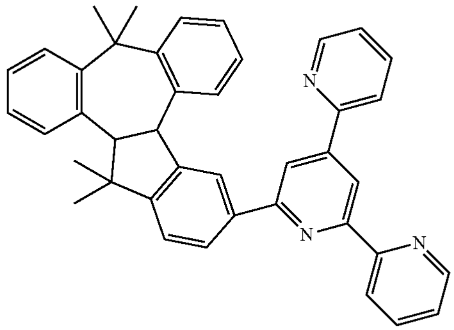
2-151a
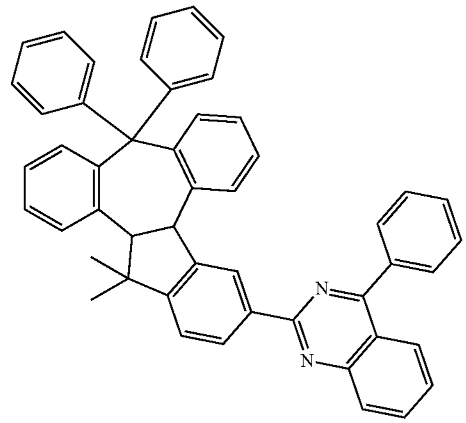
2-152a
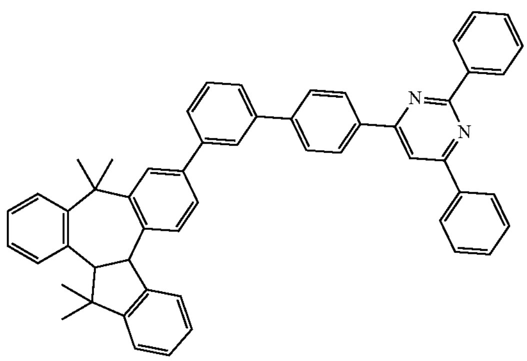
2-153a
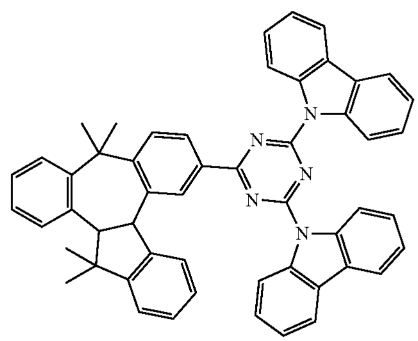
2-154a
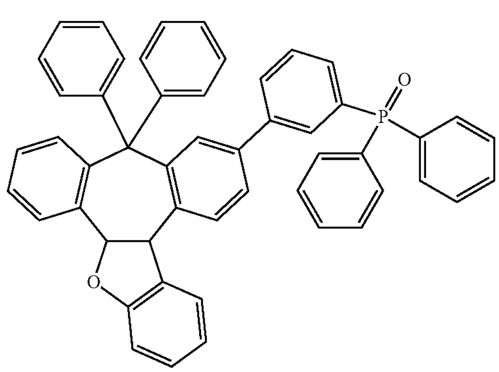
2-155a
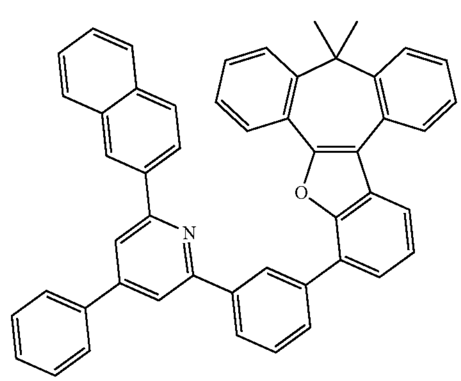

-continued
2-156a
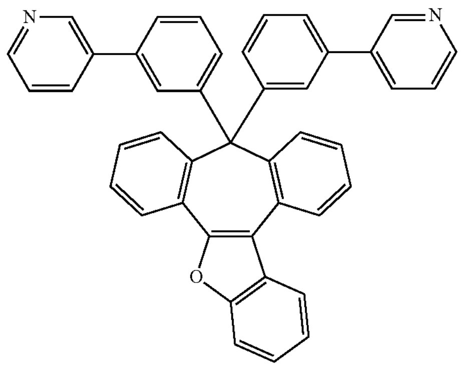
2-157a
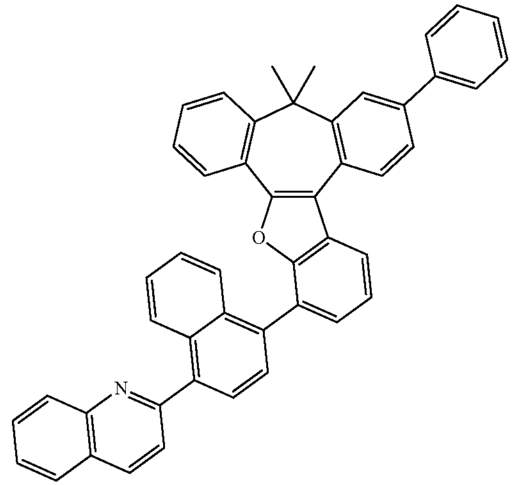
2-158a
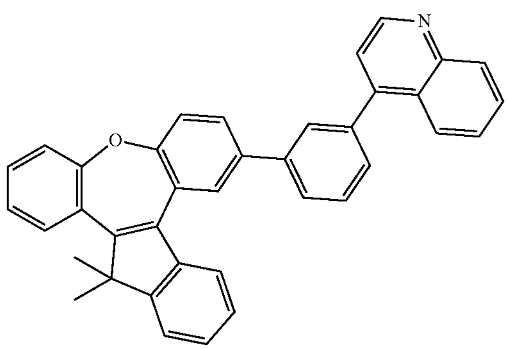
2-159a
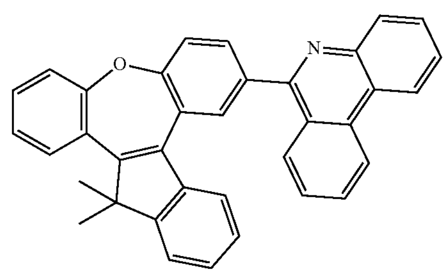
2-160a
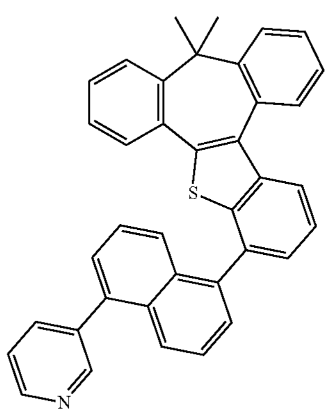
2-161a
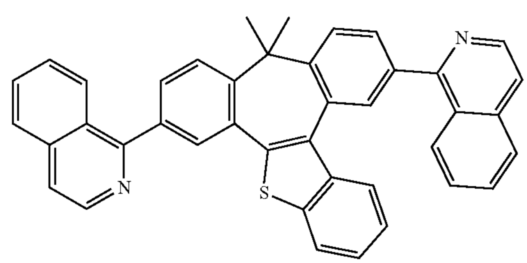

-continued
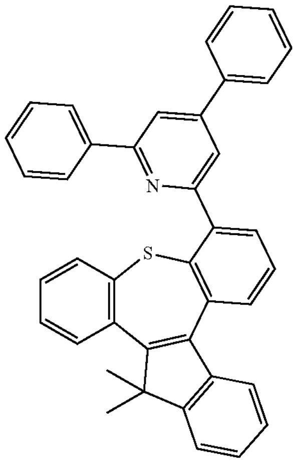
2-162a
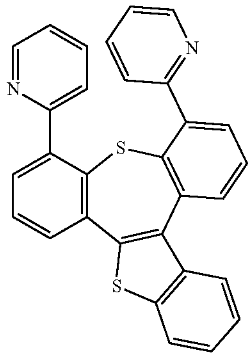
2-163a
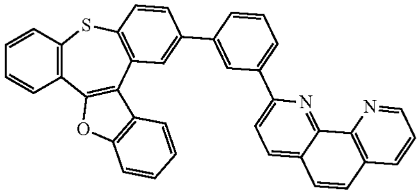
2-164a
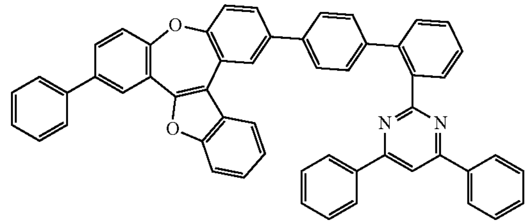
2-165a
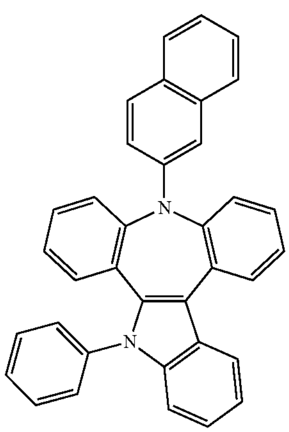
2-166a
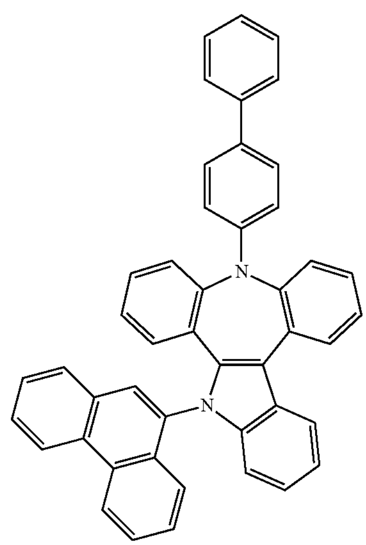
2-167a -continued
2-168a
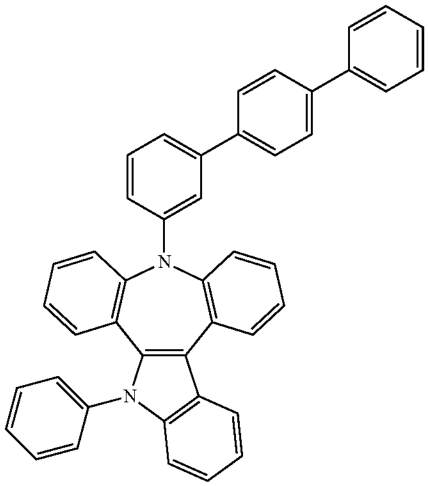
2-169a
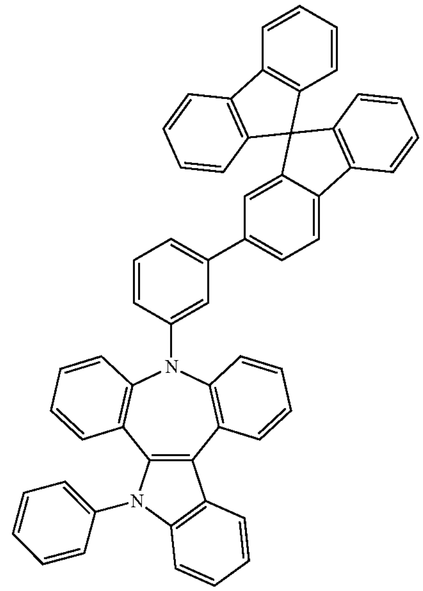
2-170a
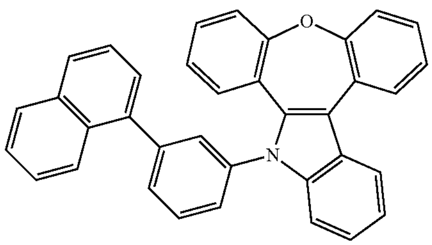
2-171a
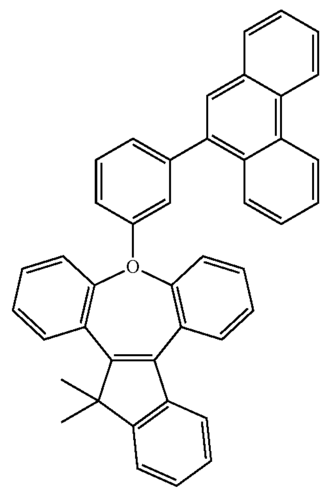
2-172a
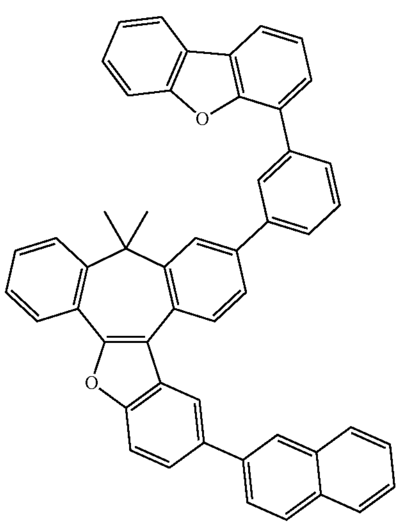
2-1
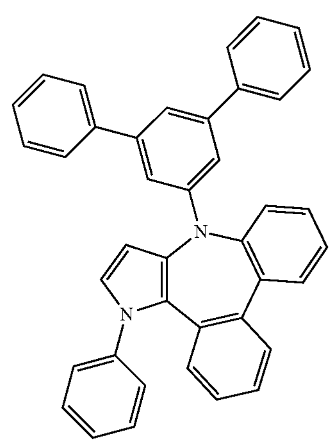

-continued
2-2
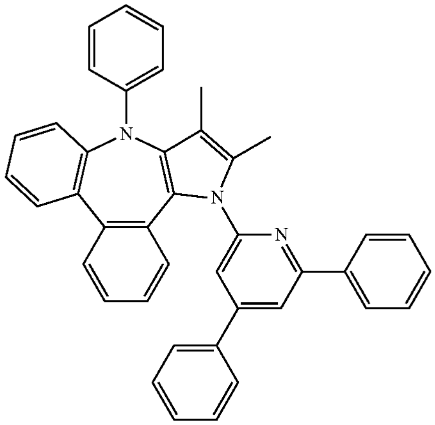
2-3
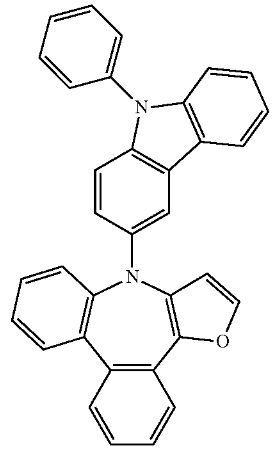
2-4
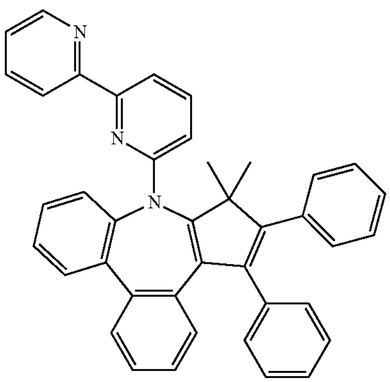
2-5
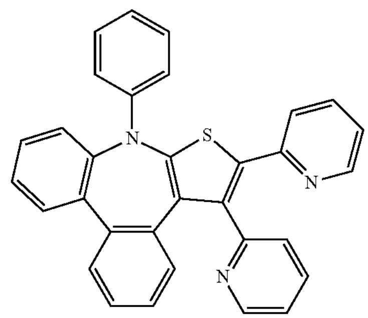
2-6
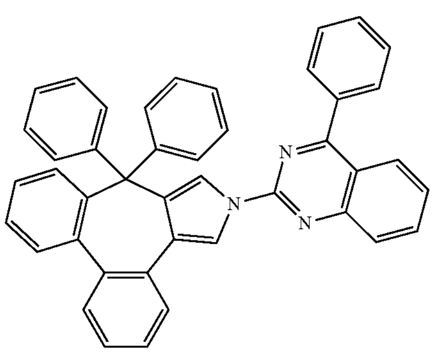
2-7
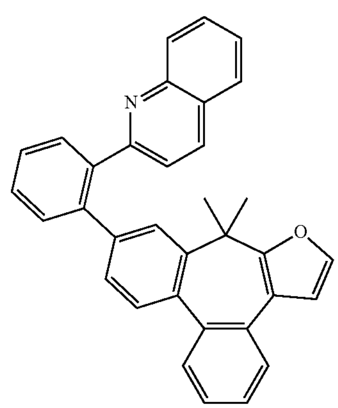

-continued
2-8
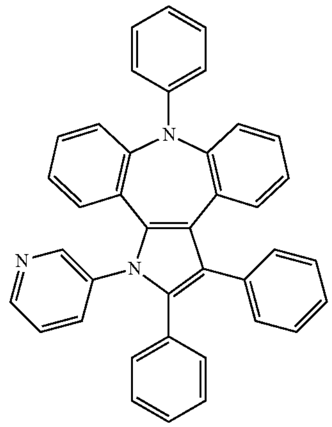
2-9
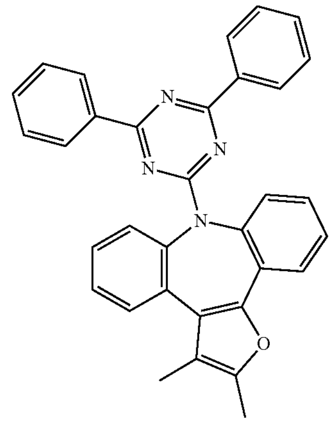
2-10
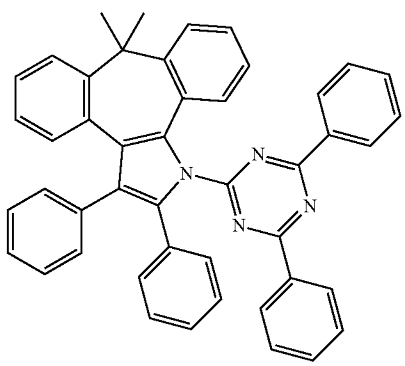
2-11
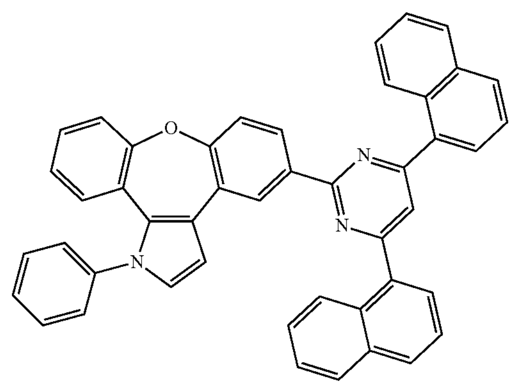
2-12
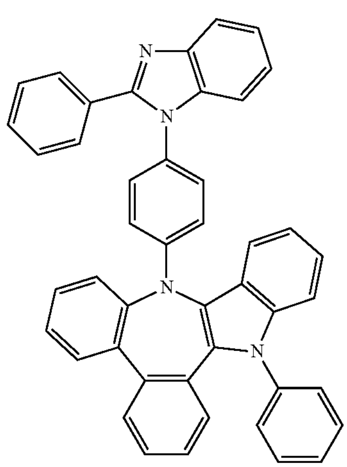
2-13
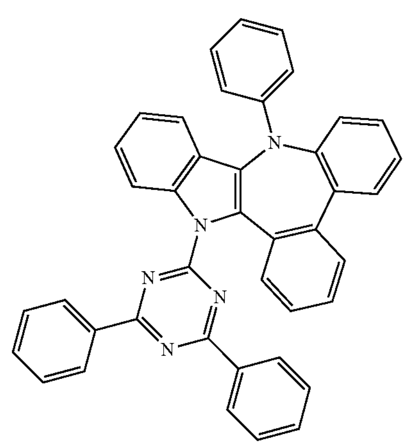

-continued
2-14
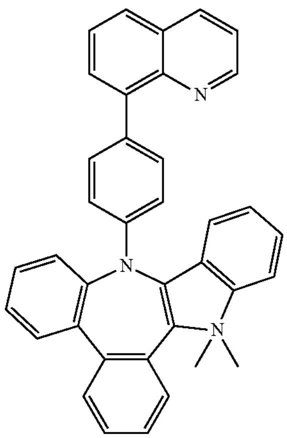
2-15
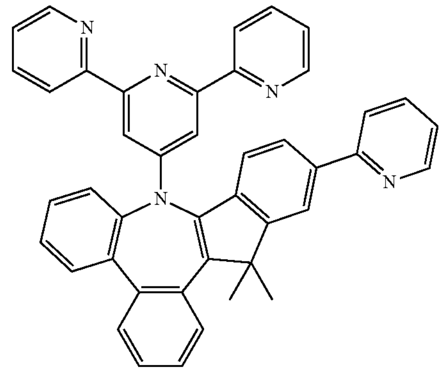
2-16
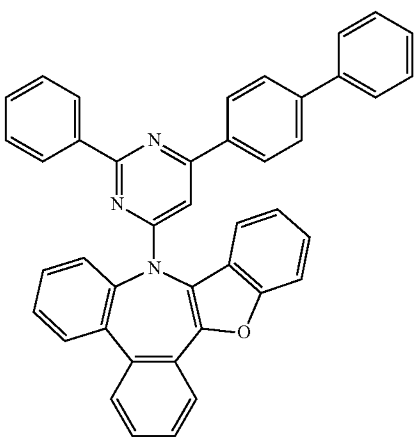
2-17
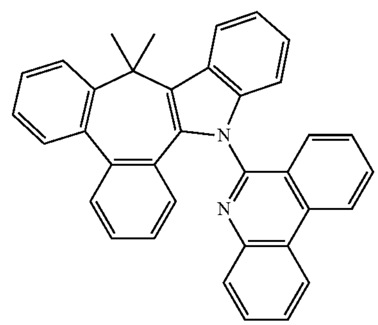
2-18
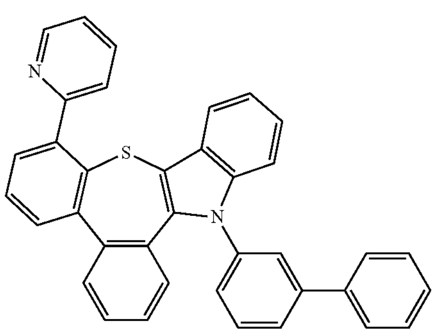
2-19
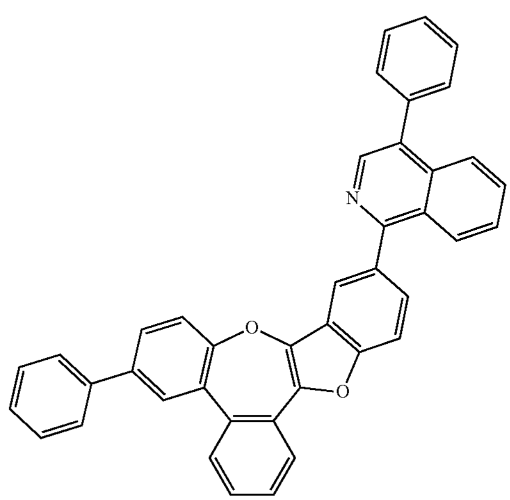

-continued
2-20
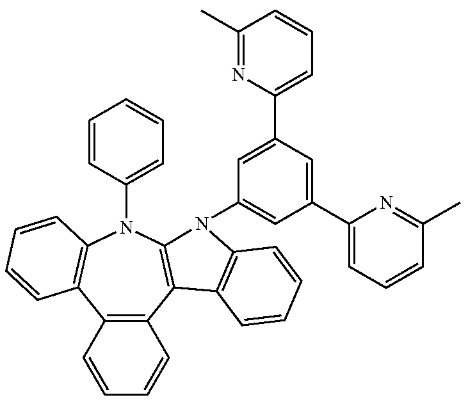
2-21
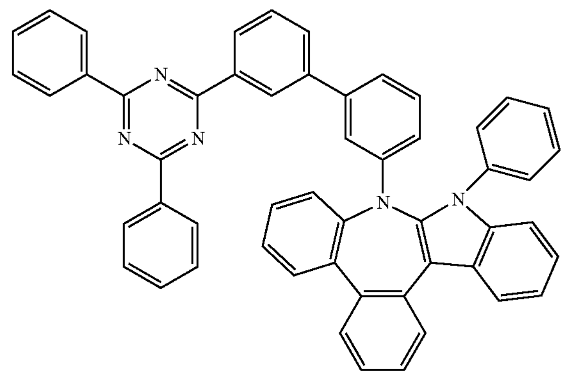
2-22
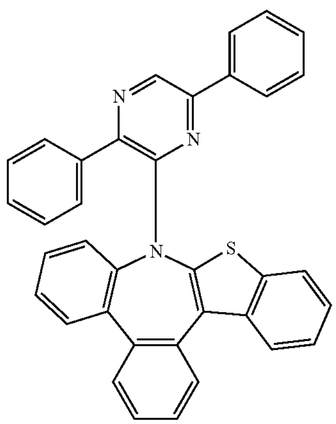
2-23
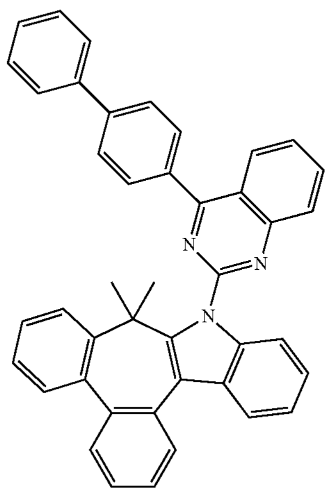
2-24
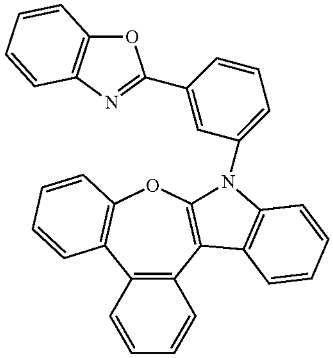
2-25
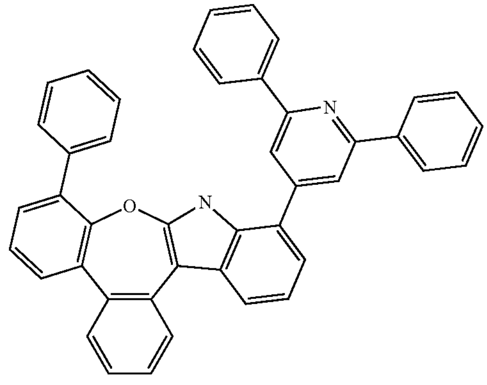

-continued
2-26
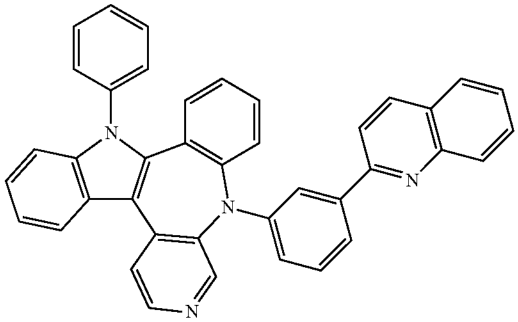
2-27
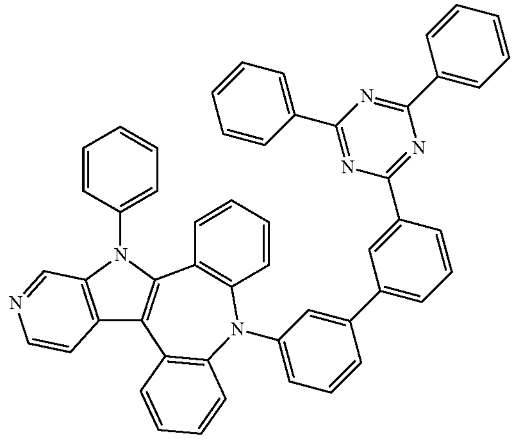
2-28
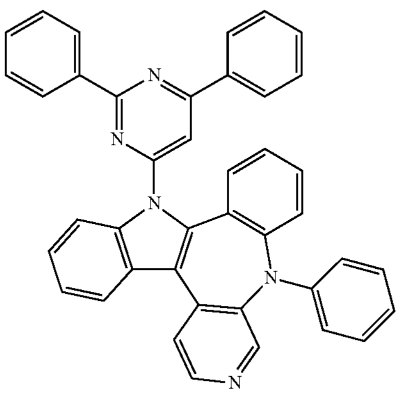
2-29
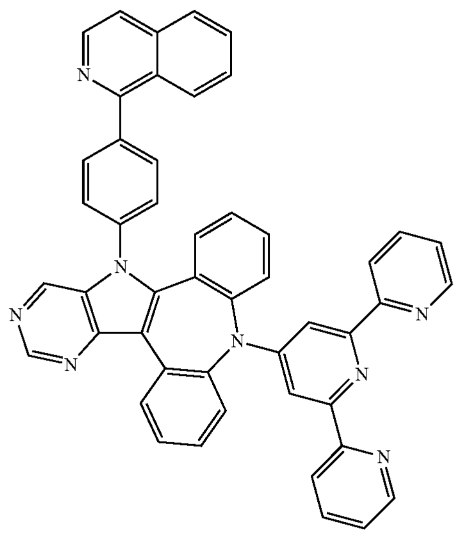
2-30
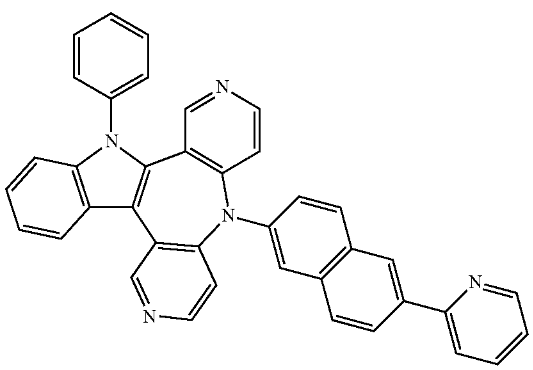
2-31
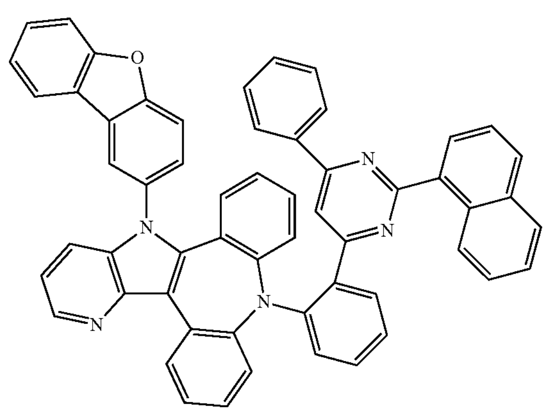

-continued
2-32
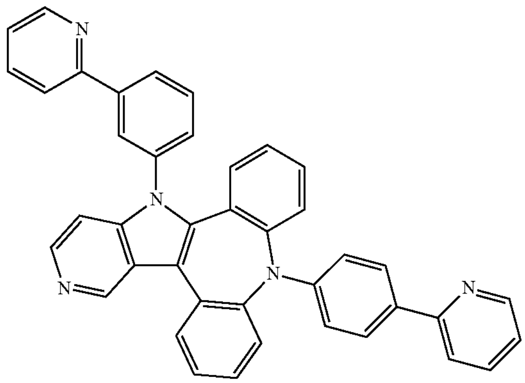
2-33
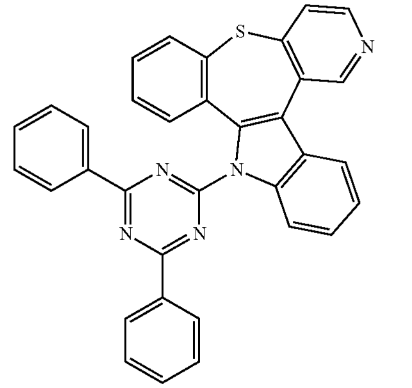
2-34
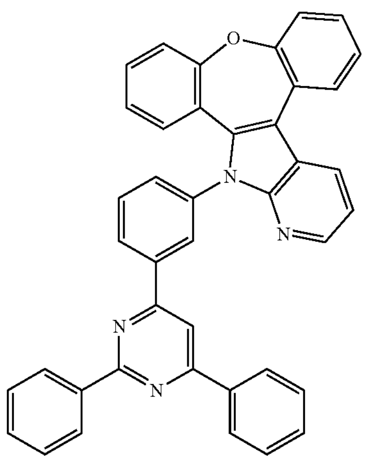
2-35
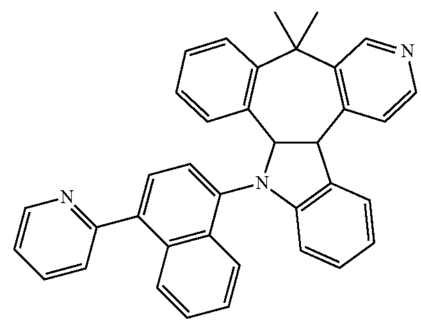
2-36
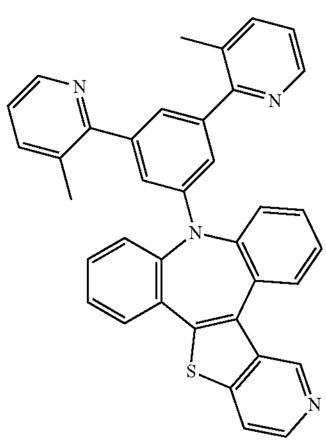
2-37
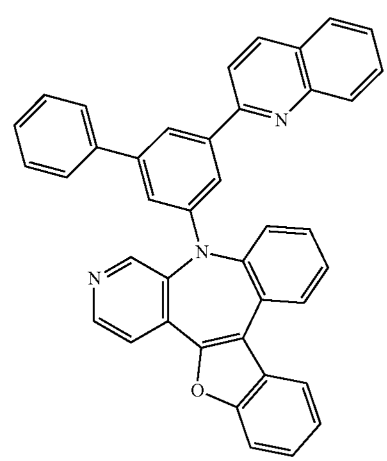

-continued
2-38
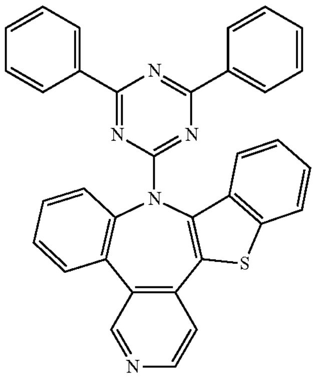
2-39
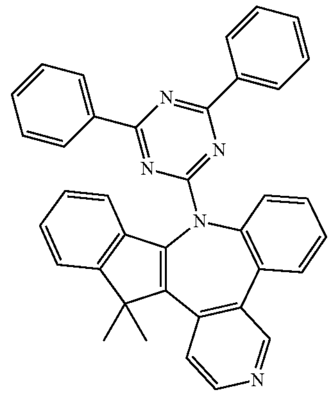
2-40
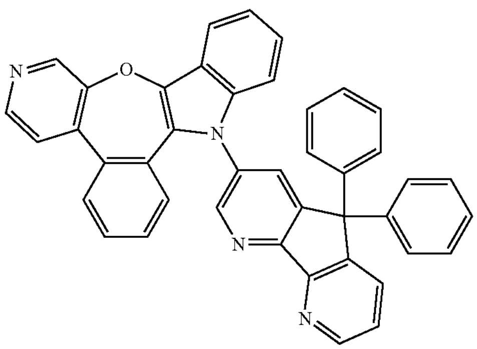
2-41
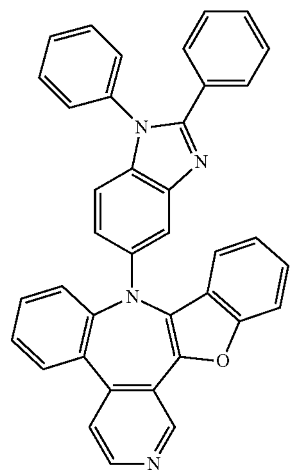
2-42
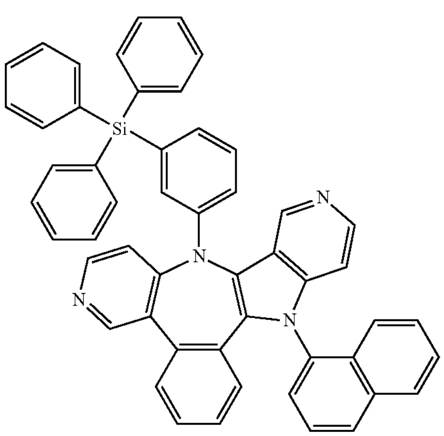

-continued
2-43
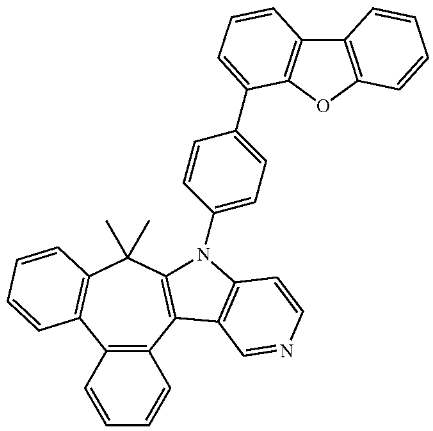
2-44
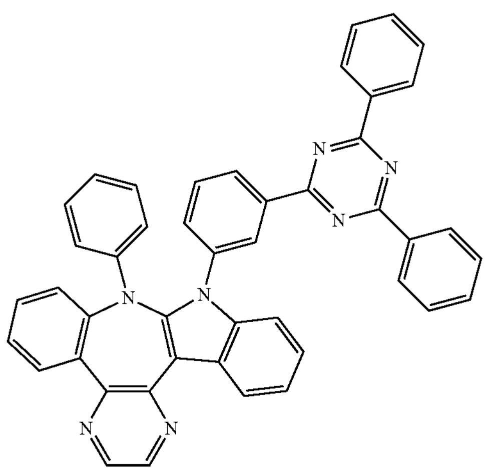
2-45
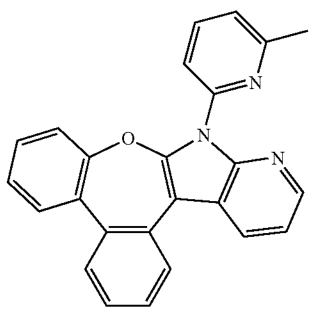
2-46
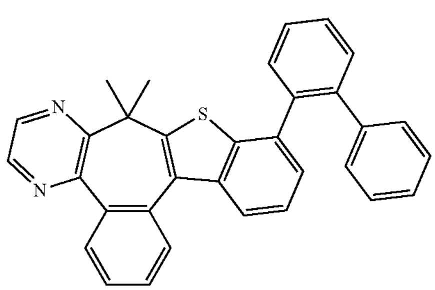
2-47
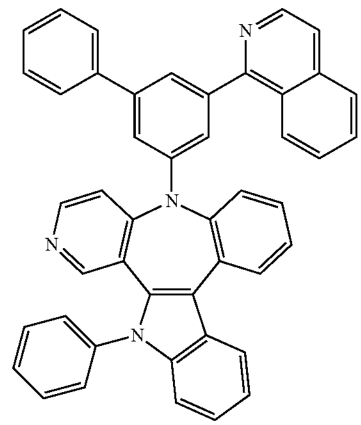
2-48
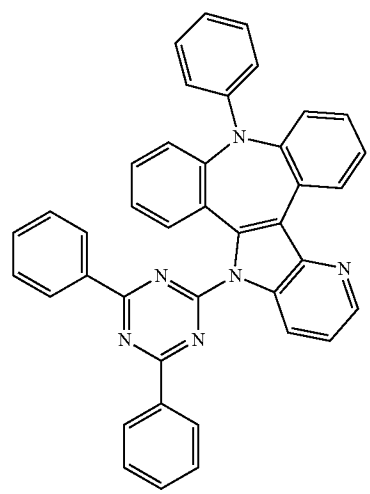
2-49
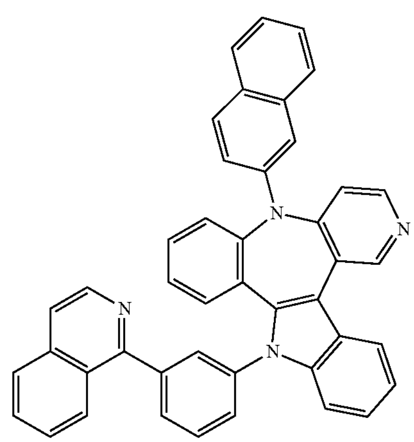

-continued
2-50
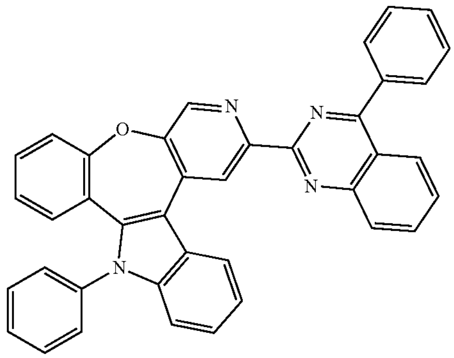
2-51
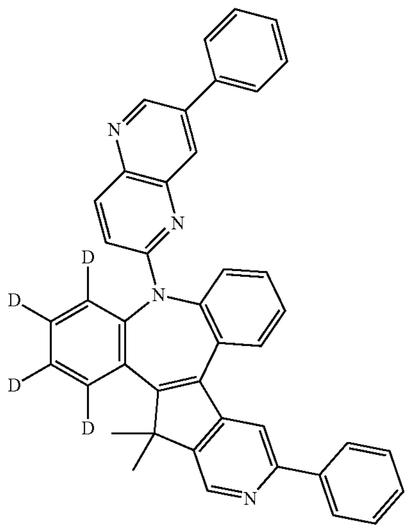
2-52
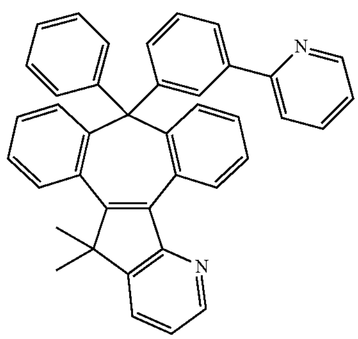
2-53
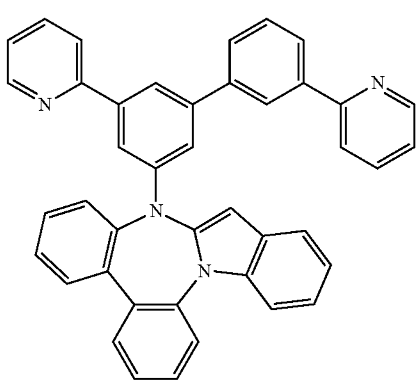
-continued
2-54
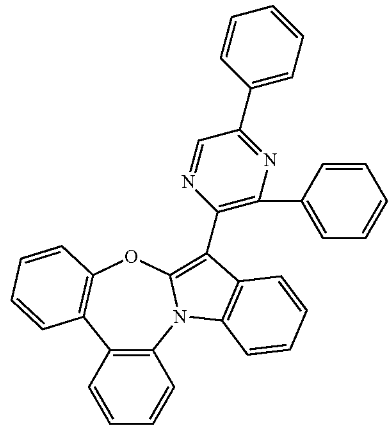
2-55
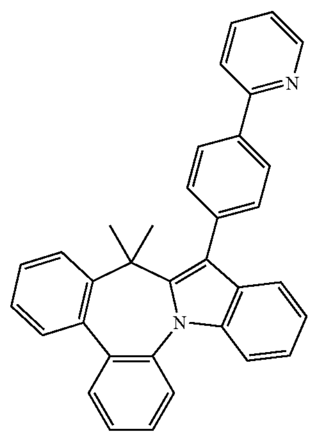
2-56
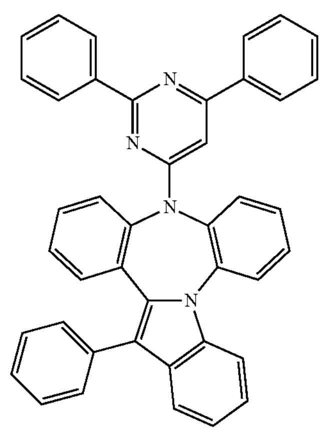

-continued
2-57
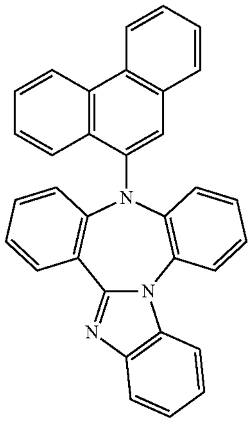
2-58
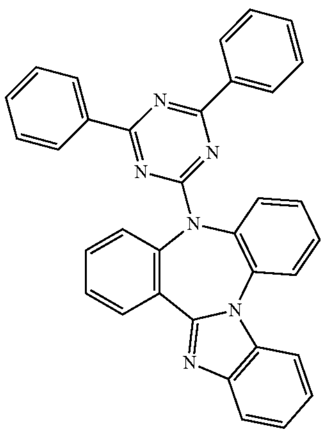
2-59
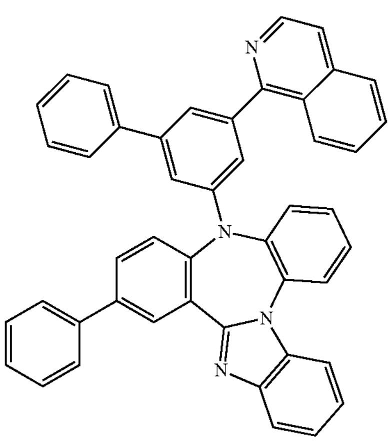
-continued
2-60
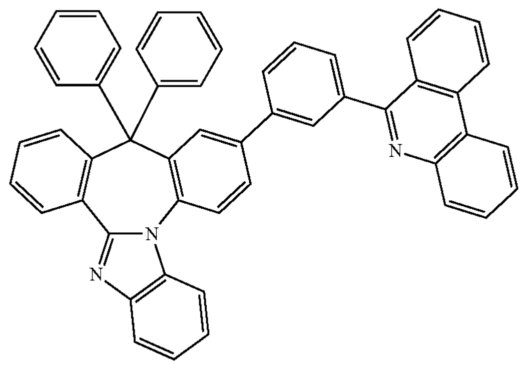
2-61
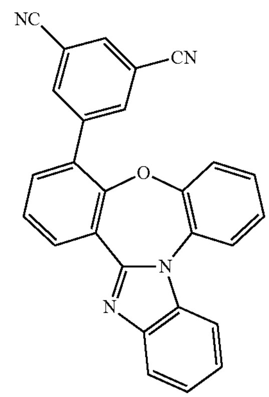
2-62
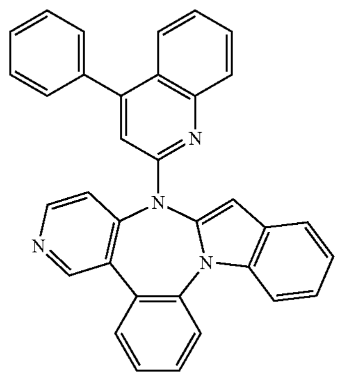
2-63
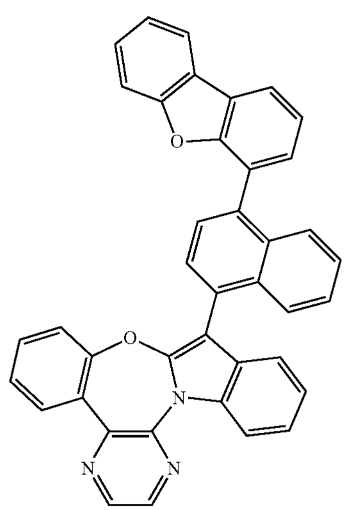

-continued
2-64
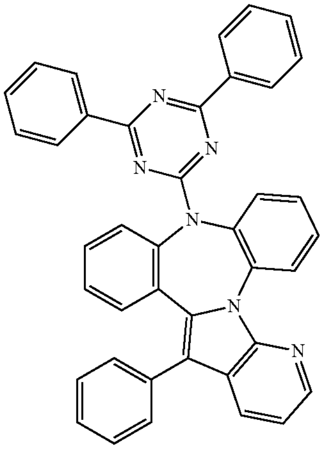
2-65
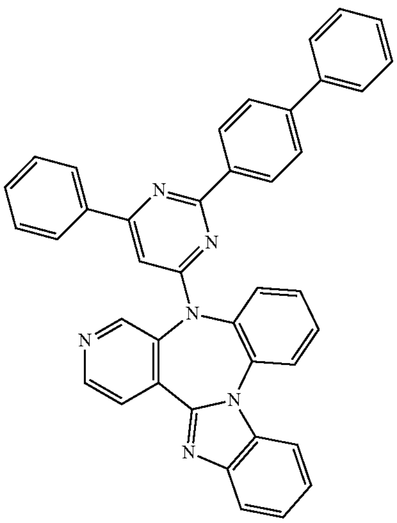
2-66
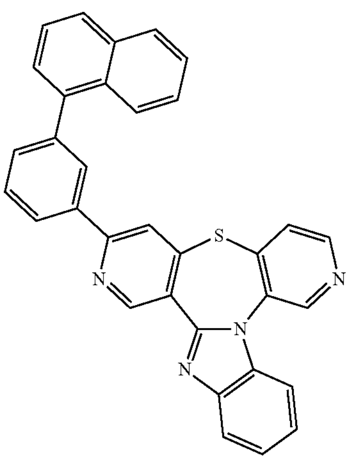
-continued
2-67
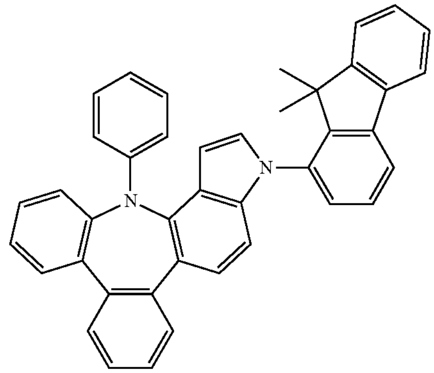
2-68
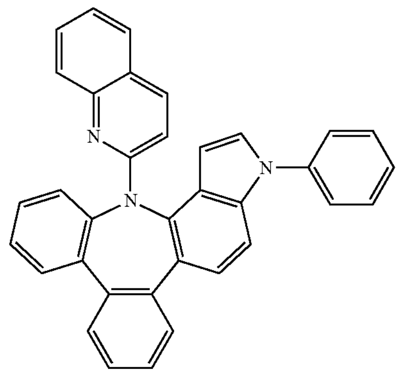
2-69
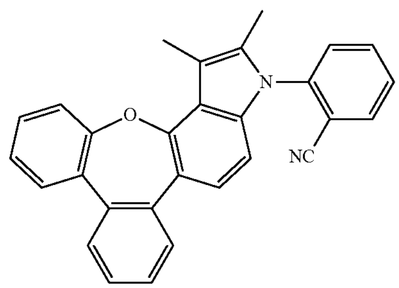
2-70
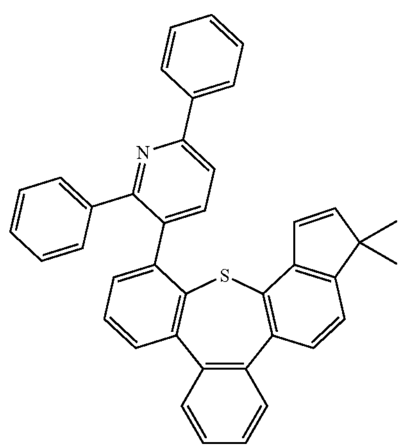

-continued
2-71
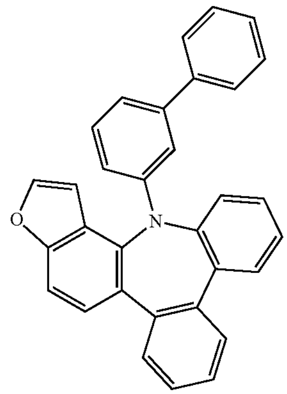
2-72
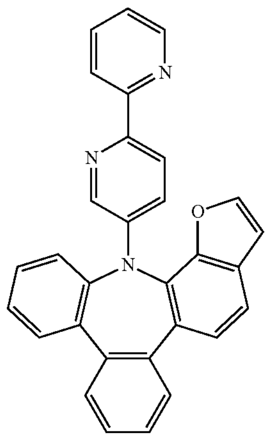
2-73
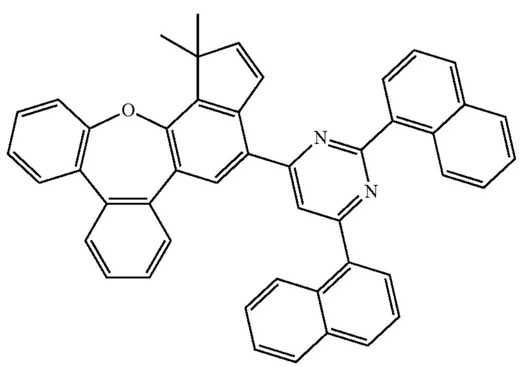
2-74
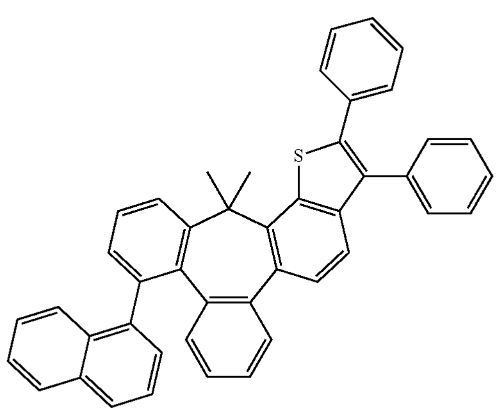
-continued
2-75
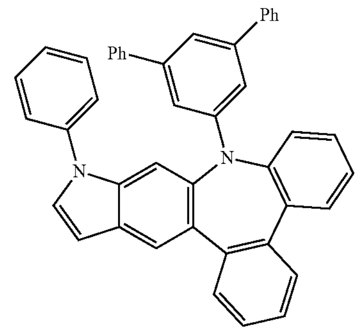
2-76
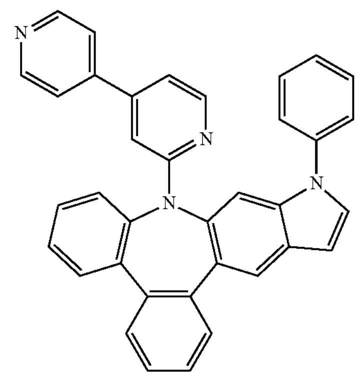
2-77
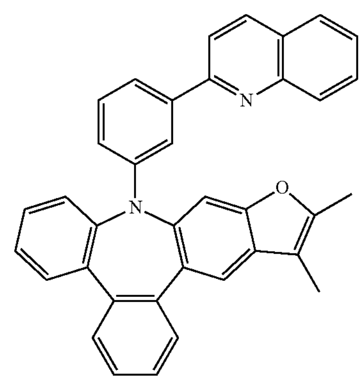
2-78
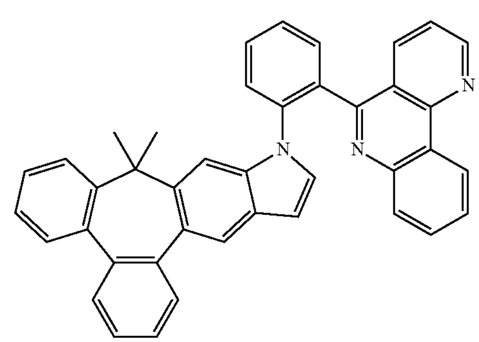

-continued
2-79
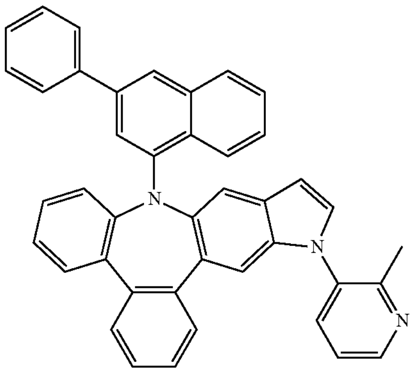
2-80
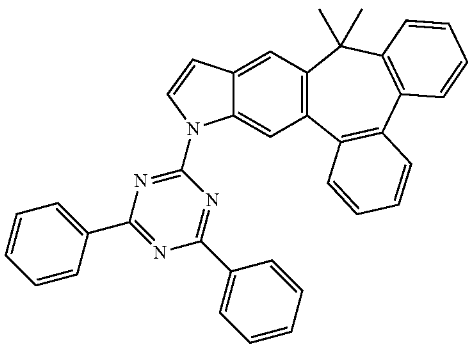
2-81
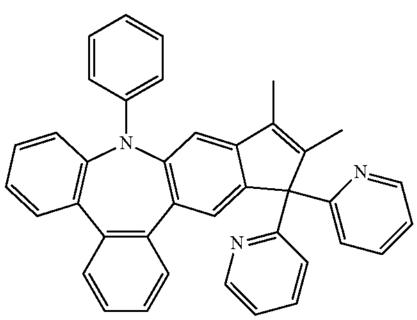
2-82
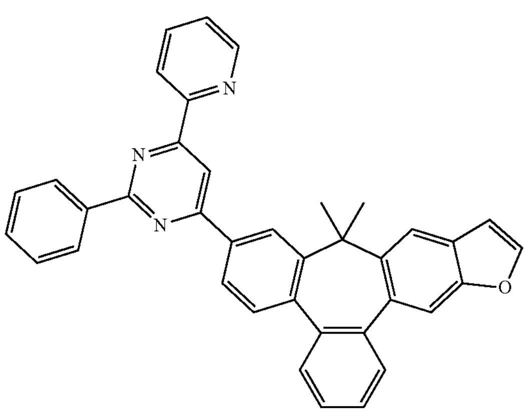
-continued
2-83
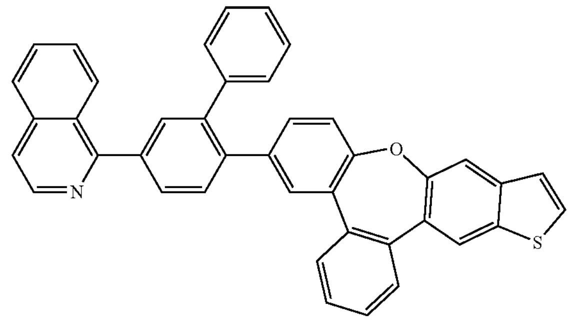
2-84
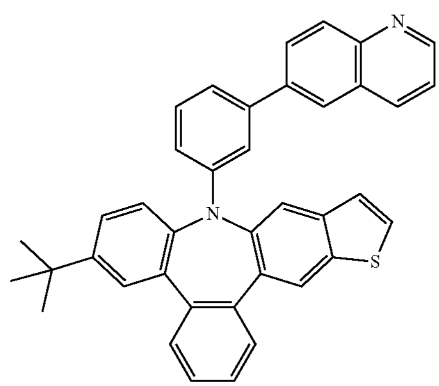
2-85
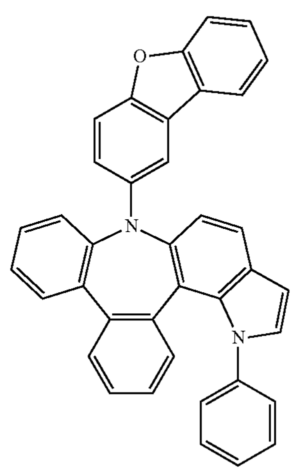

-continued
2-86
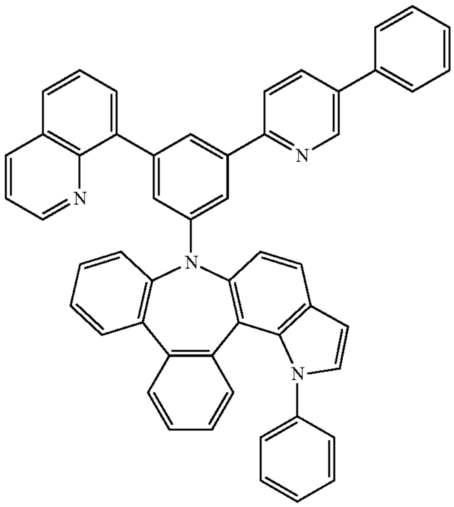
2-87
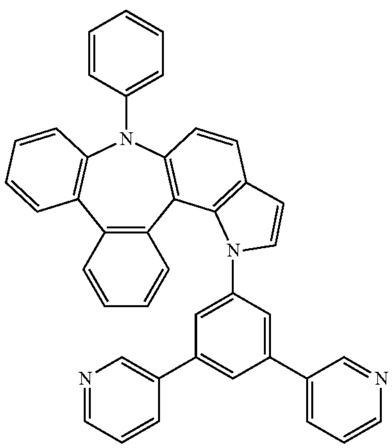
2-88
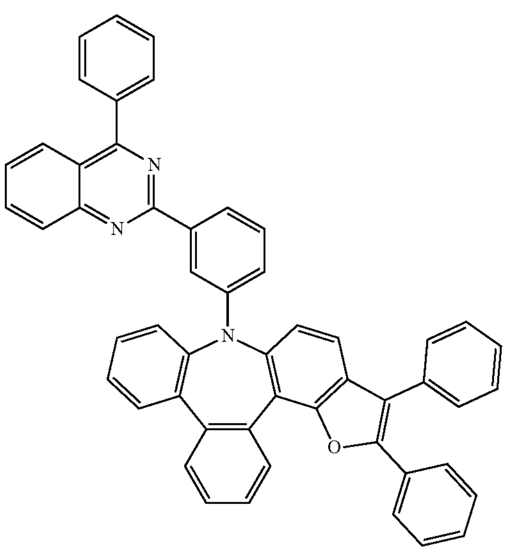
-continued
2-89
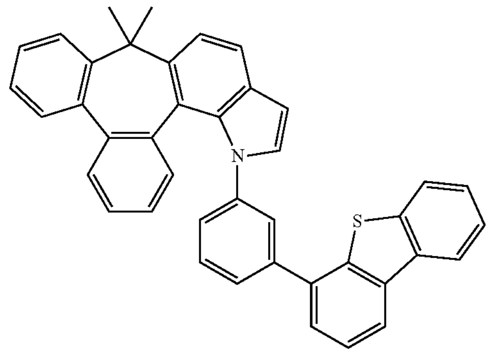
2-90
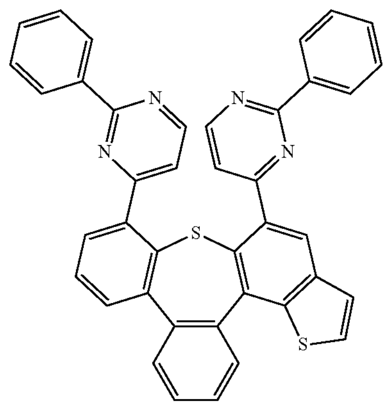
2-91
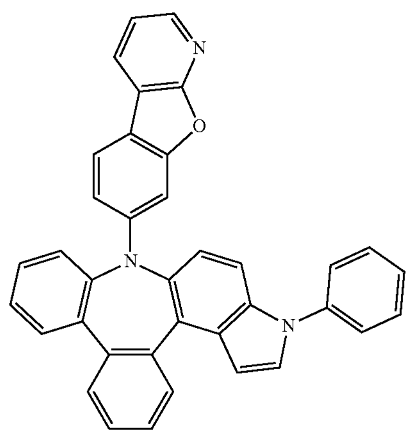
2-92
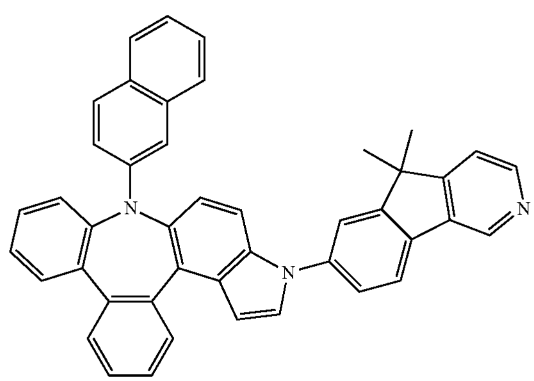

-continued
2-93
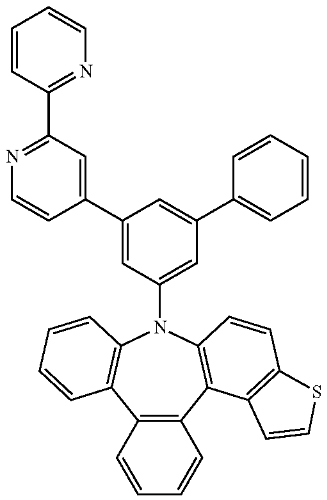
2-94
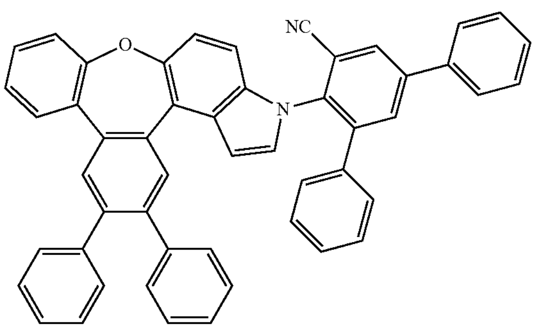
2-95
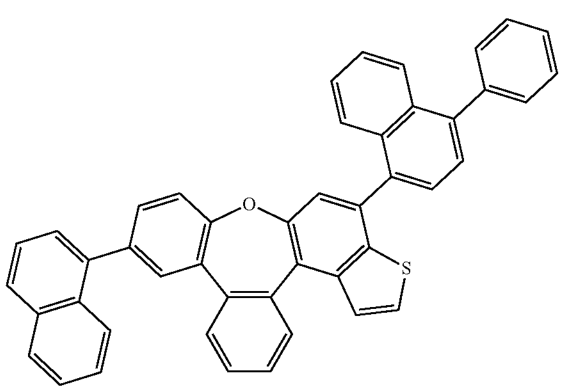
-continued
2-96
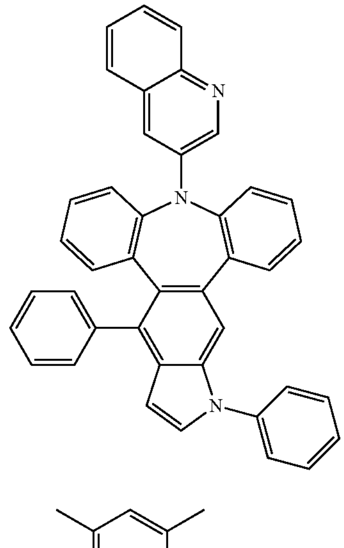
2-97
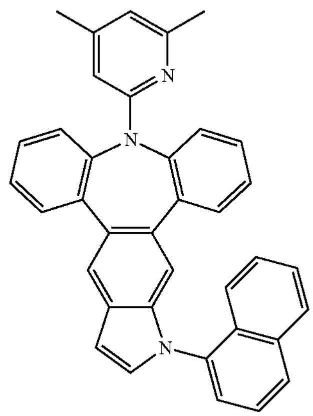
2-98
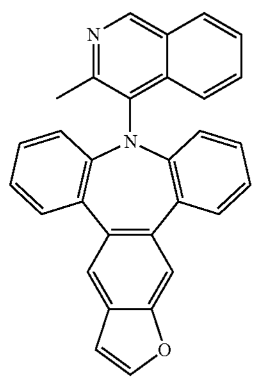
2-99
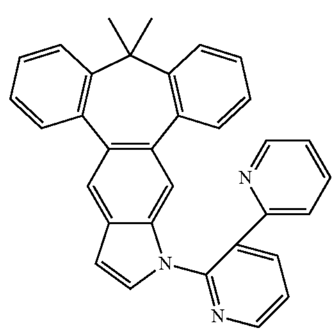

2-100
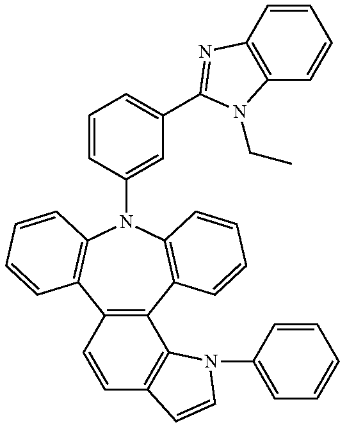
2-101
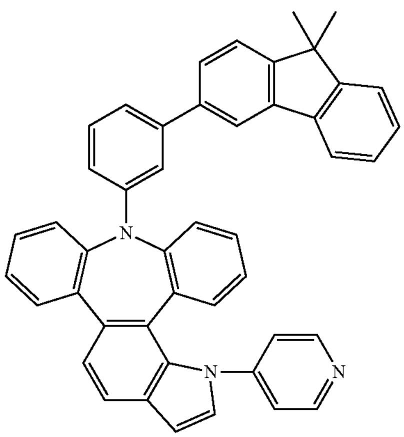
2-102
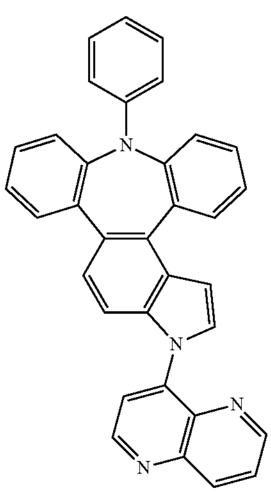
2-103
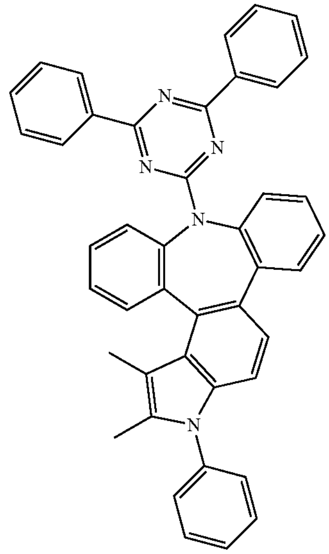
2-104
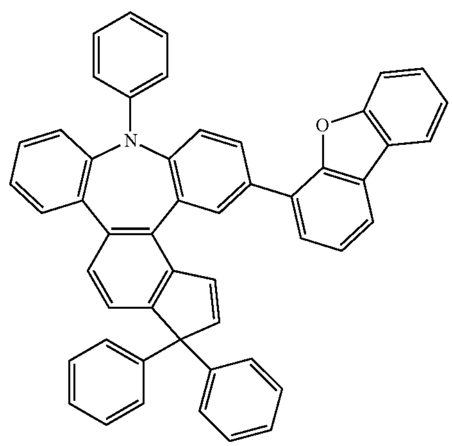
2-105
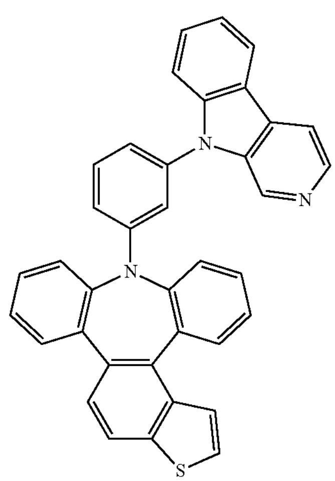

-continued
2-106
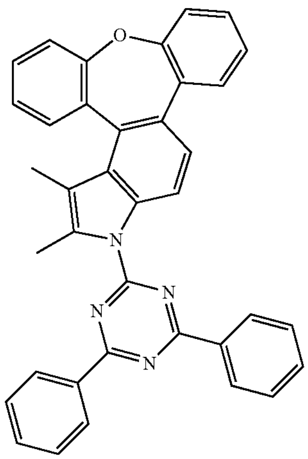
2-107
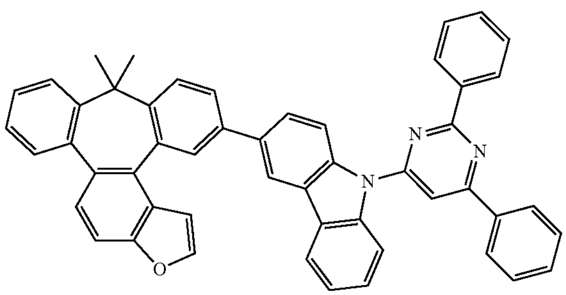
2-108
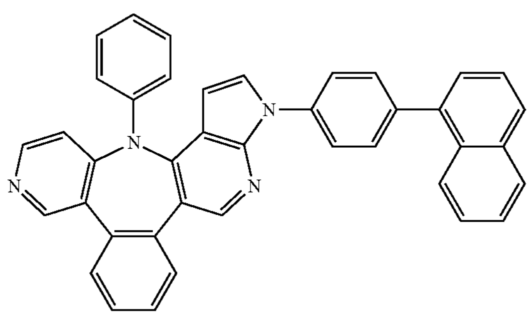
2-109
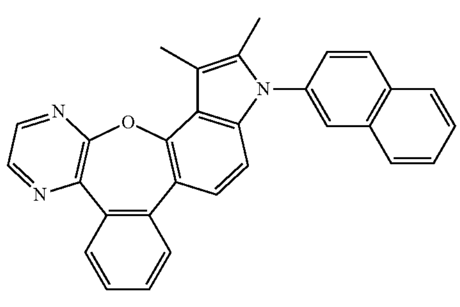
-continued
2-110
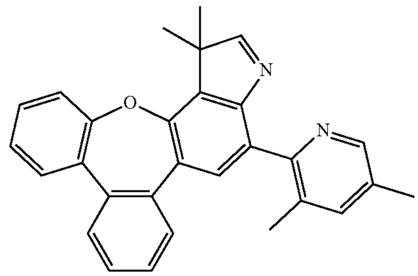
2-111
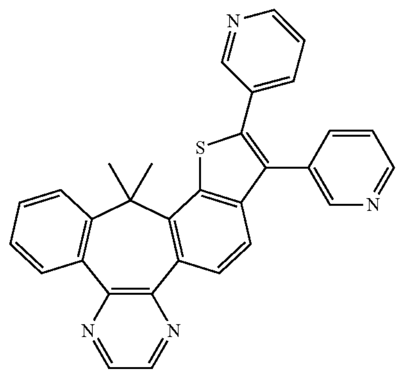
2-112
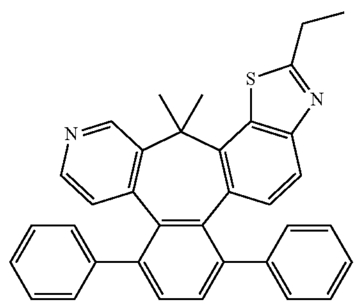
2-113
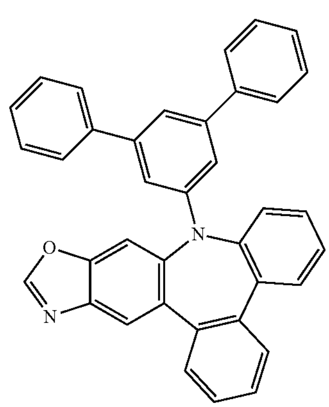

-continued
2-114
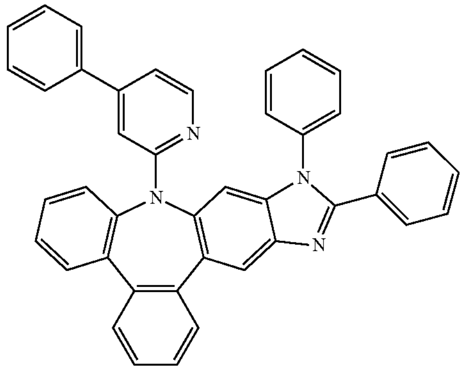
2-115
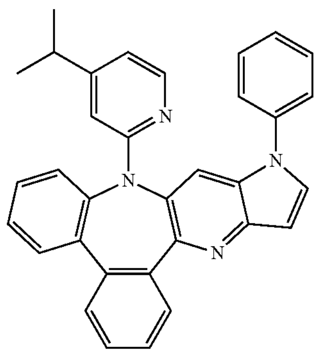
2-116
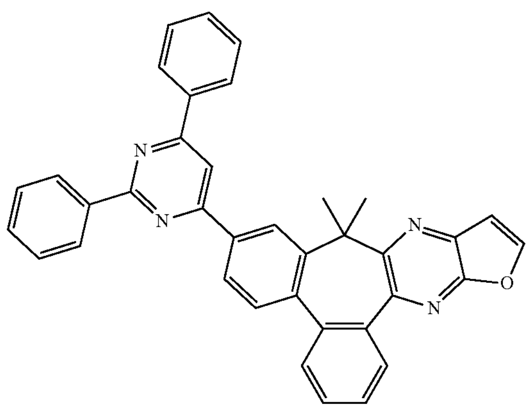
2-117
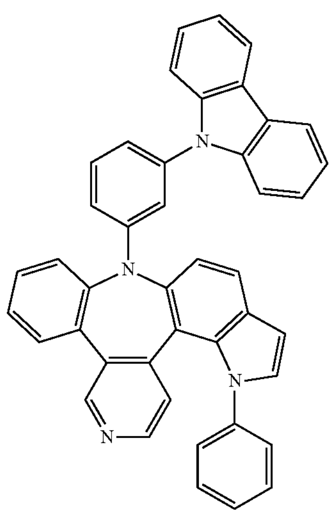
-continued
2-118
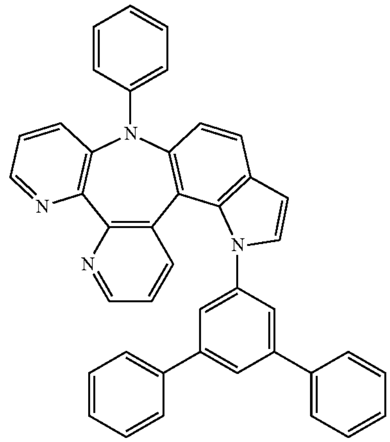
2-119
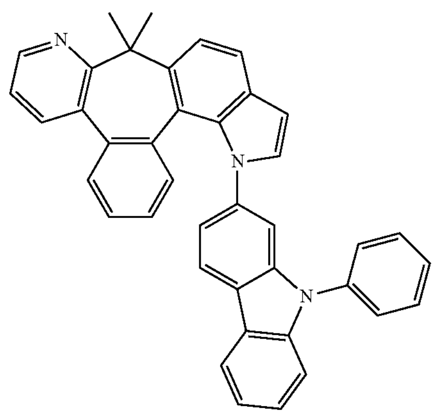
2-120
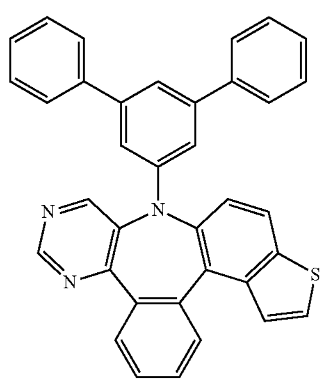

-continued
2-121
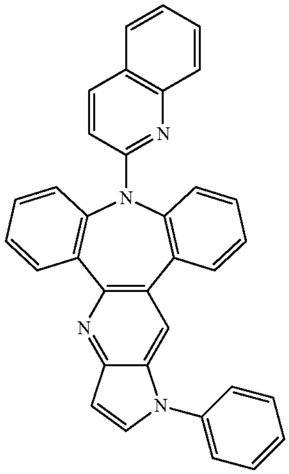
2-122
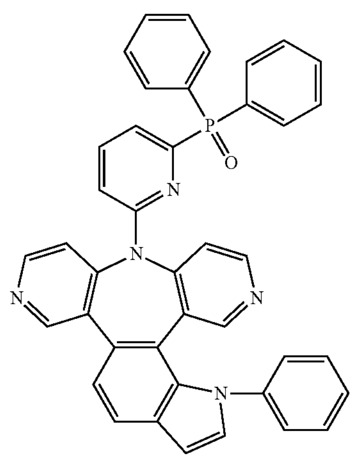
2-123
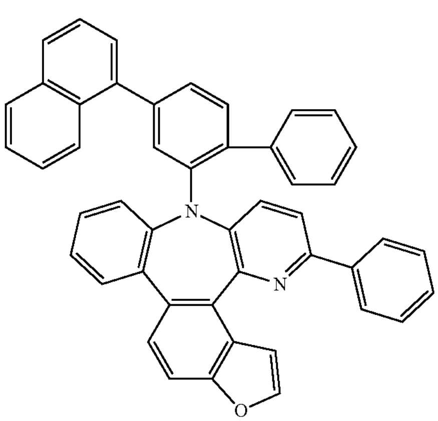
-continued
2-124
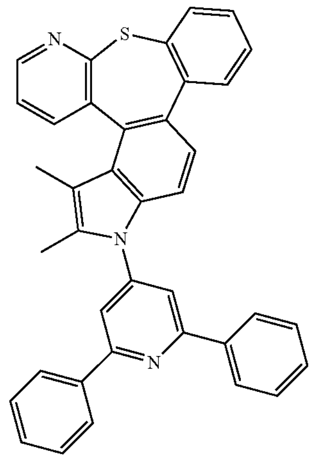
2-125
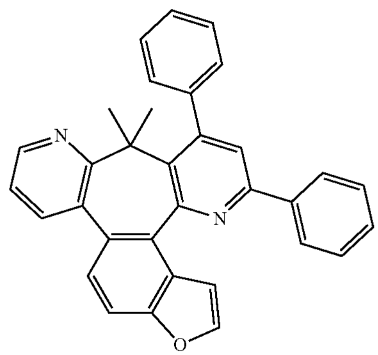
2-126
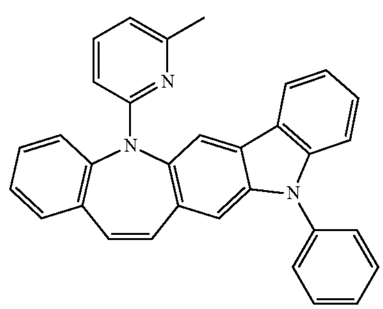
2-127
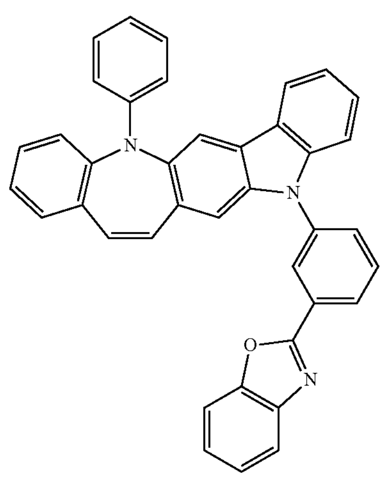

-continued
2-128
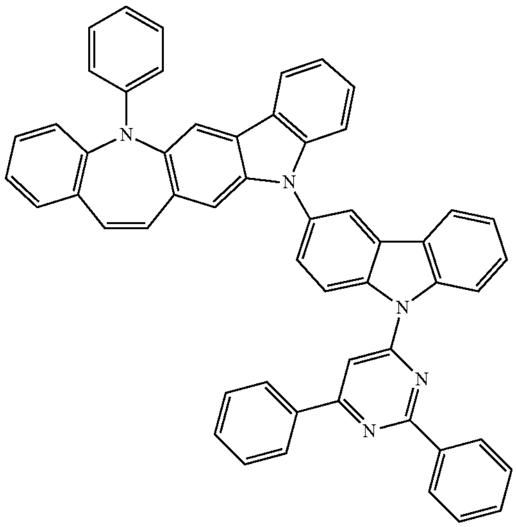
2-129
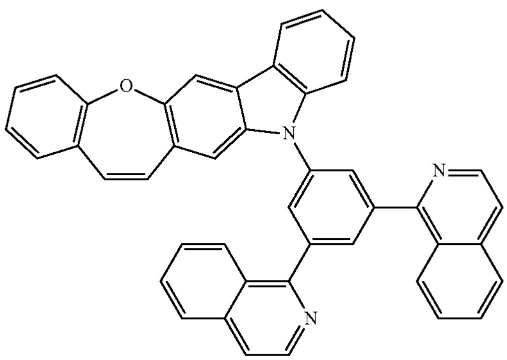
2-130
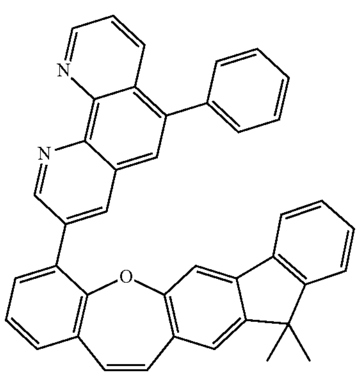
2-131
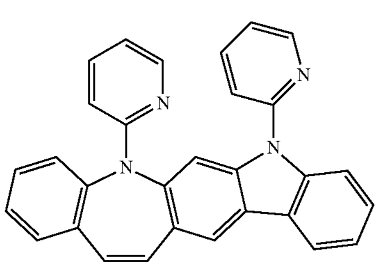
-continued
2-132
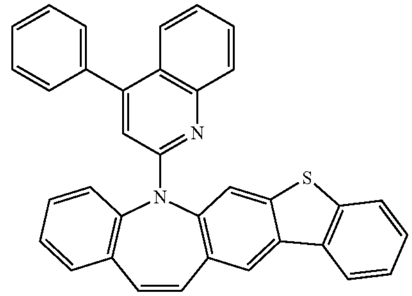
2-133
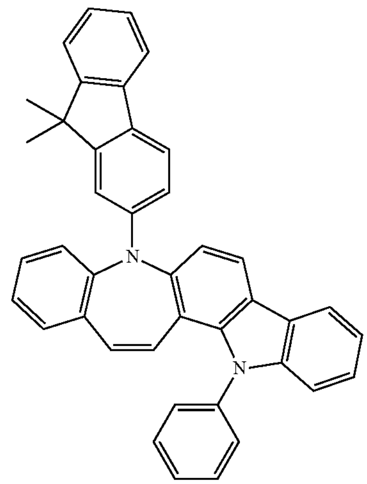
2-134
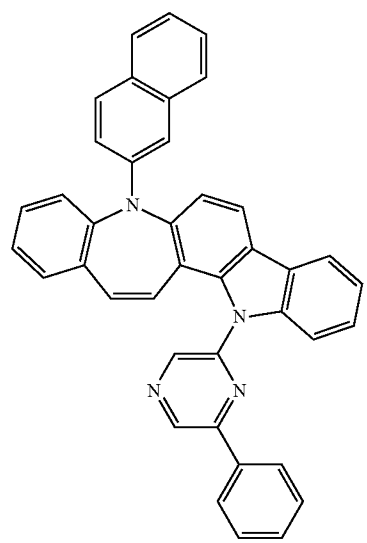
2-135
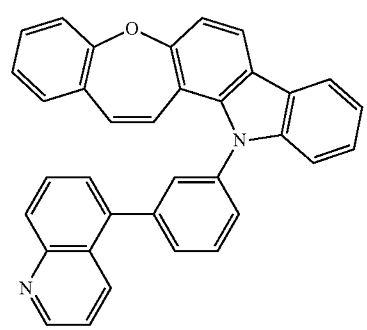

-continued
2-136
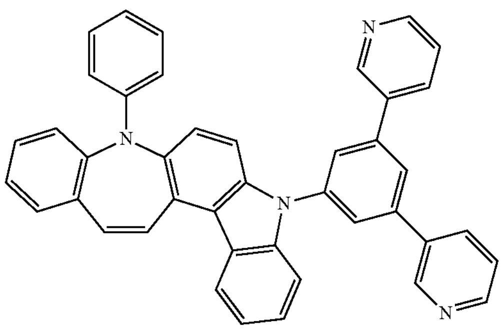
2-137
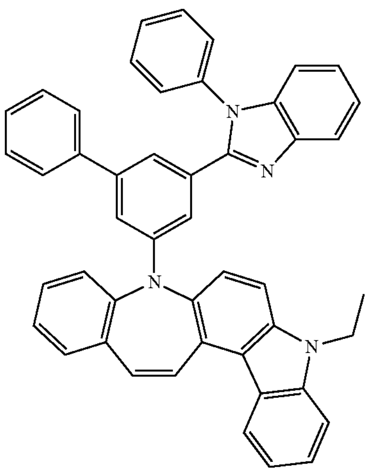
2-138
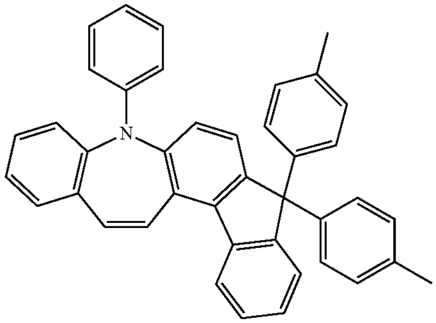
2-139
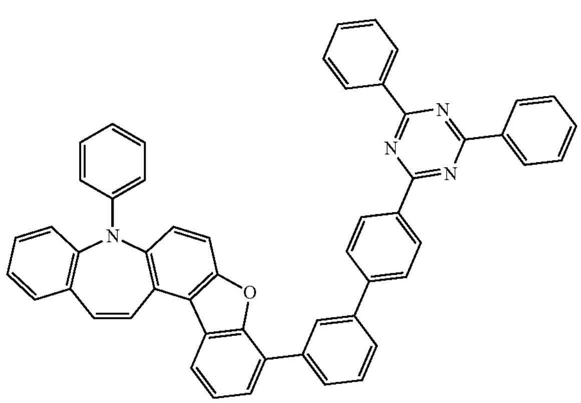
-continued
2-140
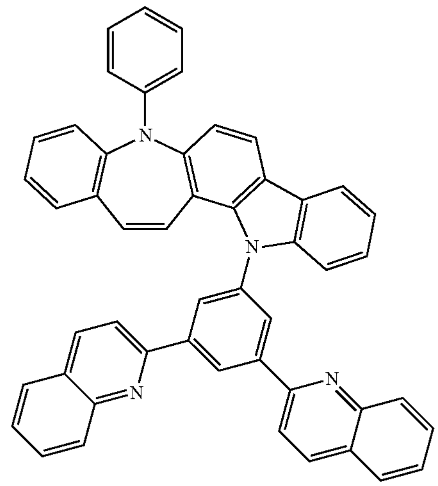
2-141
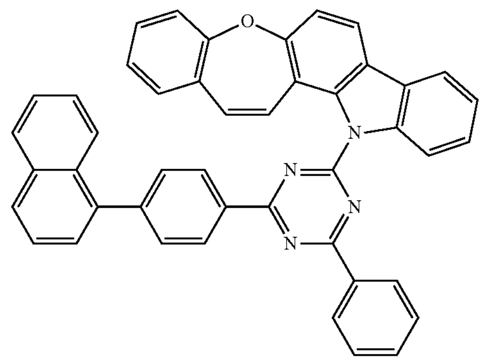
2-142
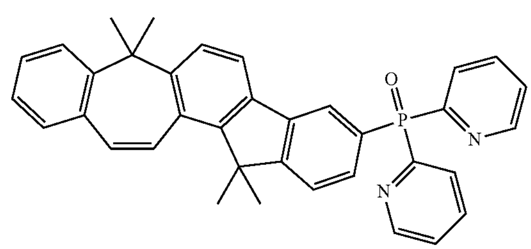
2-143
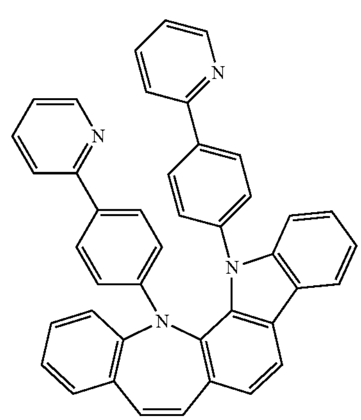

-continued
2-144
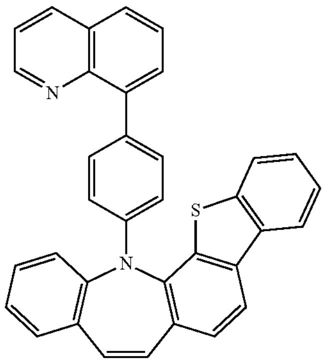
2-145
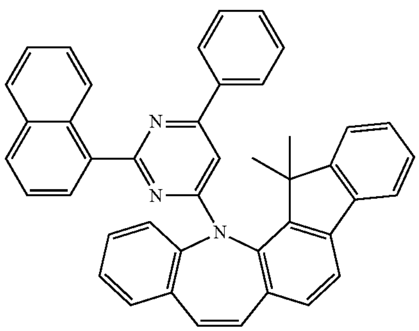
2-146
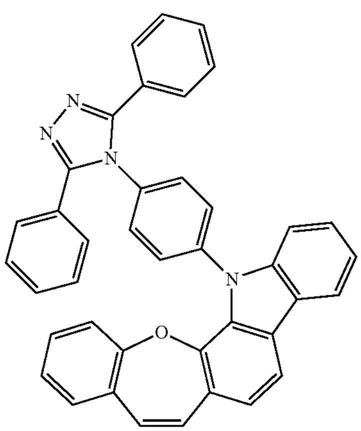
2-147
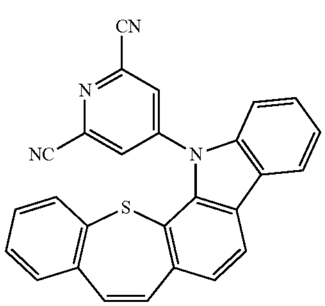
-continued
2-148
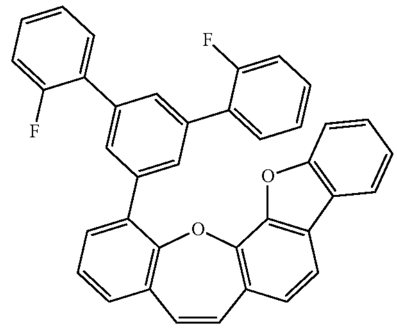
2-149
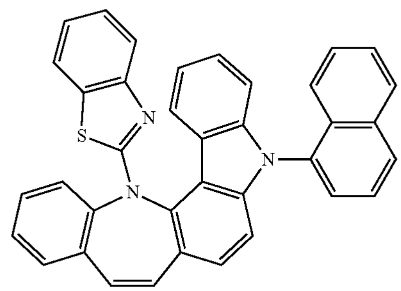
2-150
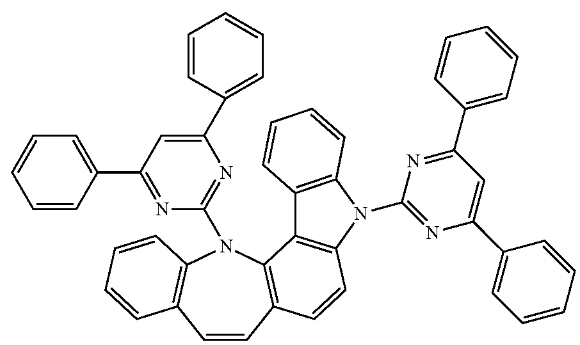
2-151
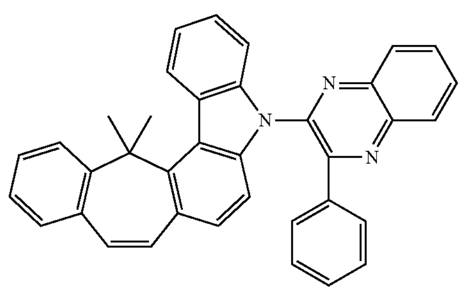

-continued
2-152
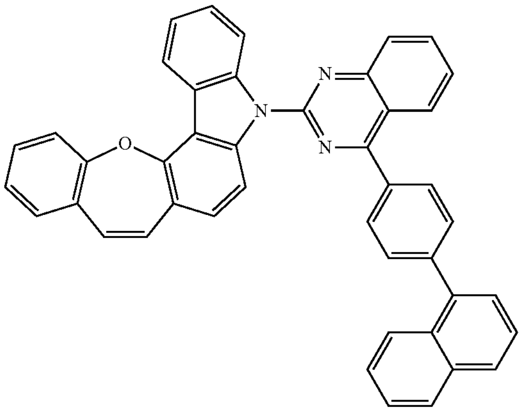
2-153
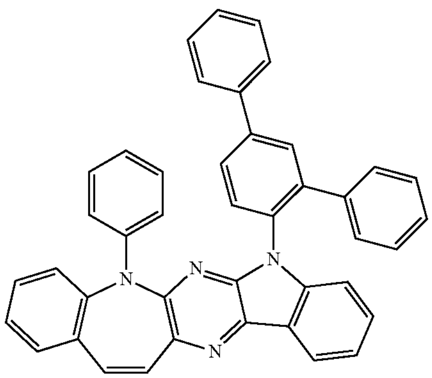
2-154
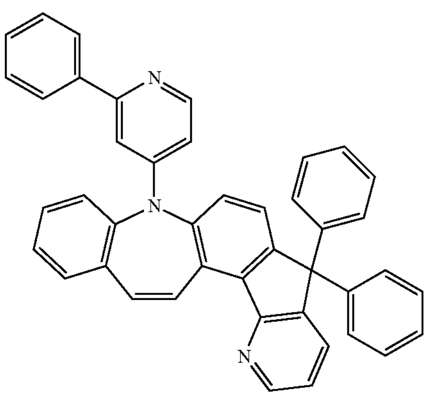
2-155
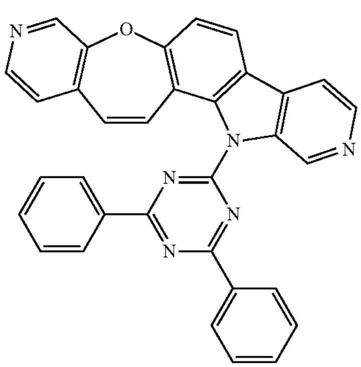
-continued
2-156
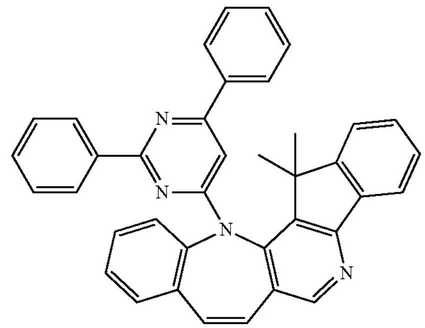
2-157
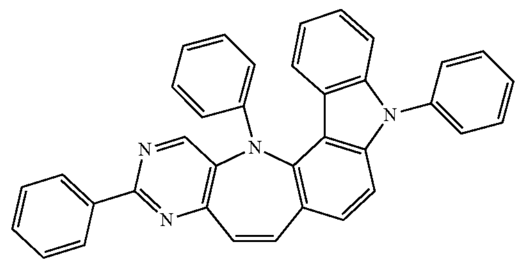
2-158
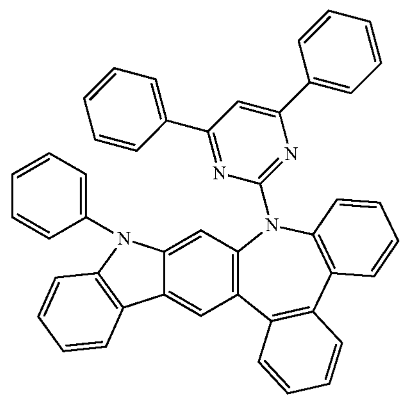
2-159
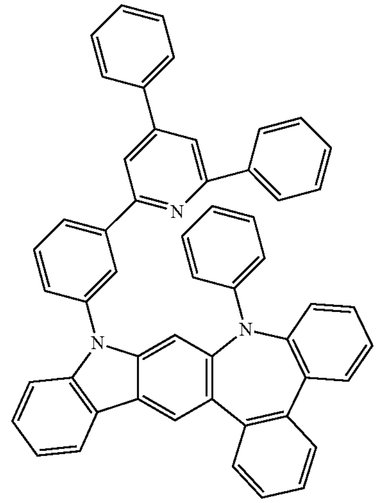

2-160
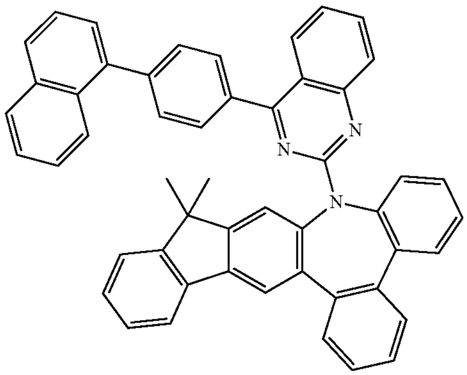
2-161
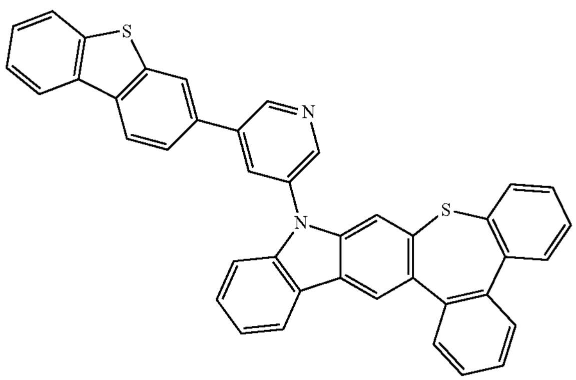
2-162
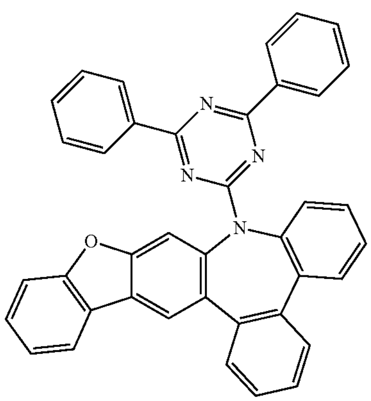
2-163
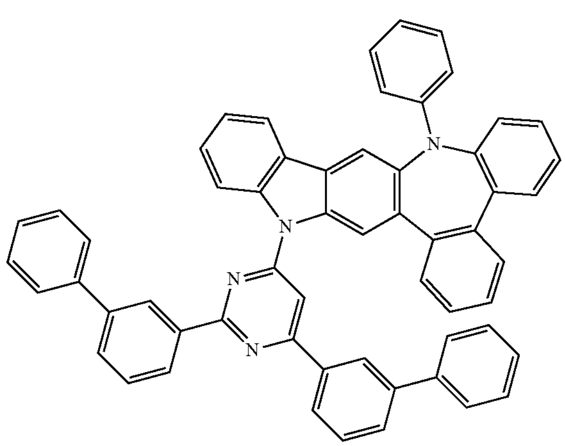
2-164
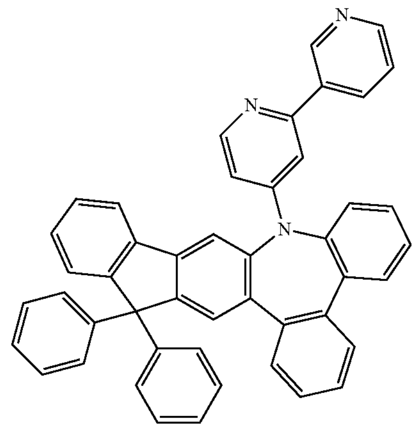
2-165
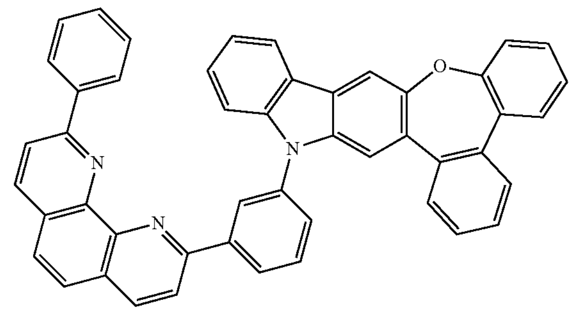
2-166
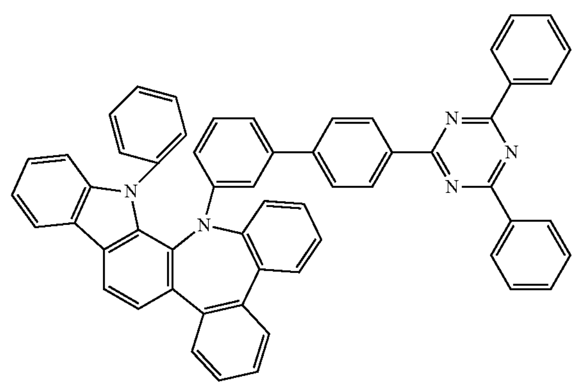
2-167
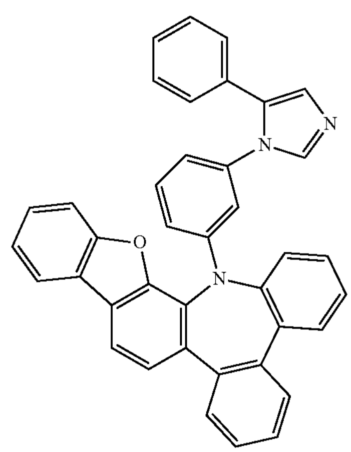

-continued
2-168
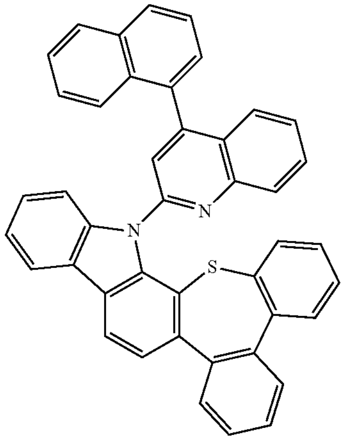
2-169
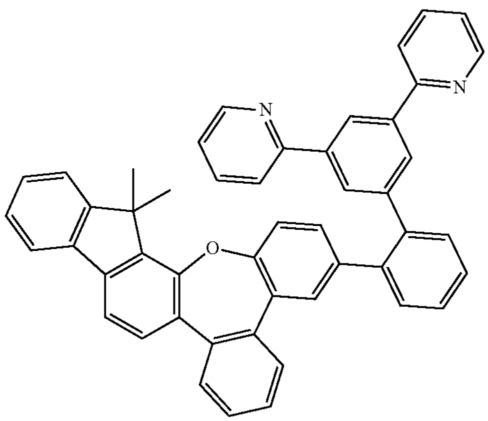
2-170
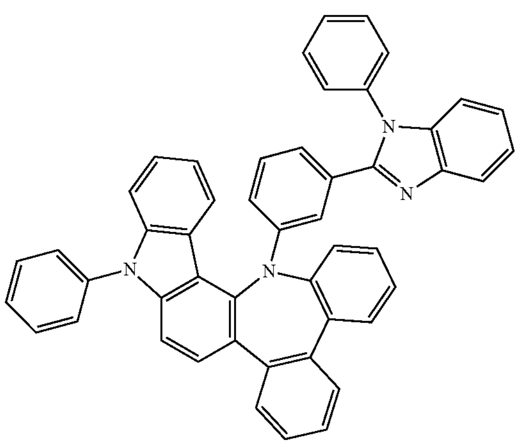
-continued
2-171
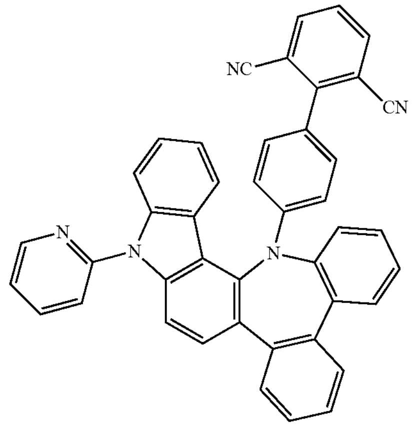
2-172
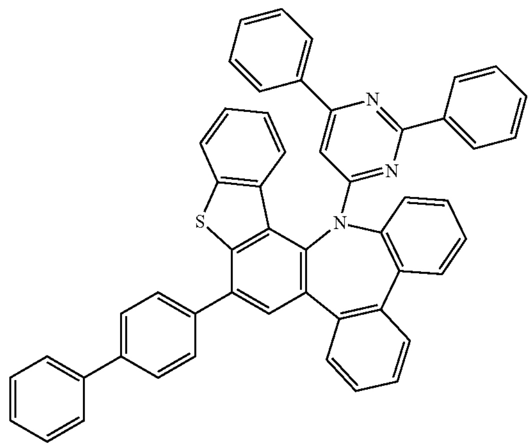
2-173
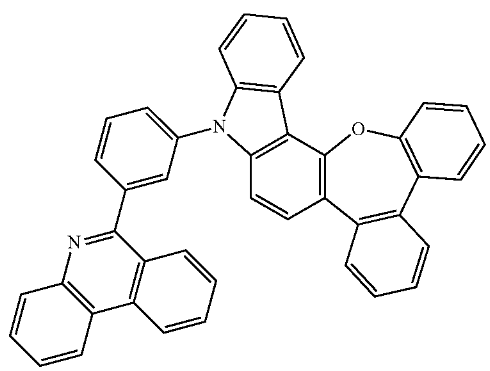

-continued
2-174
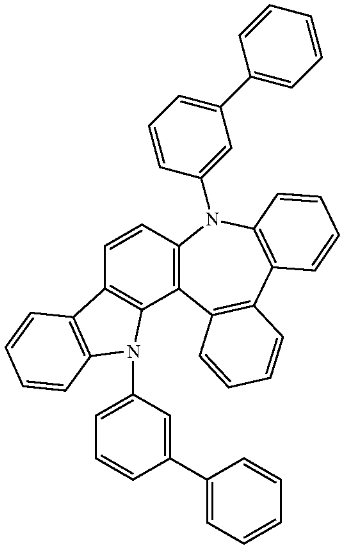
2-175
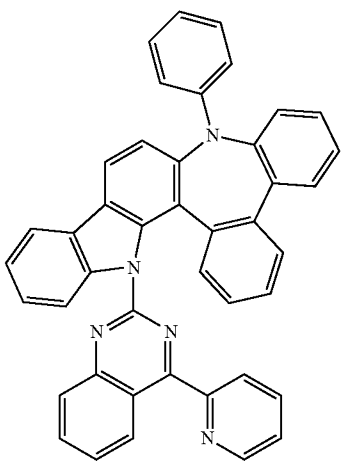
2-176
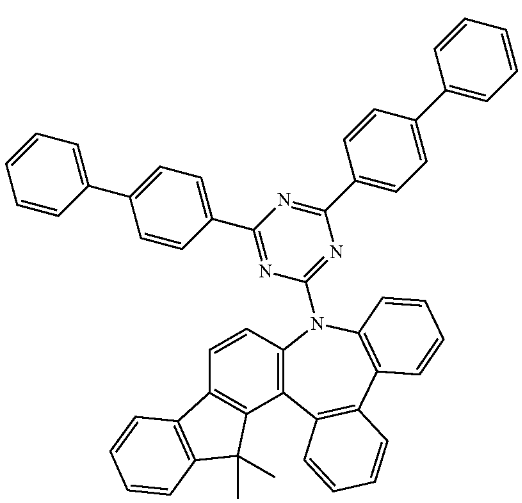
-continued
2-177
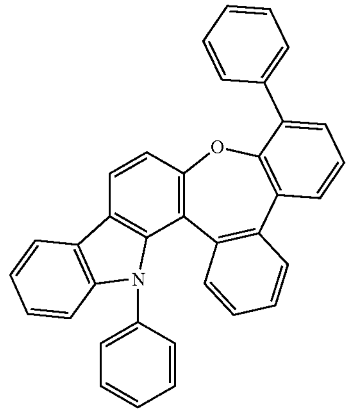
2-178
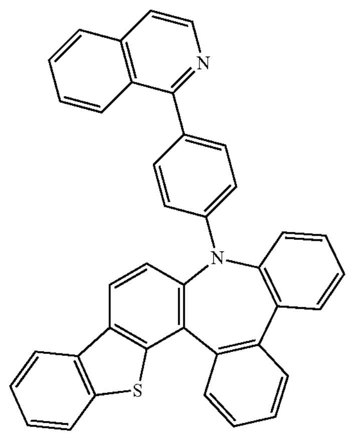
2-179
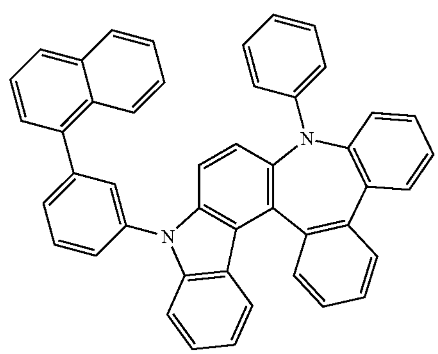
2-180
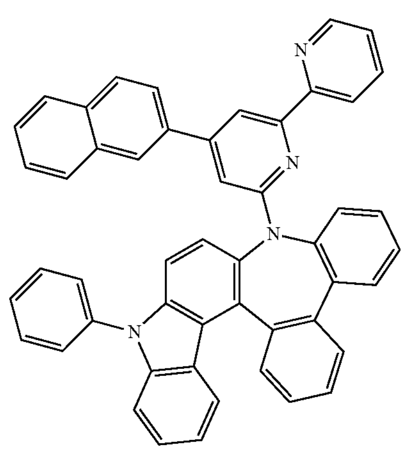

-continued
2-181
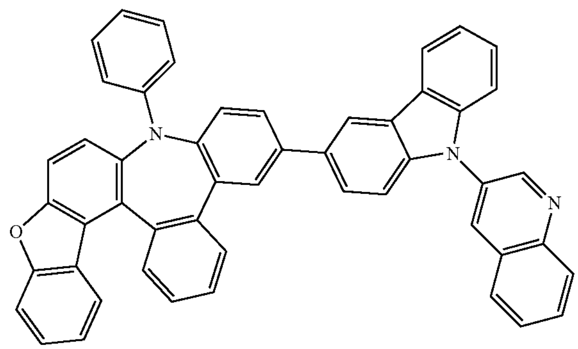
2-182
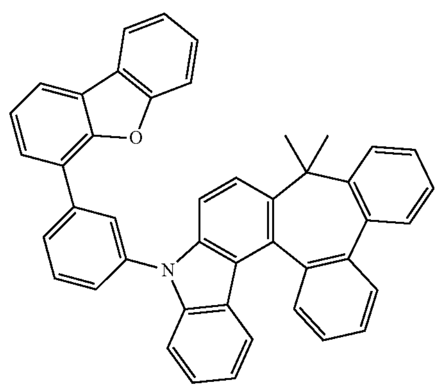
2-183
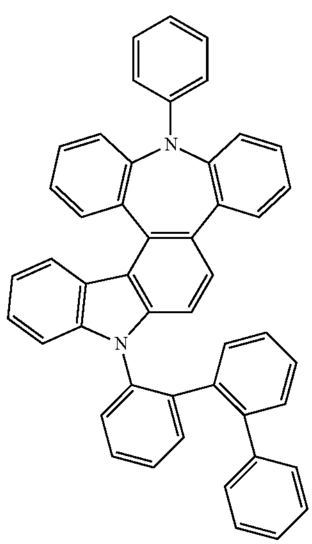
-continued
2-184
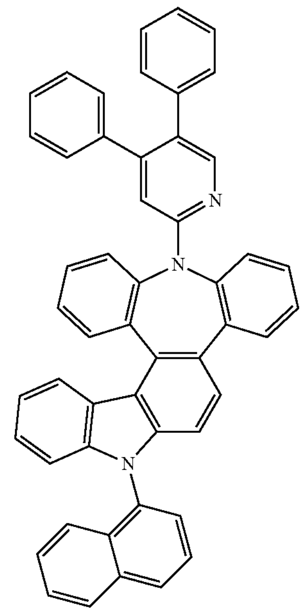
2-185
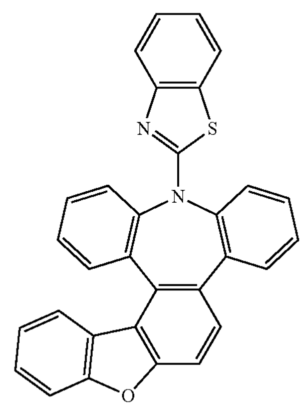
2-186
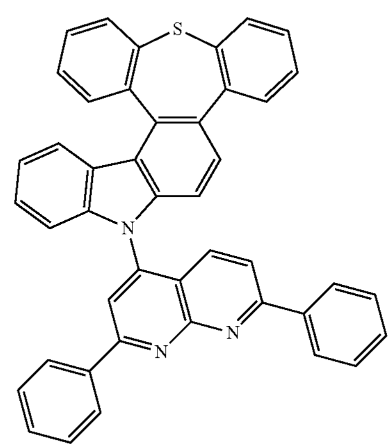

-continued
2-187
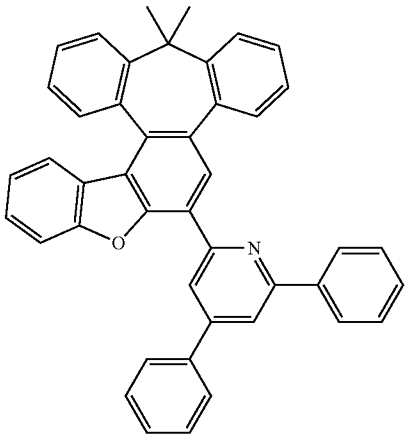
2-188
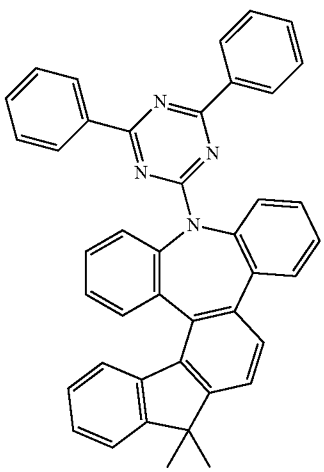
2-189
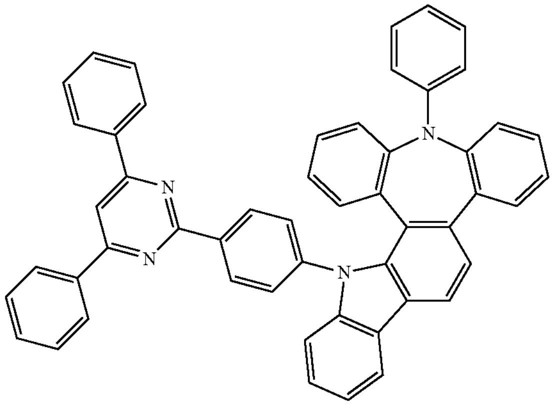
-continued
2-190
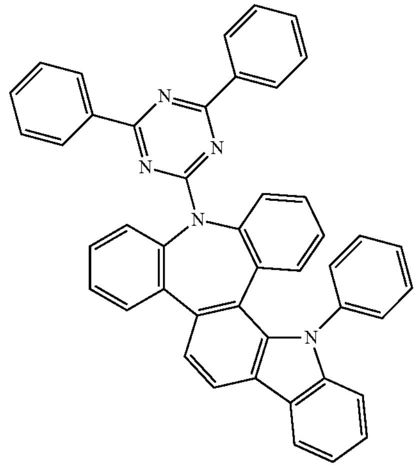
2-191
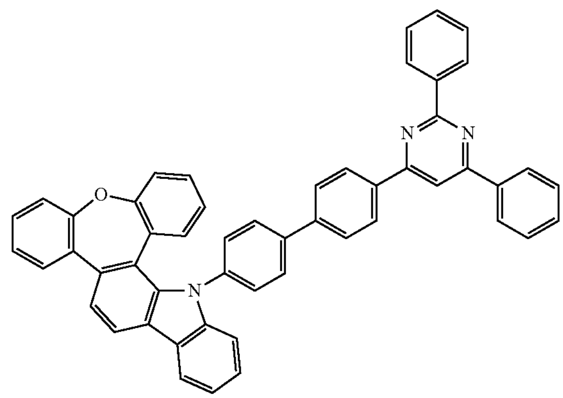
2-192
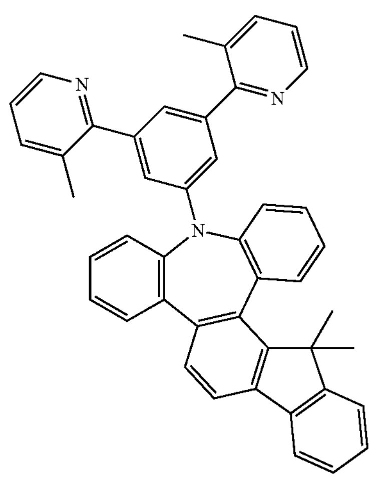

-continued
2-193
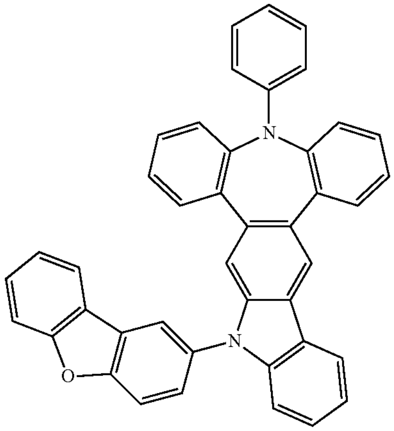
2-194
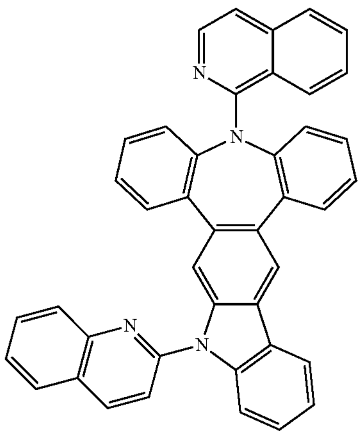
2-195
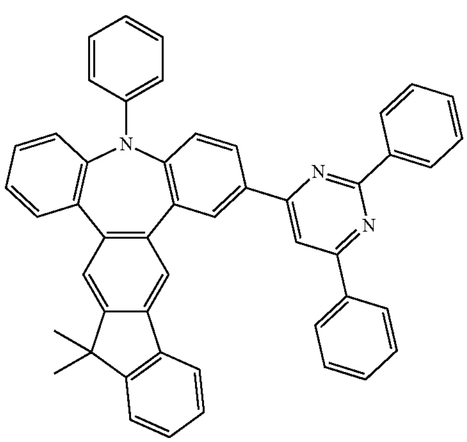
-continued
2-196
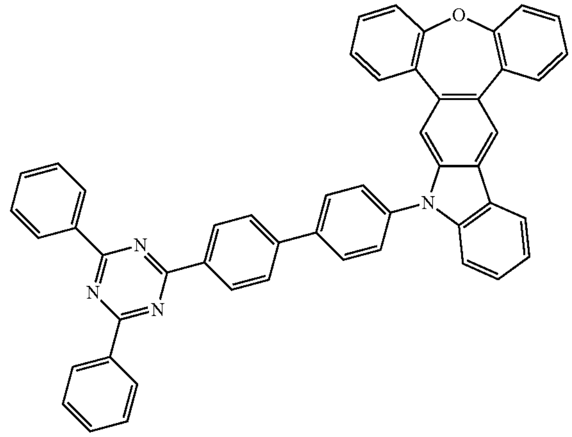
2-197
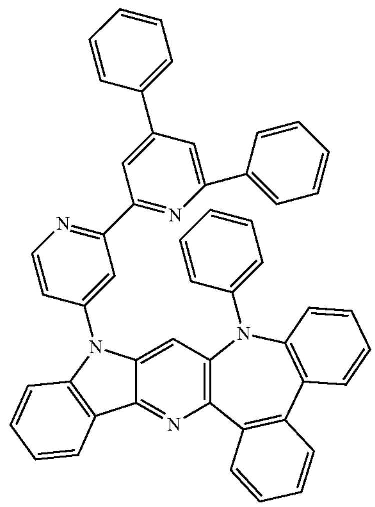
2-198
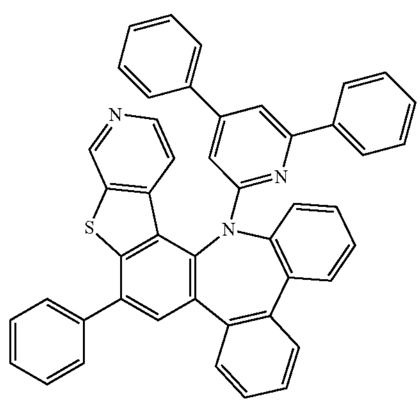

-continued
2-199
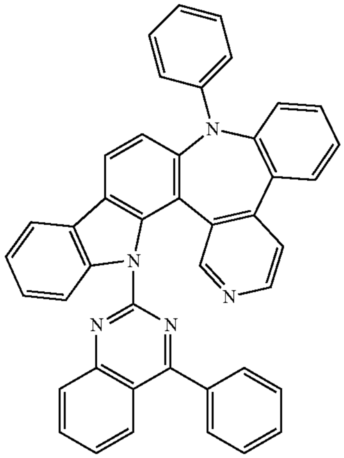
2-200
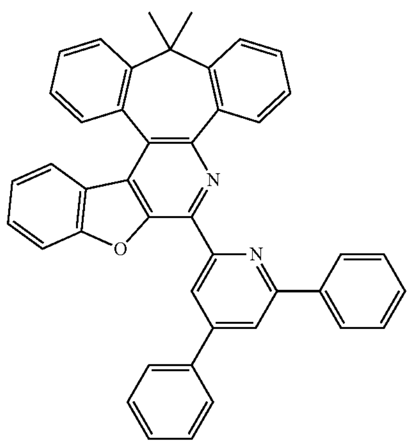
2-201
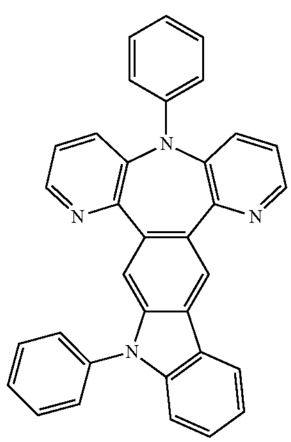
-continued
2-202
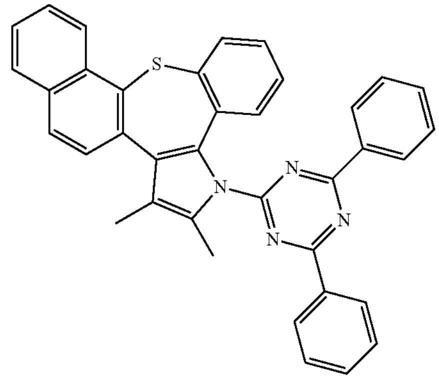
2-203
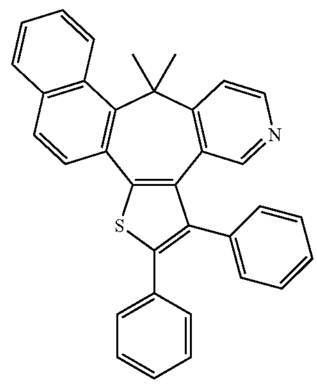
2-204
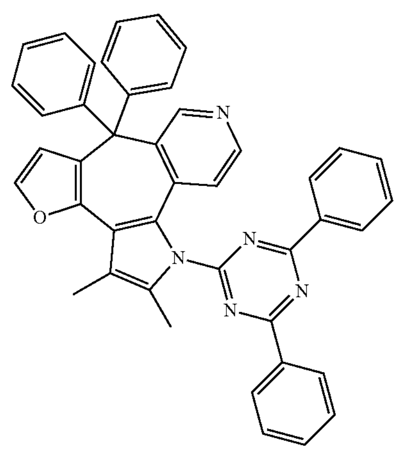
2-205
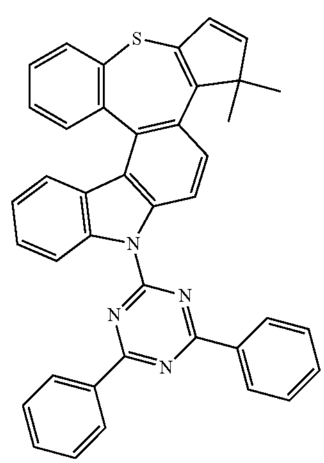

-continued
2-206
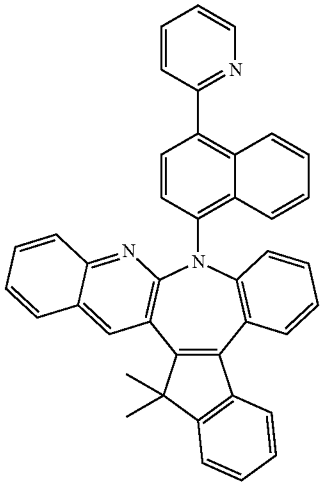
2-207
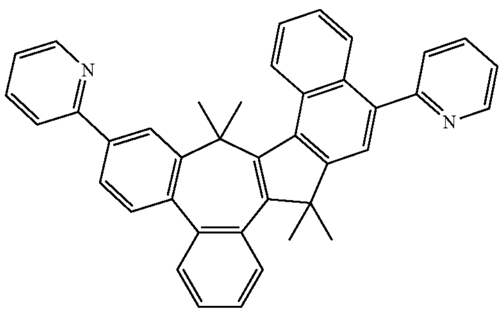
2-208
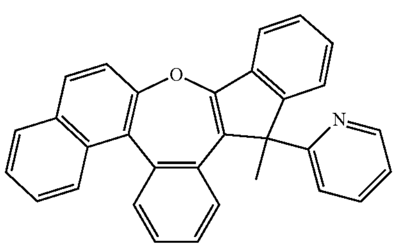
2-209
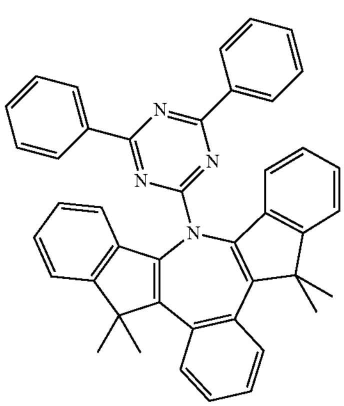
-continued
2-210
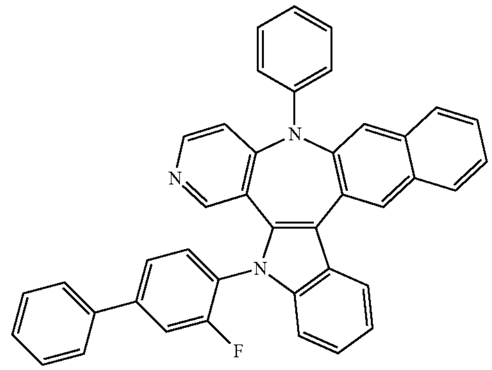
2-211
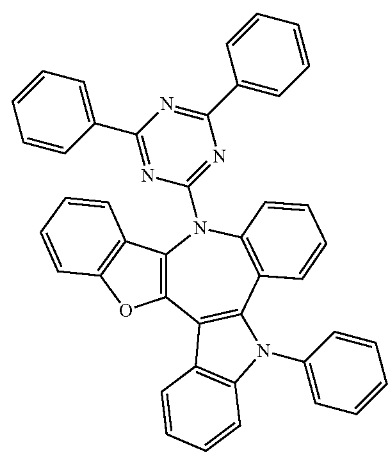
2-212
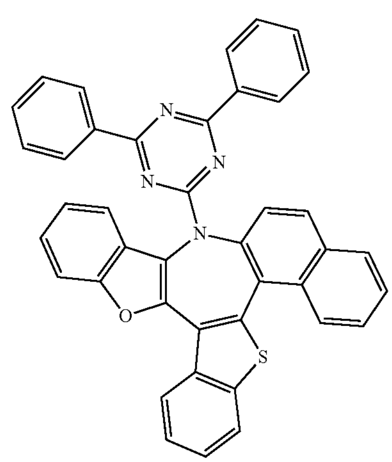

-continued
2-213
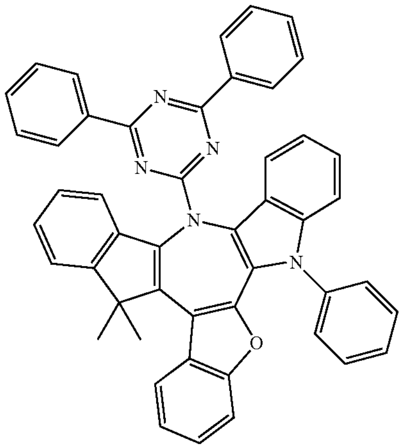
2-214
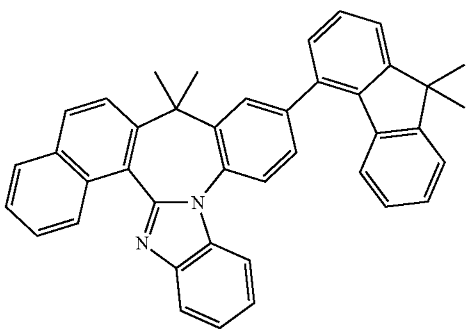
2-215
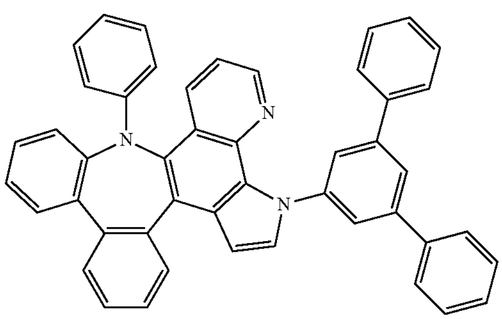
2-216
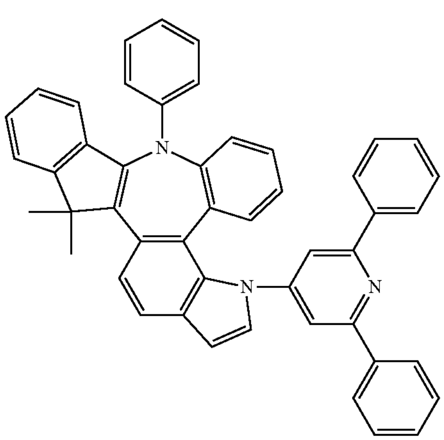
-continued
2-217
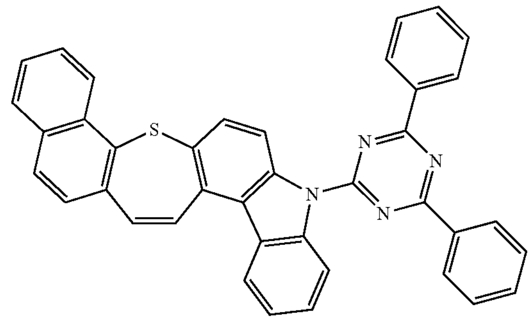
2-218
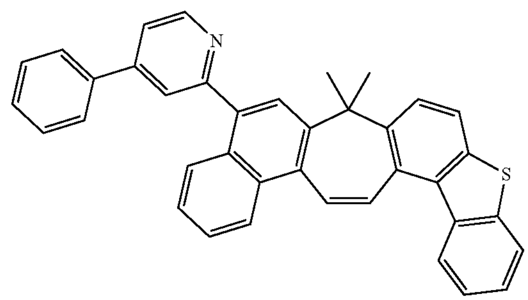
2-219
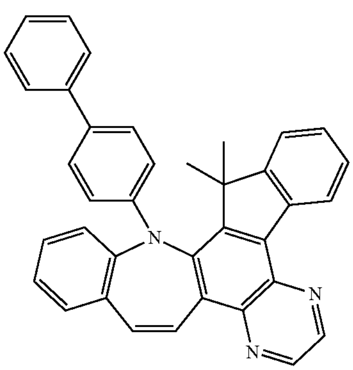
2-220
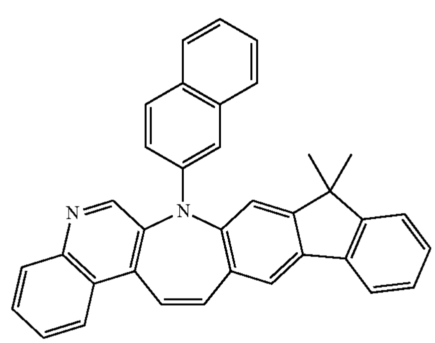

-continued
2-221
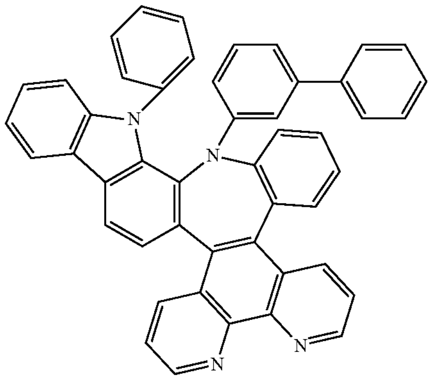
2-222
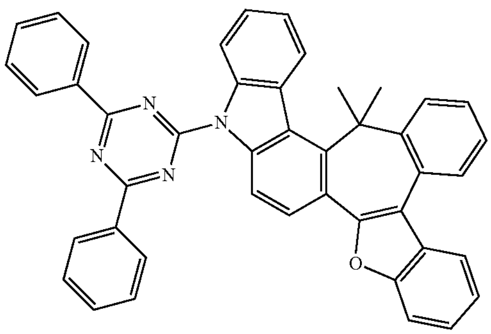
2-223
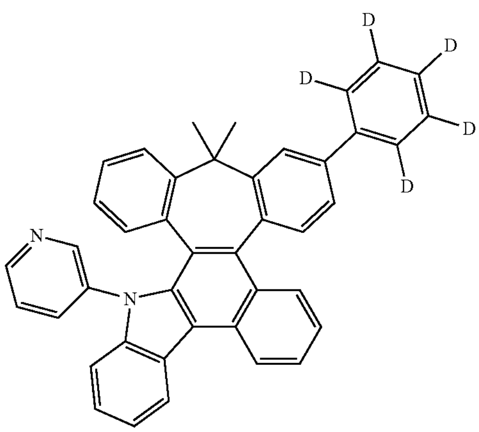
2-224
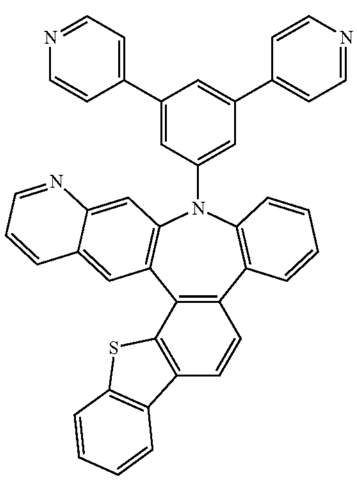
-continued
2-225
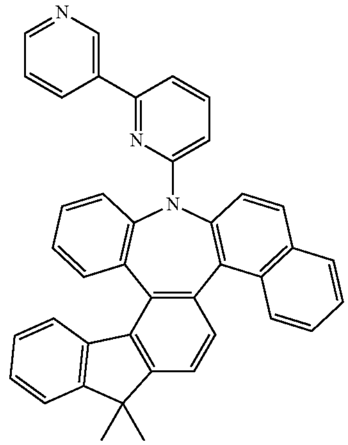
2-226
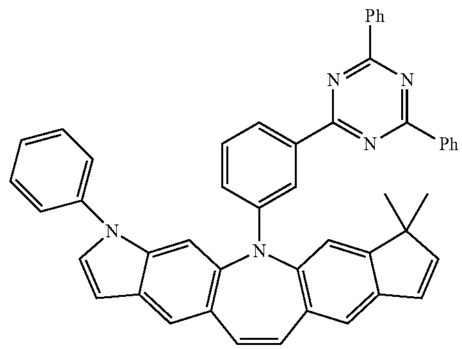
2-227
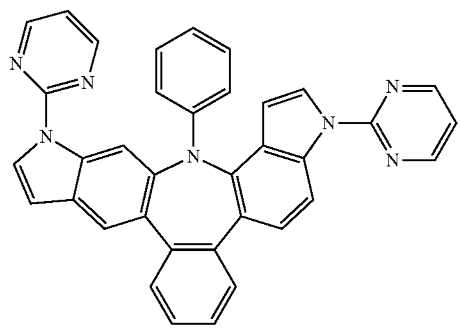
2-228
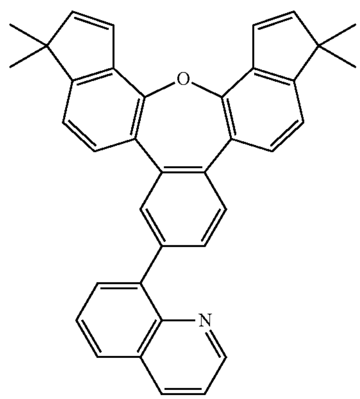

2-229
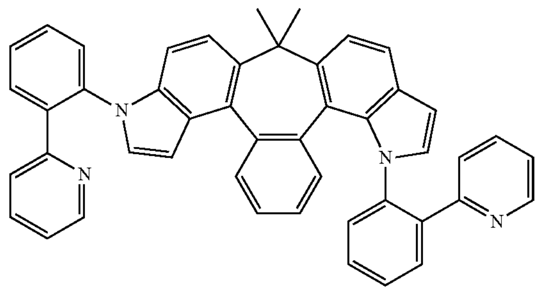
2-230
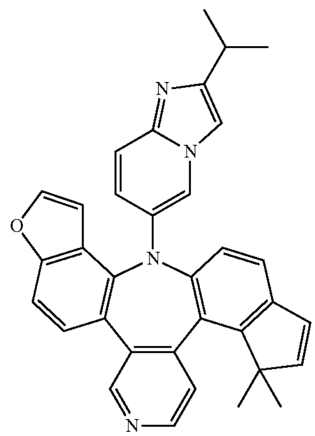
2-231
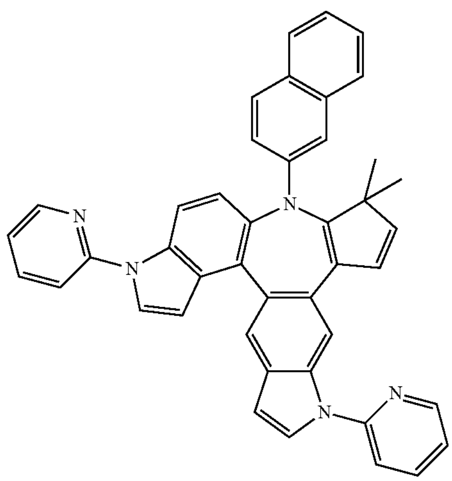
2-232
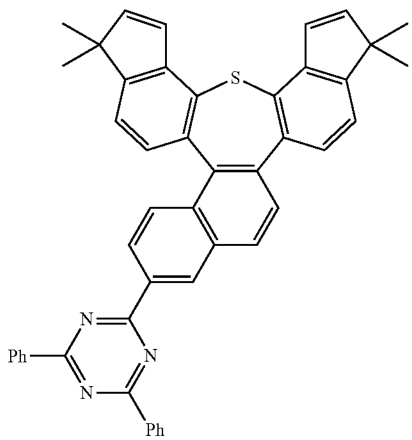
2-233
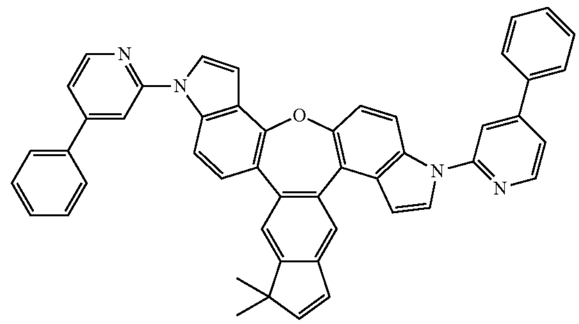
2-234
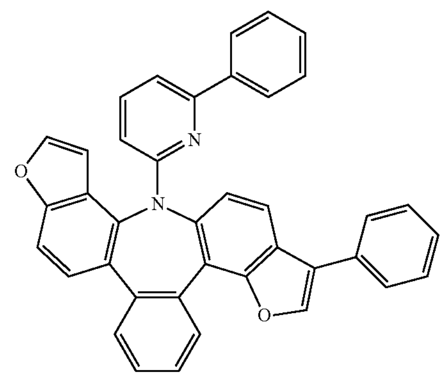
2-235
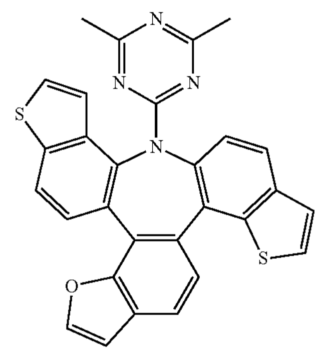
2-236
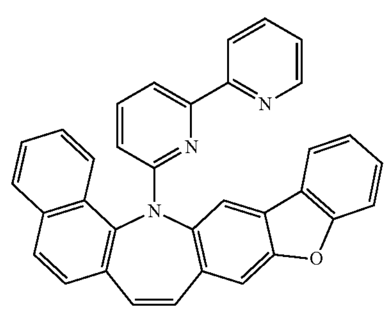

2-237
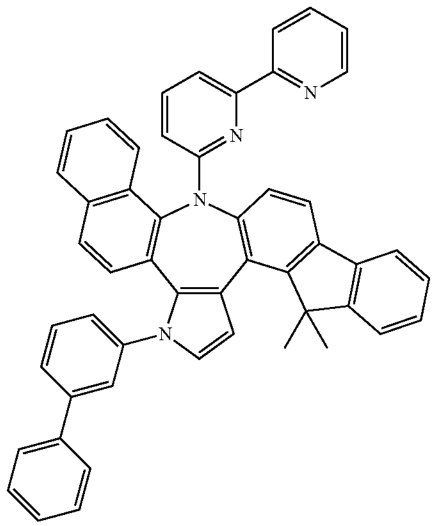
2-238
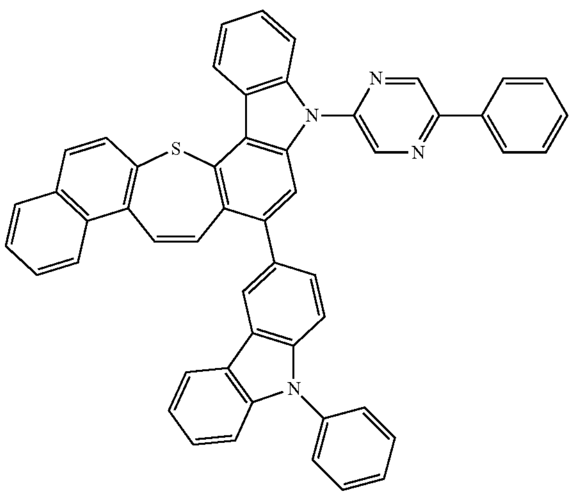
2-239
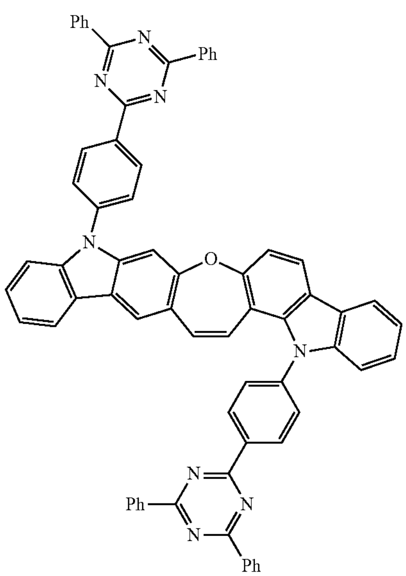
2-240
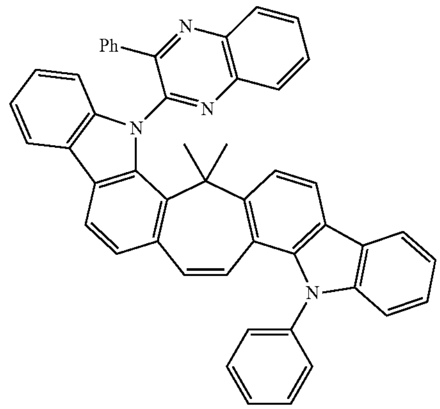
2-241
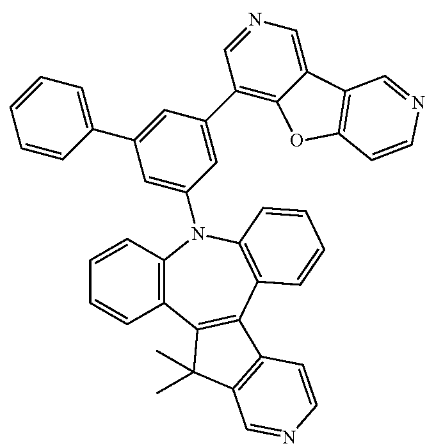
2-242
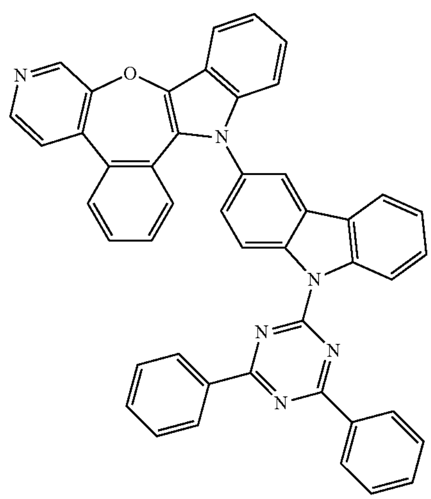

2-243
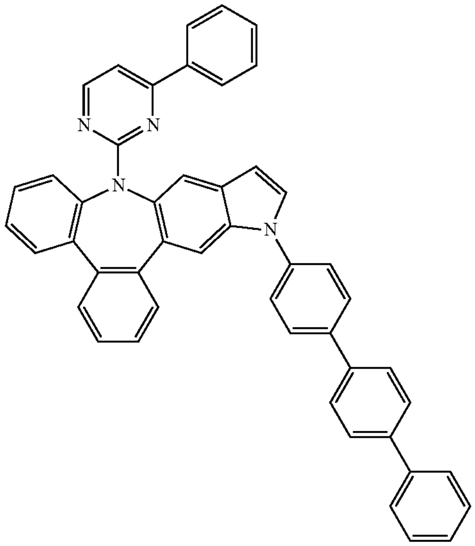
2-244
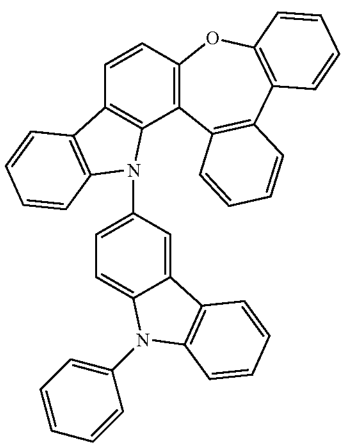
2-245
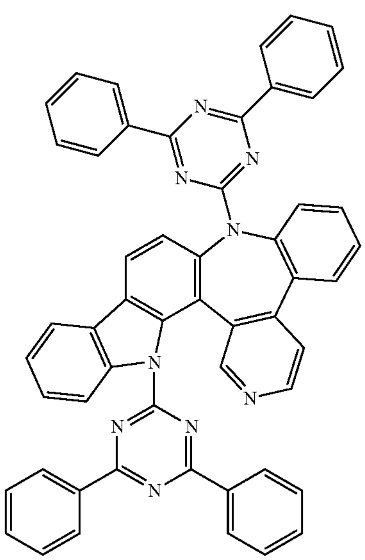
2-246
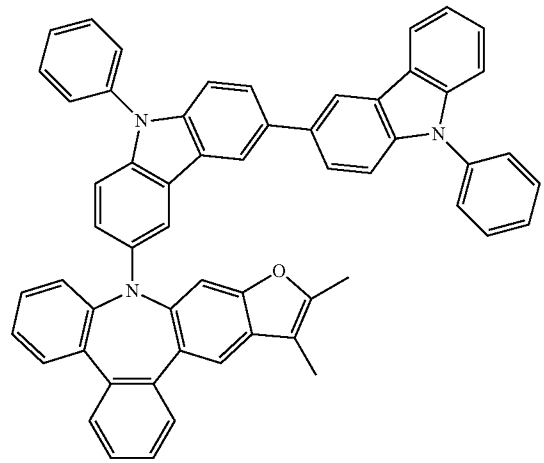
2-247
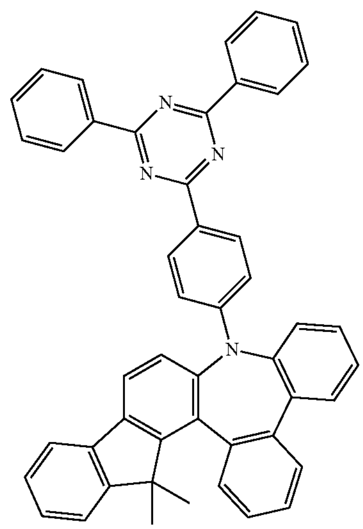
2-248
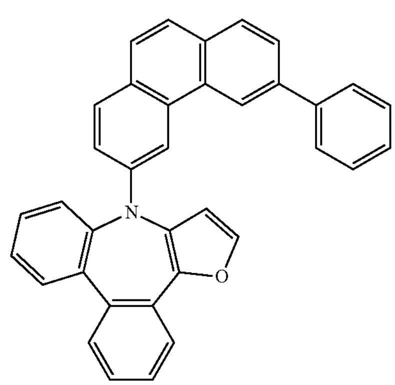

-continued
2-249
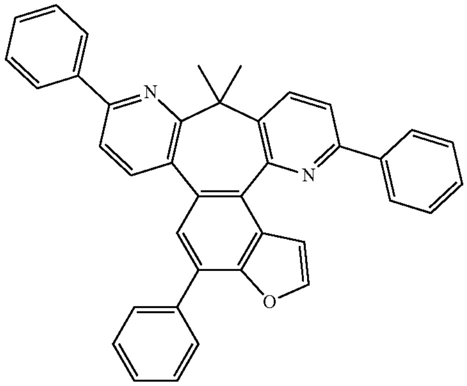
2-250
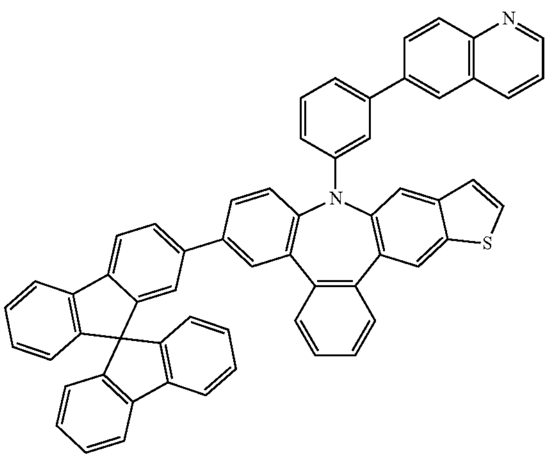
2-251
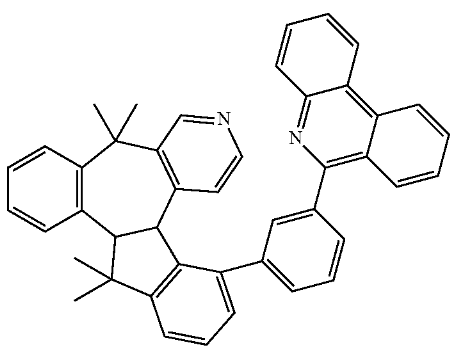
2-252
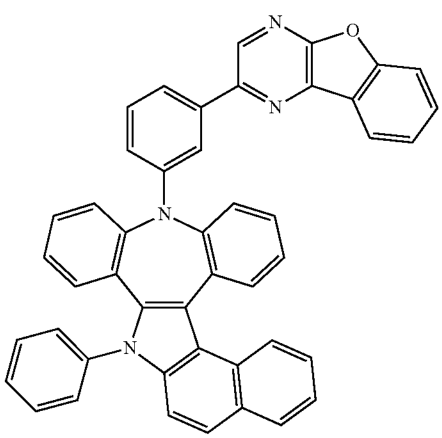
-continued
2-253
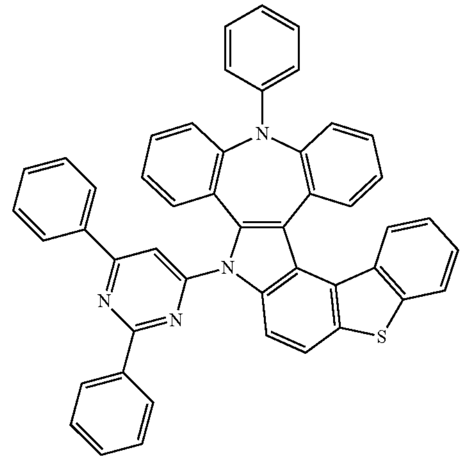
2-254
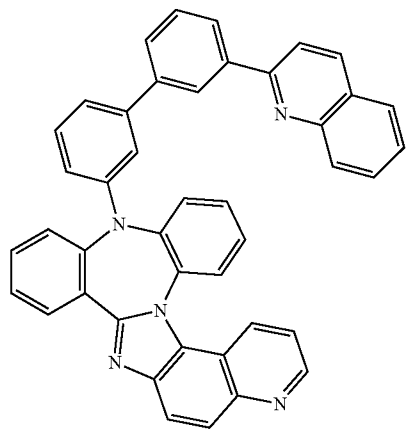
2-255
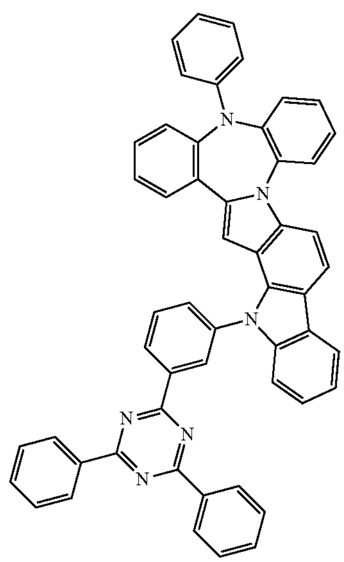

-continued
2-256
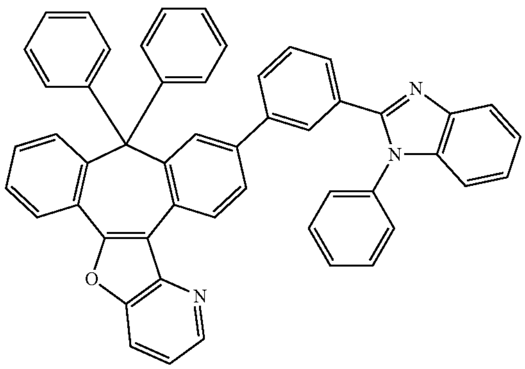
2-257
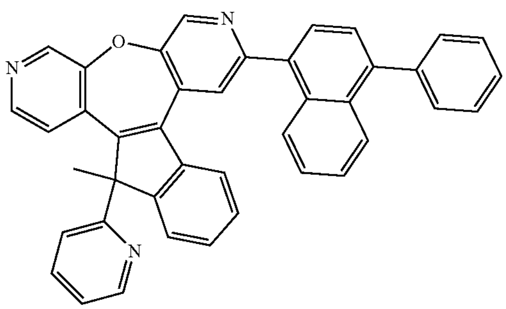
2-258
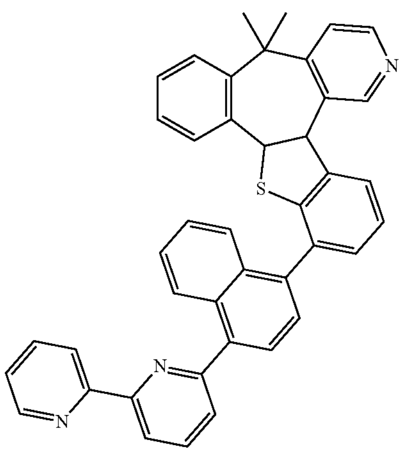
2-259
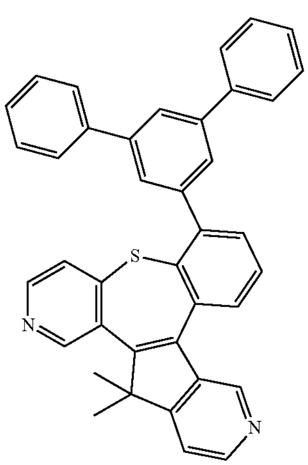
-continued
2-260
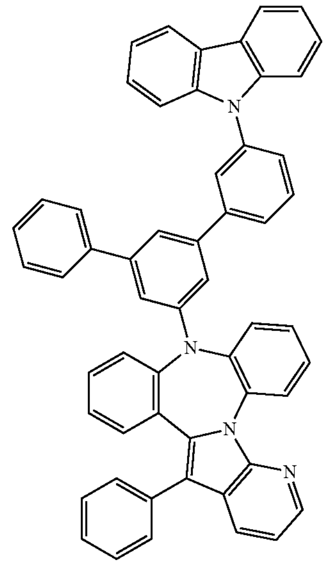
2-261
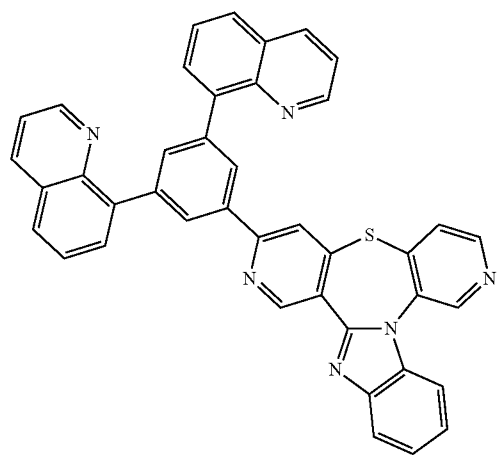
2-262
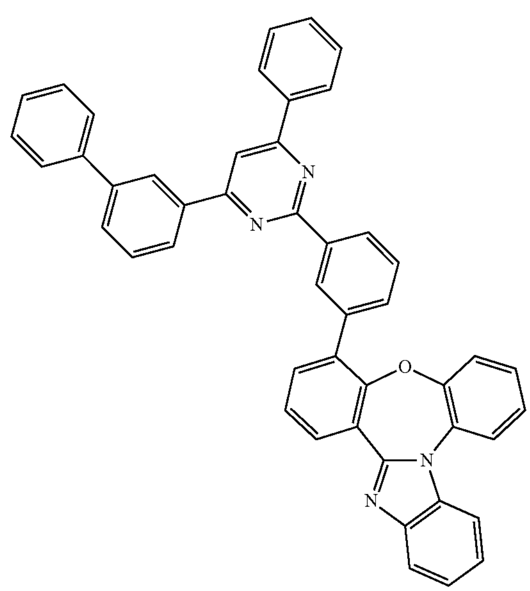

Any combinations of ring $A_1$, ring $A_2$, $L_1$ to $L_5$, $L_{11}$, $L_{12}$, a1 to a5, a11, a12, $R_1$ to $R_5$, $R_{11}$, $R_{12}$, b1 to b5, b11, and b12 in Formulae 1A to 1D may be embodied within the scope described herein.

Any combinations of ring $A_{21}$, ring $A_{22}$, ring $A_{23}$, $X_{21}$, and $T_{11}$ to $T_{14}$ may be embodied within the scope described herein.

Any combinations of $*-[(L_{22})_{a22}-(R_{22})_{b22}]$, $C(R_{23})(R_{24})$, $Si(R_{23})(R_{24})$, and $N-[(L_{21})_{a21}-(R_{21})_{b21}]$ may be embodied within the scope of descriptions of $L_{21}$, $L_{22}$, a21, a22, $R_{21}$ to $R_{24}$, b21, and b22 provided herein.

In various embodiments, the hole transport region may include an emission auxiliary layer, the emission auxiliary layer may directly contact the emission layer, and the second compound may be included in the emission auxiliary layer.

In various embodiments, the electron transport region may include a buffer layer, the buffer layer may directly contact the emission layer, and the second compound may be included in the buffer layer, but embodiments are not limited thereto.

When both the hole transport region and the electron transport region in the organic light-emitting device include the second compound described above, the second compound included in the hole transport region and the second compound included in the electron transport region may be identical to or different from each other.

The electron transport region may include an electron transport layer, and the first compound may be included in the electron transport layer.

In various embodiments, the electron transport region may include a buffer layer and an electron transport layer (between the buffer layer and the second electrode), the second compound may be included in the buffer layer, and the first compound may be included in the electron transport layer.

[Description of FIG. 1]

FIG. 1 is a schematic view of an organic light-emitting device 10 according to an embodiment. The organic light-emitting device 10 may include a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

[First Electrode 110]

In FIG. 1, a substrate may be additionally disposed (e.g., positioned) under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing or sputtering a material for forming the first electrode 110 on the substrate. When the first electrode 110 is an anode, the material for forming the first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming the first electrode may be selected from indium tin oxide (ITO), indium zinc oxide (IZO), tin oxide ($SnO_2$), zinc oxide (ZnO), and combinations thereof, but is not limited thereto. In various embodiments, when the first electrode 110 is a semi-transmissive electrode or a reflective electrode, a material for forming the first electrode may be selected from magnesium(Mg), silver (Ag), aluminum (Al), aluminum-lithium (Al—Li), calcium (Ca), magnesium-indium (Mg—In), magnesium-silver (Mg—Ag), and combinations thereof, but is not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

[Organic Layer 150]

The organic layer 150 may be disposed on the first electrode 110. The organic layer 150 may include an emission layer.

The organic layer 150 may include a hole transport region between the first electrode 110 and the emission layer, and an electron transport region between the emission layer and the second electrode 190.

[Hole Transport Region in Organic Layer 150]

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein for each structure, constituting layers are sequentially stacked from the first electrode 110 in this stated order, but the structure of the hole transport region is not limited thereto.

The hole transport region may include the second compound as described above.

In various embodiments, the hole transport region may include an emission auxiliary layer. The emission auxiliary layer may directly contact the emission layer.

In various embodiments, the hole transport region may include a hole injection layer and a hole transport layer, which are stacked in this stated order on the first electrode 110; a hole injection layer and an emission auxiliary layer, which are stacked in this stated order on the first electrode 110; or a hole injection layer, a hole transport layer, and an emission auxiliary layer, which are stacked in this stated order on the first electrode 110, but the structure of the hole transport region is not limited thereto.

When the hole transport region includes an emission auxiliary layer, the emission auxiliary layer may further include the second compound.

The hole transport region may include at least one selected from m-MTDATA, TDATA, 2-TNATA, NPB (NPD), β-NPB, TPD, spiro-TPD, spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201, and a compound represented by Formula 202:

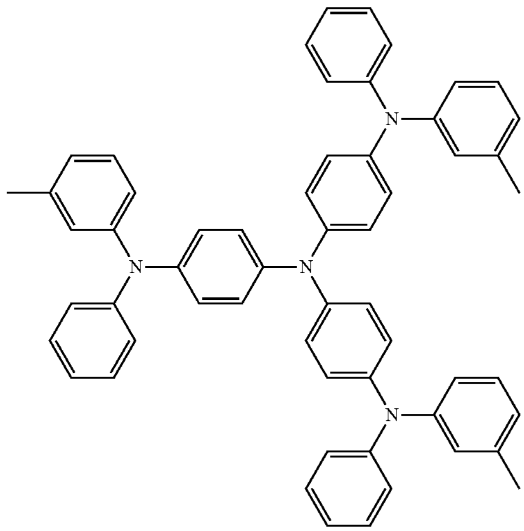
m-MTDATA
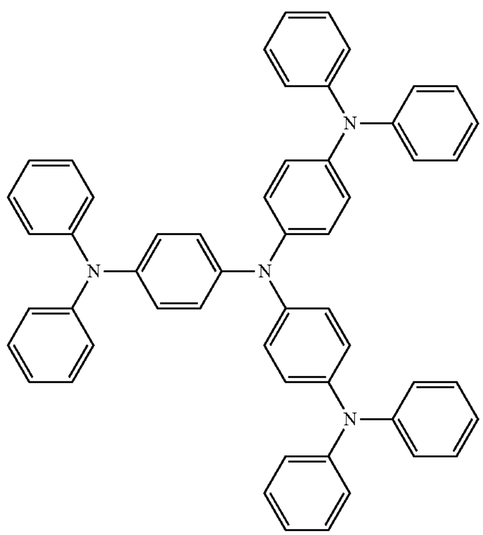
TDATA
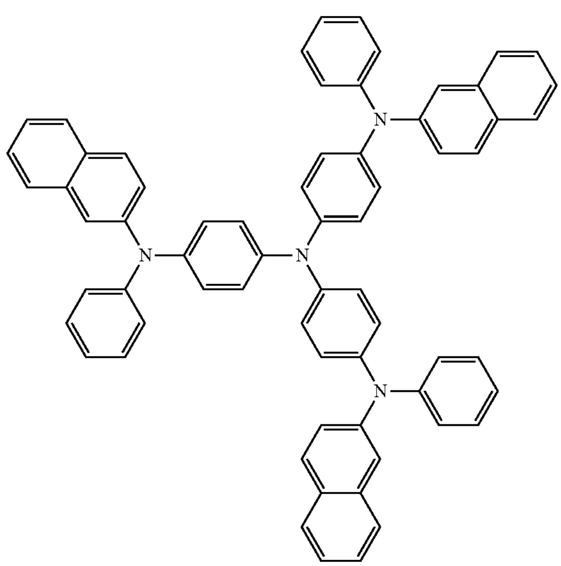
2-TNATA
-continued
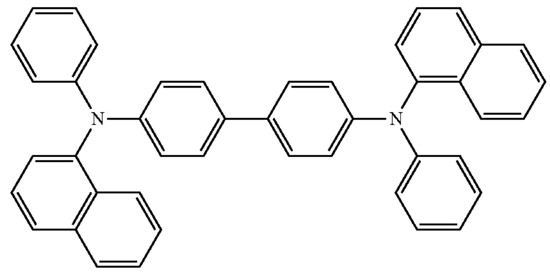
NPB
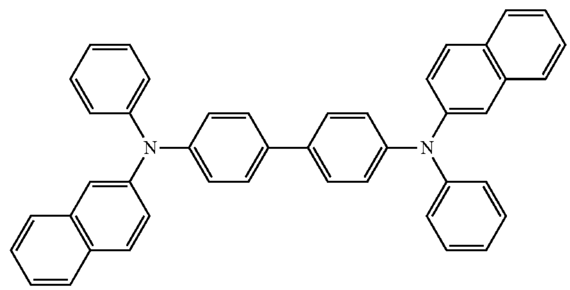
β-NPB
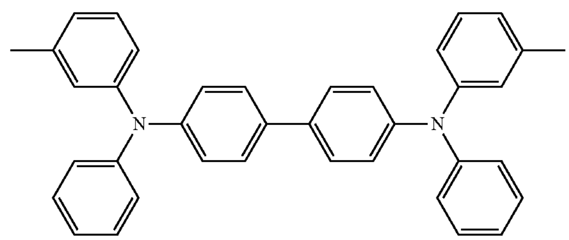
TPD
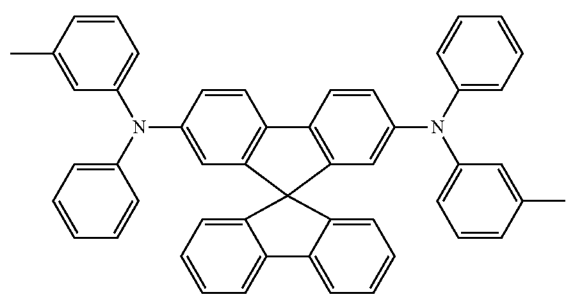
Spiro-TPD
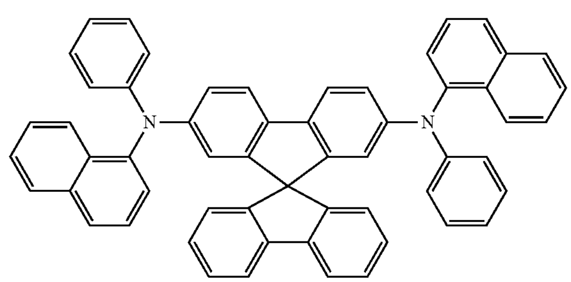
Spiro-NPB -continued

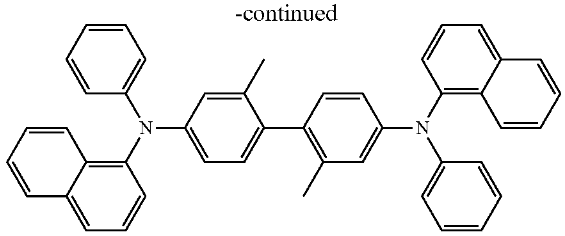

methylated NPB

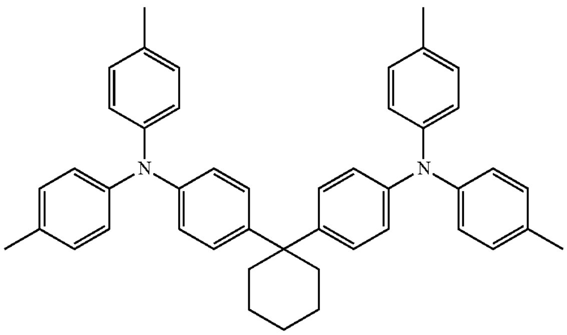

TAPC

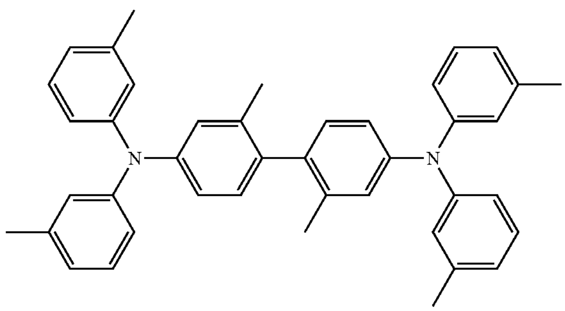

HMTPD

Formula 201

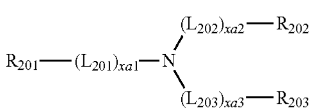

Formula 202

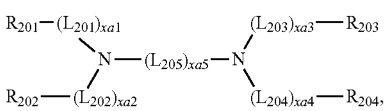

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may be optionally connected to each other via a single bond, a dimethyl-methylene group, or a diphenyl-methylene group; and $R_{203}$ and $R_{204}$ may be optionally connected to each other via a single bond, a dimethyl-methylene group, or a diphenyl-methylene group.

In various embodiments, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xa1 to xa4 may each independently be 0, 1, or 2.

In various embodiments, xa5 may be 1, 2, 3, or 4.

In various embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein descriptions of $Q_{31}$ to $Q_{33}$ are the same as described herein.

In various embodiments, at least one selected from $R_{201}$ to $R_{203}$ in Formula 201 may each independently be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In various embodiments, in Formula 202, i) $R_{201}$ and $R_{202}$ may be connected to each other via a single bond, and/or ii) $R_{203}$ and $R_{204}$ may be connected to each other via a single bond.

In various embodiments, at least one selected from $R_{201}$ to $R_{204}$ in Formula 202 may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but is not limited thereto.

The compound represented by Formula 201 may be represented by Formula 201A:

Formula 201A

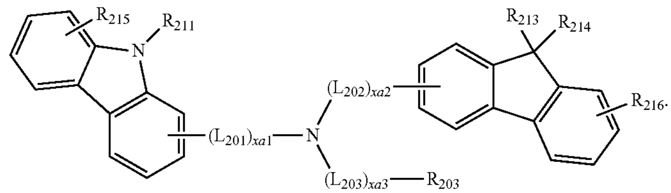

For example, the compound represented by Formula 201 may be represented by Formula 201A(1), but is not limited thereto:

Formula 201A(1)

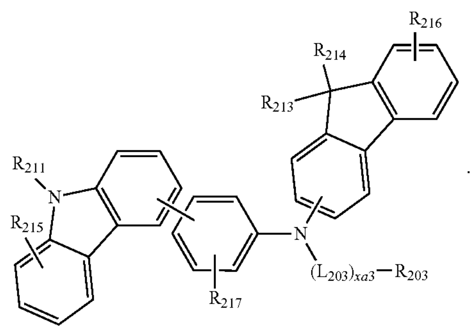

In various embodiments, the compound represented by Formula 201 may be represented by Formula 201A-1, but is not limited thereto:

Formula 201A-1

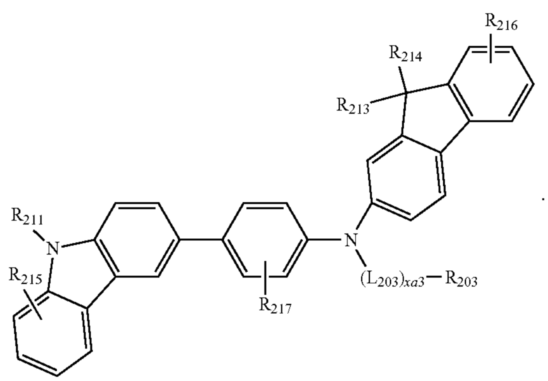

The compound represented by Formula 202 may be represented by Formula 202A:

Formula 202A

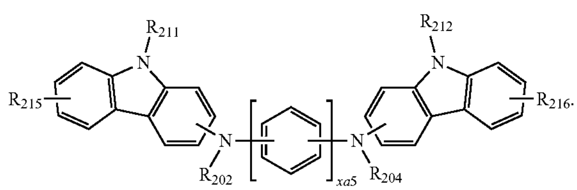

In various embodiments, the compound represented by Formula 202 may be represented by Formula 202A-1:

Formula 202A-1

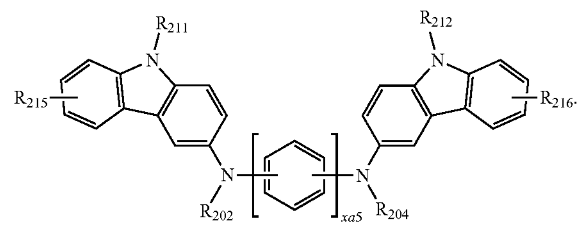

In Formulae 201A, 201A(1), 201A-1, 202A, and 202A-1, descriptions of $L_{201}$ to $L_{203}$, xa1 to xa3, xa5, and $R_{202}$ to $R_{204}$ are the same as described herein, descriptions of $R_{211}$ and $R_{212}$ may each independently be the same as the description provided in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but is not limited thereto:

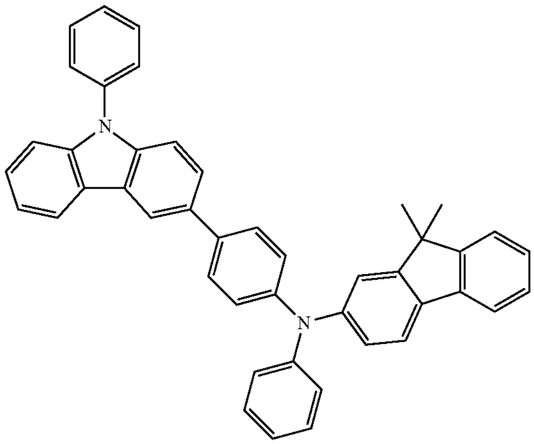
HT1
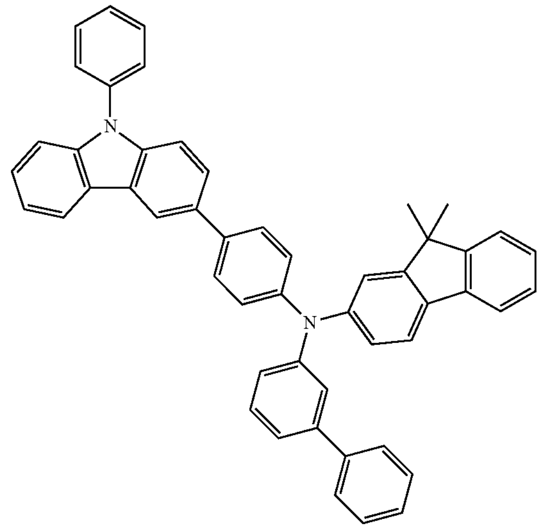
HT2
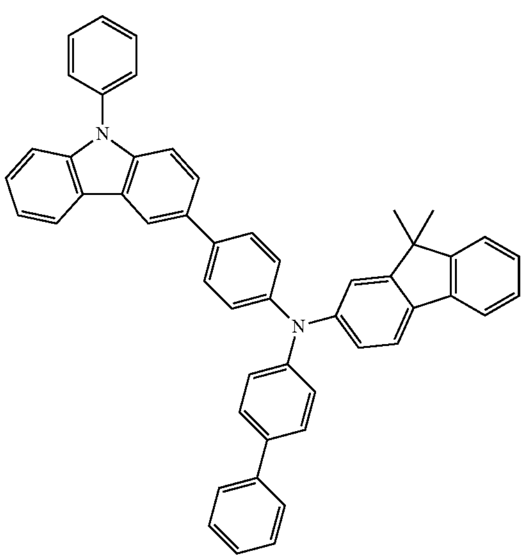
HT3
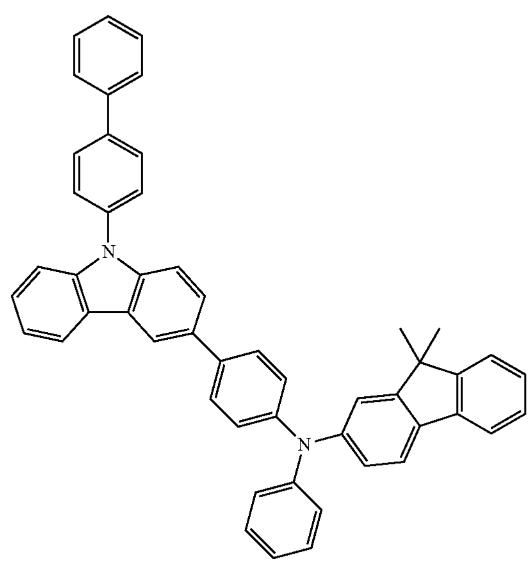
HT4

-continued
HT5
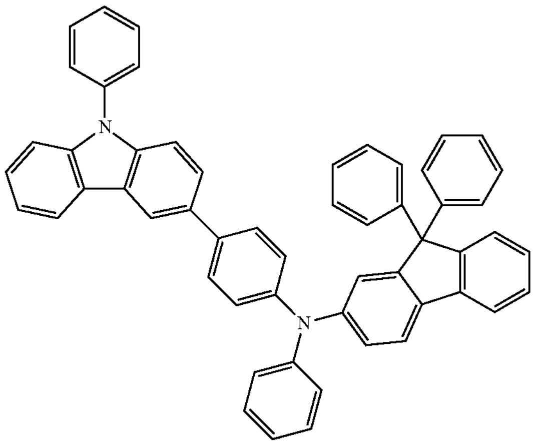
HT6
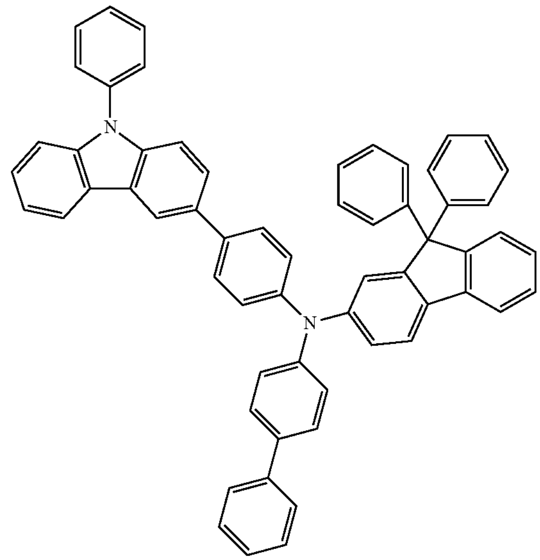
HT7
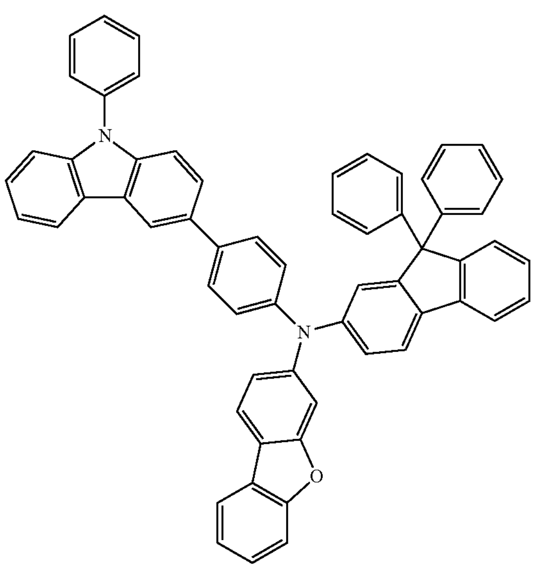
HT8
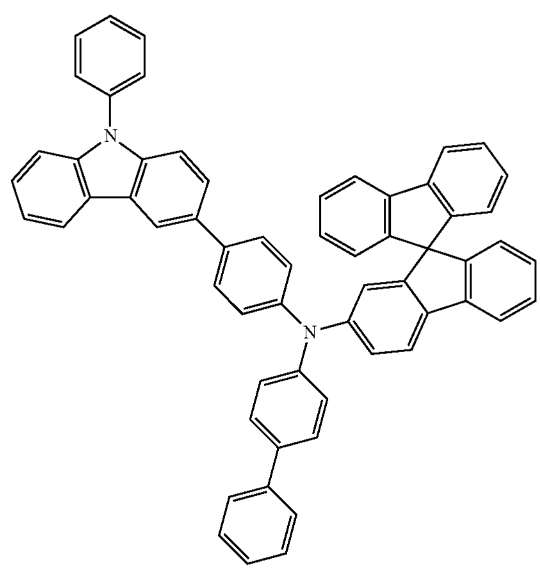

-continued
HT9
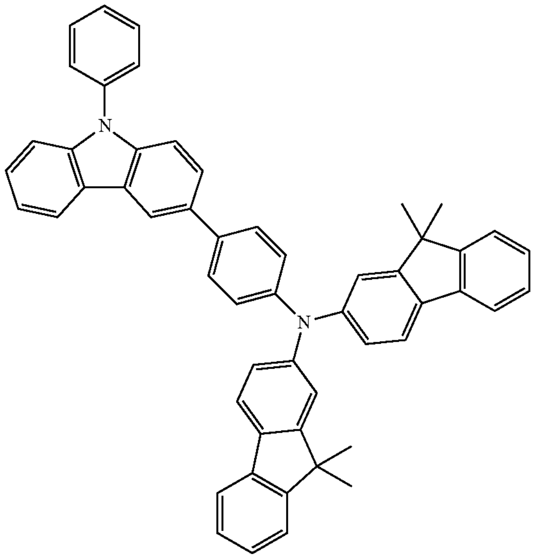
HT10
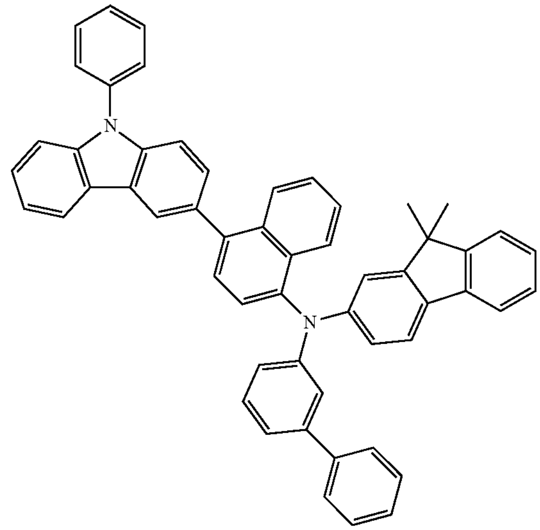
HT11
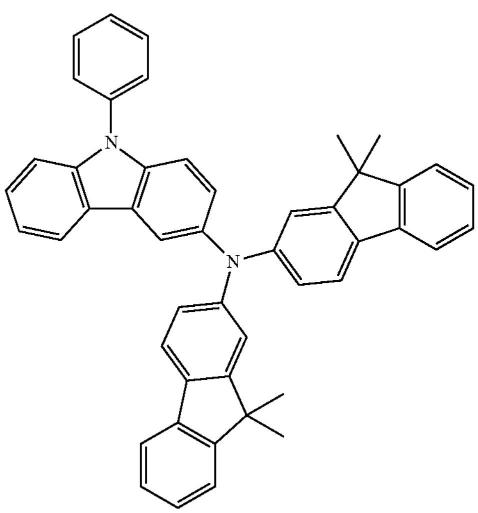
HT12
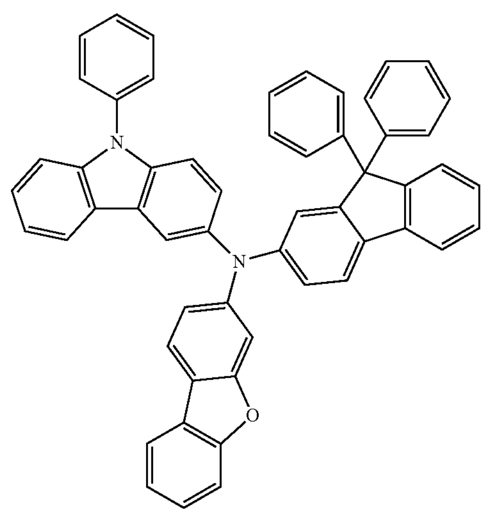

-continued
HT13
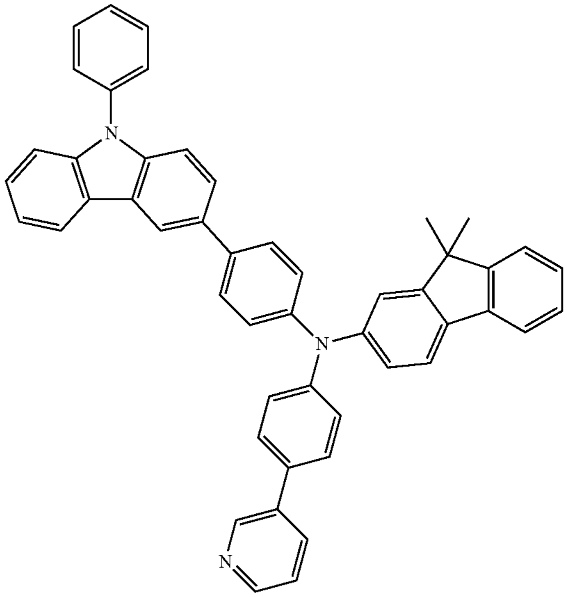
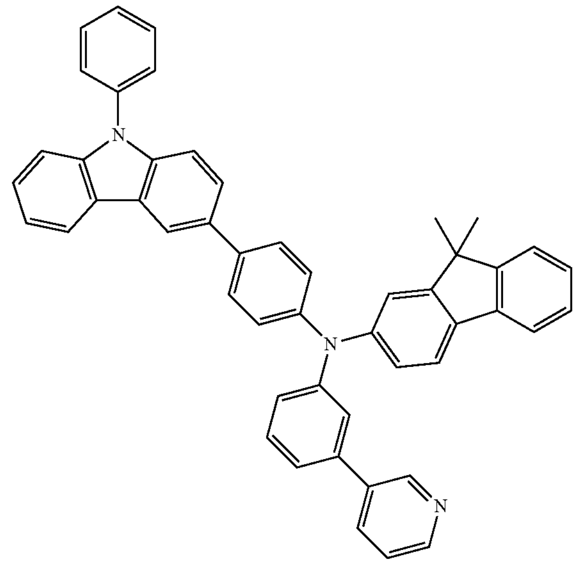
HT15
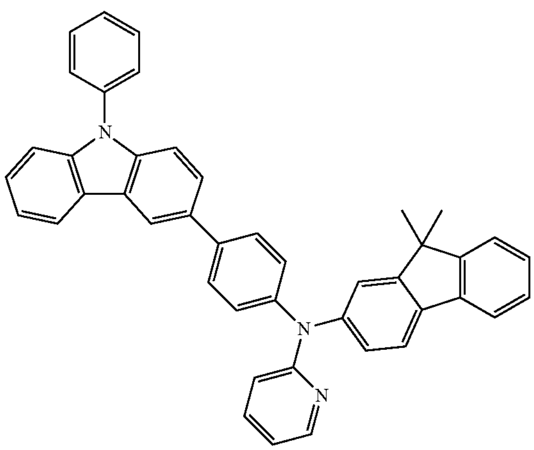
HT16
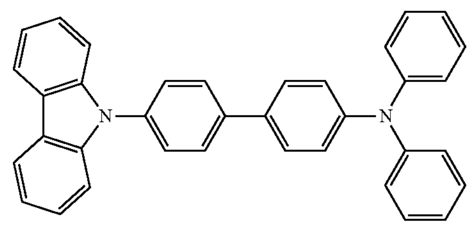
HT17
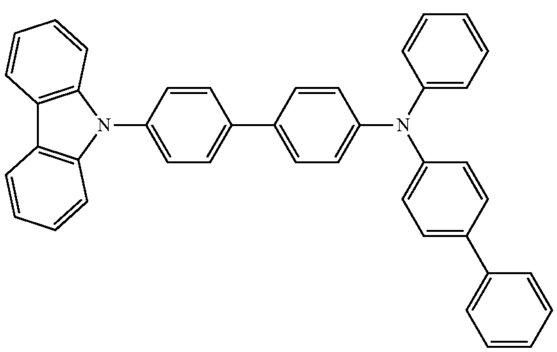
HT18
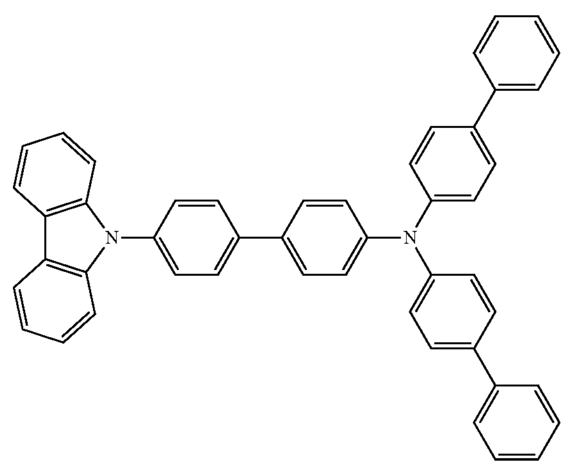

-continued
HT19
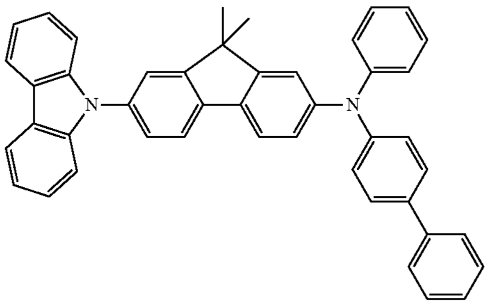
HT20
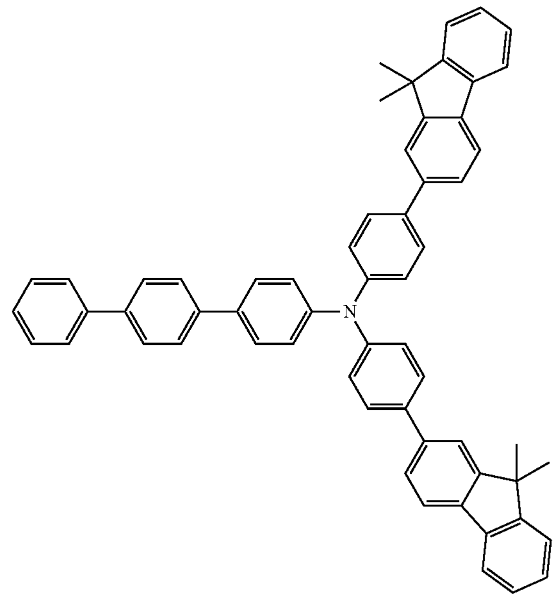
HT21
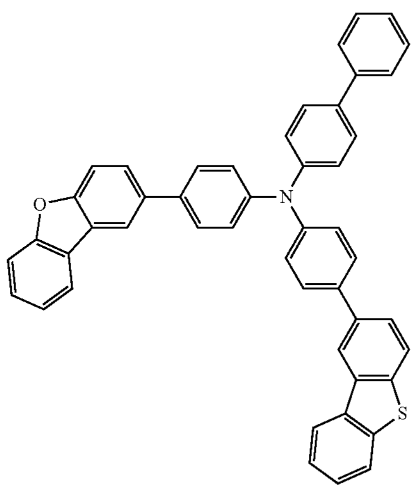
HT22
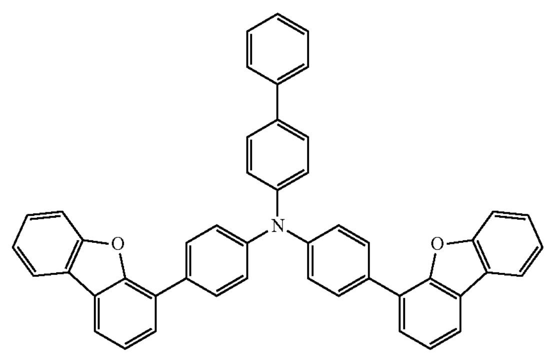
HT23
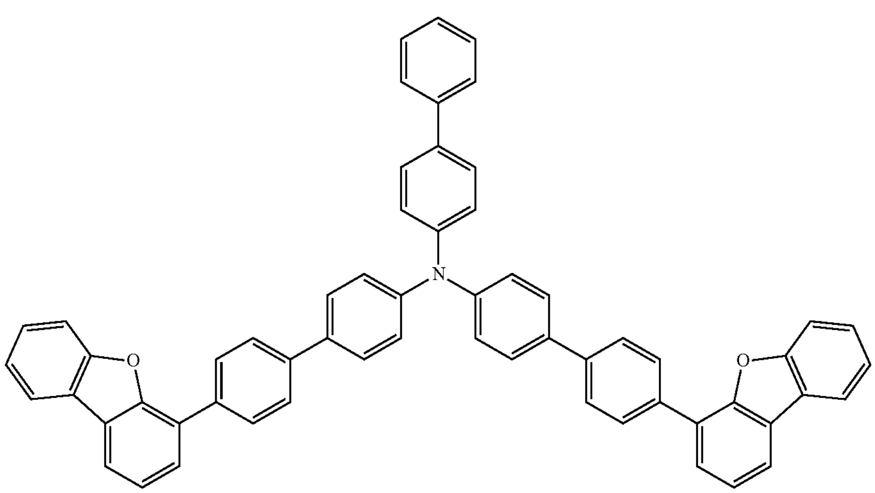

-continued
HT24
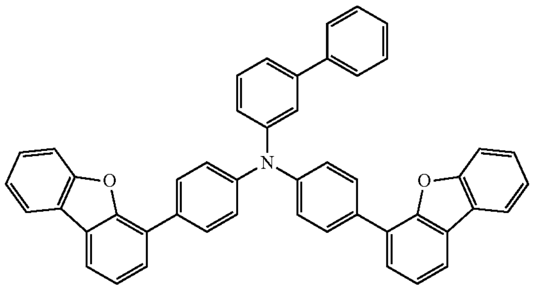
HT25
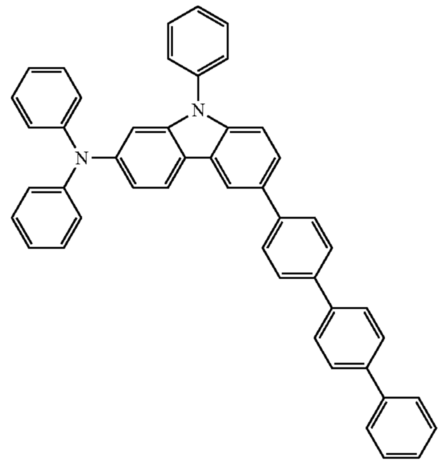
HT26
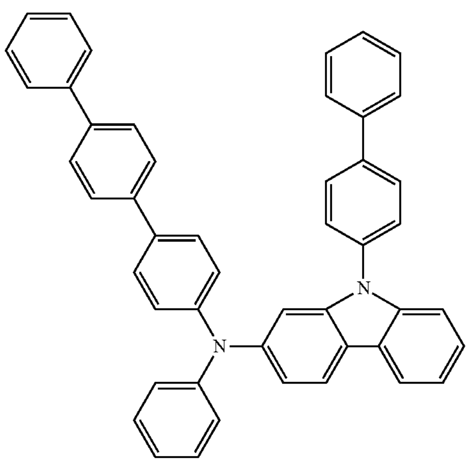
HT27
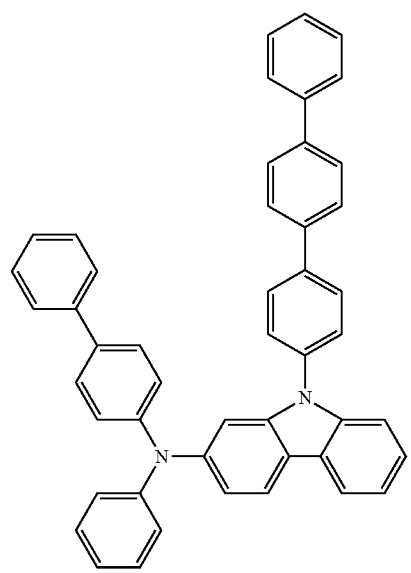
HT28
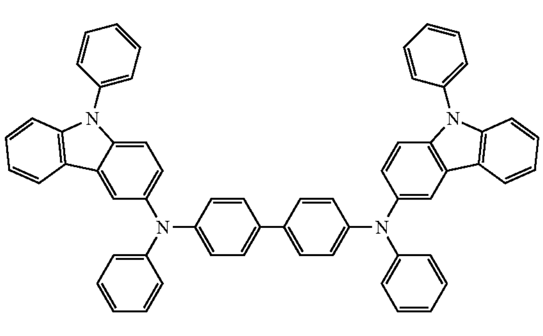
HT29
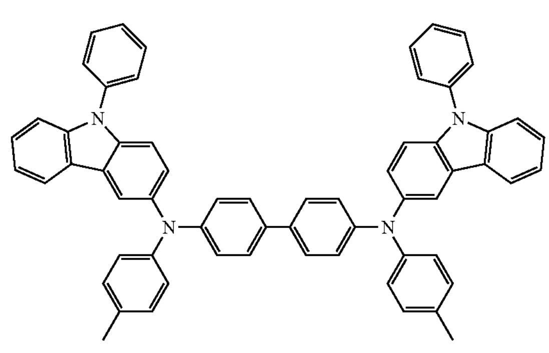

-continued
HT30
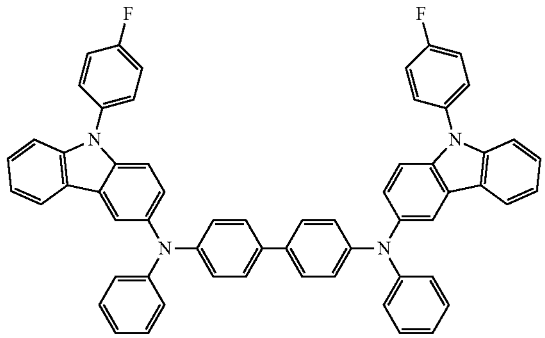
HT31
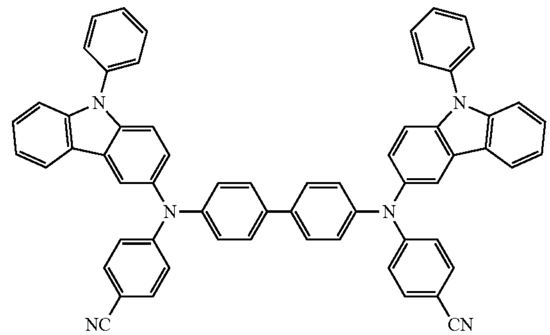
HT32
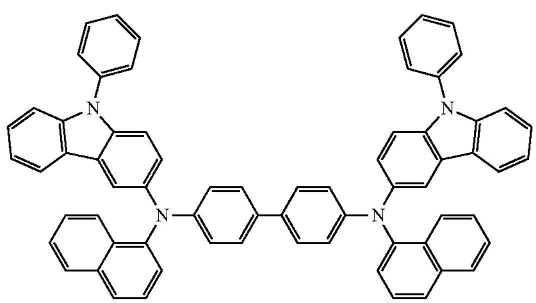
HT33
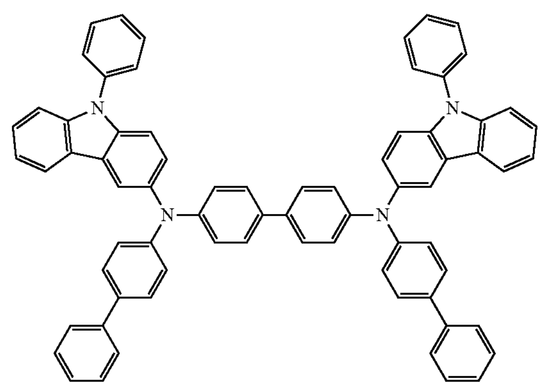
HT34
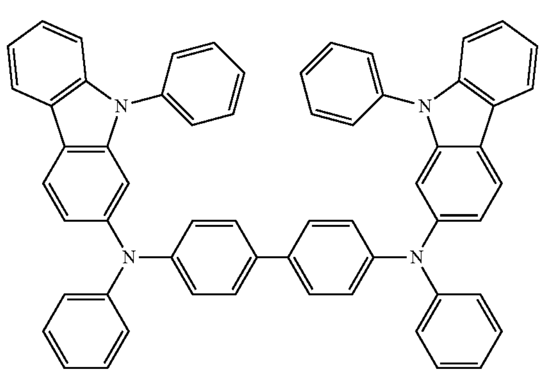
HT35
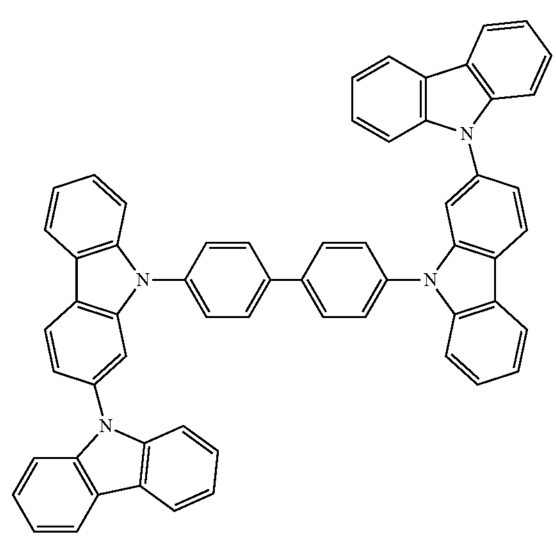

-continued

HT36

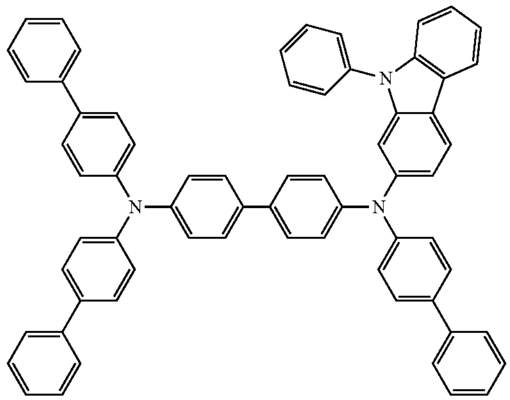

HT37

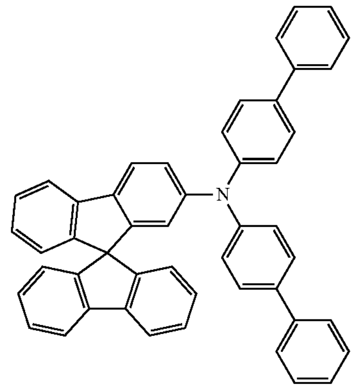

HT38

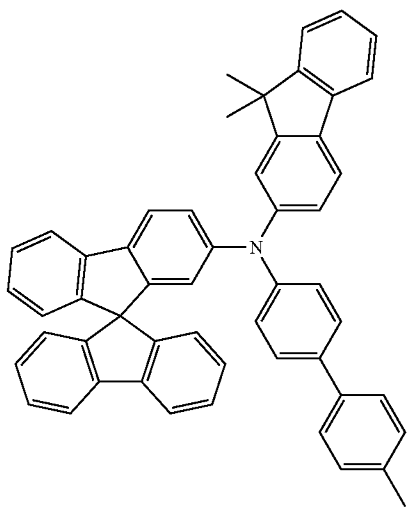

HT39

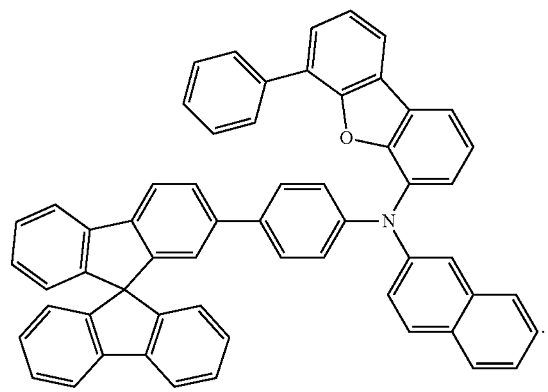

A thickness of the hole transport region may be in a range of about 100 Å to about 10,000 Å, for example, about 100 Å to about 1,000 Å. When the hole transport region includes at least one selected from a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may each independently include any of the materials as described above.

[p-dopant]

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In various embodiments, a lowest unoccupied molecular orbital (LUMO) of the p-dopant may be −3.5 eV or less.

The p-dopant may include at least one selected from a quinone derivative, a metal oxide, and a cyano group-containing compound, but embodiments are not limited thereto.

For example, the p-dopant may include at least one selected from the group consisting of:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221 below, but is not limited thereto:

HAT-CN

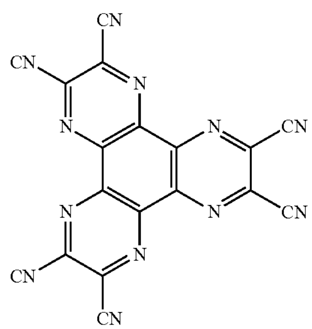

F4-TCNQ

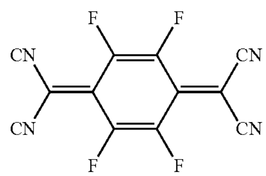

Formula 221

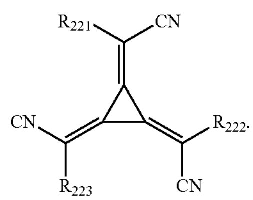

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full color organic light-emitting device, the emission layer may be patterned into a red emission layer, a green emission layer, and/or a blue emission layer, according to a sub-pixel. In various embodiments, the emission layer may have a stacked structure of two or more layers selected from a red emission layer, a green emission layer, and a blue emission layer, in which the two or more layers contact each other or are separated from each other. In various embodiments, the emission layer may include two or more materials selected from a red-light emission material, a green-light emission material, and a blue-light emission material, in which the two or more materials are mixed with each other in a single layer to emit white light.

In various embodiments, the emission layer of the organic light-emitting device 10 may be a first-color-light emission layer, the organic light-emitting device 10 may further include i) at least one second-color-light emission layer or ii) at least one second-color-light emission layer and at least one third-color-light emission layer, between the first electrode 110 and the second electrode 190, a maximum emission wavelength of the first-color-light emission layer, a maximum emission wavelength of the second-color-light emission layer, and a maximum emission wavelength of the third-color-light emission layer may be identical to or different from each other, and the organic light-emitting device 10 may emit mixed light including first-color-light and second-color-light, or mixed light including first-color-light, second-color-light, and third-color-light, but embodiments of the present disclosure are not limited thereto.

For example, the maximum emission wavelength of the first-color-light emission layer may be different from a maximum emission wavelength of the second-color-light emission layer, and the mixed light including first-color-light and second-color-light may be white light, but embodiments are not limited thereto.

In various embodiments, the maximum emission wavelength of the first-color-light emission layer, the maximum emission wavelength of the second-color-light emission layer, and the maximum emission wavelength of the third-color-light emission layer may be different from one another, and the mixed light including first-color-light, second-color-light, and third-color-light may be white light. However, embodiments are not limited thereto.

The emission layer may include a host and a dopant. The dopant may include at least one selected from a phosphorescent dopant and a fluorescent dopant.

An amount of the dopant in the emission layer may be, for example, in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within any of these ranges, excellent (or suitable) light-emission characteristics may be obtained without a substantial increase in driving voltage.

[Host in Emission Layer]

In various embodiments, the host may include a compound represented by Formula 301 below.

$$[Ar_{301}]_{xb11}\text{-}[(L_{301})_{xb1}\text{-}R_{301}]_{xb21} \quad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer selected from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In various embodiments, $Ar_{301}$ in Formula 301 may be selected from the group consisting of:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

When xb11 in Formula 301 is two or more, adjacent $Ar_{301}$(s) may be connected to each other via a single bond.

In various embodiments, the compound represented by Formula 301 may be represented by Formula 301-1 or 301-2:

Formula 301-1

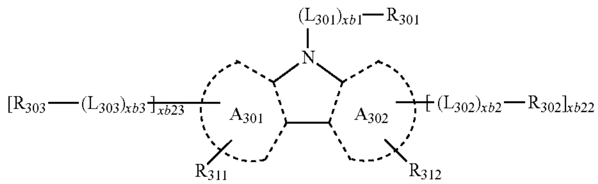

Formula 301-2

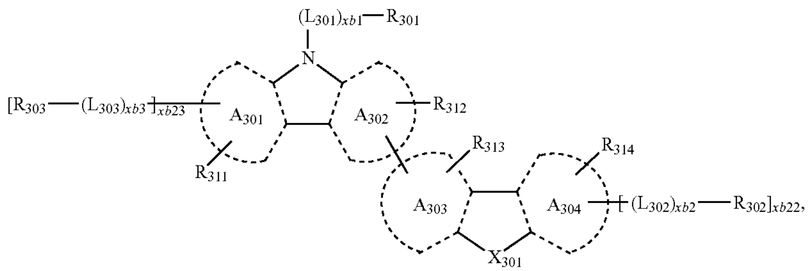

wherein, in Formulae 301-1 to 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, descriptions of $L_{301}$, xb1, $R_{301}$, and $Q_{31}$ to $Q_{33}$ are the same as described herein, descriptions of $L_{302}$ to $L_{304}$ may each independently be the same as the description provided in connection with $L_{301}$, descriptions of xb2 to xb4 may each independently be the same as the description provided in connection with xb1, and descriptions of $R_{302}$ to $R_{304}$ may each independently be the same as the description provided in connection with $R_{301}$.

For example, $L_{301}$ to $L_{304}$ in Formulae 301, 301-1, and 301-2 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described herein.

In various embodiments, $R_{301}$ to $R_{304}$ in Formulae 301, 301-1, and 301-2 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described herein.

In various embodiments, the host may include an alkaline earth-metal complex. For example, the host may be selected from a Be complex (e.g., Compound H55), a Mg complex, and a Zn complex.

The host may include at least one selected from 9,10-di(2-naphthyl)anthracene (herein referred to as AND or ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), TCP (1,3,5-tri(carbazol-9-yl)benzene), and Compounds H1 to H55, but is not limited thereto:

H1

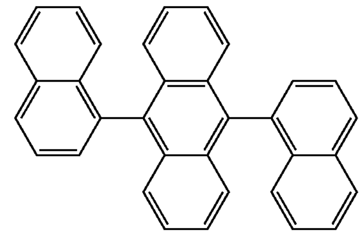

H2

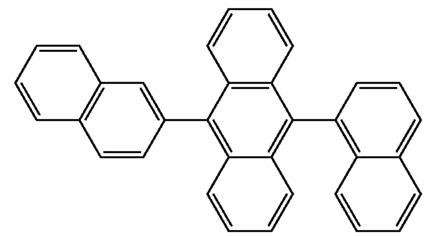

H3

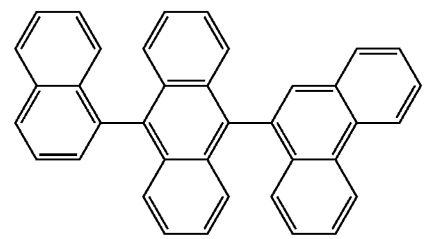

H4

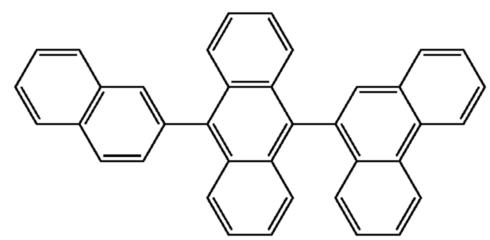

H5

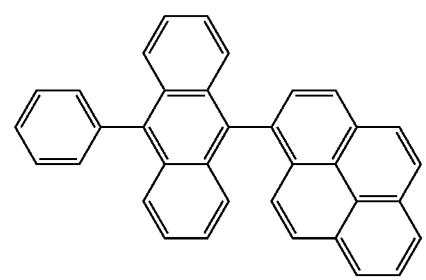

H6

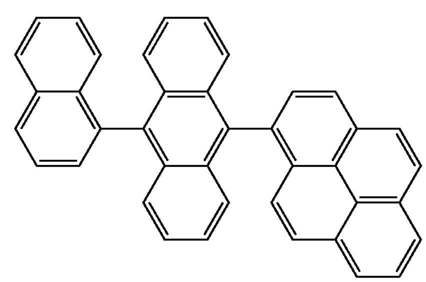

-continued
H7
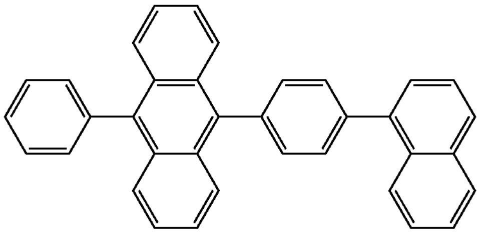
H8
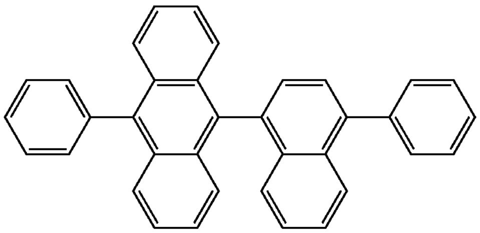
H9
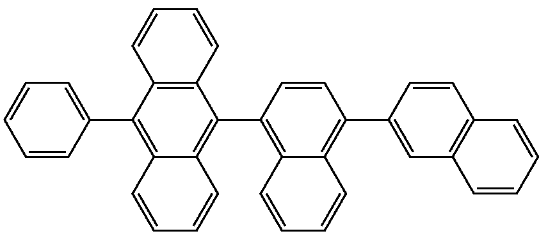
H10
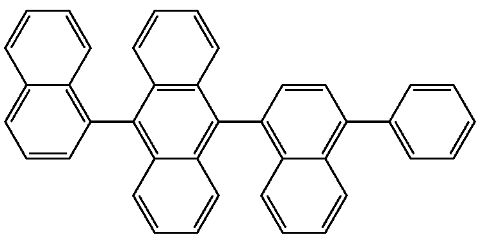
H11
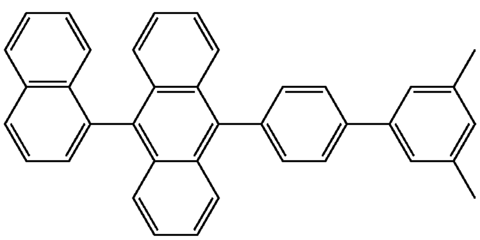
H12
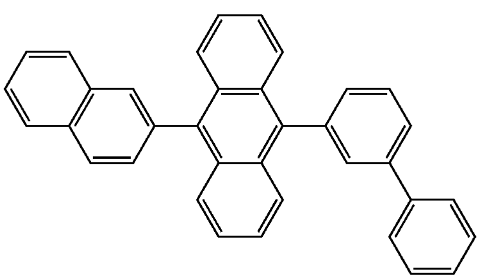
-continued
H13
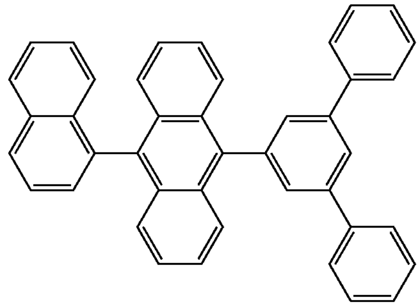
H14
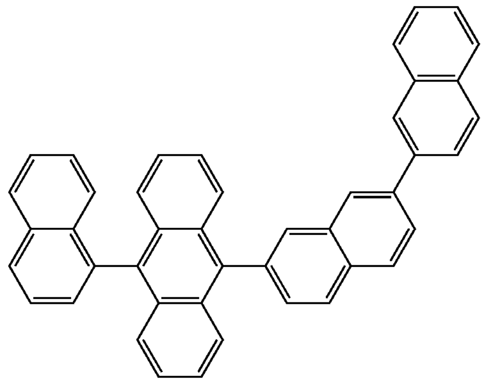
H15
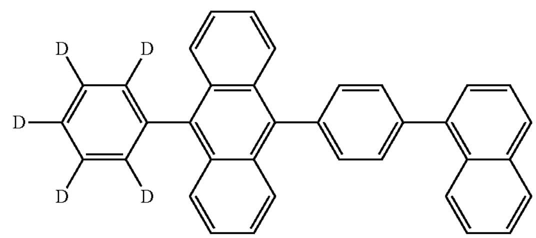
H16
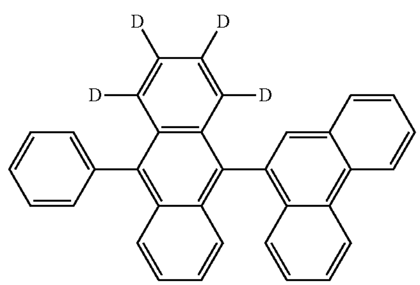
H17
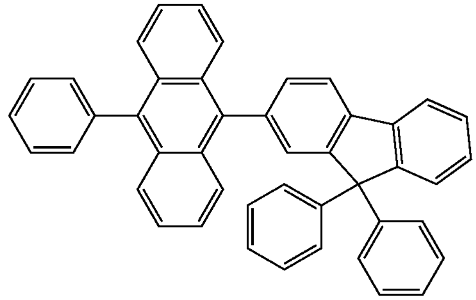

-continued
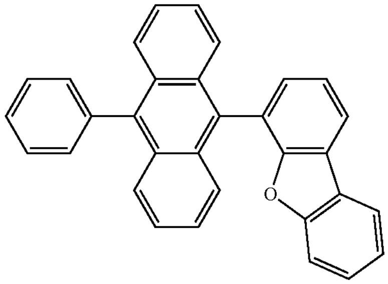
H18
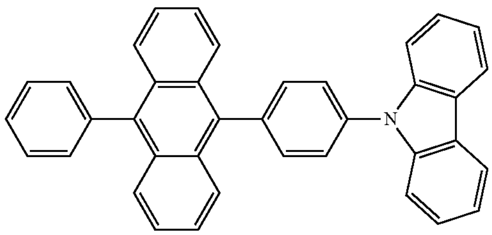
H19
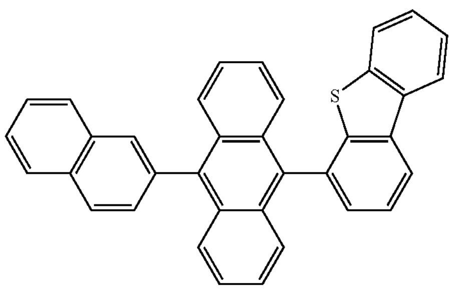
H20
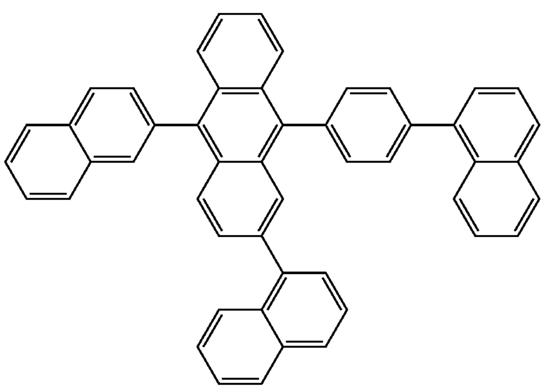
H21
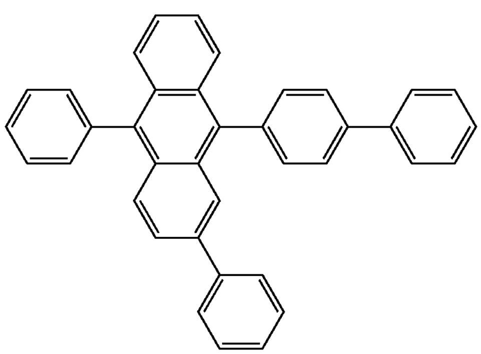
H22
-continued
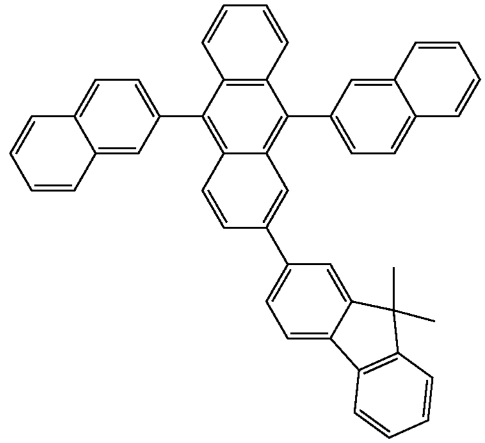
H23
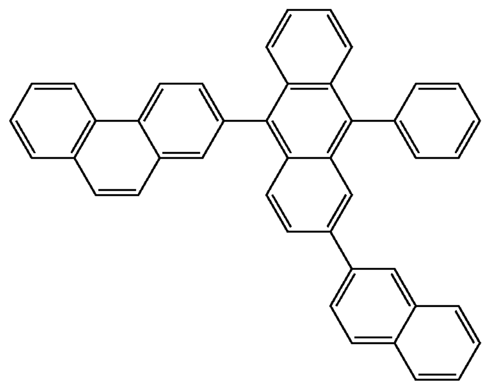
H24
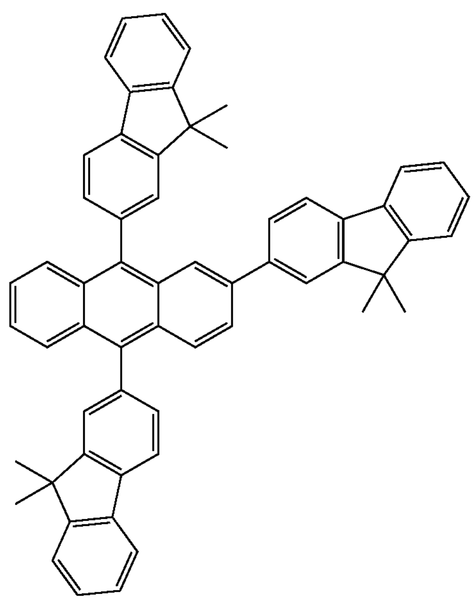
H25

-continued
H26
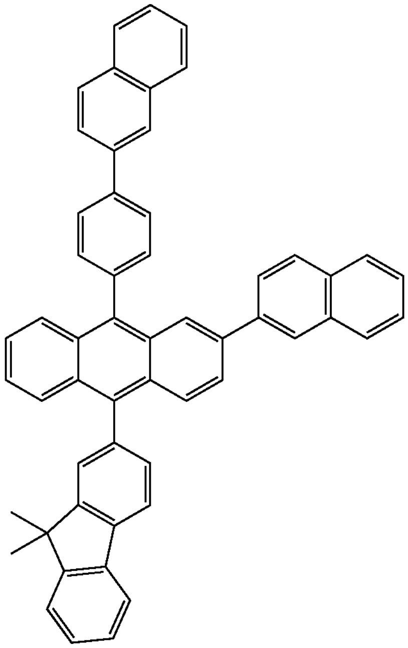
H27
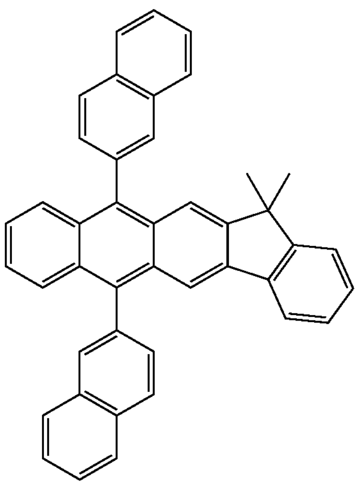
H28
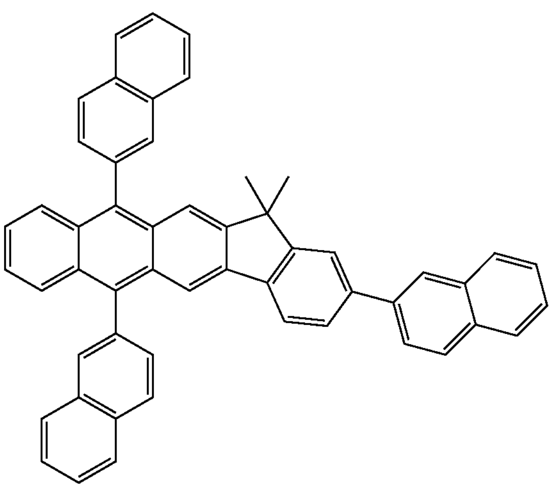
-continued
H29
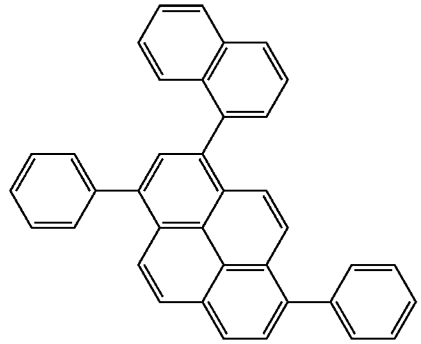
H30
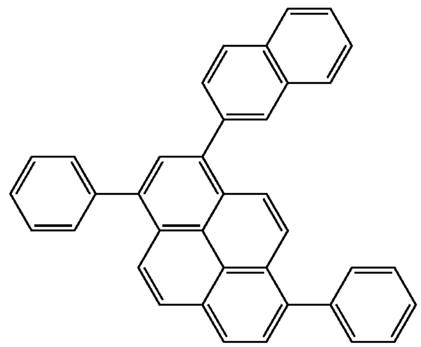
H31
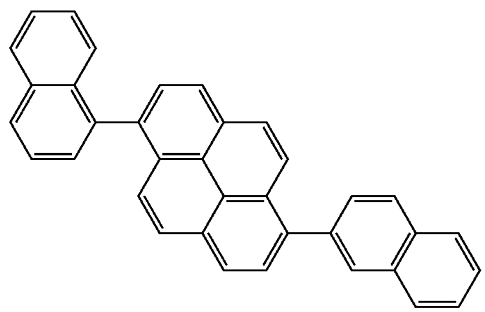
H32
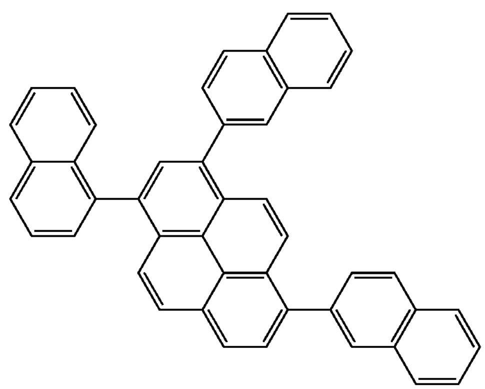
H33
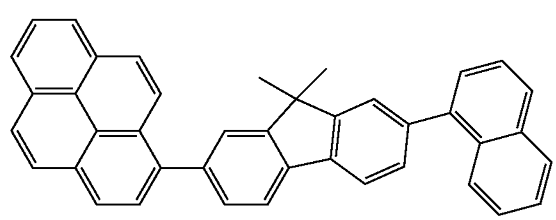

H34
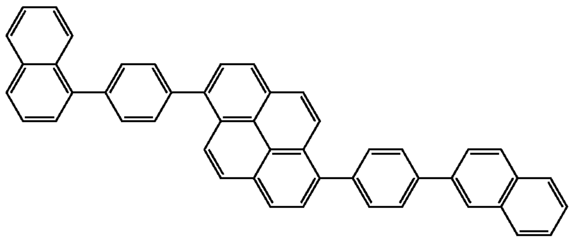
H35
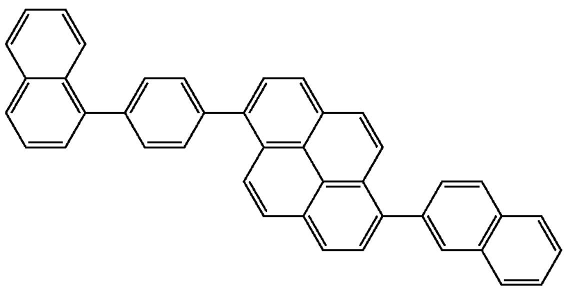
H36
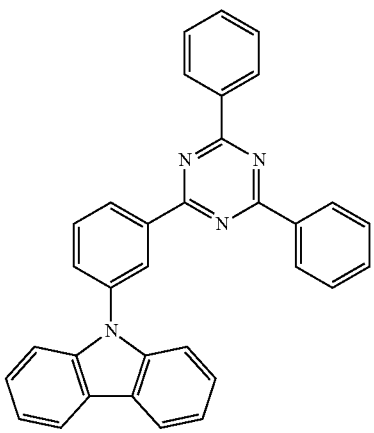
H37
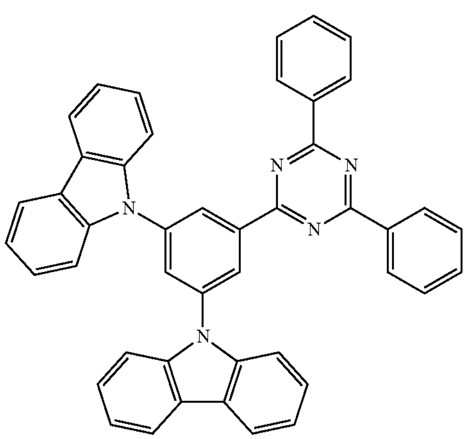
H38
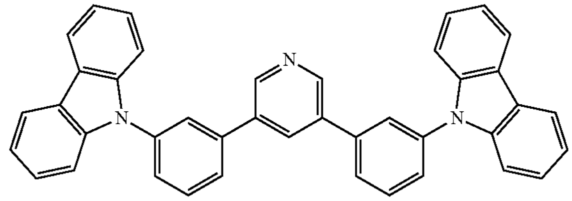
H39
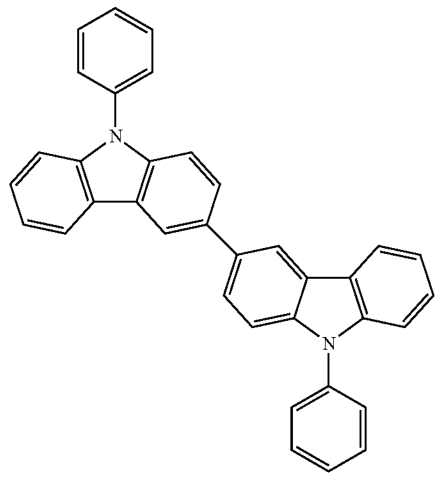
H40
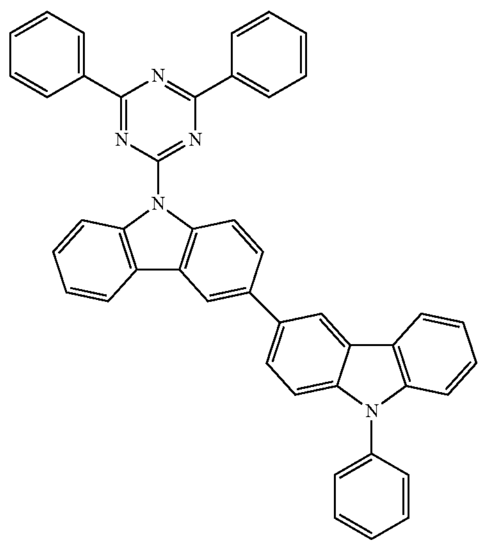

-continued
H41
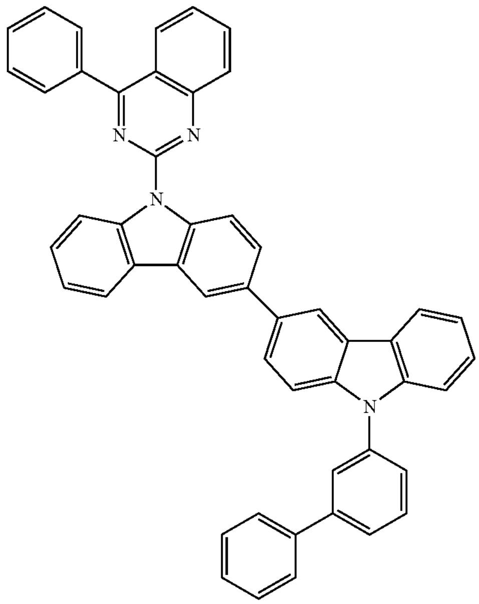
H42
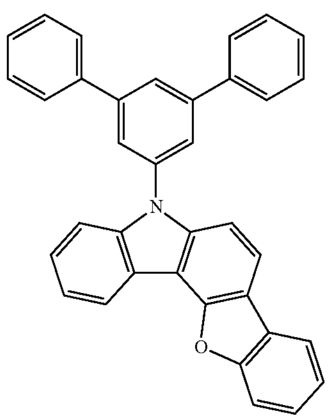
H43
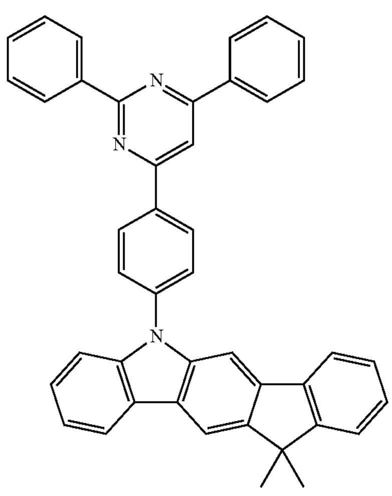
-continued
H44
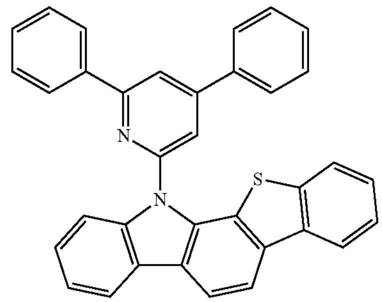
H45
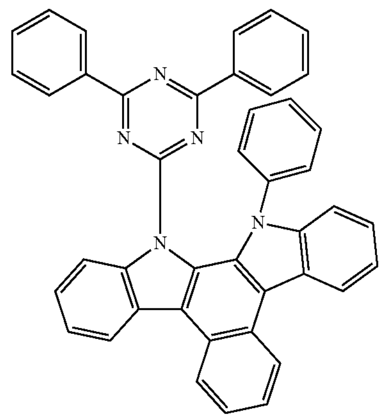
H46
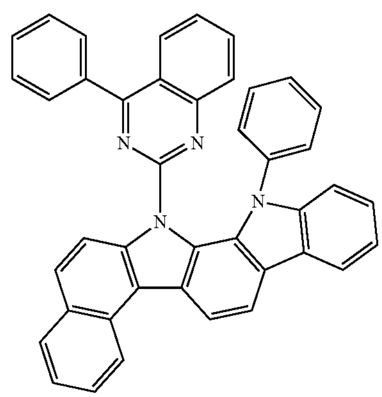
H47
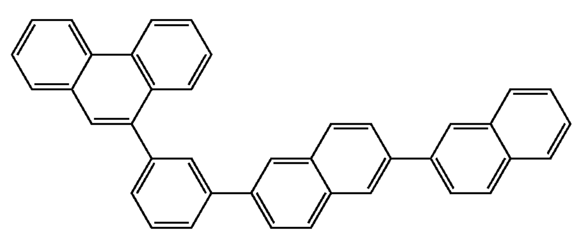
H48
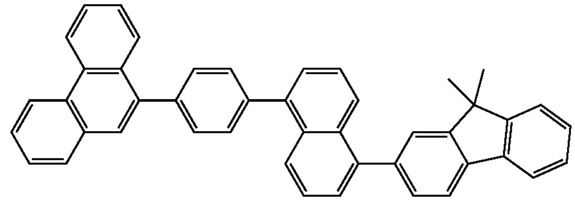

-continued

H49

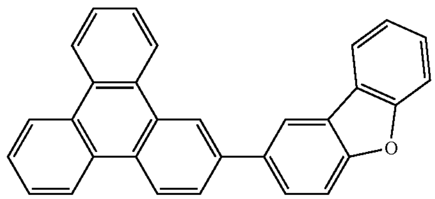

H50

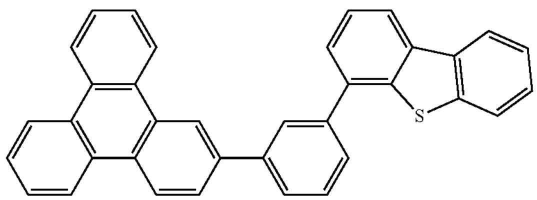

H51

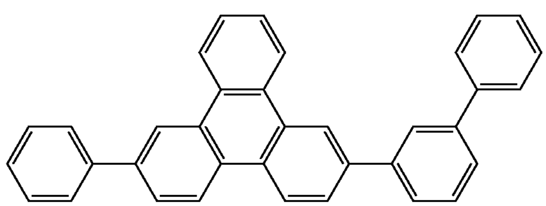

H52

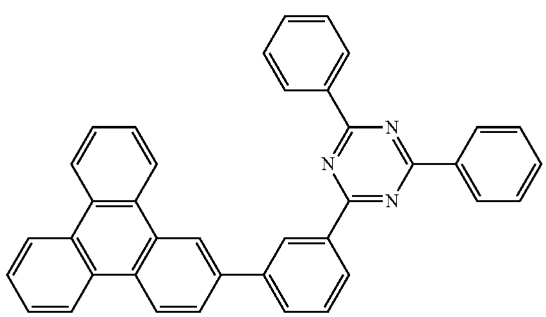

H53

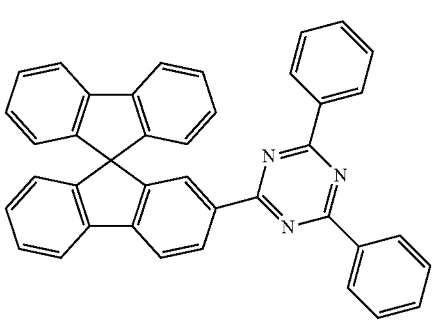

-continued

H54

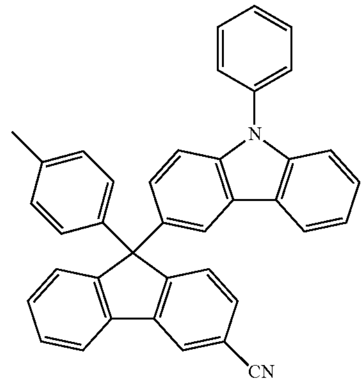

H55

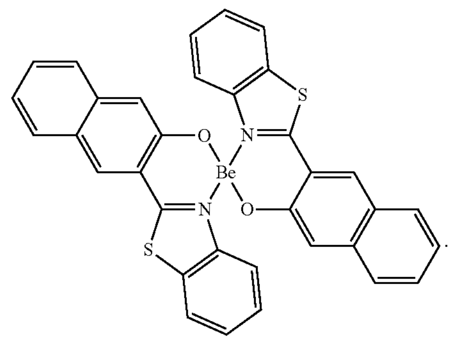

[Phosphorescent Dopant Included in Emission Layer in Organic Layer 150]

The phosphorescent dopant may include an organometallic complex represented by Formula 401 below:

Formula 401

$$M(L_{401})_{xc1}(L_{402})_{xc2}$$

Formula 402

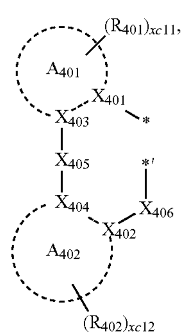

wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein when xc1 is two or more, two or more $L_{401}$(s) may be identical to or different from each other, $L_{402}$ may be an organic ligand, and xc2 may be an integer selected from 0 to 4, wherein xc2 is two or more, two or more $L_{402}$(s) may be identical to or different from each other, $X_{401}$ to $X_{404}$ may each independently be nitrogen or carbon, $X_{401}$ and $X_{403}$ may be connected to each other via a single bond or a double bond, and $X_{402}$ and $X_{404}$ may be connected to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—C(═O)—*', *—N($Q_{411}$)-*', *—C($Q_{411}$)($Q_{412}$)-*', *—C($Q_{411}$)=C($Q_{412}$)-*', *—C($Q_{411}$)=*', or *═C($Q_{411}$)=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 may each independently indicate a binding site to M in Formula 401.

In various embodiments, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In various embodiments, in Formula 402, i) $X_{401}$ may be nitrogen and $X_{402}$ may be carbon, or ii) both $X_{401}$ and $X_{402}$ may be nitrogen.

In various embodiments, $R_{401}$ and $R_{402}$ in Formula 402 may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In various embodiments, when xc1 in Formula 401 is two or more, two $A_{401}$(s) selected from two or more $L_{401}$(s) may be optionally connected to each other via a linking group $X_{407}$, and/or two $A_{402}$(s) may be optionally connected to each other via a linking group $X_{408}$ (see Compounds PD1 to PD4 and PD7). $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but are not limited thereto.

$L_{402}$ in Formula 401 may be any monovalent, divalent, or trivalent organic ligand. For example, $L_{402}$ may be selected from a halogen ligand, a diketone ligand (e.g., an acetylacetonate), a carboxylic acid ligand (e.g., a picolinate), —C(═O), an isonitrile, —CN, and phosphorus ligand (e.g., a phosphine and/or a phosphite), but is not limited thereto.

In various embodiments, the phosphorescent dopant may be selected from, for example, Compounds PD1 to PD25, but is not limited thereto:

PD1
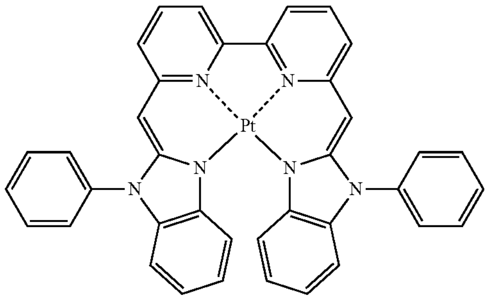
PD2
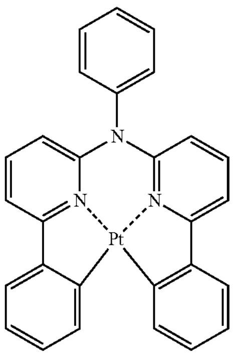
PD3
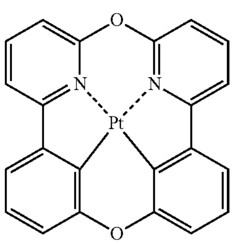
PD4
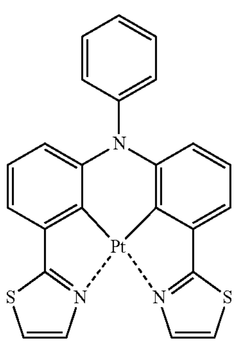
PD5
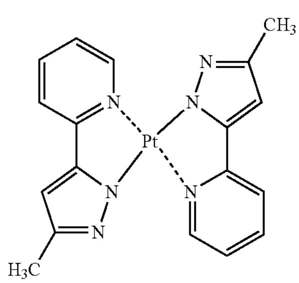
-continued
PD6
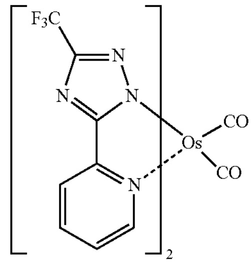
PD7
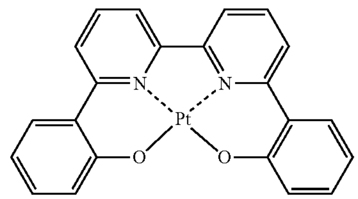
PD8
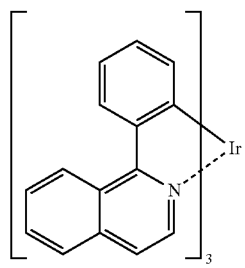
PD9
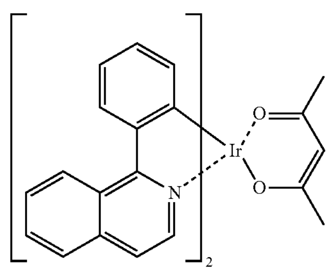
PD10
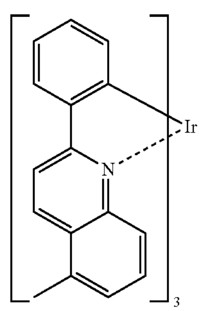
PD11
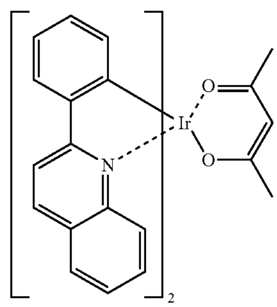

-continued
PD12
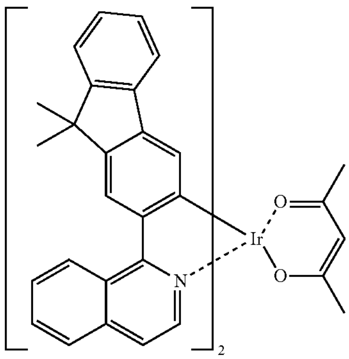
PD13
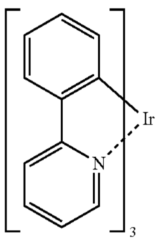
PD14
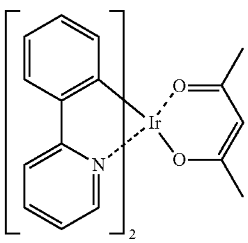
PD15
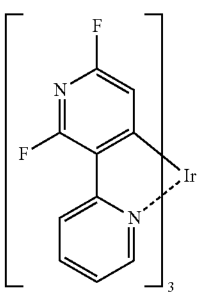
PD16
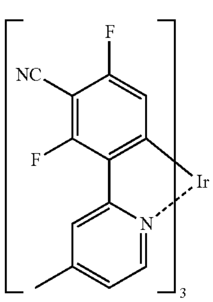
-continued
PD17
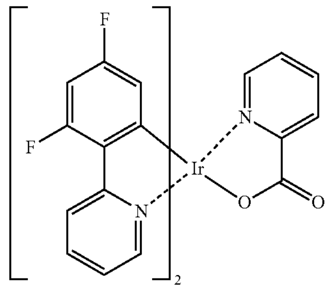
PD18
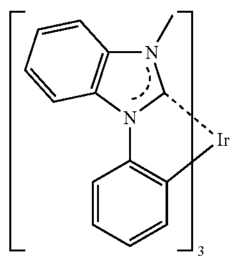
PD19
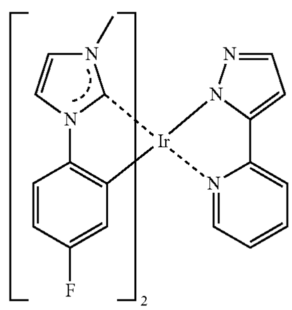
PD20
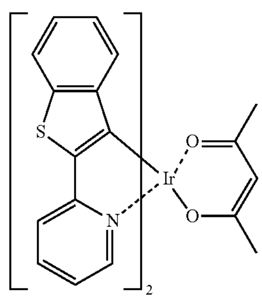
PD21
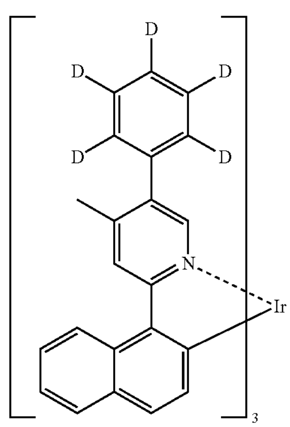

-continued

PD22

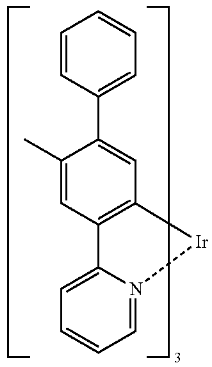

PD23

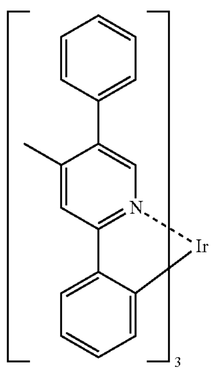

PD24

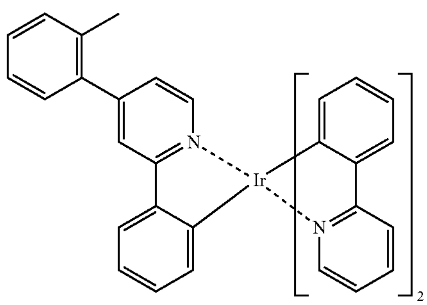

PD25

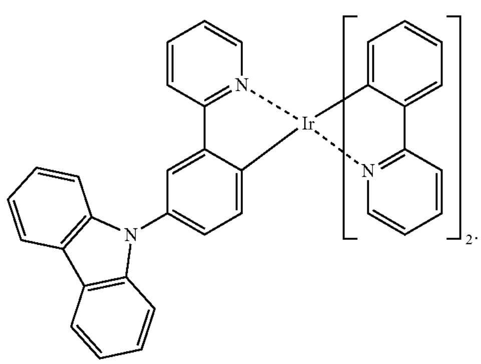

[Fluorescent Dopant in Emission Layer]

The fluorescent dopant may include an arylamine compound or a styrylamine compound.

In various embodiments, the fluorescent dopant may include a compound represented by Formula 501:

Formula 501

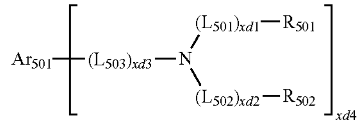

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In various embodiments, $Ar_{501}$ in Formula 501 may be selected from the group consisting of:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In various embodiments, $L_{501}$ to $L_{503}$ in Formula 501 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In various embodiments, $R_{501}$ and $R_{502}$ in Formula 501 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xd4 in Formula 501 may be 2, but is not limited thereto.

For example, the fluorescent dopant may be selected from Compounds FD1 to FD22:

FD1

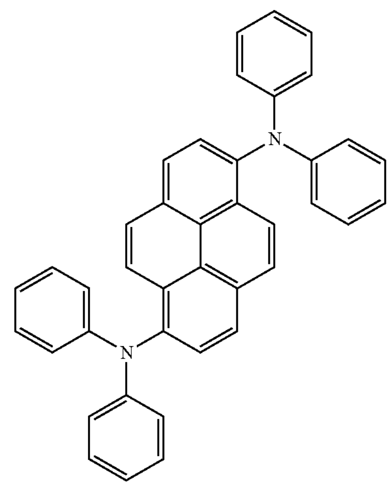

FD2

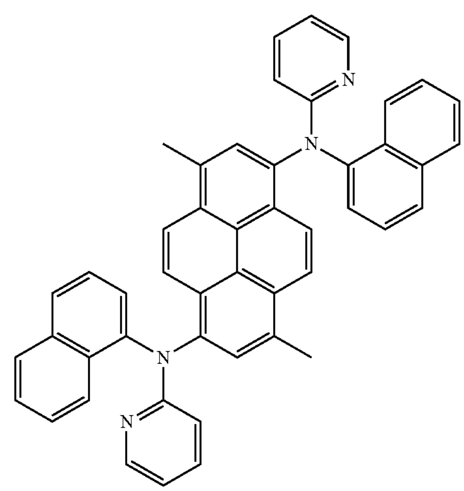

-continued
FD3
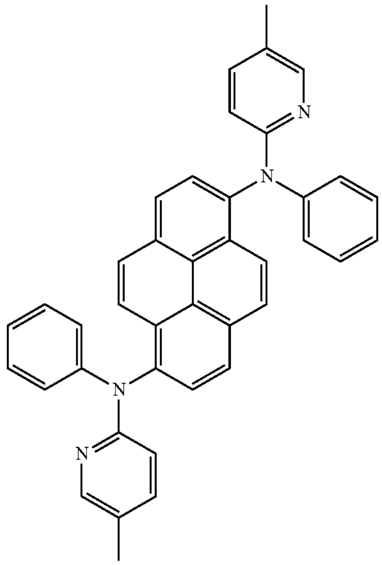
FD4
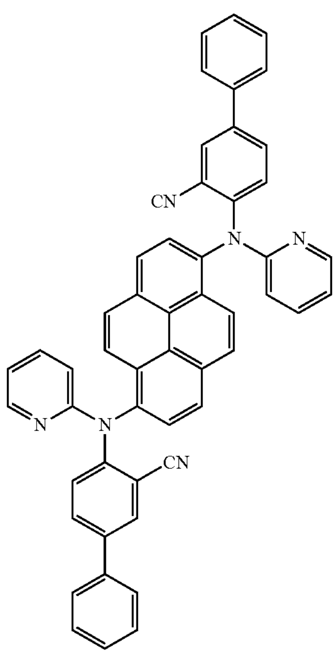
-continued
FD5
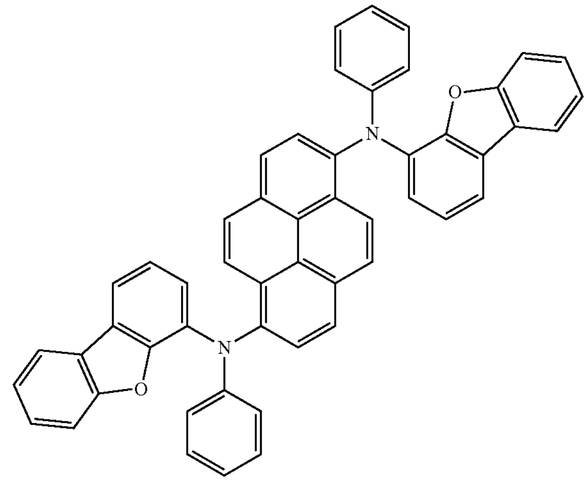
FD6
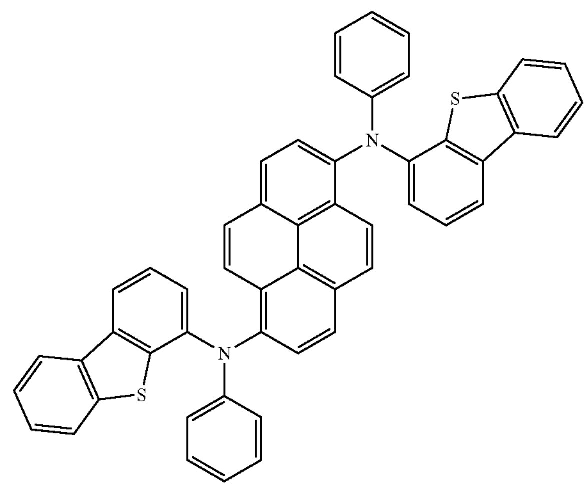
FD7
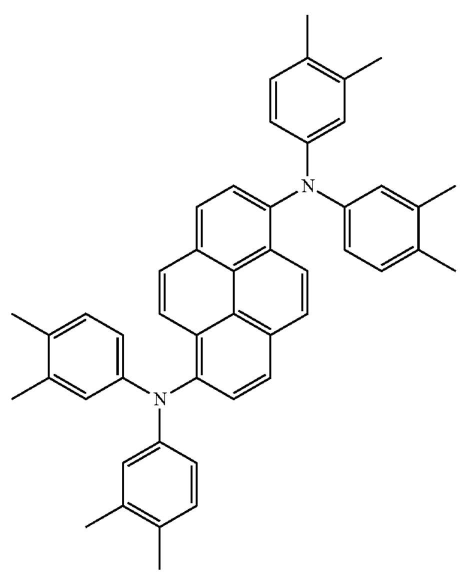

-continued
FD8
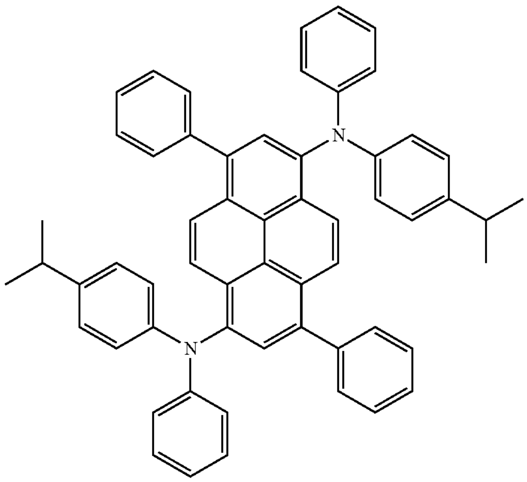
FD9
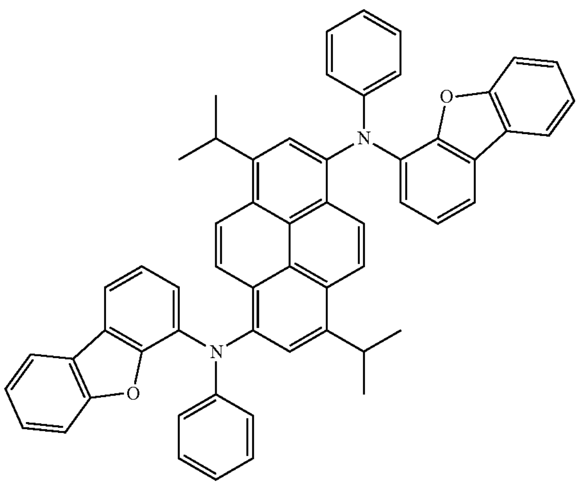
FD10
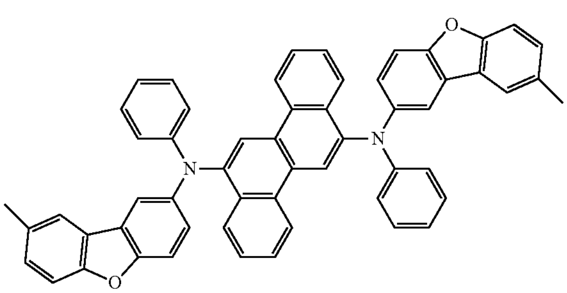
FD11
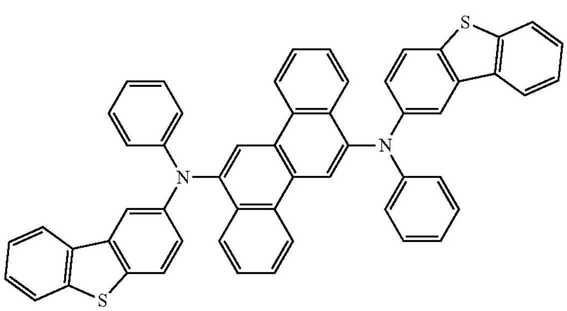
-continued
FD12
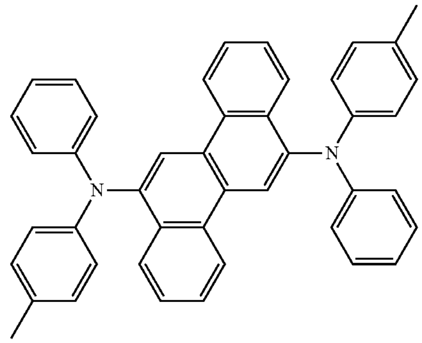
FD13
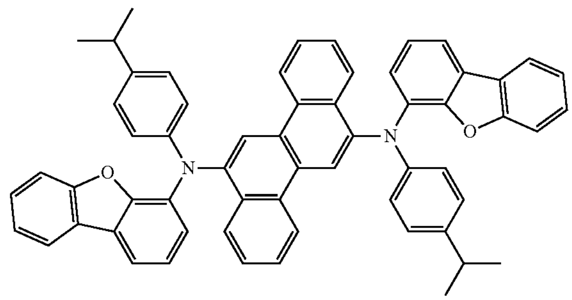
FD14
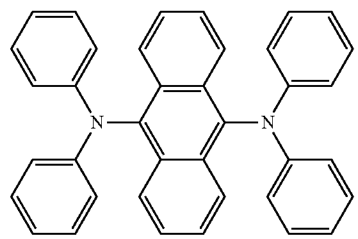
FD15
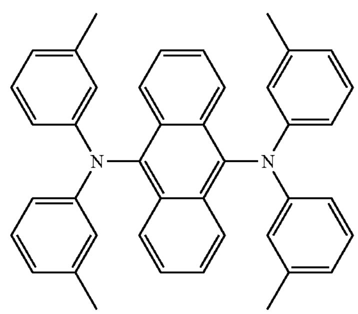
FD16
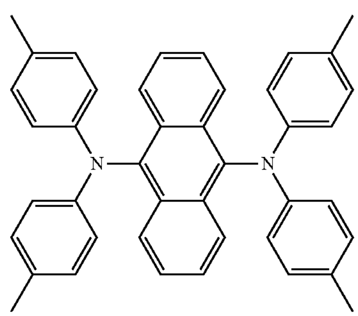

-continued
FD17
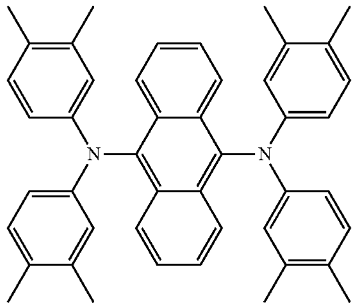
FD18
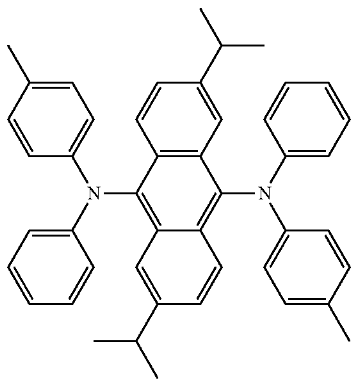
FD19
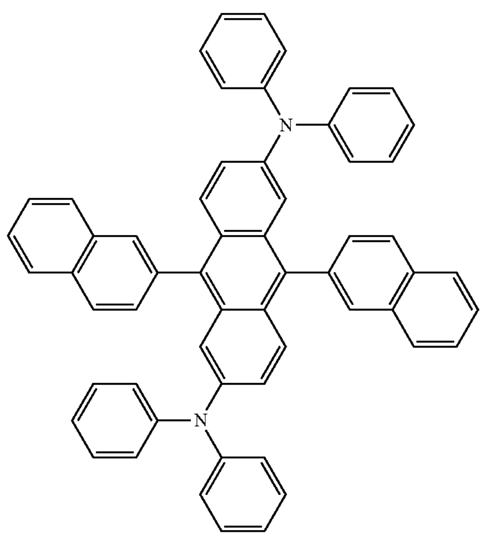
-continued
FD20
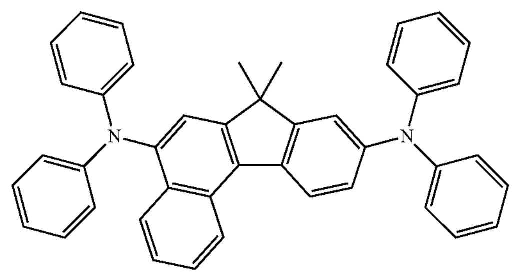
FD21
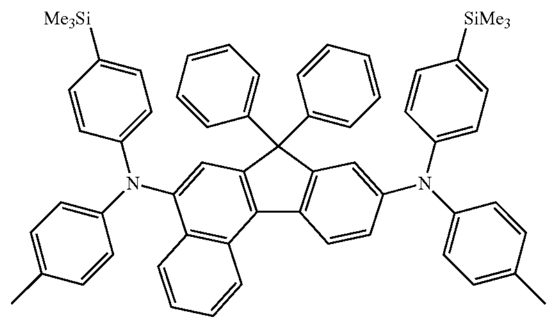
FD22
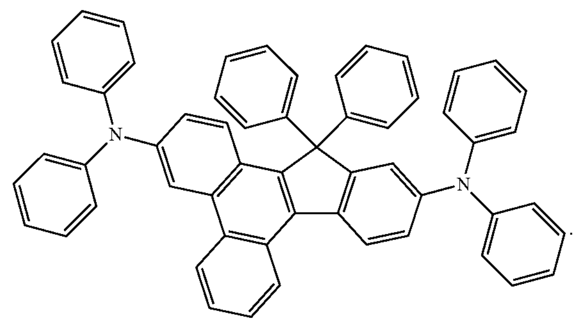
In various embodiments, the fluorescent dopant may be selected from compounds illustrated below, but is not limited thereto:
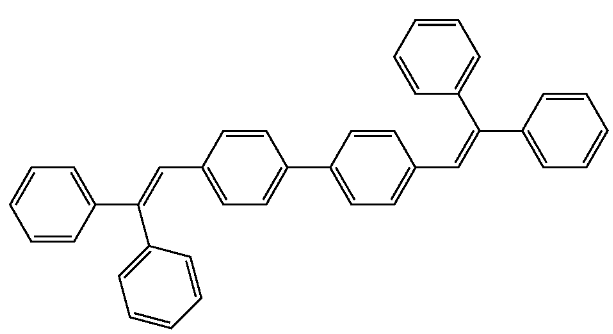
DPVBi -continued

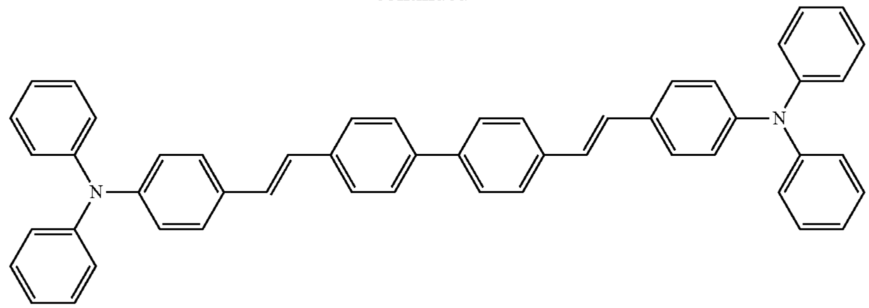

DPAVBi

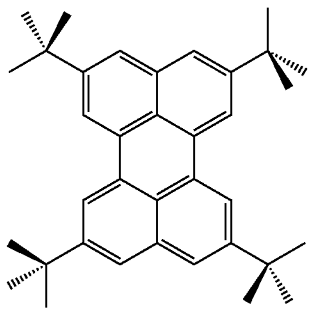

TBPe

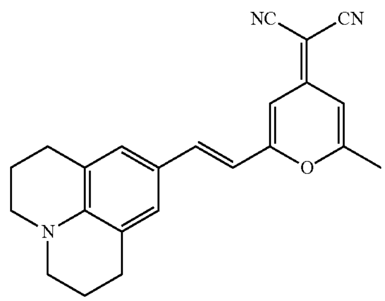

DCM

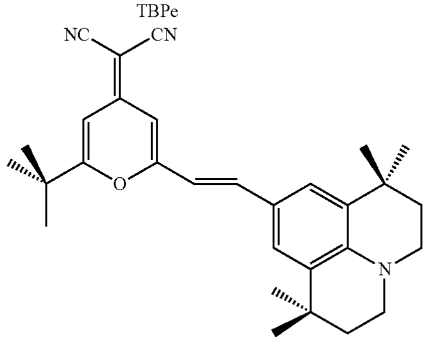

DCJTB

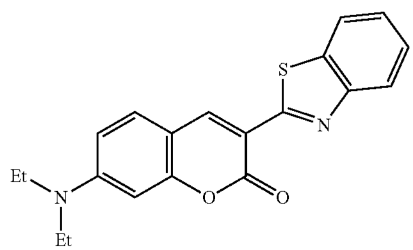

Coumarin 6

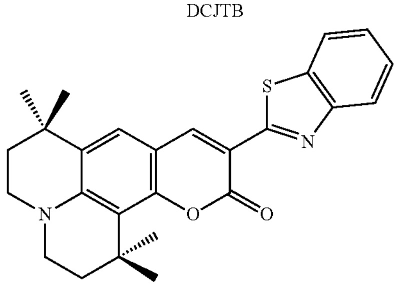

C545T

[Electron Transport Region in Organic Layer 150]

The electron transport region may have i) a single-layered structure having (e.g., consisting of) a single layer including a single material, ii) a single-layered structure having (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or any combination thereof, but is not limited thereto.

In various embodiments, the electron transport region may include the first compound and the second compound. The first compound and the second compound are the same as described herein.

In various embodiments, the electron transport region may include an electron transport layer and a buffer layer (between the emission layer and the electron transport layer), wherein the first compound may be included in the electron transport layer and the second compound may be included in the buffer layer.

In various embodiments, the buffer layer may directly contact the emission layer.

In various embodiments, the electron transport region may include, in addition to the first compound and/or the second compound, at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.

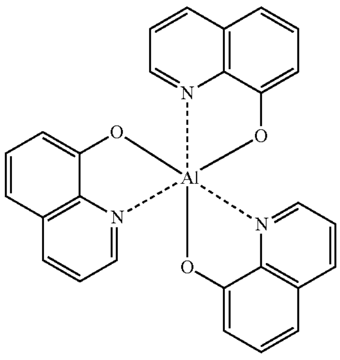

$Alq_3$

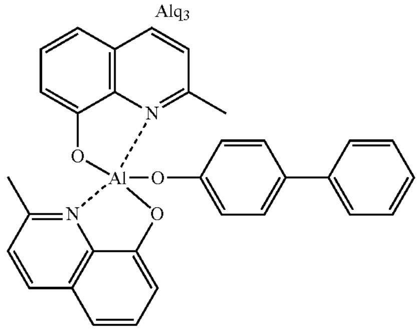

BAlq

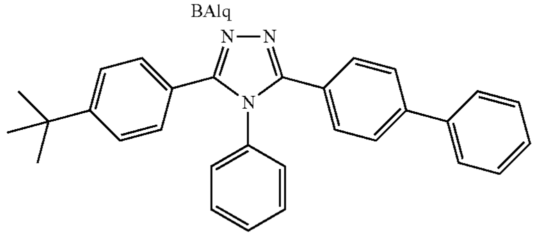

TAZ

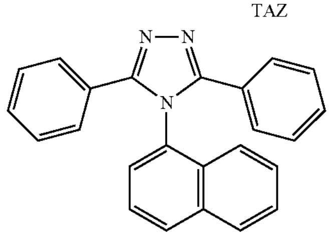

NTAZ

A thickness of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and/or the electron control layer are within any of these ranges, the electron transport region may have excellent (or suitable) hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory (or suitable) electron transport characteristics without a substantial increase in driving voltage.

The electron transport region (e.g., the electron transport layer in the electron transport region) may further include, in addition to the materials described above, a metal-containing material.

The metal-containing material may include at least one selected from an alkaline metal complex and an alkaline earth-metal complex. The alkaline metal complex may include a metal ion selected from a Li ion, a Na ion, a K ion, a Rb ion, and a Cs ion; and the alkaline earth-metal complex may include a metal ion selected from a Be ion, a Mg ion, a Ca ion, a Sr ion, and a Ba ion. A ligand coordinated with the metal ion of the alkaline metal complex or the alkaline earth-metal complex may each independently be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but is not limited thereto.

For example, the metal-containing material may include a Li complex. The Li complex may include, for example, Compound ET-D1 (lithium quinolate, LiQ) and/or Compound ET-D2.

ET-D1

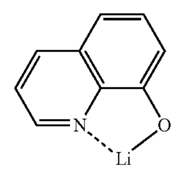

ET-D2

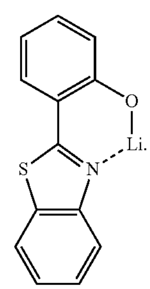

The electron transport region may include an electron injection layer that facilitates injection of electrons from the second electrode 190. The electron injection layer may directly contact the second electrode 190.

The electron injection layer may have i) a single-layered structure having a single layer including a single material, ii) a single-layered structure having a single layer including a plurality of different materials, or iii) a multi-layered structure having a plurality of layers including a plurality of different materials.

The electron injection layer may include an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or a combination thereof.

In various embodiments, the electron injection layer may include Li, Na, K, Rb, Cs, Mg, Ca, Er, Tm, Yb or any combination thereof. However, a material included in the electron injection layer is not limited thereto.

The alkaline metal may be selected from Li, Na, K, Rb, and Cs. In various embodiments, the alkaline metal may be Li, Na, or Cs. In various embodiments, the alkaline metal may be Li or Cs, but is not limited thereto.

The alkaline earth metal may be selected from Mg, Ca, Sr, and Ba.

The rare-earth metal may be selected from Sc, Y, Ce, Tb, Yb, Gd, and Tb.

The alkaline metal compound, the alkaline earth-metal compound, and the rare-earth metal compound may be selected from oxides and halides (e.g., fluorides, chlorides, bromides, and/or iodines) of the alkaline metal, the alkaline earth-metal, and the rare-earth metal, respectively.

For example, the alkaline metal compound may be selected from alkaline metal oxides (such as $Li_2O$, $Cs_2O$, and/or $K_2O$), and alkaline metal halides (such as LiF, NaF, CsF, KF, LiI, NaI, CsI, and/or KI). In various embodiments, the alkaline metal compound may be selected from LiF, $Li_2O$, NaF, LiI, NaI, CsI, and KI, but is not limited thereto.

The alkaline earth-metal compound may be selected from alkaline earth-metal compounds, such as BaO, SrO, CaO, $Ba_xSr_{1-x}O(0<x<1)$, and/or $Ba_xCa_{1-x}O(0<x<1)$. In various embodiments, the alkaline earth-metal compound may be selected from BaO, SrO, and CaO, but is not limited thereto.

The rare-earth metal compound may be selected from $YbF_3$, $ScF_3$, $ScO_3$, $Y_2O_3$, $Ce_2O_3$, $GdF_3$, and $TbF_3$. In various embodiments, the rare-earth metal compound may be selected from $YbF_3$, $ScF_3$, $TbF_3$, $YbI_3$, $ScI_3$, and $TbI_3$, but is not limited thereto.

The alkaline metal complex, the alkaline earth-metal complex, and the rare-earth metal complex may include an ion of an alkaline metal, an alkaline earth-metal, and a rare-earth metal, respectively, as described above; and a ligand coordinated with the metal ion of the alkaline metal complex, the alkaline earth-metal complex, and the rare-earth metal complex may each independently be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but is not limited thereto.

The electron injection layer may consist of an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or a combination thereof, as described above. In various embodiments, the electron injection layer may further include an organic material. When the electron injection layer further includes an organic material, an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or a combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

In various embodiments, the electron transport region of the organic light-emitting device 10 may include a buffer layer, an electron transport layer, and an electron injection layer, and at least one layer selected from the electron transport layer and the electron injection layer may include an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or combinations thereof.

[Second Electrode 190]

The second electrode 190 may be disposed (e.g., positioned) on the organic layer 150 having the structure according to embodiments of the present disclosure. The second electrode 190 may be a cathode (which is an electron injection electrode), and in this regard, a material for forming the second electrode 190 may be selected from a metal, an alloy, an electrically conductive compound, and a mixture thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but is not limited thereto. The second electrode 190 may be a transmissive electrode, a semi-transmissive electrode, or a reflective electrode.

The second electrode 190 may have a single-layered structure, or a multi-layered structure including two or more layers.

[Description of FIGS. 2 to 6]

Figure 2:
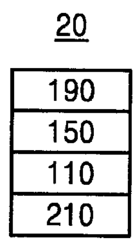
FIG. 2 is a schematic view of organic light-emitting device according to another embodiment.
Figure 3:
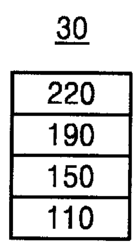
FIG. 3 is a schematic view of organic light-emitting device according to another embodiment.
Figure 4:
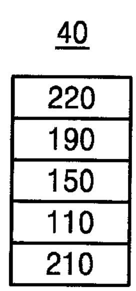
FIG. 4 is a schematic view of organic light-emitting device according to another embodiment.

FIG. 2 is a schematic view of an organic light-emitting device 20 according to an embodiment. The organic light-emitting device 20 includes a first capping layer 210, the first electrode 110, the organic layer 150, and the second electrode 190, which are sequentially stacked in this stated order. FIG. 3 is a schematic view of an organic light-emitting device 30 according to an embodiment. The organic light-emitting device 30 includes the first electrode 110, the organic layer 150, the second electrode 190, and a second capping layer 220, which are sequentially stacked in this stated order. FIG. 4 is a schematic view of an organic light-emitting device 40 according to an embodiment. The organic light-emitting device 40 includes the first capping layer 210, the first electrode 110, the organic layer 150, the second electrode 190, and the second capping layer 220, which are sequentially stacked in this stated order.

Regarding FIGS. 2 to 4, descriptions of the first electrode 110, the organic layer 150, and the second electrode 190 may each independently be understood by referring to the descriptions thereof presented in connection with FIG. 1.

In the organic layer 150 of each of the organic light-emitting devices 20 and 40, light generated in an emission layer may pass through the first electrode 110, which may be a semi-transmissive electrode or a transmissive electrode, and the first capping layer 210 toward the outside; and in the organic layer 150 of each of the organic light-emitting devices 30 and 40, light generated in an emission layer may pass through the second electrode 190, which may be a semi-transmissive electrode ora transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkaline metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In various embodiments, at least one selected from the first capping layer 210 and the second capping layer 220 may each independently include an amine-based compound.

In various embodiments, at least one selected from the first capping layer 210 and the second capping layer 220 may each independently include the compound represented by Formula 201 or the compound represented by Formula 202.

In various embodiments, at least one selected from the first capping layer 210 and the second capping layer 220 may each independently include a compound selected from Compounds $HT_{28}$ to $HT_{33}$ and Compounds CP1 to CPS, but is not limited thereto:

CP1

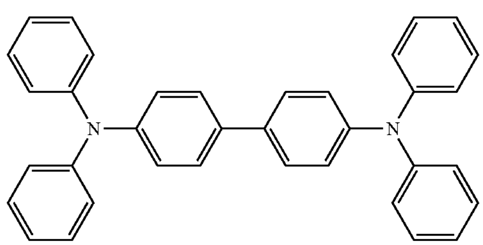

CP2

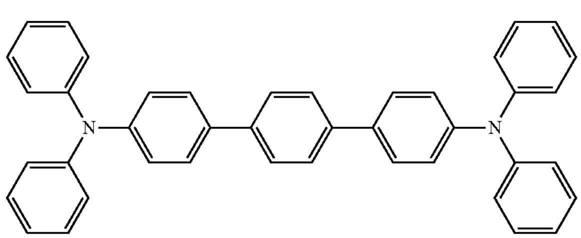

-continued

CP3

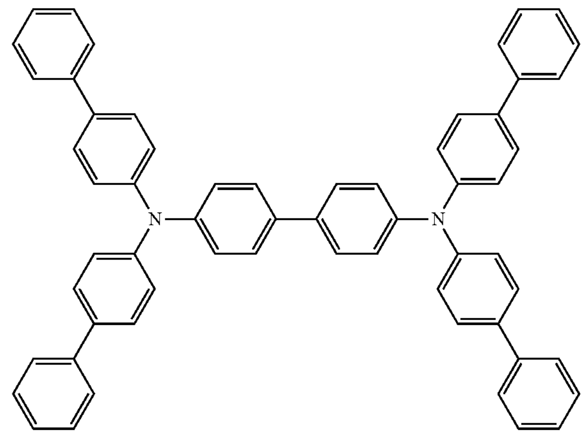

CP4

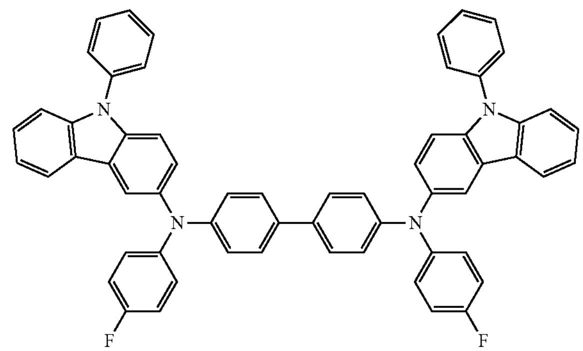

CP5

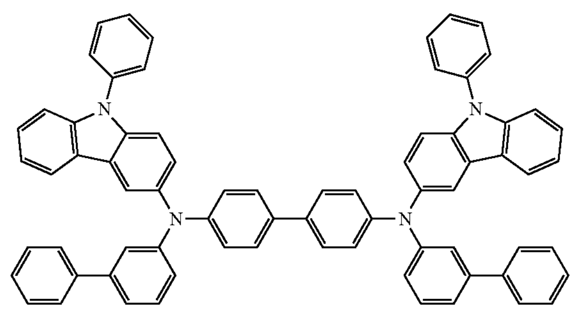

Figure 5:
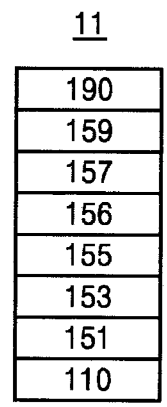
FIG. 5 is a schematic view of organic light-emitting device according to another embodiment.

FIG. 5 is a scheatic view of an organic light-emitting device 11 according to an embodiment. The organic light-emitting device 11 may include a first electrode 110, a hole injection layer 151, a hole transport layer 153, an emission layer 155, a buffer layer 156, an electron transport layer 157, an electron injection layer 159, and a second electrode 190, which are sequentially stacked in this stated order.

Figure 6:
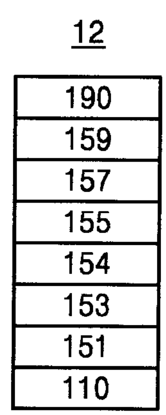
FIG. 6 is a schematic view of organic light-emitting device according to another embodiment.

FIG. 6 is a schematic view of an organic light-emitting device 12 according to an embodiment. The organic light-emitting device 12 may include the first electrode 110, a hole injection layer 151, a hole transport layer 153, an emission auxiliary layer 154, an emission layer 155, an electron transport layer 157, an electron injection layer 159, and the second electrode 190, which are sequentially stacked in this stated order.

Descriptions of the layers constituting the organic light-emitting devices 11 and 12 illustrated in FIGS. 5 and 6 are the same as described herein.

Hereinbefore, the organic light-emitting device according to one or more embodiments of the present disclosure has been described in connection with FIGS. 1-6. However, embodiments of the present disclosure are not limited thereto.

Layers constituting the hole transport region, the emission layer, and layers constituting the electron transport region may each independently be formed in a certain region by using one or more suitable methods such as vacuum deposition, spin coating, casting, langmuir-blodgett (LB) deposition, ink-jet printing, laser-printing, and/or laser-induced thermal imaging.

When layers constituting the hole transport region, the emission layer, and layers constituting the electron transport region are formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, by taking into account a compound to be included in a layer to be formed, and the structure of a layer to be formed.

When layers constituting the hole transport region, the emission layer, and layers constituting the electron transport region are formed by spin coating, for example, the spin coating may be performed at a coating speed of about 2,000 rpm to about 5,000 rpm and at a heat treatment temperature of about 80° C. to 200° C., by taking into account a compound to be included in a layer to be formed, and the structure of a layer to be formed.

[General Definition of Substituents]

The term "$C_1$-$C_{60}$ alkyl group," as used herein, may refer to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, may refer to a divalent group having the same structure as the $C_1$-$C_{60}$ alkyl group.

The term "$C_2$-$C_{60}$ alkenyl group," as used herein, may refer to a hydrocarbon group having at least one carbon-carbon double bond at one or more positions along the hydrocarbon chain of the $C_2$-$C_{60}$ alkyl group (e.g, in the middle and/or at the terminus of the $C_2$-$C_{60}$ alkyl group), and non-limiting examples thereof include an ethenyl group, a propenyl group, and a butenyl group. The term "$C_2$-$C_{60}$ alkenylene group," as used herein, may refer to a divalent group having the same structure as the $C_2$-$C_{60}$ alkenyl group.

The term "$C_2$-$C_{60}$ alkynyl group," as used herein, may refer to a hydrocarbon group having at least one carbon-carbon triple bond at one or more positions along the hydrocarbon chain of the $C_2$-$C_{60}$ alkyl group (e.g, in the middle and/or at the terminus of the $C_2$-$C_{60}$ alkyl group), and non-limiting examples thereof include an ethynyl group and a propynyl group. The term "$C_2$-$C_{60}$ alkynylene group," as used herein, may refer to a divalent group having the same structure as the $C_2$-$C_{60}$ alkynyl group.

The term "$C_1$-$C_{60}$ alkoxy group," as used herein, may refer to a monovalent group represented by —$OA_{101}$ (wherein $A_{101}$ is the $C_1$-$C_{60}$ alkyl group), and non-limiting examples thereof include a methoxy group, an ethoxy group, and an isopropoxy group.

The term "$C_3$-$C_{10}$ cycloalkyl group," as used herein, may refer to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, may refer to a divalent group having the same structure as the $C_3$-$C_{10}$ cycloalkyl group.

The term "$C_1$-$C_{10}$ heterocycloalkyl group," as used herein, may refer to a monovalent monocyclic group having at least one heteroatom selected from N, O, Si, P, and S as a ring-forming atom, and 1 to 10 carbon atoms, and non-limiting examples thereof include 1,2,3,4-oxatriazolidinyl group, a tetrahydrofuranyl group, and a tetrahydrothiophenyl group. The term "$C_1$-$C_{10}$ heterocycloalkylene group," as used herein, may refer to a divalent group having the same structure as the $C_1$-$C_{10}$ heterocycloalkyl group.

The term "$C_3$-$C_{10}$ cycloalkenyl group," as used herein, may refer to a monovalent monocyclic group that has 3 to 10 carbon atoms and at least one carbon-carbon double bond in the ring thereof and does not have aromaticity, and non-limiting examples thereof include a cyclopentenyl group, a cyclohexenyl group, and a cycloheptenyl group. The term "$C_3$-$C_{10}$ cycloalkenylene group," as used herein, may refer to a divalent group having the same structure as the $C_3$-$C_{10}$ cycloalkenyl group.

The term "$C_1$-$C_{10}$ heterocycloalkenyl group," as used herein, may refer to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group inlclude a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, may refer to a divalent group having the same structure as the $C_1$-$C_{10}$ heterocycloalkenyl group.

The term "$C_6$-$C_{60}$ aryl group," as used herein, may refer to a monovalent group having an aromatic system having 6 to 60 carbon atoms, and the term "$C_6$-$C_{60}$ arylene group," as used herein, may refer to a divalent group having an aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be condensed (e.g., fused) with each other.

The term "$C_1$-$C_{60}$ heteroaryl group," as used herein, may refer to a monovalent group having a heterocyclic aromatic system that has at least one heteroatom selected from N, O, Si, P, and S as a ring-forming atom, and 1 to 60 carbon atoms. The term "$C_1$-$C_{60}$ heteroarylene group," as used herein, may refer to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be condensed (e.g., fused) with each other.

The term "$C_6$-$C_{60}$ aryloxy group," as used herein, may refer to a monovalent group represented by —$OA_{102}$ (wherein $A_{102}$ is the $C_6$-$C_{60}$ aryl group), and the term "$C_6$-$C_{60}$ arylthio group," as used herein, may refer to a monovalent group represented by —$SA_{103}$ (wherein $A_{103}$ is the $C_6$-$C_{60}$ aryl group).

The term "monovalent non-aromatic condensed polycyclic group," as used herein, may refer to a monovalent group that has two or more rings condensed (e.g., fused) with each other, only carbon atoms as ring-forming atoms (e.g., 8 to 60 carbon atoms), and non-aromaticity in the entire molecular structure (e.g., does not have overall aromaticity). Non-limiting example of the monovalent non-aromatic condensed polycyclic group include a fluorenyl group. The term "divalent non-aromatic condensed polycyclic group," as used herein, may refer to a divalent group having the same structure as the monovalent non-aromatic condensed polycyclic group.

The term "monovalent non-aromatic condensed heteropolycyclic group," as used herein, may refer to a monovalent group that has two or more rings condensed (e.g., fused) to each other, has at least one heteroatom selected from N, O, Si, P, and S, other than carbon atoms (e.g., 1 to 60 carbon atoms), as a ring-forming atom, and has non-aromaticity in the entire molecular structure (e.g., does not have overall aromaticity). Non-limiting example of the monovalent non-aromatic condensed heteropolycyclic group include a carbazolyl group. The term "divalent non-aromatic condensed heteropolycyclic group," as used herein, may refer to a divalent group having the same structure as the monovalent non-aromatic condensed heteropolycyclic group.

The term "$C_5$-$C_{60}$ carbocyclic group," as used herein, may refer to a monocyclic or polycyclic group having 5 to 60 carbon atoms in which ring-forming atoms are carbon atoms only. The term "$C_5$-$C_{60}$ carbocyclic group," as used herein, may refer to an aromatic carbocyclic group or a non-aromatic carbocyclic group. The term "$C_5$-$C_{60}$ carbocyclic group," as used herein, may refer to a ring (such as a benzene ring), a monovalent group (such as a phenyl group), or a divalent group (such as a phenylene group). In various embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, may refer to a group having the same structure as the $C_1$-$C_{60}$ carbocyclic group, except that as a ring-forming atom, at least one heteroatom selected from N, O, Si, P, and S is used, in addition to carbon atoms (e.g., the number of carbon atoms may be in a range of 1 to 60).

At least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph" as used herein may refer to a phenyl group, the term "Me" as used herein may refer to a methyl group, the term "Et" as used herein may refer an ethyl group, the term "ter-Bu" or "$Bu^t$" as used herein, may refer a tert-butyl group, the term "OMe" as used herein may refer to a methoxy group, and "D" as used herein may refer to deuterium.

The term "a biphenyl group" as used herein may refer to a monovalent group having two benzene rings linked to each other via a single bond. The "biphenyl group" may be referred to as a "phenyl group substituted with a phenyl group. The "biphenyl group" may also be referred to as a "substituted phenyl group" having a "$C_6$-$C_{60}$ aryl group" as a substituent.

The term "a terphenyl group" as used herein may refer to a monovalent group having three benzene rings in which adjacent benzenes are linked to each other via a single bond. The "terphenyl group" may be referred to as a "phenyl group substituted with a biphenyl group. The "terphenyl group" may also be referred to as a "substituted phenyl group" having a "$C_6$-$C_{60}$ aryl group substituted with a $C_6$-$C_{60}$ aryl group" as a substituent.

*and *', as used herein, unless defined otherwise, each independently refer to a binding site to a neighboring atom in a corresponding formula.

Hereinafter, a compound according to embodiments of the present disclosure and an organic light-emitting device according to embodiments will be described in more detail with reference to Synthesis Examples and Examples. However, these examples are provided for illustrative purposes only, and should not in any sense be interpreted as limiting the scope of the present disclosure. The expression "B was used instead of A" used in describing Synthesis Examples may refer to an identical (or substantially the same) number of molar equivalents of A being used in place of molar equivalents of B.

EXAMPLES

Example 1

An anode was prepared by cutting an ITO glass substrate (manufactured by Corning Inc.), on which ITO was formed to a thickness of 15 $\Omega/cm^2$ (1,200 Å), to a size of 50 mm×50 mm×0.7 mm, ultrasonically cleaning the ITO glass substrate (anode) using isopropyl alcohol and pure water, each for 5 minutes, and then, exposing the ITO glass substrate to irradiation of UV light for 30 minutes and ozone. Then, the ITO glass substrate was loaded into a vacuum deposition apparatus.

m-MTDATA was vacuum-deposited on the ITO glass substrate (anode) to form a hole injection layer having a thickness of 700 Å. Then, NPB was vacuum-deposited on the hole injection layer to form a hole transport layer having a thickness of 100 Å.

ADN (as a host) and FBD (as a dopant) were co-deposited on the hole transport layer at a weight ratio of 95:5 to form an emission layer having a thickness of 300 Å.

Compound 2-48 was deposited on the emission layer to form a buffer layer having a thickness of 100 Å, and then, Compound 1-3 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

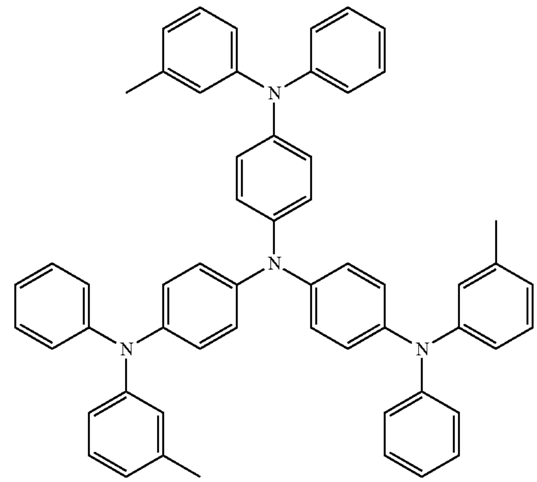

m-MTDATA

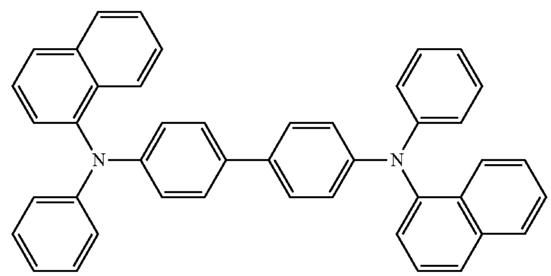

NPB

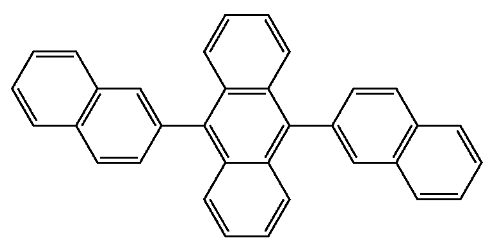

ADN

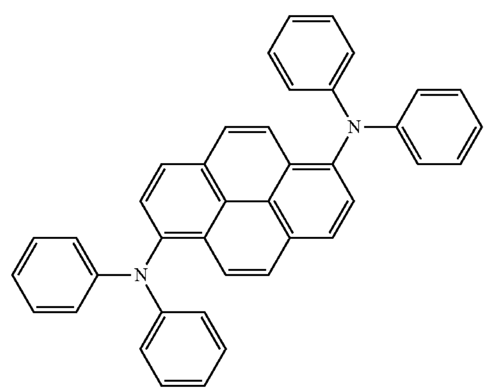

FBD

-continued

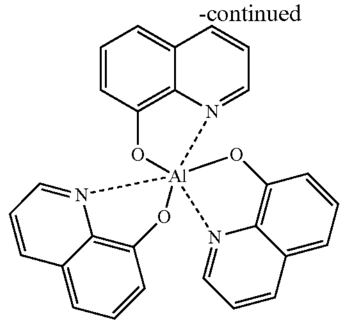

Alq$_3$

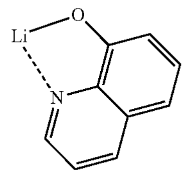

LiQ

Examples 2 to 27 and Comparative Examples 1 and 4

Organic light-emitting devices were manufactured in the same (or substantially the same) manner as in Example 1, except that compounds as shown in Table 5 were respectively used instead of Compounds 2-48 and 1-3 in forming a buffer layer and an electron transport layer.

Evaluation Example 1

The driving voltage and efficiency of the organic light-emitting devices of Examples 1 to 27 and Comparative Examples 1 to 4 were evaluated by using a Keithley SMU 236 meter. Results thereof are shown in Table 5.

TABLE 5

| | Buffer layer | Electron transport layer (weight ratio) | Driving voltage (V) | Efficiency (cd/A) |
|---|---|---|---|---|
| Example 1 | Compound 2-48 | Compound 1-3 | 4.5 | 4.8 |
| Example 2 | Compound 2-48 | Compound 1-5 | 4.4 | 4.9 |
| Example 3 | Compound 2-58 | Compound 1-8 | 4.4 | 5.1 |
| Example 4 | Compound 2-190 | Compound 1-8 | 4.4 | 5.2 |
| Example 5 | Compound 2-162 | Compound 1-10 | 4.3 | 5.1 |
| Example 6 | Compound 2-48 | Compound 1-17 | 4.5 | 5.0 |
| Example 7 | Compound 2-147a | Compound 1-25 | 4.6 | 5.1 |
| Example 8 | Compound 2-147a | Compound 1-25:Li (98:2) | 4.5 | 5.0 |
| Example 9 | Compound 2-162 | Compound 1-53 | 4.6 | 5.0 |
| Example 10 | Compound 2-48 | Compound 1-32 | 4.5 | 5.1 |
| Example 11 | Compound 2-190 | Compound 1-32 | 4.4 | 4.9 |
| Example 12 | Compound 2-190 | Compound 1-32:LiQ (5:5) | 4.3 | 5.1 |
| Example 13 | Compound 2-136a | Compound 1-37 | 4.5 | 4.9 |
| Example 14 | Compound 2-190 | Compound 1-37 | 4.5 | 5.0 |
| Example 15 | Compound 2-136a | Compound 1-37:LiQ (5:5) | 4.5 | 5.0 |
| Example 16 | Compound 2-147a | Compound 1-46 | 4.5 | 4.9 |
| Example 17 | Compound 2-162 | Compound 1-46 | 4.6 | 5.1 |
| Example 18 | Compound 2-147a | Compound 1-46:LiQ (5:5) | 4.3 | 5.0 |
| Example19 | Compound 2-48 | Compound 1-33 | 4.4 | 4.9 |
| Example20 | Compound 2-190 | Compound 1-33 | 4.3 | 5.1 |
| Example 21 | Compound 2-48 | Compound 1-33:LiQ (5:5) | 4.3 | 5.0 |
| Example 22 | Compound 2-136a | Compound 1-43 | 4.4 | 5.0 |
| Example 23 | Compound 2-64 | Compound 1-43 | 4.3 | 4.9 |
| Example 24 | Compound 2-136a | Compound 1-43:LiQ (5:5) | 4.4 | 5.1 |
| Example 25 | Compound 2-147a | Compound 1-51 | 4.3 | 4.9 |
| Example 26 | Compound 2-58 | Compound 1-51 | 4.4 | 5.0 |
| Example 27 | Compound 2-58 | Compound 1-51:LiQ (5:5) | 4.3 | 5.1 |
| Comparative Example 1 | | Alq$_3$ | 4.9 | 4.4 |
| Comparative Example 2 | Compound 1-32 | | 4.6 | 4.6 |
| Comparative Example 3 | Compound 2-48 | Alq$_3$ | 4.7 | 4.5 |
| Comparative Example 4 | Compound 2-190 | Alq$_3$ | 4.7 | 4.5 |

Referring to the results shown in Table 5, it can be seen that the organic light-emitting devices of Examples 1 to 27 had a low driving voltage and high efficiency, compared to those of the organic light-emitting devices of Comparative Examples 1 to 4.

Example 28

An anode was prepared by cutting an ITO glass substrate (manufactured by Corning Inc.), on which ITO was formed to a thickness of 15 Ω/cm$^2$ (1,200 Å), to a size of 50 mm×50 mm×0.7 mm, ultrasonically cleaning the ITO glass substrate (anode) using isopropyl alcohol and pure water, each for 5 minutes, and then, exposing the ITO glass substrate to irradiation of UV light for 30 minutes and ozone. Then, the resulting ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and Ir(ppy)$_3$ (as a dopant) were co-deposited on the hole transport layer at a weight ratio of 90:10 to form an emission layer having a thickness of 300 Å.

Compound 2-136a was deposited on the emission layer to form a buffer layer having a thickness of 100 Å, and then, Compound 1-5 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

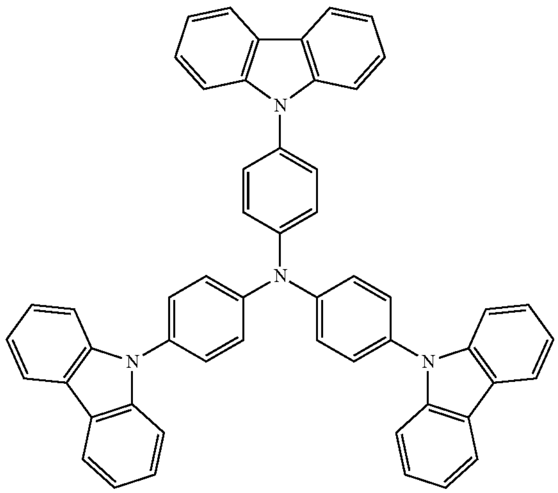

TCTA

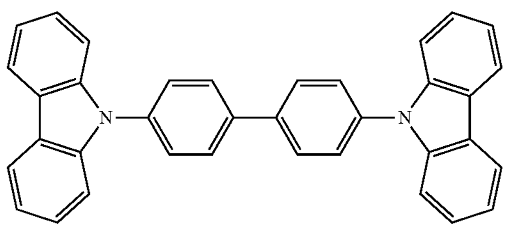

CBP

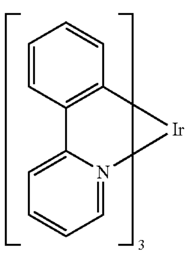

$Ir(ppy)_3$

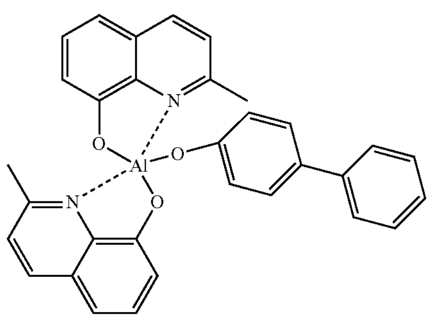

BAlq

Examples 29 to 46 and Comparative Examples 5 to 8

Organic light-emitting devices were manufactured in the same (or substantially the same) manner as in Example 28, except that compounds listed in Table 6 were respectively used instead of Compounds 2-136a and 1-5 in forming a buffer layer and an electron transport layer.

Evaluation Example 2

The driving voltage and efficiency of the organic light-emitting devices of Examples 28 to 46 and Comparative Examples 5 to 8 were evaluated by using a Keithley SMU 236 meter. Results thereof are shown in Table 6.

TABLE 6

| | Buffer layer | Electron transport layer (weight ratio) | Driving voltage (V) | Efficiency (cd/A) |
|---|---|---|---|---|
| Example 28 | Compound 2-136a | Compound 1-5 | 5.7 | 39.3 |
| Example 29 | Compound 2-64 | Compound 1-8 | 5.6 | 40.1 |
| Example 30 | Compound 2-190 | Compound 1-8 | 5.6 | 41.0 |
| Example 31 | Compound 2-162 | Compound 1-10 | 5.7 | 41.5 |
| Example 32 | Compound 2-136a | Compound 1-25 | 5.7 | 42.0 |
| Example 33 | Compound 2-147a | Compound 1-32 | 5.6 | 42.0 |
| Example 34 | Compound 2-162 | Compound 1-32 | 5.7 | 41.3 |
| Example 35 | Compound 2-136a | Compound 1-37 | 5.6 | 40.0 |
| Example 36 | Compound 2-190 | Compound 1-37 | 5.6 | 40.5 |
| Example 37 | Compound 2-58 | Compound 1-46 | 5.5 | 40.5 |
| Example 38 | Compound 2-162 | Compound 1-46 | 5.6 | 42.3 |
| Example 39 | Compound 2-58 | Compound 1-46:LiQ (5:5) | 5.5 | 41.5 |
| Example 40 | Compound 2-64 | Compound 1-33 | 5.6 | 41.0 |
| Example 41 | Compound 2-190 | Compound 1-33 | 5.5 | 40.5 |
| Example 42 | Compound 2-64 | Compound 1-33:LiQ (5:5) | 5.5 | 42.0 |
| Example 43 | Compound 2-147a | Compound 1-43 | 5.6 | 40.7 |
| Example 44 | Compound 2-58 | Compound 1-43 | 5.5 | 41.3 |
| Example 45 | Compound 2-48 | Compound 1-51 | 5.6 | 40.5 |
| Example 46 | Compound 2-136a | Compound 1-51 | 5.5 | 41.2 |
| Comparative Example 5 | BAlq | $Alq_3$ | 6.1 | 36.1 |
| Comparative Example 6 | BAlq | Compound 1-32 | 5.9 | 39.0 |
| Comparative Example7 | Compound 2-48 | $Alq_3$ | 6.0 | 38.0 |
| Comparative Example8 | Compound 2-190 | $Alq_3$ | 5.9 | 37.3 |

Referring to the results shown in Table 6, it can be seen that that the organic light-emitting devices of Examples 28 to 46 had a low driving voltage and high efficiency, compared to those of the organic light-emitting devices of Comparative Examples 5 to 8.

Example 47

An anode was prepared by cutting an ITO glass substrate (manufactured by Corning Inc.), on which ITO was formed to a thickness of 15 Ω/cm$^2$ (1,200 Å), to a size of 50 mm×50 mm×0.7 mm, ultrasonically cleaning the ITO glass substrate (anode) using isopropyl alcohol and pure water, each for 5 minutes, and then, exposing the ITO glass substrate to irradiation of UV light for 30 minutes and ozone. Then, the resulting ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and $Ir(bzq)_3$ (as a dopant) were co-deposited on the hole transport layer at a weight ratio of 96:4 to form an emission layer having a thickness of 300 Å.

Compound 2-147a was deposited on the emission layer to form a buffer layer having a thickness of 100 Å, and then, Compound 1-8 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

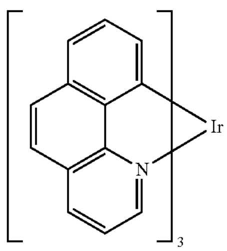

$Ir(bzq)_3$

Examples 48 to 66 and Comparative Examples 9 to 12

Organic light-emitting devices were manufactured in the same (or substantially the same) manner as in Example 47, except that compounds listed in Table 7 were respectively used instead of Compounds 2-147a and 1-8 in forming a buffer layer and an electron transport layer.

Evaluation Example 3

The driving voltage and efficiency of the organic light-emitting devices of Examples 47 to 66 and Comparative Examples 9 to 12 were evaluated by using a Keithley SMU 236 meter. Results thereof are shown in Table 7.

TABLE 7

| | Buffer layer | Electron transport layer (weight ratio) | Driving voltage (V) | Efficiency (cd/A) |
|---|---|---|---|---|
| Examle 47 | Compound 2-147a | Compound 1-8 | 5.9 | 24.5 |
| Example 48 | Compound 2-162 | Compound 1-8 | 5.7 | 24.7 |
| Example 49 | Compound 2-190 | Compound 1-10 | 5.8 | 23.8 |
| Example 50 | Compound 2-162 | Compound 1-25 | 5.7 | 25.0 |
| Example 51 | Compound 2-48 | Compound 1-32 | 5.6 | 24.5 |
| Example 52 | Compound 2-136a | Compound 1-32 | 5.7 | 23.9 |
| Example 53 | Compound 2-136a | Compound 1-32:LiQ (5:5) | 5.6 | 24.8 |

TABLE 7-continued

| | Buffer layer | Electron transport layer (weight ratio) | Driving voltage (V) | Efficiency (cd/A) |
|---|---|---|---|---|
| Example 54 | Compound 2-147a | Compound 1-37 | 5.7 | 24.0 |
| Example 55 | Compound 2-190 | Compound 1-37 | 5.6 | 24.2 |
| Example 56 | Compound 2-147a | Compound 1-46 | 5.7 | 24.0 |
| Example 57 | Compound 2-190 | Compound 1-46 | 5.7 | 23.8 |
| Example 58 | Compound 2-190 | Compound 1-46:LiQ (5:5) | 5.6 | 24.2 |
| Example 59 | Compound 2-58 | Compound 1-33 | 5.6 | 24.5 |
| Example 60 | Compound 2-162 | Compound 1-33 | 5.6 | 24.1 |
| Example 61 | Compound 2-162 | Compound 1-33:LiQ (5:5) | 5.7 | 24.0 |
| Example 62 | Compound 2-136a | Compound 1-43 | 5.8 | 24.5 |
| Example63 | Compound 2-162 | Compound 1-43 | 5.7 | 23.5 |
| Example64 | Compound 2-48 | Compound 1-51 | 5.8 | 24.3 |
| Example65 | Compound 2-64 | Compound 1-51 | 5.7 | 24.0 |
| Example66 | Compound 2-64 | Compound 1-51:LiQ (5:5) | 5.6 | 24.3 |
| Comparative Example9 | BAlq | $Alq_3$ | 6.2 | 21.6 |
| Comparative Example10 | BAlq | Compound 1-32 | 6.0 | 23.0 |
| Comparative Example11 | Compound 2-48 | $Alq_3$ | 6.1 | 23.1 |
| Comparative Example12 | Compound 2-190 | $Alq_3$ | 6.0 | 23.3 |

Referring to the results shown in Table 7, it can be seen that the organic light-emitting devices of Examples 47 to 66 had a low driving voltage and high efficiency, compared to those of the organic light-emitting devices of Comparative Examples 9 to 12.

Example 67

An anode was prepared by cutting an ITO glass substrate (manufactured by Corning Inc.), on which ITO was formed to a thickness of 15 $\Omega/cm^2$ (1,200 Å), to a size of 50 mm×50 mm×0.7 mm, ultrasonically cleaning the ITO glass substrate (anode) using isopropyl alcohol and pure water, each for 5 minutes, and then, exposing the ITO glass substrate to irradiation of UV light for 30 minutes and ozone to clean. Then, the resulting ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and $Ir(pq)_2(acac)$ (as a dopant) were co-deposited on the hole transport layer at a weight ratio of 96:4 to form an emission layer having a thickness of 300 Å.

Compound 2-48 was deposited on the emission layer to form a buffer layer having a thickness of 100 Å, and then, Compound 1-37 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

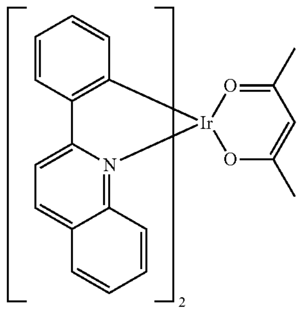

$Ir(pq)_2(acac)$

Comparative Example 13

An organic light-emitting device was manufactured in the same (or substantially the same) manner as in Example 67, except that compounds listed in Table 8 were respectively used instead of Compounds 2-48 and 1-13 in forming a buffer layer and an electron transport layer.

Evaluation Example 4

The driving voltage and efficiency of the organic light-emitting devices of Example 67 and Comparative Example 13 were evaluated by using a Keithley SMU 236 meter. Results thereof are shown in Table 8.

TABLE 8

| | Buffer layer | Electron transport layer | Driving voltage (V) | Efficiency (cd/A) |
|---|---|---|---|---|
| Example 67 | Compound 2-48 | Compound 1-37 | 5.6 | 29.1 |
| Comparative Example 13 | BAlq | $Alq_3$ | 6.2 | 25.4 |

Referring to the results shown in Table 8, it can be seen that the organic light-emitting device of Example 67 had a low driving voltage and high efficiency, compared to those of the organic light-emitting device of Comparative Example 13.

According to one or more embodiments, an organic light-emitting device may have a low driving voltage and high efficiency.

As used herein, the term "and/or" includes any and all combinations of one or more of the associated listed items. Expressions such as "at least one selected from," "one selected from," "selected from," "at least one of," and "one of," when preceding a list of elements, modify the entire list of elements and do not modify the individual elements of the list. Further, the use of "may" when describing embodiments of the present invention refers to "one or more embodiments of the present invention."

As used herein, the terms "use," "using," and "used" may be considered synonymous with the terms "utilize," "utilizing," and "utilized," respectively.

In addition, as used herein, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" another element, it can be directly on the other element or intervening elements may also be present. In contrast, when an element is referred to as being "directly on" or "directly contacting" another element, there are no intervening elements present.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the electron transport region comprises a first compound, at least one selected from the hole transport region and the electron transport region comprises a second compound, the first compound is represented by one selected from Formulae 1A to 1D or the first compound is selected from Compounds 1-2, 1-4, 1-7, 1-9 to 1-11, 1-22, 1-26, 1-29, 1-58, 1-59, 1-70 to 1-75, 1-88 to 1-90, 1-94 to 1-96, 1-101, 1-102, 1-106, 1-107, 1-111, 1-135, 1-143, 1-145, 1-146, 1-148, 1-175, 1-177, 1-225, 1-226, 1-229, 1-252 and 1-256, and the second compound is represented by Formula 2A or Formula 2B:

<Formula 1A>

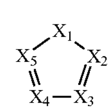

-continued

<Formula 1B>

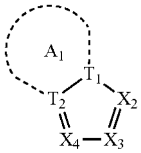

<Formula 1C>

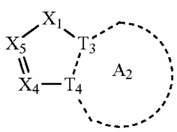

<Formula 1D>

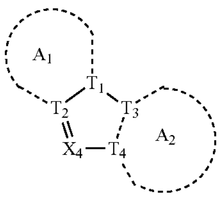

<Formula 2A>

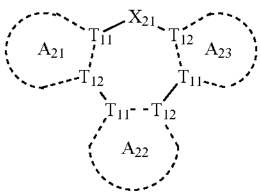

<Formula 2B>

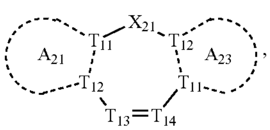

wherein, in Formulae 1A to 1D, 2A, and 2B, ring $A_1$ is a $C_5$-$C_{60}$ carbocyclic group or a $C_1$-$C_{30}$ heterocyclic group, each substituted with at least one *-[$(L_{11})_{a11}$-$(R_{11})_{b11}$], and ring $A_2$ is a $C_5$-$C_{60}$ carbocyclic group or a $C_1$-$C_{30}$ heterocyclic group, each substituted with at least one *-[$(L_{12})_{a12}$-$(R_{12})_{b12}$], rings $A_{21}$, $A_{22}$, and $A_{23}$ in Formula 2A are each independently selected from groups represented by Formulae 2-1 to 2-36, each substituted with at least one *-[$(L_{22})_{a22}$-$(R_{22})_{b22}$], and at least two of rings $A_{21}$, $A_{22}$ and $A_{23}$ in Formula 2A are each independently selected from groups represented by Formulae 2-1 to 2-3, 2-8 to 2-27 and 2-29 to 2-36, each substituted with at least one *-[$(L_{22})_{a22}$-$(R_{22})_{b22}$], rings $A_{21}$ and $A_{23}$ in Formula 2B are each independently selected from groups represented by Formulae 2-1 to 2-3, 2-8 to 2-27 and 2-29 to 2-36, each substituted with at least one *-[$(L_{22})_{a22}$-$(R_{22})_{b22}$]:

Formula 2-1

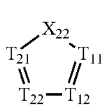

Formula 2-2

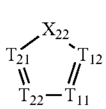

-continued

Formula 2-3

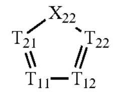

Formula 2-4

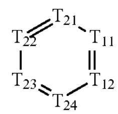

Formula 2-5

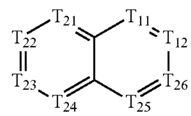

Formula 2-6

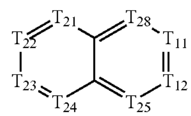

Formula 2-7

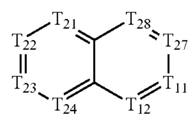

Formula 2-8

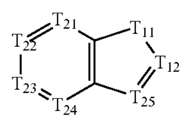

Formula 2-9

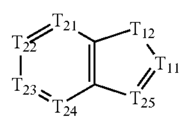

Formula 2-10

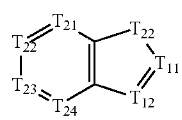

Formula 2-11

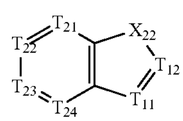

Formula 2-12

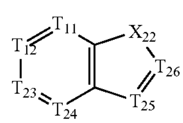

Formula 2-13

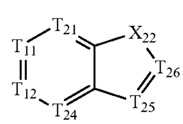

Formula 2-14

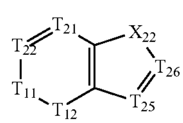

Formula 2-15

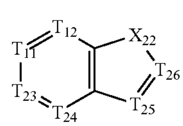

-continued
Formula 2-16
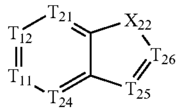
Formula 2-17
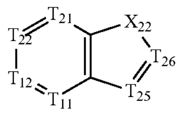
Formula 2-18
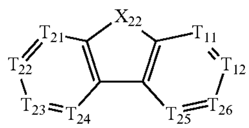
Formula 2-19
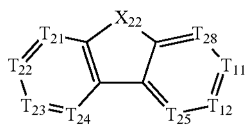
Formula 2-20
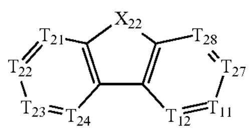
Formula 2-21
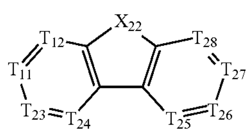
Formula 2-22
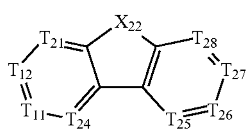
Formula 2-23
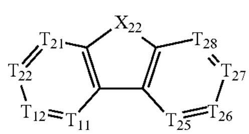
Formula 2-24
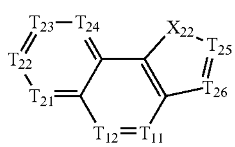
Formula 2-25
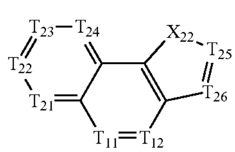
Formula 2-26
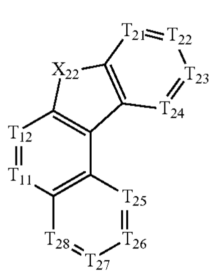
-continued
Formula 2-27
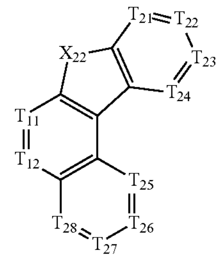
Formula 2-28
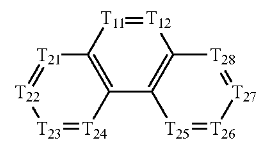
Formula 2-29
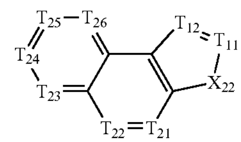
Formula 2-30
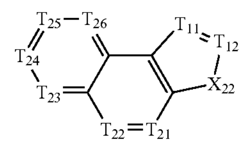
Formula 2-31
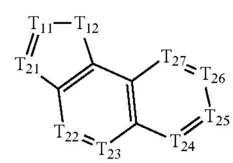
Formula 2-32
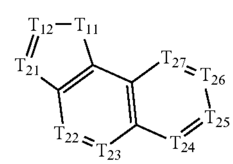
Formula 2-33
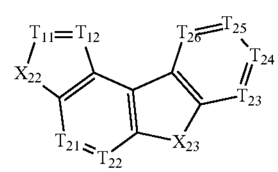
Formula 2-34
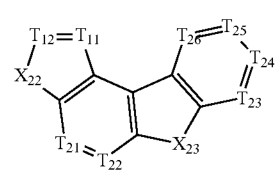

-continued

Formula 2-35

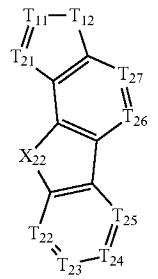

Formula 2-36

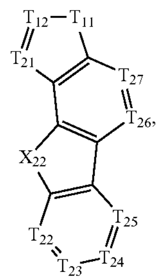

wherein, in Formulae 2-1 to 2-36, $X_{22}$ and $X_{23}$ are each independently O, S, or Se, or are each independently a moiety comprising C, N, or Si, $T_{21}$ to $T_{28}$ are each independently N, or are each independently a moiety comprising C, $T_1$ to $T_4$ are each independently carbon or nitrogen, wherein a bond between $T_1$ and $T_2$ is a single bond, and a bond between $T_3$ and $T_4$ is a double bond, ring $A_1$ is condensed with a 5-membered ring in Formulae 1B and 1D, while sharing $T_1$ and $T_2$ therewith, and ring $A_2$ is condensed with a 5-membered ring in Formulae 1C and 1D, while sharing $T_3$ and $T_4$ therewith, $T_{11}$ and $T_{12}$ are each independently carbon or nitrogen, $T_{13}$ is N or C($R_{27}$), and $T_{14}$ is N or C($R_{28}$), wherein two or more selected from three $T_{11}$(s) in Formula 2A are identical to or different from each other, two or more selected from three $T_{12}$(s) in Formula 2A are identical to or different from each other, two $T_{11}$(s) in Formula 2B are identical to or different from each other, two $T_{12}$(s) in Formula 2B are identical to or different from each other, $T_{11}$ and $T_{12}$ fused to ring $A_{22}$ of Formula 2A are both carbon, a bond between $T_{11}$ and $T_{12}$ is a single bond or a double bond, a case where three $T_{11}$(s) and three $T_{12}$(s) in Formula 2A are all nitrogen is excluded, and a case where two $T_{11}$(s), two $T_{12}$(s), $T_{13}$, and $T_{14}$ in Formula 2B are all nitrogen is excluded, rings $A_{21}$, $A_{22}$, and $A_{23}$ are each condensed with a 7-membered ring in each of Formulae 2A and 2B, while sharing $T_{11}$ and $T_{12}$ therewith, $X_1$ is selected from O, S, and N-[$(L_1)_{a1}$-$(R_1)_{b1}$], $X_2$ is N or C-$(L_2)_{a2}$-$(R_2)_{b2}$, $X_3$ is N or C-$(L_3)_{a3}$-$(R_3)_{b3}$, $X_4$ is N or C-$(L_4)_{a4}$-$(R_4)_{b4}$, and $X_5$ is N or C-$(L_5)_{a5}$-$(R_5)_{c5}$, provided that Formula 1C is not a benzimidazole or a purine, $X_{21}$ is selected from O, S, Se, C($R_{23}$)($R_{24}$), Si($R_{23}$)($R_{24}$), and N-[$(L_{21})_{a21}$-$(R_{21})_{b21}$], $L_1$ to $L_5$, $L_{11}$, $L_{12}$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, provided that $L_1$ to $L_5$, $L_{11}$, and $L_{12}$ each independently do not include an anthracenylene group, a1 to a5, a11, a12, a21, and a22 are each independently an integer selected from 0 to 5, $R_1$ to $R_5$, $R_{11}$, $R_{12}$, $R_{27}$, and $R_{28}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), provided that $R_1$ to $R_5$, $R_{11}$, and $R_{12}$ each independently do not include an anthracenyl group, $R_{21}$ to $R_{24}$ are each independently selected from groups represented by Formulae 5-1 to 5-49:

Formula 5-1

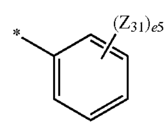

Formula 5-2

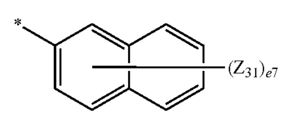

Formula 5-3

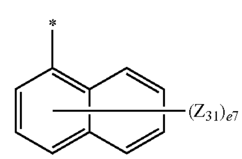

Formula 5-4

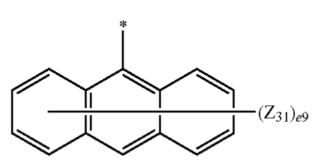

Formula 5-5
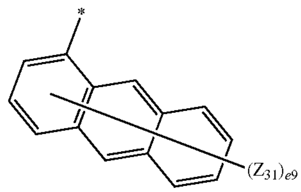
Formula 5-6
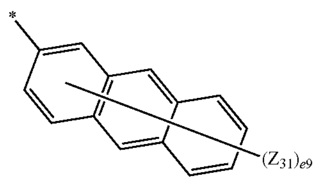
Formula 5-7
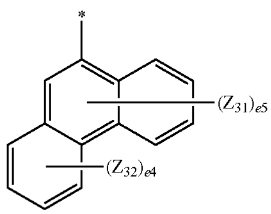
Formula 5-8
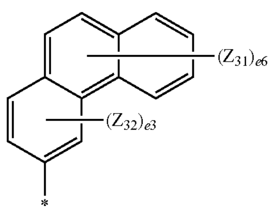
Formula 5-9
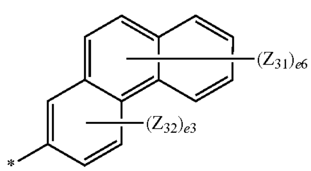
Formula 5-10
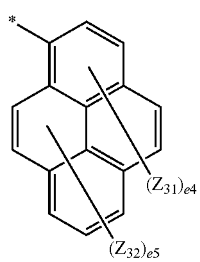
Formula 5-11
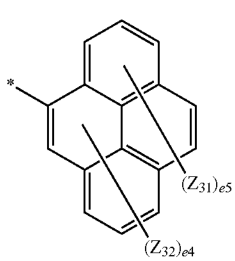
Formula 5-12
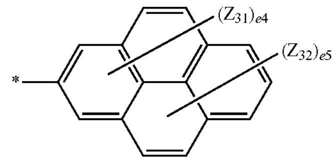
Formula 5-13
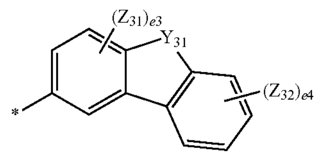
Formula 5-14
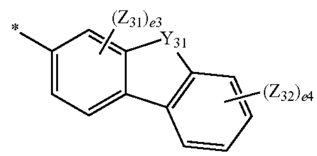
Formula 5-15
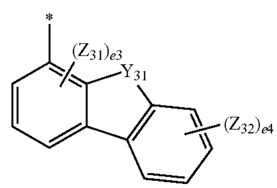
Formula 5-16
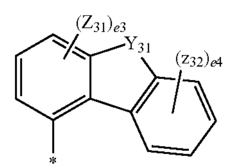
Formula 5-17
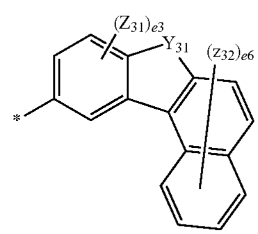
Formula 5-18
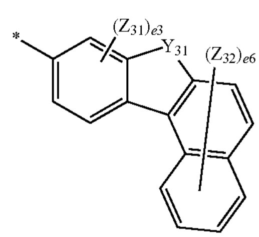
Formula 5-19
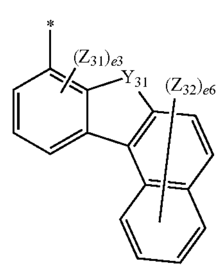

Formula 5-20
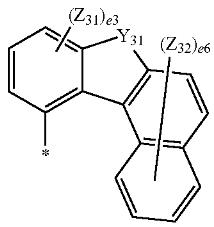
Formula 5-21
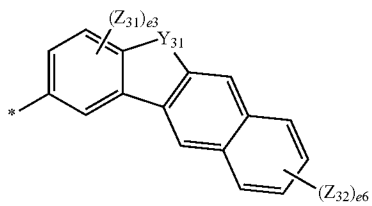
Formula 5-22
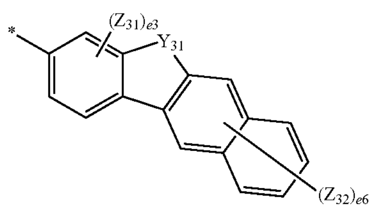
Formula 5-23
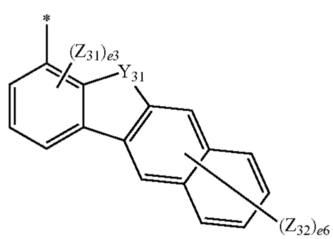
Formula 5-24
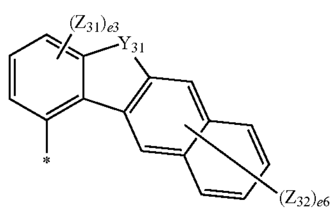
Formula 5-25
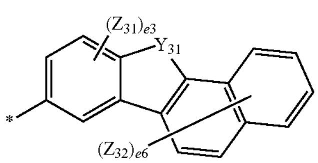
Formula 5-26
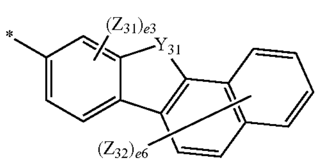
Formula 5-27
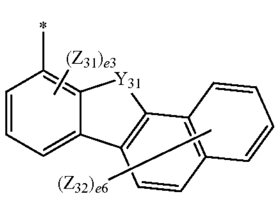
Formula 5-28
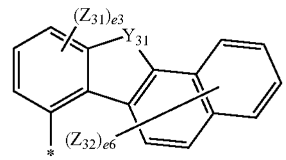
Formula 5-29
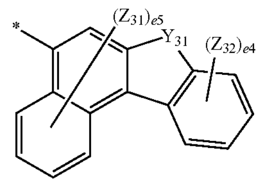
Formula 5-30
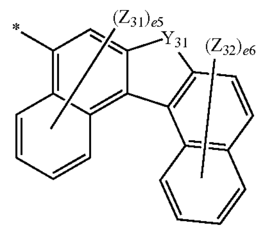
Formula 5-31
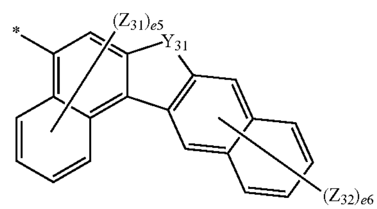
Formula 5-32
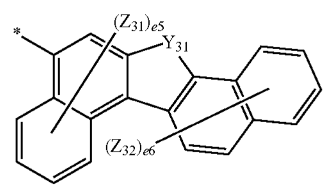
Formula 5-33
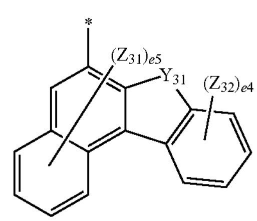
Formula 5-34
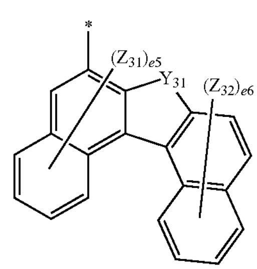

-continued
Formula 5-35
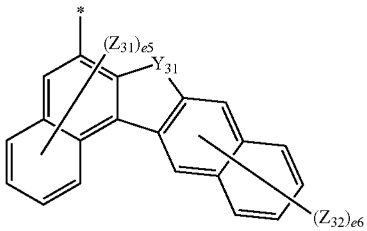
Formula 5-36
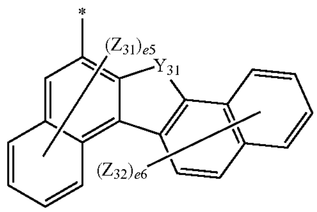
Formula 5-37
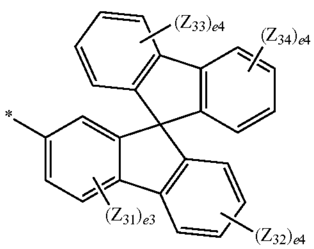
Formula 5-38
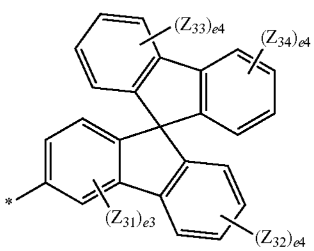
Formula 5-39
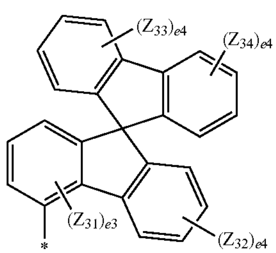
Formula 5-40
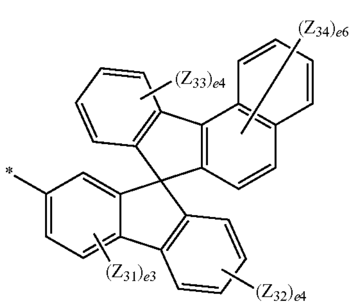
-continued
Formula 5-41
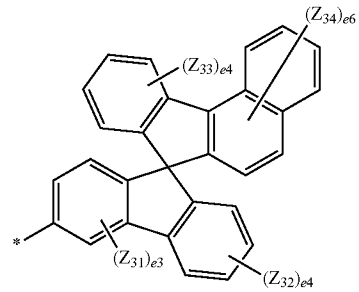
Formula 5-42
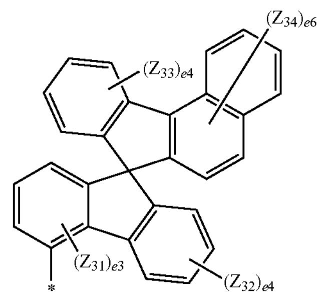
Formula 5-43
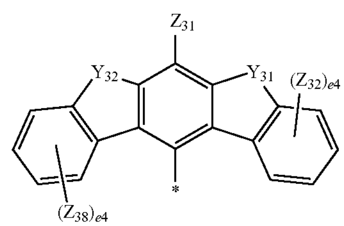
Formula 5-44
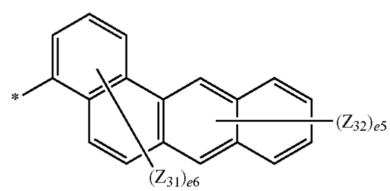
Formula 5-45
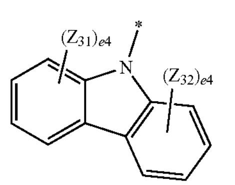
Formula 5-46
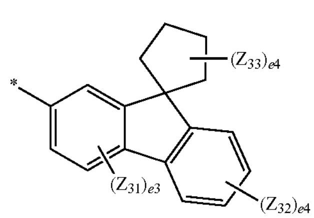

-continued

Formula 5-47

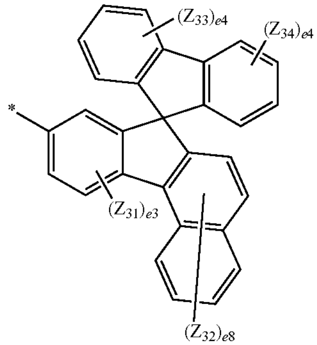

Formula 5-48

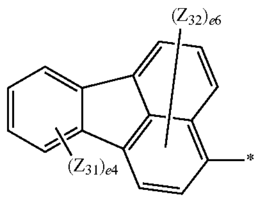

Formula 5-49

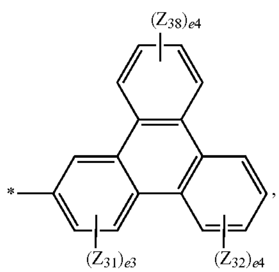

wherein in Formulae 5-1 to 5-49, $Y_{31}$ and $Y_{32}$ are each independently O, S, $C(Z_{33})(Z_{34})$, $N(Z_{35})$, or $Si(Z_{36})(Z_{37})$, $Z_{31}$ to $Z_{38}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, $—Si(Q_{31})(Q_{32})(Q_{33})$, and $—P(=O)(Q_{31})(Q_{32})$, $e_2$ is an integer selected from 0 to 2, $e_3$ is an integer selected from 0 to 3, $e_4$ is an integer selected from 0 to 4, $e_5$ is an integer selected from 0 to 5, $e_6$ is an integer selected from 0 to 6, $e_7$ is an integer selected from 0 to 7, $e_9$ is an integer selected from 0 to 9, and

* indicates a binding site to a neighboring atom, b1 to b5, b11, b12, b21, and b22 are each independently an integer selected from 0 to 4, $R_4$ and $R_5$ are optionally connected to each other to form a saturated or unsaturated ring, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})$ $(Q_{12})(Q_{13})$, —$N(Q_{11})(Q_{12})$, —$B(Q_{11})(Q_{12})$, —$C({=}O)(Q_{11})$, —$S({=}O)_2(Q_{11})$, and —$P({=}O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C({=}O)(Q_{21})$, —$S({=}O)_2(Q_{21})$, and —$P({=}O)(Q_{21})(Q_{22})$; and —$Si(Q_{31})(Q_{32})(Q_{33})$, —$N(Q_{31})(Q_{32})$, —$B(Q_{31})(Q_{32})$, —$C({=}O)(Q_{31})$, —$S({=}O)_2(Q_{31})$, and —$P({=}O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group, 1-2

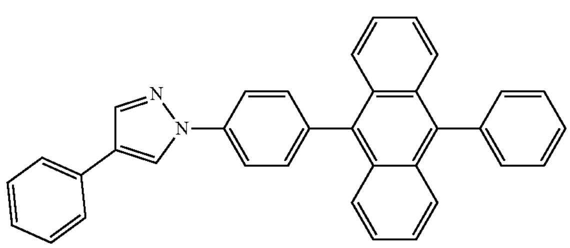

-continued 1-4

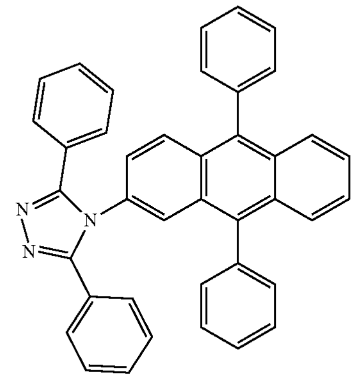

1-7

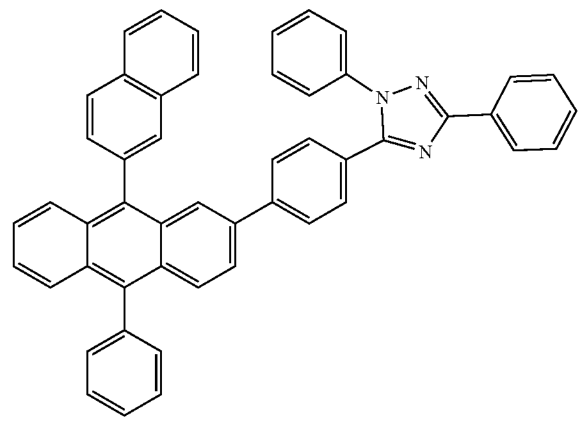

1-9

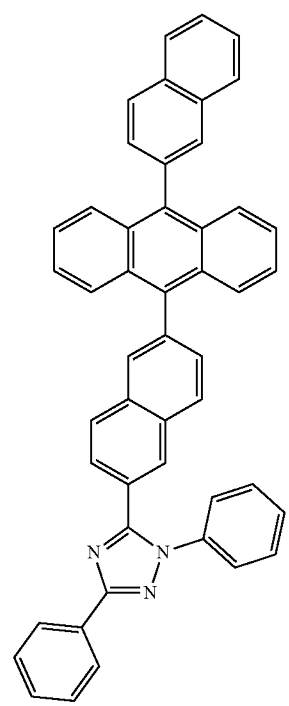

-continued
1-10
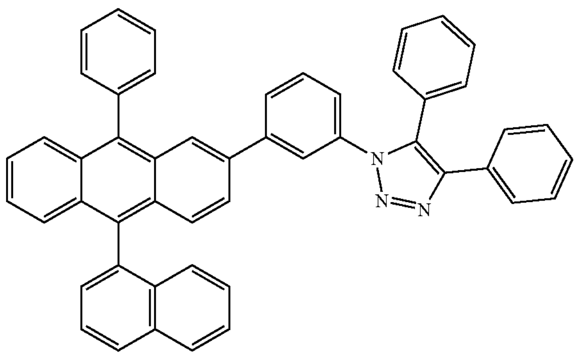
1-11
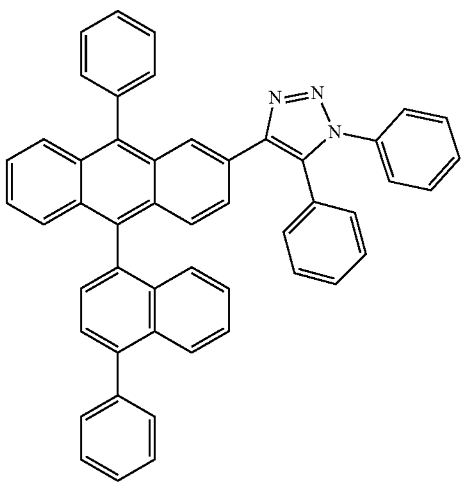
1-22
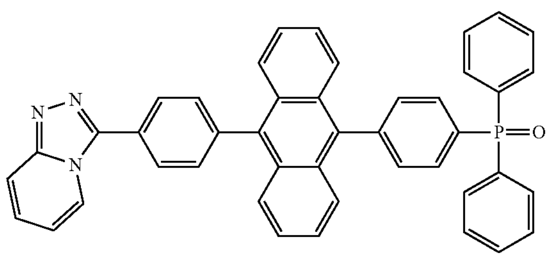
1-26
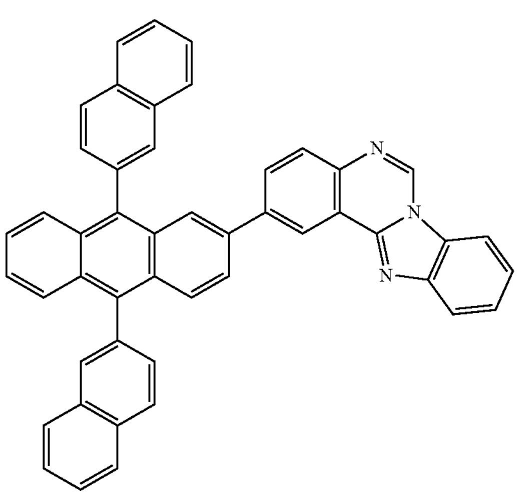
-continued
1-29
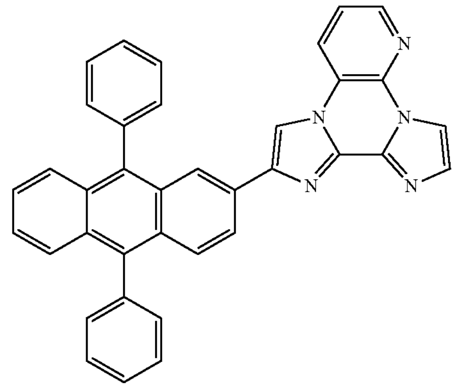
1-58
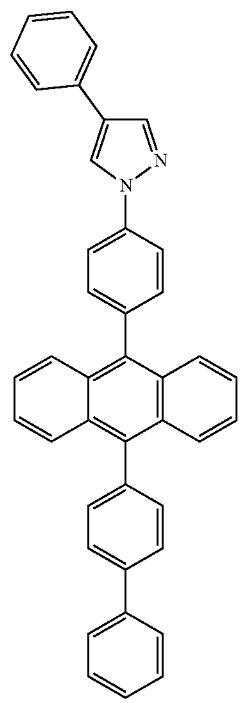
1-59
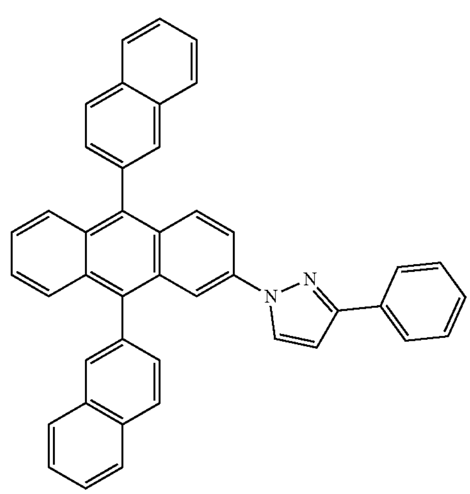

-continued
1-70
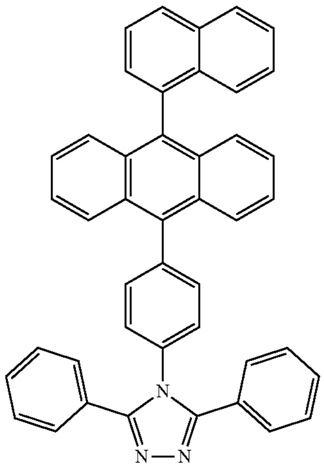
1-71
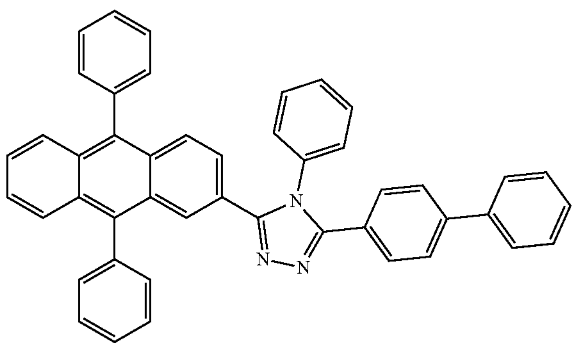
1-72
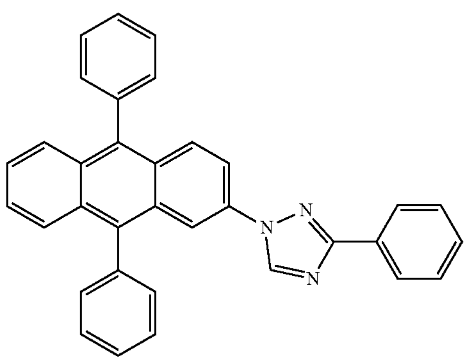
1-73
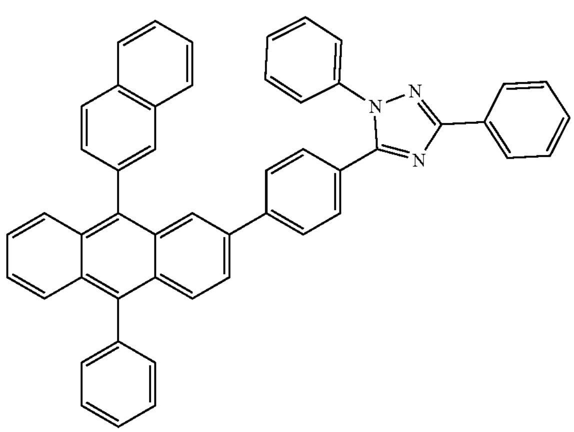
-continued
1-74
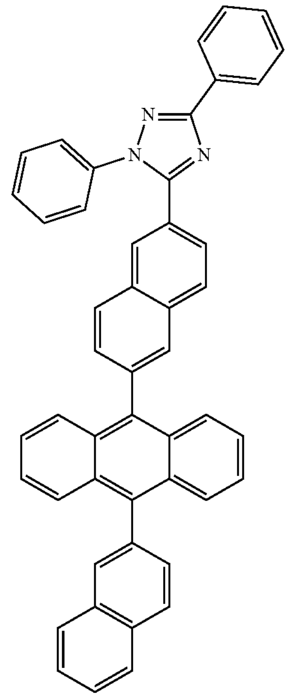
1-75
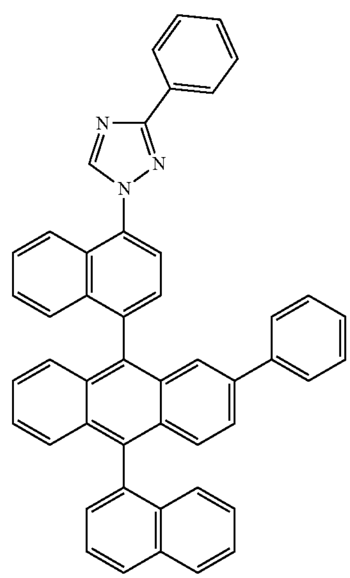

-continued
1-88
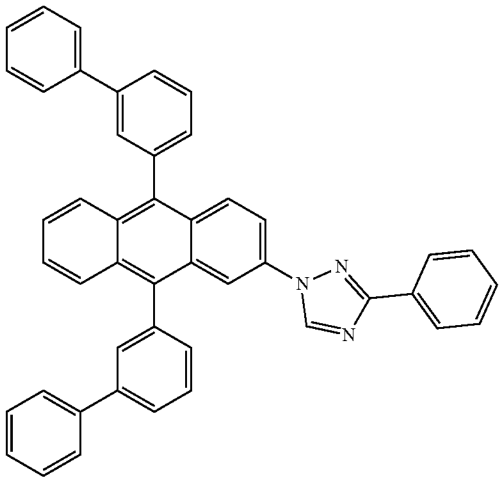
1-89
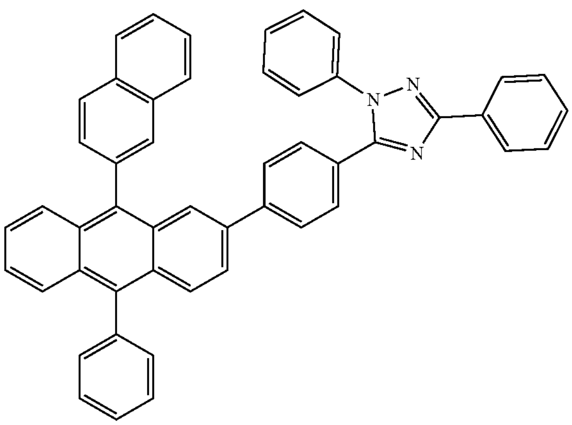
1-90
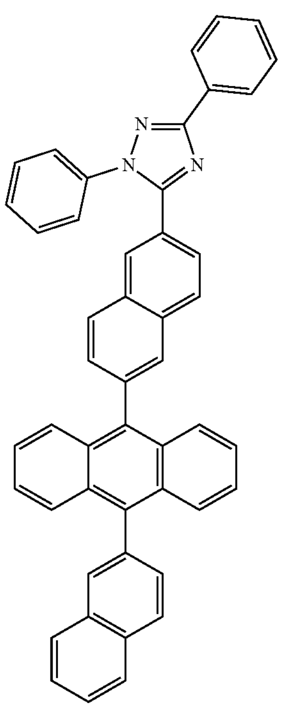
-continued
1-94
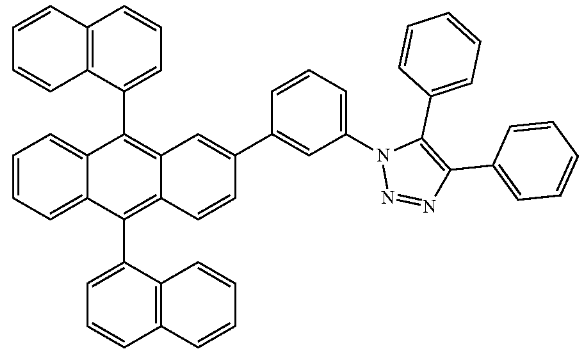
1-95
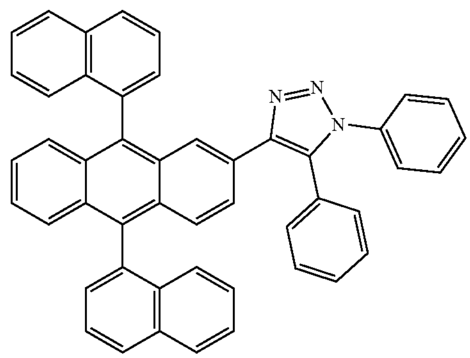
1-96
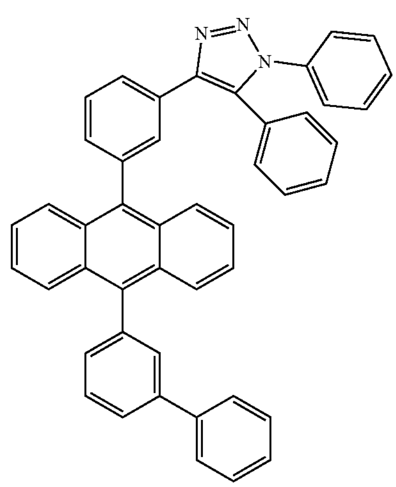

-continued
1-101
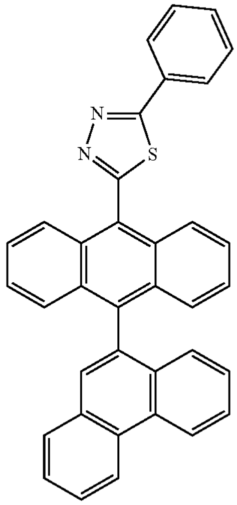
1-102
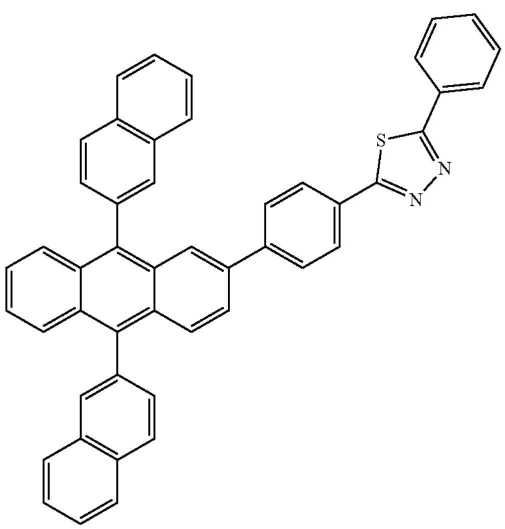
-continued
1-106
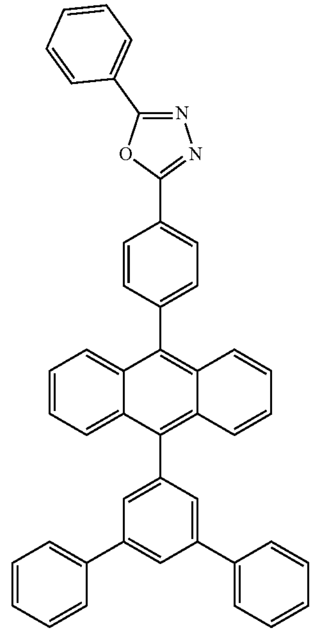
1-107
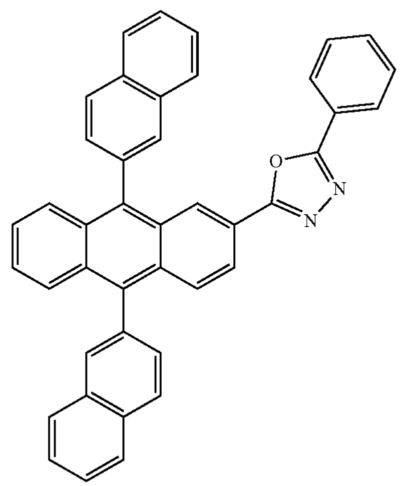
1-111
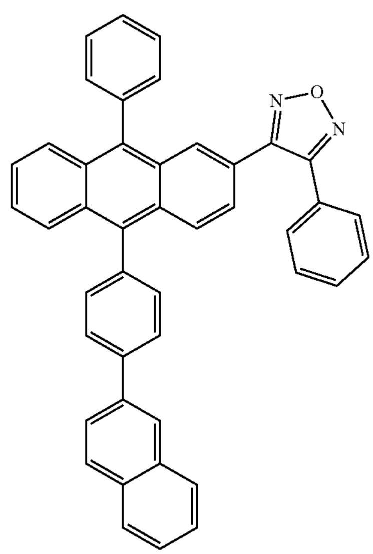

-continued
1-135
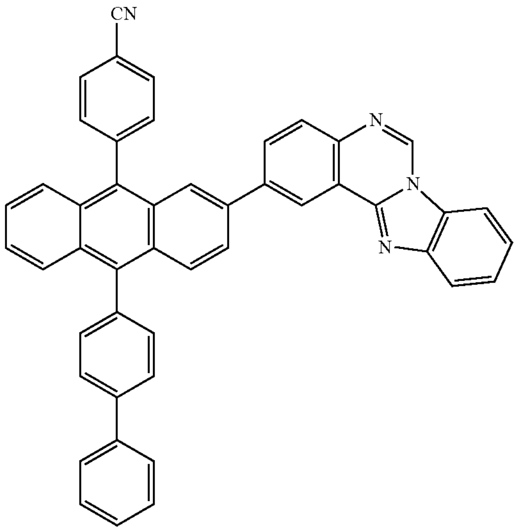
1-143
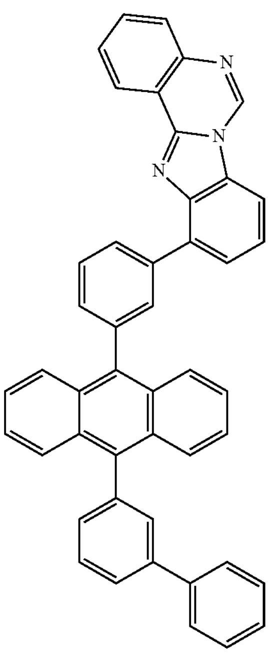
-continued
1-145
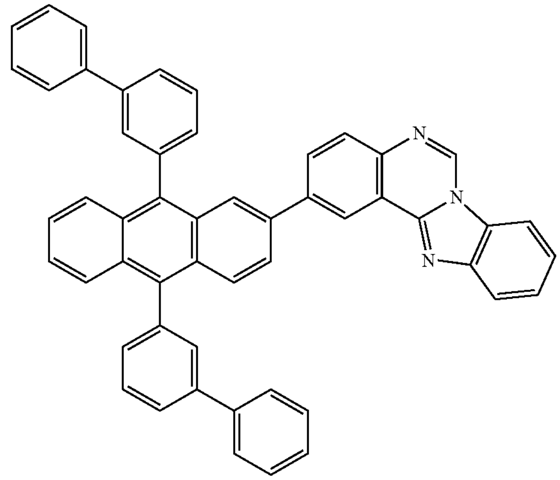
1-146
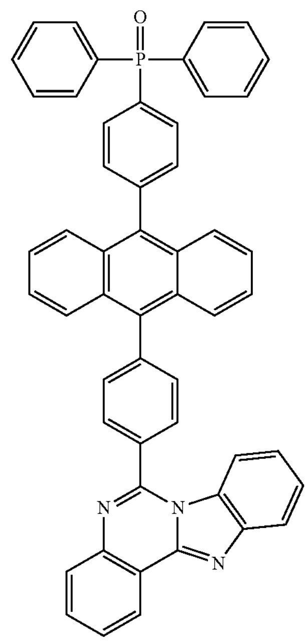
1-148
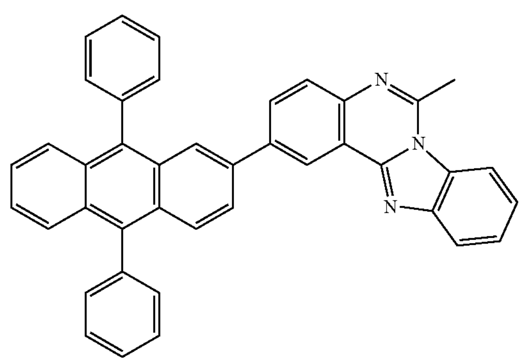

-continued
1-175
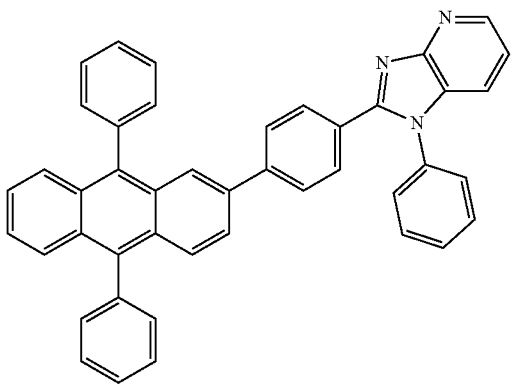
1-177
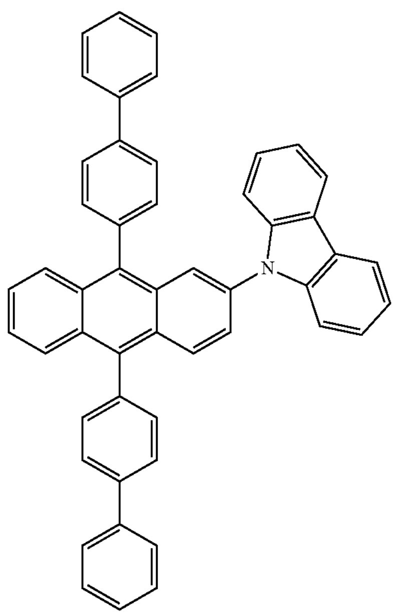
1-225
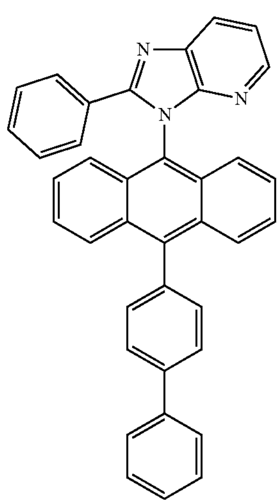
-continued
1-226
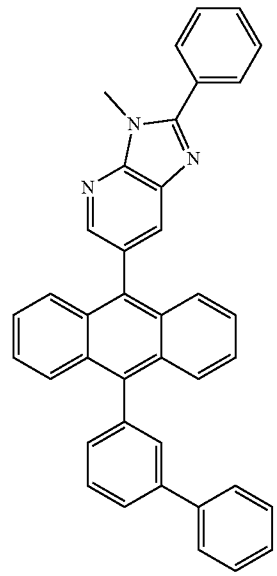
1-229
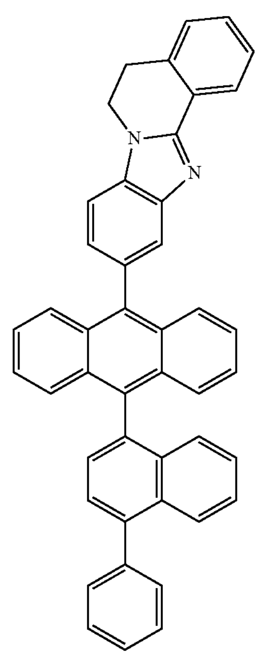

-continued 1-252

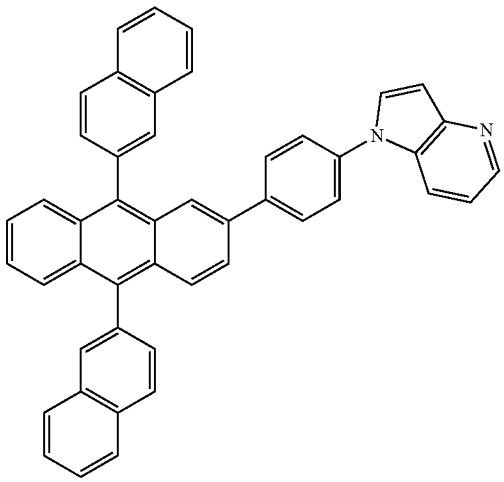

1-256

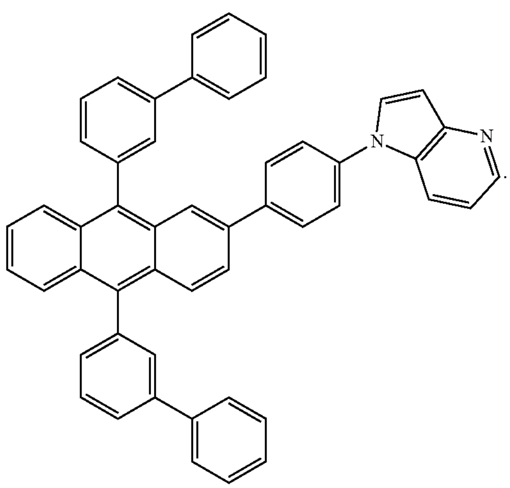

2. The organic light-emitting device of claim 1, wherein in Formulae 1B to 1D, ring $A_1$ is selected from groups represented by Formulae 1-1 to 1-8, each substituted with at least one *-[$(L_{11})_{a11}$-$(R_{11})_{b11}$], and ring $A_2$ is selected from groups represented by Formulae 1-9 to 1-21, each substituted with at least one *-[$(L_{12})_{a12}$-$(R_{12})_{b12}$]:

Formula 1-1

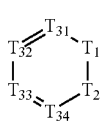

Formula 1-2

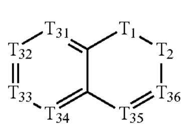

Formula 1-3

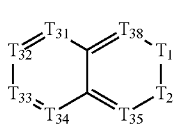

-continued

Formula 1-4

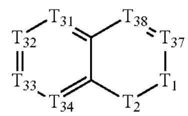

Formula 1-5

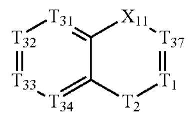

Formula 1-6

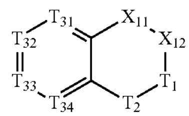

Formula 1-7

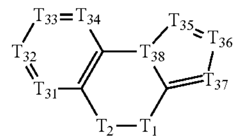

Formula 1-8

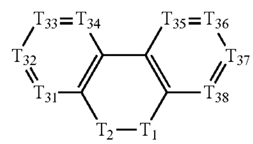

Formula 1-9

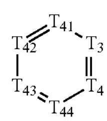

Formula 1-10

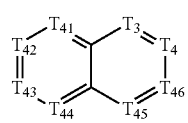

Formula 1-11

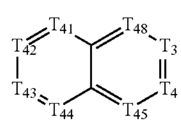

Formula 1-12

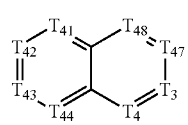

Formula 1-13

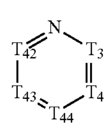

Formula 1-14

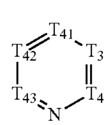

Formula 1-15

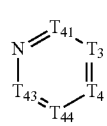

-continued

Formula 1-16

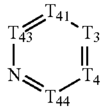

Formula 1-17

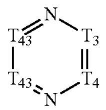

Formula 1-18

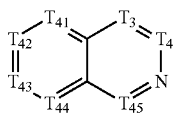

Formula 1-19

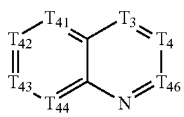

Formula 1-20

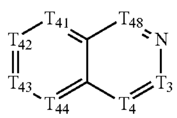

Formula 1-21

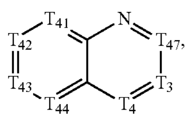

wherein, in Formulae 1-1 to 1-21, descriptions of $T_1$ to $T_4$ are each independently the same as those provided in connection with Formulae 1B to 1D, $X_{11}$ and $X_{12}$ are each independently O or S, or are each independently a moiety comprising C, and $T_{31}$ to $T_{38}$ and $T_{41}$ to $T_{48}$ are each independently N or C, or are each independently a moiety comprising C.

3. The organic light-emitting device of claim 1, wherein $X_{21}$ in Formulae 2A and 2B is $N[(L_{21})_{a21}$-$(R_{21})_{b21}]$.

4. The organic light-emitting device of claim 1, wherein i) in Formula 1A, $X_1$ is O, S, or $N$-$[(L_1)_{a1}$-$(R_1)_{b1}]$, $X_2$ is $C$-$(L_2)_{a2}$-$(R_2)_{b2}$, $X_3$ is N, $X_4$ is $C$-$(L_4)$-$(R_4)_{b4}$, and $X_5$ is N, $X_1$ is O, S, or $N$-$[(L_1)_{a1}$-$(R_1)_{b1}]$, $X_2$ is N, $X_3$ is $C$-$(L_3)_{a3}$-$(R_3)_{b3}$, $X_4$ is $C$-$(L_4)_{a4}$-$(R_4)_{b4}$, and $X_5$ is N, $X_1$ is $N$-$[(L_1)_{a1}$-$(R_1)_{b1}]$, $X_2$ is $C$-$(L_2)_{a2}$-$(R_2)_{b2}$, $X_3$ is $C$-$(L_3)_{a3}$-$(R_3)_{b3}$, $X_4$ is N, and $X_5$ is N, $X_1$ is $N$-$[(L_1)_{a1}$-$(R_1)_{b1}]$, $X_2$ is N, $X_3$ is $C$-$(L_3)_{a3}$-$(R_3)_{b3}$, $X_4$ is N, and $X_5$ is $C$-$(L_5)_{a5}$-$(R_5)_{b5}$, $X_1$ is $N$-$[(L_1)_{a1}$-$(R_1)_{b1}]$, $X_2$ is $C$-$(L_2)_{a2}$-$(R_2)_{b2}$, $X_3$ is $C$-$(L_3)_{a3}$-$(R_3)_{b3}$, $X_4$ is $C$-$(L_4)_{a4}$-$(R_4)_{b4}$, and $X_5$ is $C$-$(L_5)_{a5}$-$(R_5)_{b5}$, or $X_1$ is $N$-$[(L_1)_{a1}$-$(R_1)_{b1}]$, $X_2$ is $C$-$(L_2)_{a2}$-$(R_2)_{b2}$, $X_3$ is N, $X_4$ is $C$-$(L_4)_{a4}$-$(R_4)_{b4}$, and $X_5$ is $C$-$(L_5)_{a5}$-$(R_5)_{b5}$, ii) in Formula 1B, $T_1$ is N, $T_2$ is C, $X_2$ is $C$-$(L_2)_{a2}$-$(R_2)_{b2}$, $X_3$ is $C$-$(L_3)_{a3}$-$(R_3)_{b3}$, and $X_4$ is N, or $T_1$ is N, $T_2$ is C, $X_2$ is $C$-$(L_2)_{a2}$-$(R_2)_{b2}$, $X_3$ is N, and $X_4$ is N, iii) in the Formula 1C, $X_1$ is O, S, or $N$-$[(L_1)_{a1}$-$(R_1)_{b1}]$, $T_3$ and $T_4$ are both C, $X_4$ is N, and $X_5$ is $C$-$(L_5)_{a5}$-$(R_5)_{c5}$, provided that Formula 1C is not a benzimidazole or a purine, or iv) in Formula 1D, $T_1$ is N, $T_2$ is C, $T_3$ and $T_4$ is C, $X_4$ is N or $C$-$(L_4)_{a4}$-$(R_4)_{b4}$.

5. The organic light-emitting device of claim 1, wherein $L_1$ to $L_5$, $L_{11}$, $L_{12}$, $L_{21}$, and $L_{22}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

6. The organic light-emitting device of claim 1, wherein $R_1$ to $R_5$, $R_{11}$, and $R_{12}$ are each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, and a hydrazono group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothiophenopyrimidyl group, a pyrimidinoquinoxalinyl group, and an azaindenopyridinyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothiophenopyrimidyl group, a pyrimidinoquinoxalinyl group, and an azaindenopyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), provided that $R_1$ to $R_5$, $R_{11}$, and $R_{12}$ are each independently not substituted with an anthracenyl group;

wherein $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

7. The organic light-emitting device of claim 1, wherein $R_{27}$ and $R_{28}$ are each independently selected from the group consisting of:

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and wherein $Q_1$ to $Q_3$ and $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

8. The organic light-emitting device of claim 1, wherein the first compound is represented by one selected from Formulae 1A(1) to 1A(11), 1B(1), 1B(2), 1C(1) to 1C(4), 1D(1), and 1D(2):

Formula 1A(1)

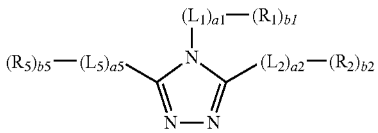

Formula 1A(2)

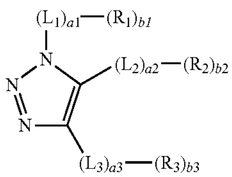

Formula 1A(3)

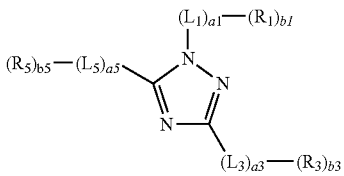

Formula 1A(4)

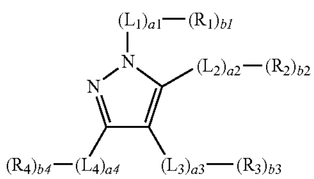

Formula 1A(5)

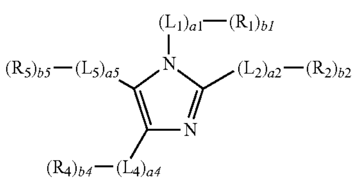

Formula 1A(6)

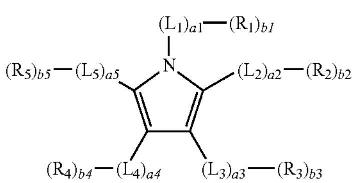

Formula 1A(7)

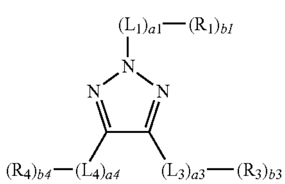

Formula 1A(8)

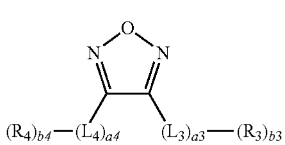

-continued

Formula 1A(9)

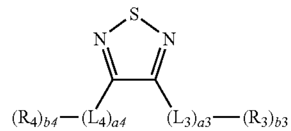

Formula 1A(10)

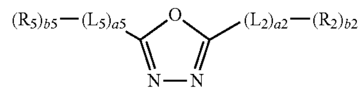

Formula 1A(11)

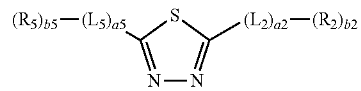

Formula 1B(1)

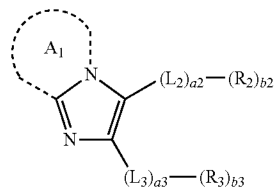

Formula 1B(2)

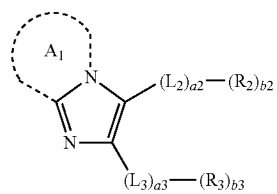

Formula 1C(1)

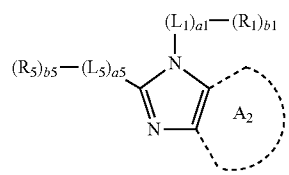

Formula 1C(2)

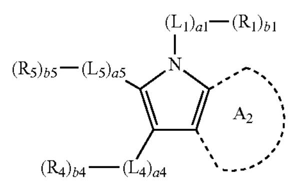

Formula 1C(3)

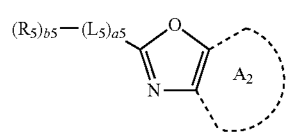

Formula 1C(4)

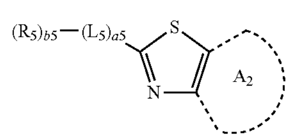

Formula 1D(1)

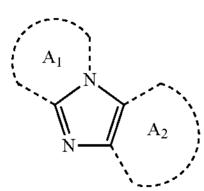

-continued

Formula 1D(2)

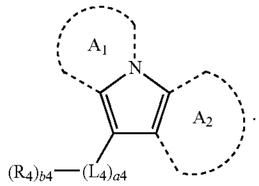

9. The organic light-emitting device of claim 1, wherein the hole transport region comprises an emission auxiliary layer, the emission auxiliary layer directly contacts the emission layer, and the second compound is comprised in the emission auxiliary layer.

10. The organic light-emitting device of claim 1, wherein the electron transport region comprises a buffer layer, the buffer layer directly contacts the emission layer, and the second compound is comprised in the buffer layer.

11. The organic light-emitting device of claim 1, wherein the electron transport region comprises a buffer layer, an electron transport layer, and an electron injection layer, and the first compound is comprised in the electron transport layer.

12. The organic light-emitting device of claim 11, wherein the electron transport layer comprises an alkaline metal, an alkaline earth metal, a rare-earth metal, an alkaline metal compound, an alkaline earth-metal compound, a rare-earth metal compound, an alkaline metal complex, an alkaline earth-metal complex, a rare-earth metal complex, or a combination thereof.

13. The organic light-emitting device of claim 11, wherein the electron injection layer comprises an alkaline metal, an alkaline earth metal, a rare-earth metal, an alkaline metal compound, an alkaline earth-metal compound, a rare-earth metal compound, an alkaline metal complex, an alkaline earth-metal complex, a rare-earth metal complex, or a combination thereof.

14. The organic light-emitting device of claim 13, wherein the electron injection layer comprises Li, Na, K, Rb, Cs, Mg, Ca, Er, Tm, Yb, or a combination thereof.

15. The organic light-emitting device of claim 1, wherein the hole transport region comprises a p-dopant, and a lowest unoccupied molecular orbital (LUMO) of the p-dopant is about −3.5 eV or less.

16. The organic light-emitting device of claim 15, wherein the p-dopant comprises a cyano group-containing compound.

17. The organic light-emitting device of claim 1, wherein the emission layer is a first-color-light emission layer, and the organic light-emitting device further comprises, between the first electrode and the second electrode, i) at least one second-color-light emission layer or ii) at least one second-color-light emission layer and at least one third-color-light emission layer, wherein a maximum emission wavelength of the first-color-light emission layer, a maximum emission wavelength of the second-color-light emission layer, and a maximum emission wavelength of the third-color-light emission layer are identical to or different from one another, and when the organic light-emitting device operates, mixed light comprising first-color-light and second-color-light, or mixed light comprising first-color-light, second-color-light, and third-color-light is emitted.

18. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the electron transport region comprises a first compound, at least one selected from the hole transport region and the electron transport region comprises a second compound, the first compound is represented by one selected from Formulae 1A to 1D, and the second compound is represented by Formula 2A or Formula 2B:

<Formula 1A>

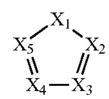

<Formula 1B>

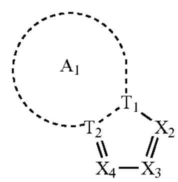

<Formula 1C>

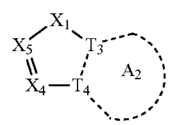

<Formula 1D>

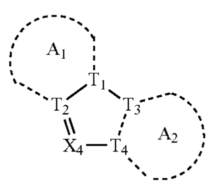

<Formula 2A>

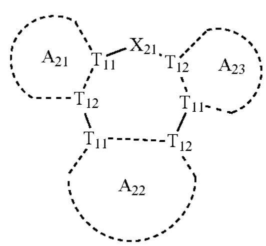

<Formula 2B>

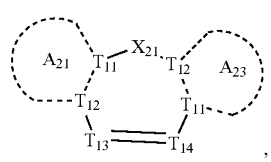

wherein, in Formulae 1A to 1D, 2A, and 2B, ring $A_1$ is a $C_5$-$C_{60}$ carbocyclic group or a $C_1$-$C_{30}$ heterocyclic group, each substituted with at least one *-[($L_{11}$)

$_{a11}$-$(R_{11})_{b11}$], and ring $A_2$ is a $C_5$-$C_{60}$ carbocyclic group or a $C_1$-$C_{30}$ heterocyclic group, each substituted with at least one *-[$(L_{12})_{a12}$-$(R_{12})_{b12}$], rings $A_{21}$, $A_{22}$, and $A_{23}$ are each independently a $C_5$-$C_{60}$ carbocyclic group or a $C_1$-$C_{30}$ heterocyclic group, each substituted with at least one *-[$(L_{22})_{a22}$-$(R_{22})_{b22}$], wherein at least one of rings $A_{21}$ and $A_{23}$ is selected from groups represented by Formulae 2-1 to 2-3, 2-8 to 2-17, and 2-24 to 2-36, each substituted with at least one *-[$(L_{22})_{a22}$-$(R_{22})_{b22}$]; or ring $A_{22}$ is selected from groups represented by Formulae 2-1 to 2-3, 2-12 to 2-28, and 2-33 to 2-36, each substituted with at least one *-[$(L_{22})_{a22}$-$(R_{22})_{b22}$]:

Formula 2-1

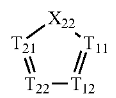

Formula 2-2

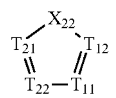

Formula 2-3

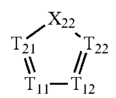

Formula 2-8

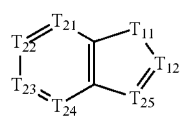

Formula 2-9

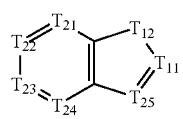

Formula 2-10

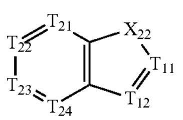

Formula 2-11

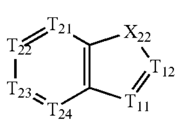

Formula 2-12

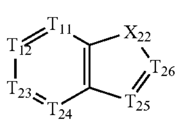

Formula 2-13

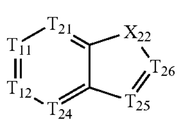

Formula 2-14

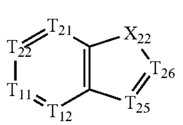

-continued

Formula 2-15

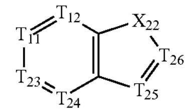

Formula 2-16

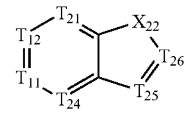

Formula 2-17

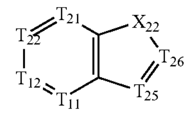

Formula 2-18

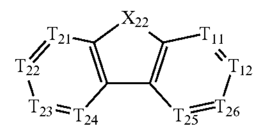

Formula 2-19

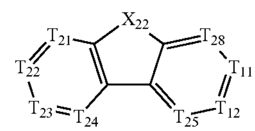

Formula 2-20

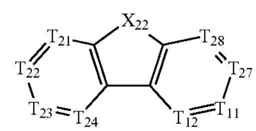

Formula 2-21

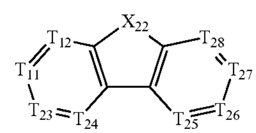

Formula 2-22

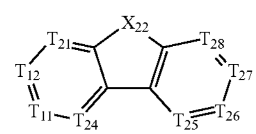

Formula 2-23

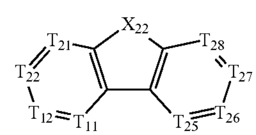

Formula 2-24

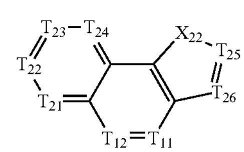

Formula 2-25

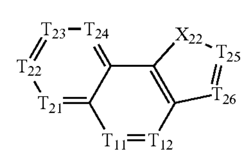

Formula 2-26

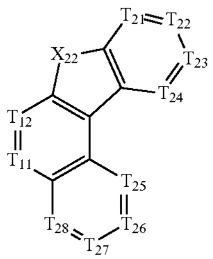

Formula 2-27

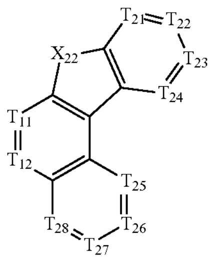

Formula 2-28

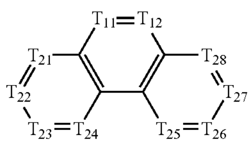

Formula 2-29

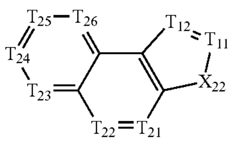

Formula 2-30

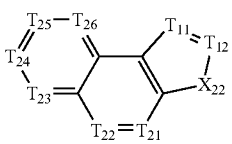

Formula 2-31

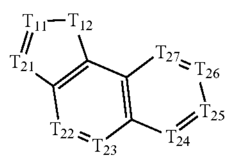

Formula 2-32

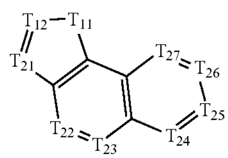

Formula 2-33

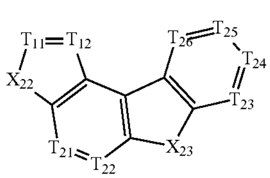

Formula 2-34

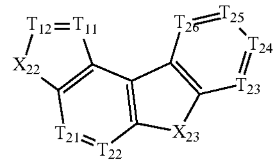

Formula 2-35

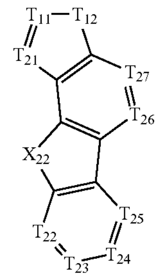

Formula 2-36

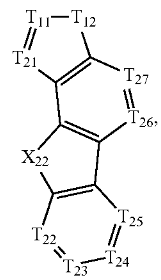

wherein, in Formulae 2-1 to 2-3 and 2-8 to 2-36, $X_{22}$ and $X_{23}$ are each independently O, S, or Se, or are each independently a moiety comprising C, N, or Si, $T_{21}$ to $T_{28}$ are each independently N, or are each independently a moiety comprising C, $T_1$ to $T_4$ are each independently carbon or nitrogen, wherein a bond between $T_1$ and $T_2$ is a single bond, and a bond between $T_3$ and $T_4$ is a double bond, ring $A_1$ is condensed with a 5-membered ring in Formulae 1B and 1D, while sharing $T_1$ and $T_2$ therewith, and ring $A_2$ is condensed with a 5-membered ring in Formulae 1C and 1D, while sharing $T_3$ and $T_4$ therewith, $T_{11}$ and $T_{12}$ are each independently carbon or nitrogen, $T_{13}$ is N or $C(R_{27})$, and $T_{14}$ is N or $C(R_{28})$, wherein two or more selected from three $T_{11}$(s) in Formula 2A are identical to or different from each other, two or more selected from three $T_{12}$(s) in Formula 2A are identical to or different from each other, two $T_{11}$(s) in Formula 2B are identical to or different from each other, two $T_{12}$(s) in Formula 2B are identical to or different from each other, $T_{11}$ and $T_{12}$ fused to ring $A_{22}$ of Formula 2A are both carbon, a bond between $T_{11}$ and $T_{12}$ is a single bond or a double bond, a case where three $T_{11}$(s) and three $T_{12}$(s) in Formula 2A are all nitrogen is excluded, and a case where two $T_{11}$(s), two $T_{12}$(s), $T_{13}$, and $T_{14}$ in Formula 2B are all nitrogen is excluded, rings $A_{21}$, $A_{22}$, and $A_{23}$ are each condensed with a 7-membered ring in each of Formulae 2A and 2B, while sharing $T_{11}$ and $T_{12}$ therewith, $X_1$ is selected from O, S, and $N-[(L_1)_{a1}-(R_1)_{b1}]$, $X_2$ is N or $C-(L_2)_{a2}-(R_2)_{b2}$, $X_3$ is N or $C-(L_3)_{a3}-(R_3)_{b3}$, $X_4$ is N or $C-(L_4)_{a4}-(R_4)_{b4}$, and $X_5$ is N or $C-(L_5)_{a5}-(R_5)_{c5}$, $X_{21}$ is selected from O, S, Se, $C(R_{23})(R_{24})$, $Si(R_{23})(R_{24})$, and $N-[(L_{21})_{a21}-(R_{21})_{b21}]$, $L_1$ to $L_5$, $L_{11}$, $L_{12}$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a5, a11, a12, a21, and a22 are each independently an integer selected from 0 to 5, $R_1$ to $R_5$, $R_{11}$, $R_{12}$, $R_{21}$ to $R_{24}$, $R_{27}$, and $R_{28}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, b1 to b5, b11, b12, b21, and b22 are each independently an integer selected from 0 to 4, $R_4$ and $R_5$ are optionally connected to each other to form a saturated or unsaturated ring, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$; and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

* * * * *